US012376447B2

(12) United States Patent
Kurokawa et al.

(10) Patent No.: US 12,376,447 B2
(45) Date of Patent: Jul. 29, 2025

(54) SEMICONDUCTOR DEVICE AND ELECTRONIC DEVICE

(71) Applicant: Semiconductor Energy Laboratory Co., Ltd., Atsugi (JP)

(72) Inventors: Yoshiyuki Kurokawa, Sagamihara (JP); Munehiro Kozuma, Atsugi (JP); Takeshi Aoki, Ebina (JP); Takuro Kanemura, Sapporo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 483 days.

(21) Appl. No.: 17/915,673

(22) PCT Filed: Apr. 5, 2021

(86) PCT No.: PCT/IB2021/052804
§ 371 (c)(1),
(2) Date: Sep. 29, 2022

(87) PCT Pub. No.: WO2021/209855
PCT Pub. Date: Oct. 21, 2021

(65) Prior Publication Data

US 2023/0132059 A1 Apr. 27, 2023

(30) Foreign Application Priority Data

Apr. 17, 2020 (JP) ................................ 2020-074001

(51) Int. Cl.
*H10K 39/32* (2023.01)
*G06F 7/50* (2006.01)
(Continued)

(52) U.S. Cl.
CPC ............... *H10K 39/32* (2023.02); *G06F 7/50* (2013.01); *G06F 7/523* (2013.01); *H04N 25/70* (2023.01);
(Continued)

(58) Field of Classification Search
CPC ........ G06N 3/048; G06N 3/063; G06N 3/045; G06F 17/10; G06F 17/147; G06F 17/16;
(Continued)

(56) References Cited

U.S. PATENT DOCUMENTS

| | | | |
|---|---|---|---|
| 7,809,432 | B2 | 10/2010 | Eversmann et al. |
| 9,634,060 | B2 | 4/2017 | Shizukuishi |

(Continued)

FOREIGN PATENT DOCUMENTS

| | | | |
|---|---|---|---|
| DE | 10216243 | | 10/2003 |
| EP | 1495443 | A | 1/2005 |

(Continued)

OTHER PUBLICATIONS

International Search Report (Application No. PCT/IB2021/052804) Dated Jun. 29, 2021.

(Continued)

*Primary Examiner* — Nikolay K Yushin
(74) *Attorney, Agent, or Firm* — Eric J. Robinson; Robinson Intellectual Property Law Office, P.C.

(57) ABSTRACT

A semiconductor device capable of performing product-sum operation with high layout flexibility is provided. In the semiconductor device, a first layer, a second layer, and a third layer are formed in this order. The first layer includes a first cell, a first circuit, a first wiring, and a second wiring adjacent to the first wiring. The second layer includes a third wiring and a fourth wiring adjacent to the third wiring. The third layer includes an electrode and a sensor. The first circuit includes a switch. The sensor is electrically connected to the third wiring through the electrode and a first plug, a first terminal of the switch is electrically connected to the third wiring through a second plug, and a second terminal of the switch is electrically connected to the first cell through the first wiring. The electrode includes a region
(Continued)

overlapping with the sensor and a region overlapping with the first plug. Note that the first to fourth wirings are parallel to each other, and the distance between the third wiring and the fourth wiring is greater than or equal to 0.9 times and less than or equal to 1.1 times the distance between the first wiring and the second wiring.

12 Claims, 39 Drawing Sheets

(51) Int. Cl.

| | |
|---|---|
| ***G06F 7/523*** | (2006.01) |
| *H04N 25/70* | (2023.01) |
| *H10B 12/00* | (2023.01) |
| *H10D 30/67* | (2025.01) |
| *H10D 86/40* | (2025.01) |
| *H10D 86/60* | (2025.01) |
| *H10D 87/00* | (2025.01) |

(52) U.S. Cl.
CPC ......... *H10B 12/00* (2023.02); *H10D 30/6734* (2025.01); *H10D 30/6755* (2025.01); *H10D 86/423* (2025.01); *H10D 86/481* (2025.01); *H10D 86/60* (2025.01); *H10D 87/00* (2025.01)

(58) Field of Classification Search
CPC .......... G06F 7/5443; G06F 7/523; G06F 7/50; G06F 7/544; H10K 39/32; H10K 39/34; H10K 39/802; H10D 88/00; H10D 88/60; H10D 88/01; H10D 30/6755; H10D 30/6757; H10D 30/6734; H10D 30/67; H10D 30/6708; H10D 30/6715; H10D 87/00; H10D 84/08; H10D 84/83; H10D 84/038; H10D 84/0126; H10D 86/423; H10D 86/481; H10D 86/60; H10B 12/00; H10B 12/50; H10B 12/31; H10B 12/05; H04N 25/70; H04N 25/74; H04N 25/78; H04N 25/65
See application file for complete search history.

(56) References Cited

U.S. PATENT DOCUMENTS

| | | | |
|---|---|---|---|
| 9,716,852 | B2 | 7/2017 | Kurokawa |
| 9,773,832 | B2 | 9/2017 | Kurokawa |
| 9,851,942 | B2 | 12/2017 | Kurokawa |
| 9,934,826 | B2 | 4/2018 | Kurokawa |
| 10,319,743 | B2 | 6/2019 | Kurokawa |
| 10,664,748 | B2 | 5/2020 | Kurokawa |
| 11,037,525 | B2 | 6/2021 | Shiokawa et al. |
| 11,101,302 | B2 | 8/2021 | Ikeda et al. |
| 11,195,866 | B2 | 12/2021 | Ikeda |
| 2005/0107893 | A1 | 5/2005 | Eversmann et al. |
| 2014/0240566 | A1 | 8/2014 | Shizukuishi |
| 2016/0293643 | A1 | 10/2016 | Kim et al. |
| 2016/0343452 | A1 | 11/2016 | Ikeda et al. |
| 2017/0317085 | A1 | 11/2017 | Kurokawa |
| 2018/0004881 | A1 | 1/2018 | Li et al. |
| 2018/0005588 | A1 | 1/2018 | Kurokawa |
| 2022/0254401 | A1 | 8/2022 | Kurokawa. et al. |
| 2022/0343954 | A1 | 10/2022 | Aoki et al. |

FOREIGN PATENT DOCUMENTS

| | | |
|---|---|---|
| JP | 2006-507557 | 3/2006 |
| JP | 2014-030170 A | 2/2014 |
| JP | 2019-047006 A | 3/2019 |
| WO | WO-2003/088141 | 10/2003 |
| WO | WO-2021/130595 | 7/2021 |
| WO | WO-2021/165799 | 8/2021 |

OTHER PUBLICATIONS

Written Opinion (Application No. PCT/IB2021/052804) Dated Jun. 29, 2021.

Guo.X et al., "Fast, Energy-Efficient, Robust, and Reproducible Mixed-Signal Neuromorphic Classifier Based on Embedded NOR Flash Memory Technology", IEDM 17: Technical Digest of International Electron Devices Meeting, Dec. 2, 2017, pp. 151-154.

FIG. 34A
Intermediate state
New crystalline phase
| Amorphous | Crystalline | Crystal |
| --- | --- | --- |
| ▪completely amorphous | ▪CAAC<br>▪nc<br>▪CAC<br>excluding single crystal and poly crystal | ▪single crystal<br>▪poly crystal |
FIG. 34B
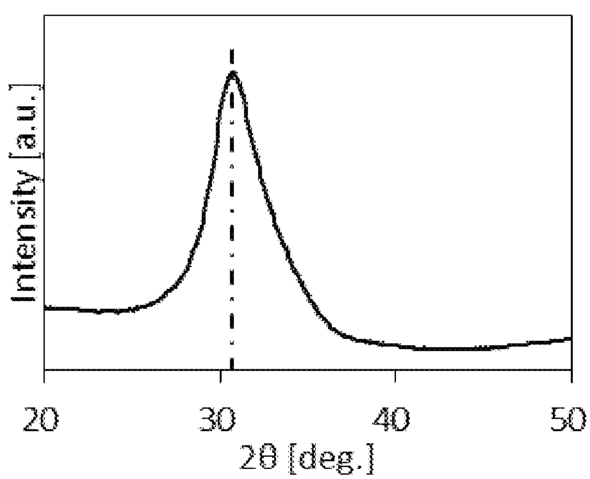
FIG. 34C
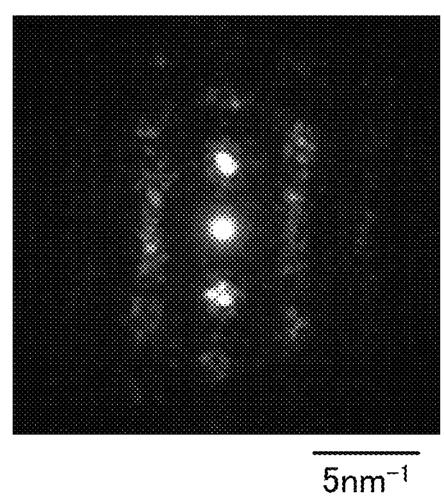

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a sensor, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits, for example. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). By using an artificial neural network, inference with an accuracy as high as or higher than that of a human can be carried out. In an artificial neural network, the main arithmetic operation is the weighted sum operation of outputs from neurons, i.e., the product-sum operation.

Non-Patent Document 1 proposes a product-sum operation circuit including a nonvolatile memory element. Each memory element of the product-sum operation circuit outputs current corresponding to a product of data corresponding to a multiplier stored in each memory element and input data corresponding to a multiplicand by using operation in a subthreshold region of a transistor containing silicon in its channel formation region. With the sum of currents output from the memory elements in each column, data corresponding to product-sum operation is obtained. The product-sum operation circuit includes memory elements therein, and thus does not need to read and write data from and to an external memory when carrying out multiplication and addition. This can decrease the number of times of data transfer for reading, writing, and the like; thus, the power consumption should be reduced.

REFERENCE

Non-Patent Document

[Non-Patent Document 1] X. Guo et al., "Fast, Energy-Efficient, Robust, and Reproducible Mixed-Signal Neuromorphic Classifier Based on Embedded NOR Flash Memory Technology" IEDM2017, pp. 151-154.

SUMMARY OF THE INVENTION

Problems to be Solved by the Invention

The transistor characteristics, field-effect mobility, and the like of a transistor containing silicon in its channel formation region easily change due to a temperature change. In particular, in the case where a product-sum operation circuit or the like is formed as an integrated circuit, heat generated at the time of driving increases the temperature of the integrated circuit, which changes the characteristics of the transistors included in the integrated circuit and thus a normal arithmetic operation cannot be carried out, in some cases.

In the case where a digital circuit executes product-sum operation, a digital multiplier circuit executes multiplication of multiplier digital data (multiplier data) and multiplicand digital data (multiplicand data). After that, a digital adder circuit executes the addition of digital data yielded by the multiplication (product data), so that digital data (product-sum data) is obtained as the product-sum operation results. The digital multiplier circuit and the digital adder circuit preferably have specifications that allow a multi-bit arithmetic operation. In that case, however, the scales of the digital multiplier circuit and the digital adder circuit need to be increased, resulting in increases in circuit areas and power consumption, in some cases.

A combination of an arithmetic circuit that carries out a neural network arithmetic operation and a sensor sometimes enables electronic devices and the like to recognize various kinds of information. For example, an optical sensor (e.g., a photodiode) as a sensor is combined with the arithmetic circuit, whereby image data obtained by the optical sensor can be used for pattern recognition such as face recognition and image recognition.

For example, in the case where a sensor array including the sensor above a semiconductor chip that includes the arithmetic circuit is placed, the sensor array is preferably placed in the center of or the vicinity of the center of the semiconductor chip in the top view. When the sensor array is placed in the center of or the vicinity of the center of the semiconductor chip in the top view, a driver circuit of the sensor included in the sensor array can be placed around the sensor array. In the case where a convex lens is provided over the sensor array regarding the sensor included in the sensor array as a photodiode, the convex lens is positioned in the center of or the vicinity of the center of the semiconductor chip in the top view, whereby the convex lens can be stably placed. In view of this, the sensor array is preferably placed in the center of or the vicinity of the center of the semiconductor chip in the top view. However, the layouts of an arithmetic circuit, a wiring, and the like formed in the semiconductor chip need to be designed in accordance with the sensor array positioned above and in the center of or the vicinity of the center of the semiconductor chip, which might decrease the layout flexibility.

An object of one embodiment of the present invention is to provide a semiconductor device capable of performing product-sum operation. Another object of one embodiment of the present invention is to provide a semiconductor device with low power consumption. Another object of one embodiment of the present invention is to provide a semiconductor device with reduced circuit area. Another object of one embodiment of the present invention is to provide a semiconductor device in which a reduction in operating performance due to heat is inhibited.

Another object of one embodiment of the present invention is to provide a novel semiconductor device and the like. Another object of one embodiment of the present invention is to provide an electronic device including any of the above semiconductor devices.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first layer, a second layer positioned above the first layer, and a third layer positioned above the second layer. The first layer includes a first cell, a first circuit, a first wiring, and a second wiring adjacent to the first wiring. The second layer includes a third wiring and a fourth wiring adjacent to the third wiring. The third layer includes an electrode and a sensor. The first circuit includes a switch. The sensor is electrically connected to the third wiring through the electrode and a first plug. A first terminal of the switch is electrically connected to the third wiring through a second plug, and a second terminal of the switch is electrically connected to the first cell through the first wiring. Note that the electrode includes a region overlapping with the sensor and a region overlapping with the first plug. The first wiring, the second wiring, the third wiring, and the fourth wiring are parallel to each other, and the distance between the third wiring and the fourth wiring is greater than or equal to 0.9 times and less than or equal to 1.1 times the distance between the first wiring and the second wiring.

(2)

In the above (1), another embodiment of the present invention may have a structure in which the first layer includes a second cell. The first cell preferably includes a first transistor, a second transistor, and a first capacitor, and the second cell preferably includes a third transistor, a fourth transistor, and a second capacitor. Specifically, it is preferable that a gate of the first transistor be electrically connected to a first terminal of the first capacitor and a first terminal of the second transistor, a first terminal of the first transistor be electrically connected to a second terminal of the second transistor, and a second terminal of the first capacitor be electrically connected to the second terminal of the switch through the first wiring. A gate of the third transistor is electrically connected to a first terminal of the second capacitor and a first terminal of the fourth transistor, a first terminal of the third transistor is electrically connected to a second terminal of the fourth transistor and the first wiring, and a second terminal of the second capacitor is electrically connected to the second terminal of the switch through the first wiring.

(3)

In the above (2), another embodiment of the present invention may have a structure in which the first layer includes a first current supply circuit. It is preferable that the first current supply circuit have a function of supplying a first current from an output terminal of the first current supply circuit, and the output terminal of the first current supply circuit be electrically connected to the first terminal of the first transistor. The sensor preferably has a function of supplying a second current corresponding to data obtained by sensing and a function of applying an input potential corresponding to the amount the second current to each of the second terminal of the first capacitor and the second terminal of the second capacitor. The second cell preferably has a function of setting an amount of current flowing between the first terminal and a second terminal of the third transistor to an amount of the second current by retaining a potential corresponding to the amount of the second current in the gate of the third transistor. The first cell preferably has a function of setting an amount of current flowing between the first terminal and a second terminal of the first transistor to an amount of the first current by retaining a potential corresponding to the first current in the gate of the first transistor, and a function of changing the first current flowing between the first terminal and the second terminal of the first transistor to an amount of third current corresponding to an amount of change in the input potential when the amount of the second current supplied from the sensor is changed. Each of the amount of the first current and the amount of the third current is in a range of current flowing when the first transistor operates in a subthreshold region, and the amount of the second current is in a range of current flowing when the second transistor operates in a subthreshold region.

(4)

In the above (2) or (3), another embodiment of the present invention may have a structure in which each of the first transistor, the second transistor, the third transistor, and the fourth transistor contains a metal oxide in a channel formation region.

(5)

In any one of the above (1) to (4), another embodiment of the present invention may have a structure in which the sensor includes a photodiode.

(6)

Another embodiment of the present invention is an electronic device including the semiconductor device according to any one of the above (1) to (5) and a housing. The semiconductor device preferably has a function of performing product-sum operation.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package or the like are examples of the semiconductor device. Moreover, a memory device, a display device, a light-emitting device, a lighting device, an electronic device, and the like themselves are semiconductor devices, or include semiconductor devices in some cases.

In the case where there is description “X and Y are connected” in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, or a NOR circuit); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected in the case where a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "a region having a resistance value", and the like; conversely, the terms "resistance", "load", and "a region having a resistance value" can be replaced with the term "resistor". The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relationship of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where a switch includes two or more transistors which are electrically connected to each other in series and whose gates are electrically connected to each other.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of current is expressed as a positive value. In other words, the direction in which a carrier with a negative charge moves is opposite to the direction of a current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

In this specification and the like, the terms for describing positioning, such as "over" and "under", are sometimes used for convenience to describe the positional relationship between components with reference to drawings. The positional relationship between components is changed as appropriate in accordance with the direction in which the components are described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Moreover, for example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the terms "electrode" and "wiring" also include the case where a plurality of "electrodes" and "wirings" are formed in an integrated manner, for example. For example, a "terminal" is used as part of a "wiring" and/or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. For another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than amain component of a semiconductor layer. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 800 and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 600 and less than or equal to 120°.

Effect of the Invention

One embodiment of the present invention can provide a semiconductor device capable of performing product-sum operation. Another embodiment of the present invention can provide a semiconductor device with low power consumption. Another embodiment of the present invention can provide a semiconductor device with reduced circuit area. Another embodiment of the present invention can provide a semiconductor device in which a reduction in operating performance due to heat is inhibited.

Another embodiment of the present invention can provide a novel semiconductor device and the like. Another embodiment of the present invention can provide an electronic device including any of the above semiconductor devices.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 34A is a diagram showing classification of crystal structures of IGZO, FIG. 34B is a diagram showing an XRD spectrum of crystalline IGZO, and FIG. 34C is a diagram showing a nanobeam electron diffraction pattern of the crystalline IGZO.

MODE FOR CARRYING OUT THE INVENTION

Figure 1:
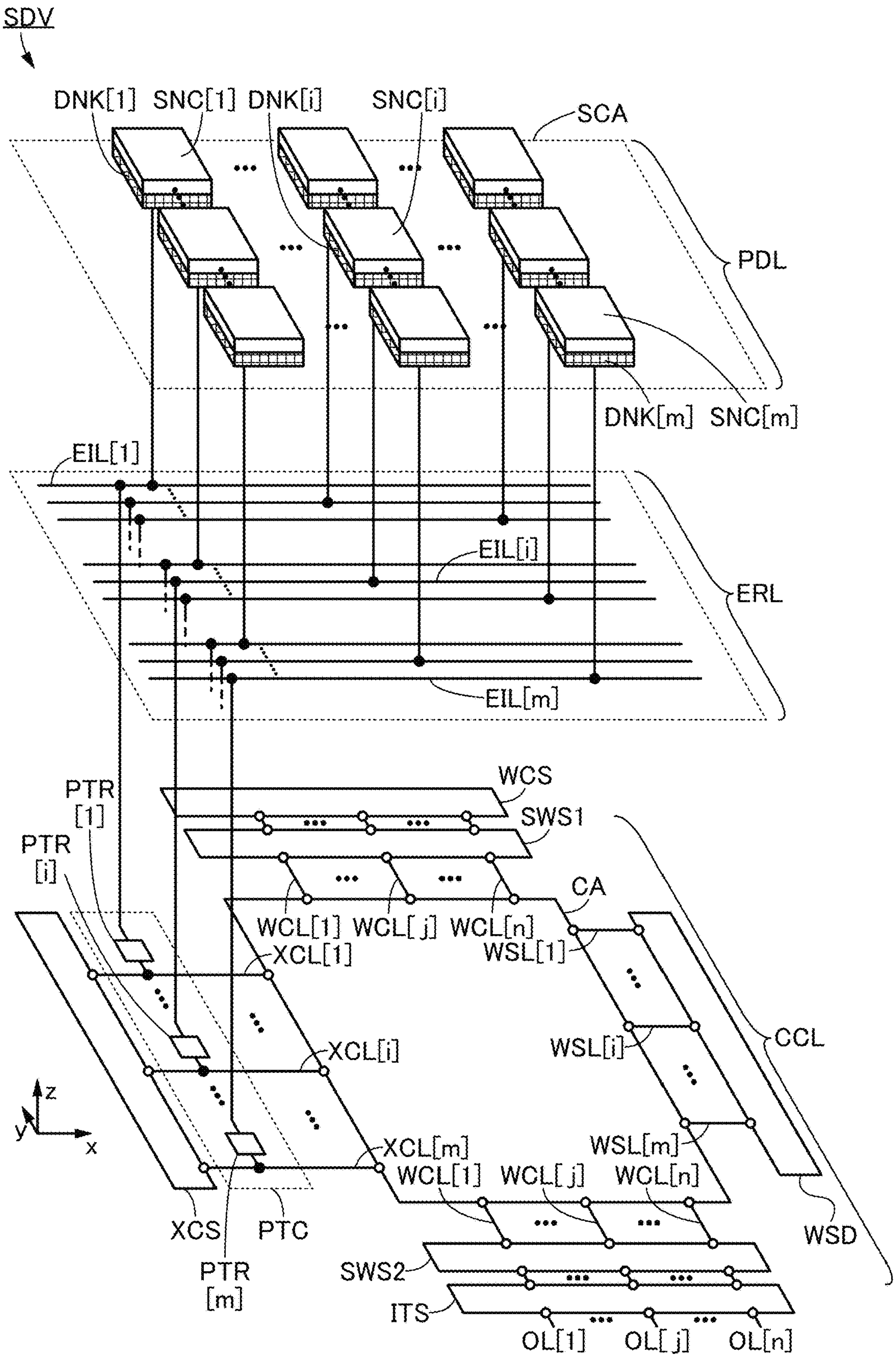
FIG. 1 is a schematic perspective view illustrating a structure example of a semiconductor device.

In an artificial neural network (hereinafter, referred to as a neural network), the connection strength between synapses can be changed when existing information is given to the neural network. The processing for determining a connection strength by providing a neural network with existing information in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield type and a hierarchical type. In particular, a neural network with a multilayer structure is called a "deep neural network" (DNN), and machine learning using a deep neural network is called "deep learning" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment (or the example), a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

EMBODIMENT 1

In this embodiment, an example of a semiconductor device capable of performing product-sum operation that is one embodiment of the present invention is described.

Structure Example of Semiconductor Device

FIG. 1 illustrates a structure example of a semiconductor device capable of performing product-sum operation of a plurality of pieces of first data and a plurality of pieces of second data. A semiconductor device SDV illustrated in FIG. 1 includes a layer PDL, a layer ERL, and a layer CCL.

Note that the semiconductor device SDV illustrated in FIG. 1 has a three-dimensional structure; thus, the x direction, the y direction, and the z direction are shown by arrows in FIG. 1. Here, the x direction, the y direction, and the z direction are shown as directions orthogonal to each other. In this specification and the like, one of the x direction, the y direction, and the z direction is referred to as a "first direction" in some cases. Another one of the directions is referred to as a "second direction" in some cases. The remaining one of the directions is referred to as a "third direction" in some cases.

The layer ERL is positioned above the layer CCL, and the layer PDL is positioned above the layer ERL. In other words, the layer CCL, the layer ERL, and the layer PDL are sequentially stacked in the z direction.

The layer PDL includes a sensor array SCA, for example. The sensor array SCA includes a plurality of electrodes and a plurality of sensors; FIG. 1 illustrates an electrode DNK[1] to an electrode DNK[m] (here, m is an integer greater than or equal to 1) as the plurality of electrodes and a sensor SNC[1] to a sensor SNC[m] as the plurality of sensors. In the layer PDL, m electrodes DNK are arranged in a matrix, and the sensor SNC[1] to the sensor SNC[m] are provided over the electrode DNK[1] to the electrode DNK[m], respectively.

In the layer PDL illustrated in FIG. 1, the reference numerals of the electrode DNK[1], the electrode DNK[i] (here, i is an integer greater than or equal to 1 and less than or equal to m), and the electrode DNK[m] among the electrode DNK[1] to the electrode DNK[m] are selectively illustrated. In the layer PDL illustrated in FIG. 1, the reference numerals of the sensor SNC[1], the sensor SNC[i], and the sensor SNC[m] among the sensor SNC[1] to the sensor SNC[m] are selectively illustrated.

Figure 2:
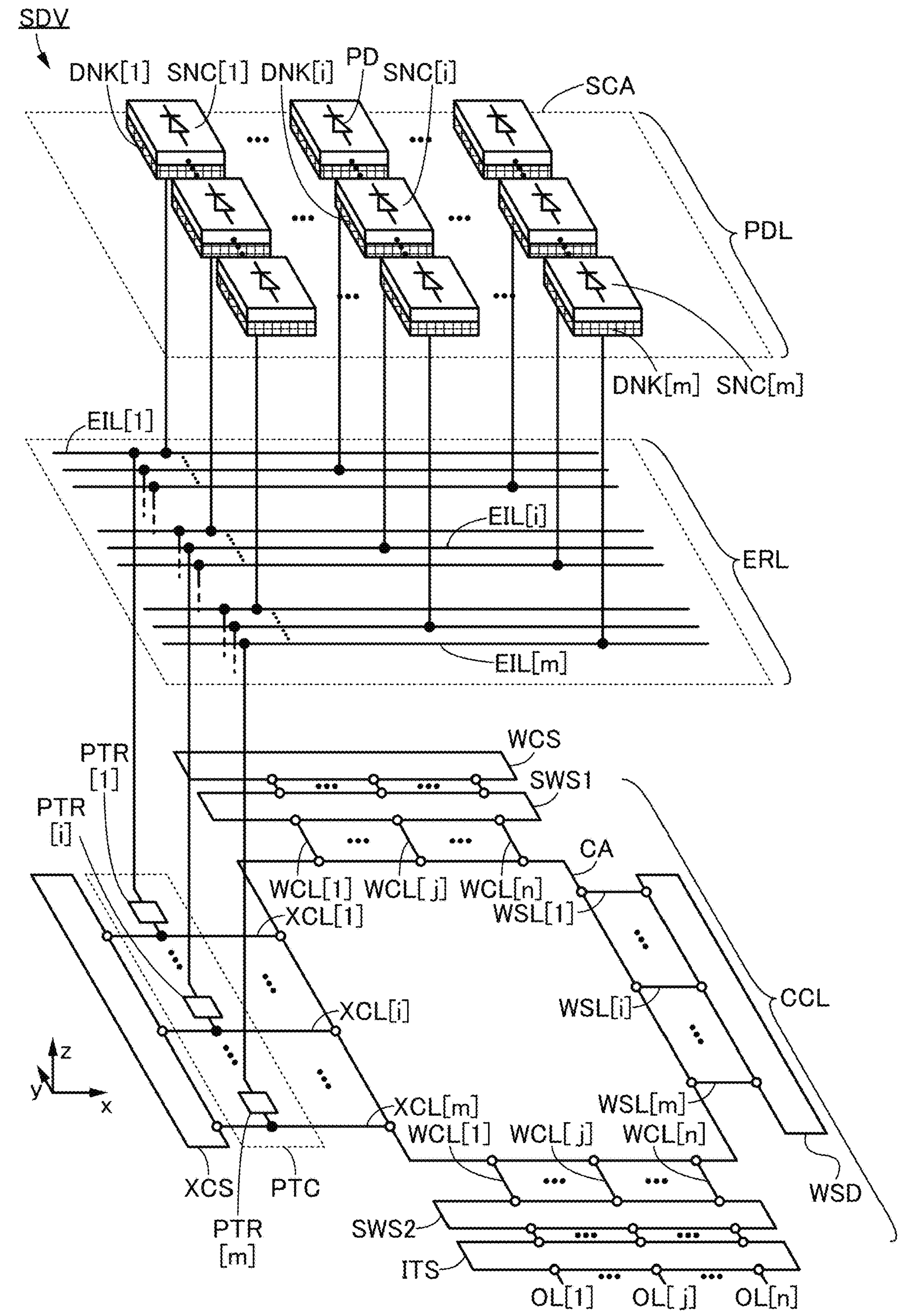
FIG. 2 is a schematic perspective view illustrating a structure example of a semiconductor device.

The sensor SNC[1] to the sensor SNC[m] each have a function of converting sensed information into a current amount and outputting the current amount. The electrode DNK[1] to the electrode DNK[m] each function as a terminal for outputting the current amount in the sensor SNC[1] to the sensor SNC[m]. As the sensors SNC, optical sensors can be used, for example. With the use of optical sensors as the sensor SNC[1] to the sensor SNC[m], the layer PDL can be part of an image sensor. In that case, it is preferable that the range of the intensity of light that can be sensed by the optical sensors include the intensity of light emitted in an environment where the optical sensors are used. FIG. 2 illustrates the semiconductor device SDV in which the sensor SNC including a photodiode PD is used as an optical sensor.

As the circuit configuration of the sensor SNC[i], a configuration may be used in which one of an input terminal and an output terminal of the photodiode PD included in the sensor SNC[i] is electrically connected to a wiring EIL[i] through the electrode DNK[i]. As the circuit configuration of the sensor SNC[i], a configuration may be used in which a switch or the like for shutting off the supply of power to temporarily halt the sensor SNC[i] is provided. In this manner, the sensor SNC[i] may include a circuit, an element, or the like having another function.

As a sensor that can be used as the sensor SNC[1] to the sensor SNC[m], for example, a pressure sensor, a gyroscope sensor, an acceleration sensor, a sound sensor, a temperature sensor, a humidity sensor, or the like can be used other than an optical sensor.

The sensor SNC[1] to the sensor SNC[m] are preferably provided in a region close to the external area because they sense information of the external area. That is, the layer PDL is preferably provided, for example, above the layer CCL and the layer ERL, as illustrated in FIG. 1.

The layer ERL includes a wiring EIL[1] to a wiring EIL[m]. Note that in the layer ERL illustrated in FIG. 1, the reference numerals of the wiring EIL[1], the wiring EIL[i], and the wiring EIL[m] among the wiring EIL[1] to the wiring EIL[m] are selectively illustrated.

The wiring EIL[1] is electrically connected to the electrode DNK[1] in the layer PDL. The wiring EIL[i] is electrically connected to the electrode DNK[i] in the layer PDL. The wiring EIL[m] is electrically connected to the electrode DNK[m] in the layer PDL.

Specifically, for example, plugs (referred to as contact holes or the like in some cases) or the like are provided at portions where the electrode DNK[1] to the electrode DNK [m] intersect with the wiring EIL[1] to the wiring EIL[m], respectively, in a top view of the semiconductor device SDV (when seen in the direction opposite to the arrows of the z axis illustrated in FIG. 1 and FIG. 2), and the electrode DNK[1] to the electrode DNK[m] are electrically connected to the wiring EIL[1] to the wiring EIL[m], respectively.

Note that in this case, the areas of the electrode DNK[1] to the electrode DNK[m] may be increased to facilitate electrical connection between the plugs and the electrodes DNK.

Thus, when information is sensed in the sensor SNC[1] to the sensor SNC[m], the wiring EIL[1] to the wiring EIL[m] function as paths through which currents flow in accordance with the information that has been output from the sensor SNC[1] to the sensor SNC[m].

The layer PDL preferably has a structure in which the sensor SNC[1] to the sensor SNC[m] perform sequential sensing and sequentially supply current to the wiring EIL[1] to the wiring EIL[m]. In this case, for example, signal lines for selecting the sensor SNC[1] to the sensor SNC[m] are provided in the layer PDL to sequentially transmit signals or the like to the signal lines so that the sensor SNC[1] to the sensor SNC[m] sequentially operate.

In the case where the sensor SNC[1] to the sensor SNC[m] are each an optical sensor including a photodiode or the like, the layer PDL in the semiconductor device SDV can have a structure in which an output terminal (cathode) of the photodiode is electrically connected to the electrode DNK, for example. For another structure example of the layer PDL in the semiconductor device SDV, an input terminal (anode) of the photodiode may be electrically connected to the electrode DNK.

For example, in the case where the sensor SNC[1] to the sensor SNC[m] are each an optical sensor including a photodiode or the like, a filter is prepared such that only one of the sensor SNC[1] to the sensor SNC[m] is irradiated with light, whereby the sensor SNC[1] to the sensor SNC[m] can sequentially operate. Since the number of sensors SNC is m, the number of kinds of filters that allow only one of the sensors SNC to be irradiated with light is m. In addition, in the case where a filter that allows none of the sensor SNC[1] to the sensor SNC[m] to be irradiated with light is prepared, the number of kinds of filters is m+1. The filters are sequentially changed while the layer PDL is being irradiated with light, whereby the sensor SNC[1] to the sensor SNC[m] can perform sequential sensing.

In the case where the sensor SNC[1] to the sensor SNC[m] are each an optical sensor including a photodiode or the like, the semiconductor device SDV may have a structure in which the sensor SNC[1] to the sensor SNC[m] are irradiated with light individually, for example. With the structure in which the sensor SNC[1] to the sensor SNC[m] are irradiated with light independently of each other, the sensor SNC[1] to the sensor SNC[m] can be sequentially irradiated with light to perform sequential sensing.

The layer CCL includes an arithmetic circuit. The arithmetic circuit includes, for example, a cell array CA, a circuit PTC, a circuit XCS, a circuit WCS, a circuit WSD, a circuit ITS, a circuit SWS1, and a circuit SWS2.

The cell array CA includes a plurality of cells. Note that the plurality of cells included in the cell array CA each have a function of holding the first data for performing product-sum operation and a function of executing multiplication of the first data and the second data, which will be described in detail later.

The cell array CA is electrically connected to a plurality of wirings. Specifically, for example, FIG. 1 illustrates a structure in which the cell array CA is electrically connected to a wiring WCL[1] to a wiring WCL[n] (here, n is an integer greater than or equal to 1), a wiring WSL[1] to a wiring WSL[m], and a wiring XCL[1] to a wiring XCL[m]. In particular, the wiring WCL[1] to the wiring WCL[n] are wirings electrically connecting the circuit SWS1 and the circuit SWS2. That is, the circuit SWS1 is electrically connected to the circuit SWS2 through the cell array CA by the wiring WCL[1] to the wiring WCL[n]. Note that in FIG. 1, the wiring WSL[1] to the wiring WSL[m] and the wiring XCL[1] to the wiring XCL[m] extend in the x direction, and the wiring WCL[1] to the wiring WCL[n] extend in the y direction.

One of the plurality of cells of the cell array CA is electrically connected to any one of the wiring WCL[1] to the wiring WCL[n], any one of the wiring WSL[1] to the wiring WSL[m], and any one of the wiring XCL[1] to the wiring XCL[m]. Thus, the plurality of cells included in the cell array CA are arranged in a matrix of at least m rows and n columns.

The circuit WCS has a function of supplying, to the wiring WCL[1] to the wiring WCL[n], a current in an amount corresponding to the first data. Thus, the circuit WCS is electrically connected to the wiring WCL[1] to the wiring WCL[n] through the circuit SWS1.

The circuit SWS1 has a function of establishing or breaking electrical continuity between the circuit WCS and each of the wiring WCL[1] to the wiring WCL[n].

The circuit WSD is electrically connected to the wiring WSL[1] to the wiring WSL[m]. The circuit WSD has a function of selecting a row of the cell array CA to which the first data is written, by supplying a predetermined signal to the wiring WSL[1] to the wiring WSL[m] at the time of writing the first data to the cell included in the cell array CA. That is, the wiring WSL[1] to the wiring WSL[m] function as write word lines.

The circuit XCS is electrically connected to the wiring XCL[1] to the wiring XCL[m]. The circuit XCS has a function of supplying a current in an amount corresponding to reference data to be described later or a current in an amount corresponding to the second data to the wiring XCL[1] to the wiring XCL[m].

The circuit PTC includes a circuit PTR[1] to a circuit PTR[m]. A first terminal of the circuit PTR[1] is electrically connected to the wiring XCL[1], a first terminal of the circuit PTR[i] is electrically connected to the wiring XCL[i], and a first terminal of the circuit PTR[m] is electrically connected to the wiring XCL[m].

A second terminal of the circuit PTR[1] is electrically connected to the wiring EIL[1] in the layer ERL, a second terminal of the circuit PTR[i] is electrically connected to the wiring EIL[i] in the layer ERL, and a second terminal of the circuit PTR[m] is electrically connected to the wiring EIL [m] in the layer ERL.

Specifically, for example, plugs or the like are provided at portions where the second terminals of the circuit PTR[1] to the circuit PTR[m] intersect with the wiring EIL[1] to the wiring EIL[m], respectively, in a top view of the semiconductor device SDV, and the second terminals of the circuit PTR[1] to the circuit PTR[m] are electrically connected to the wiring EIL[1] to the wiring EIL[m], respectively.

The circuit PTR[1] has a function of establishing or breaking electrical continuity between the wiring EIL[1] and the wiring XCL[1]. Similarly, the circuit PTR[i] has a function of establishing or breaking electrical continuity between the wiring EIL[i] and the wiring XCL[i], and the circuit PTR[m] has a function of establishing or breaking electrical continuity between the wiring EIL[m] and the wiring XCL[m]. That is, the circuit PTR[1] to the circuit PTR[m] each function as a switching element.

The circuit ITS has functions of acquiring the amount of current flowing through the wiring WCL[1] to the wiring WCL[n] and outputting the result depending on the amount of current to a wiring OL[1] to a wiring OL[n]. Thus, the circuit ITS is electrically connected to the wiring WCL[1] to the wiring WCL[n] through the circuit SWS2. The circuit ITS is electrically connected to the wiring OL[1] to the wiring OL[n].

The circuit SWS2 has a function of establishing or breaking electrical continuity between the circuit ITS and each of the wiring WCL[1] to the wiring WCL[n].

Note that although FIG. 1 illustrates a structure in which the circuit PTC, the circuit XCS, the circuit WCS, the circuit WSD, the circuit ITS, the circuit SWS1, and the circuit SWS2 are provided as peripheral circuits of the cell array CA in the layer CCL, some or all of these peripheral circuits may be provided in a layer other than the layer CCL.

Figure 3:
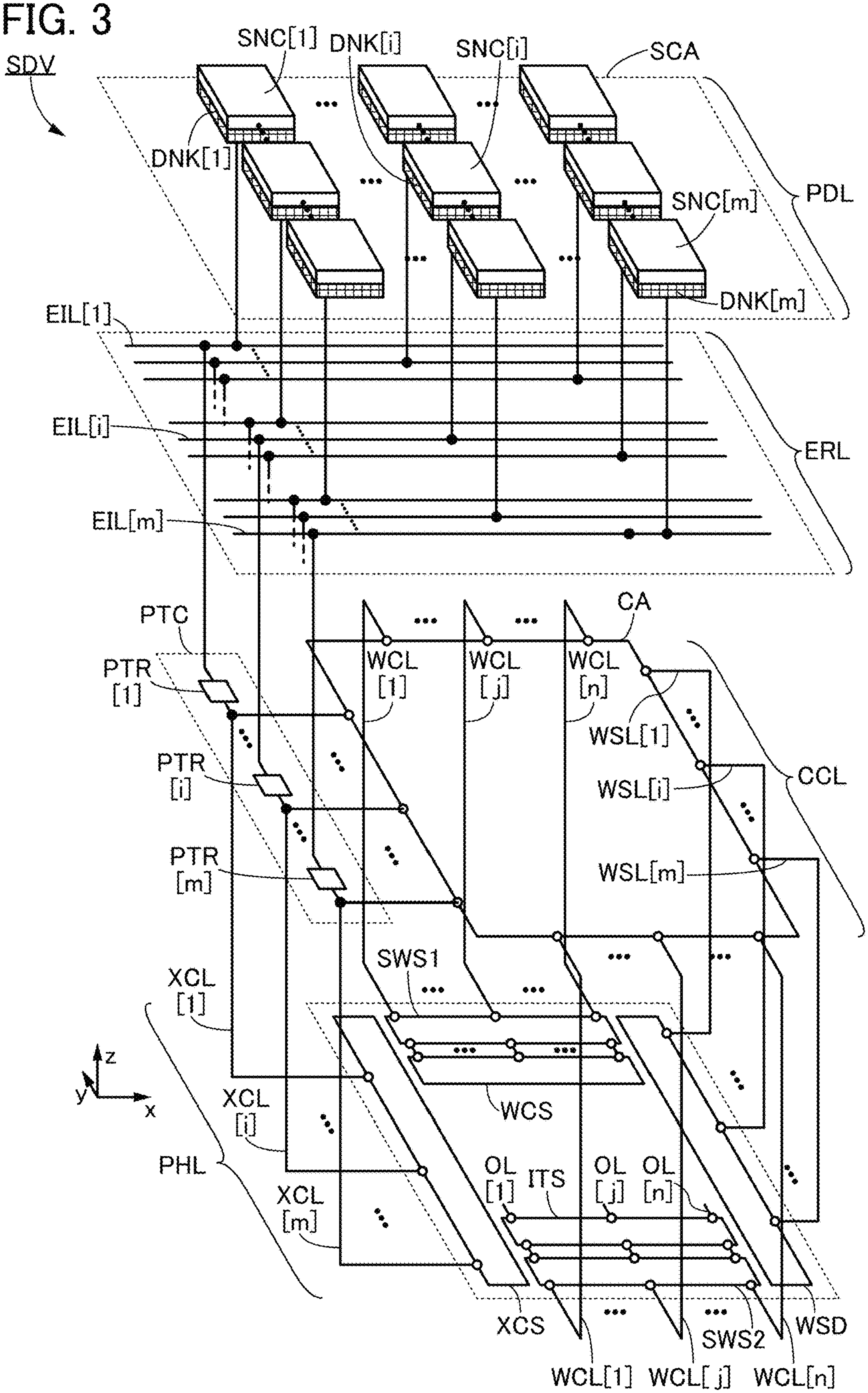
FIG. 3 is a schematic perspective view illustrating a structure example of a semiconductor device.

For example, as the structure of one embodiment of the present invention, the semiconductor device SDV including the layer PDL, the layer ERL, the layer CCL, and a layer PHL as illustrated in FIG. 3 may be employed. In FIG. 3, the layer PDL is positioned above the layer ERL, the layer ERL is positioned above the layer CCL, and the layer CCL is positioned above the layer PHL. The semiconductor device SDV in FIG. 3 is different from the semiconductor device SDV in FIG. 1 in that the layer PHL is provided, and the circuit XCS, the circuit WCS, the circuit WSD, the circuit ITS, the circuit SWS1, and the circuit SWS2, which correspond to peripheral circuits of the cell array CA, are provided in the layer PHL. Since the cell array CA is provided in the layer CCL, the circuit XCS, the circuit WCS, the circuit WSD, the circuit ITS, the circuit SWS1, and the circuit SWS2 are positioned below the cell array CA. As illustrated in FIG. 3, the structure of one embodiment of the present invention may be a structure in which the cell array CA is positioned above the circuit XCS, the circuit WCS, the circuit WSD, the circuit ITS, the circuit SWS1, and the circuit SWS2, which correspond to peripheral circuits of the cell array CA.

Although FIG. 3 illustrates a structure in which the layer PHL is positioned below the cell array CA, the layer PHL may be positioned above the cell array CA and below the layer ERL (not illustrated).

Here, structures of the wiring EIL[1] to the wiring EIL[m] included in the layer ERL in the semiconductor device of one embodiment of the present invention are described.

In the layer ERL in FIG. 1 to FIG. 3, the wiring EIL[1] to the wiring EIL[m] preferably extend along the x direction, for example. That is, for example, the direction in which the wiring EIL[1] to the wiring EIL[m] extend is preferably substantially parallel to, further preferably, parallel to the wiring XCL[1] to the wiring XCL[m] when seen in the y direction. For example, the wiring EIL[1] to the wiring EIL[m] are preferably substantially parallel to, further preferably, parallel to the wiring XCL[1] to the wiring XCL[m] included in the layer CCL when seen from above. That is, the wiring EIL[1] to the wiring EIL[m] are preferably substantially parallel to, further preferably, parallel to the row direction (x direction) of the cell array CA when seen from above. Note that at this time, the widths of the wiring EIL[1] to the wiring EIL[m] are preferably 0.7 times or more, 0.8 times or more, or 0.9 times or more, and preferably 1.1 times or less, 1.2 times or less, 1.3 times or less, 1.5 times or less, or 2 times or less those of the wiring XCL[1] to the wiring XCL[m]. The distance between adjacent wirings among the wiring EIL[1] to the wiring EIL[m] is preferably 0.1 times or more, 0.5 times or more, 0.7 times or more, 0.8 times or more, or 0.9 times or more, and preferably 1.1 times or less, 1.2 times or less, 1.3 times or less, or 1.5 times or less the distance between adjacent wirings among the wiring XCL[1] to the wiring XCL[m]. Note that any of the above minimum values and maximum values can be combined with each other.

In the case where the wiring EIL[1] to the wiring EIL[m] and the wiring XCL[1] to the wiring XCL[m] are parallel to each other, a process for forming the wiring EIL[1] to the wiring EII[m] may be similar to a process for forming the wirings XCL[1] to the wiring WCL[m]. For example, as a photomask for forming the wiring EIL[1] to the wiring EIL[m], a photomask for forming the wiring XCL[1] to the wiring XCL[m] may be used.

Figure 4:
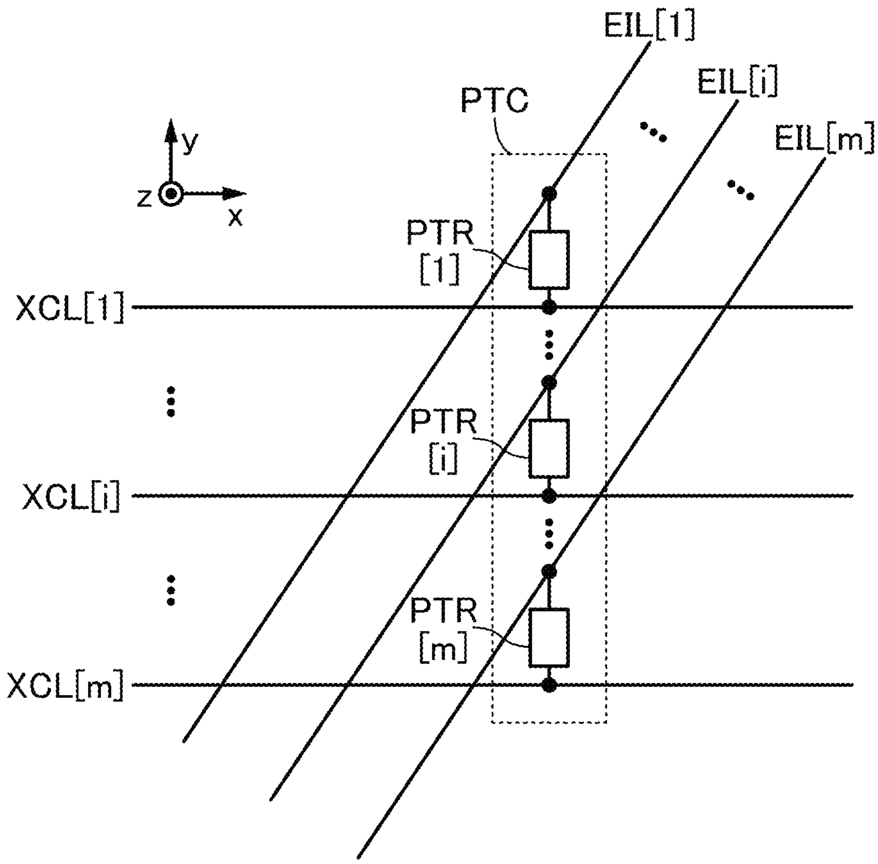
FIG. 4 is a top view illustrating an example of routing of wirings included in a semiconductor device.

Note that the wiring XCL[1] to the wiring XCL[m] are not necessarily parallel to the wiring EIL[1] to the wiring EIL[m] when seen from above. For example, FIG. 4 is a top view (diagram seen in the z direction) illustrating an example of routing of the wiring XCL[1] to the wiring XCL[m] and the wiring EIL[1] to the wiring EIL[m] of the semiconductor device SDV. As illustrated in FIG. 4, the angles between the wiring XCL[1] to the wiring XCL[m] and the wiring EIL[1] to the wiring EIL[m] in the top view may be greater than 0°. That is, the angles between the wiring XCL[1] to the wiring XCL[m] and the wiring EIL[1] to the wiring EIL[m] can be set to greater than or equal to 0°, so that the degree of freedom of the position of the sensor array SCA that is electrically connected to the wiring EIL[1] to the wiring EIL[m] can be high. Note that since the widths of the wiring EIL[1] to the wiring EIL[m] have finite values, when the angles between the wiring XCL[1] to the wiring XCL[m] and the wiring EIL[1] to the wiring EIL[m] are increased, the adjacent wirings among the wiring EIL[1] to the wiring EIL[m] might be in contact with each other. Thus, the widths and the angles need to be set such that the adjacent wirings among the wiring EIL[1] to the wiring EIL[m] are not in contact with each other.

The layer ERL preferably includes a region where at least two wirings of the wiring EIL[1] to the wiring EIL[m] are parallel to each other, and further preferably includes a region where the wiring EIL[1] to the wiring EIL[m] are parallel to each other.

Figure 5A:
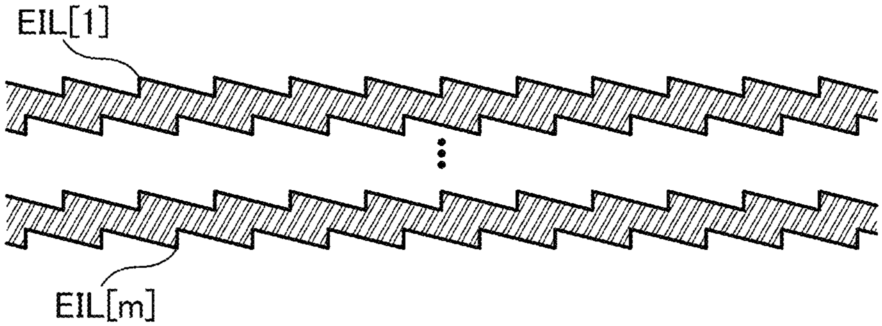
FIG. 5A and FIG. 5B are diagrams each illustrating a shape example of a wiring included in a semiconductor device.
Figure 5B:
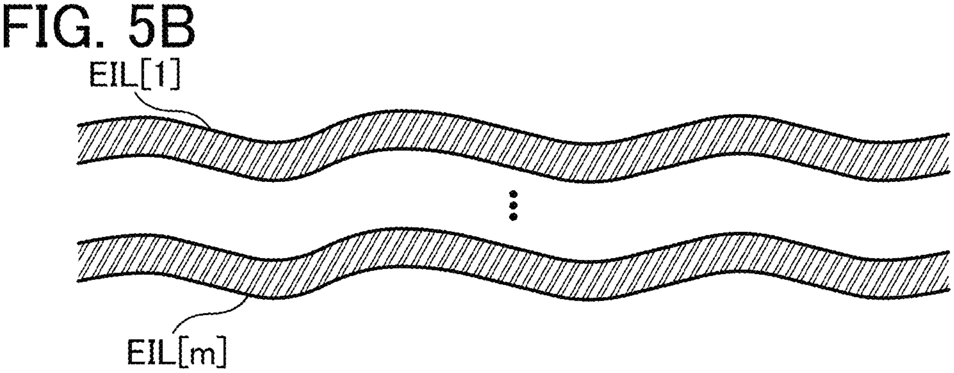

There is no particular limitation on a shape of each of the wiring EIL[1] to the wiring EIL[m] as long as the wiring EIL[1] to the wiring EIL[m] are designed such that electrical continuity is not established (current, a signal, or the like does not flow) between the wirings. For example, as the wiring EIL[1] to the wiring EIL[m], wirings having angles as illustrated in FIG. 5A, wirings having curve portions as illustrated in FIG. 5B, or the like may be used. The wiring EIL[1] to the wiring EIL[m] may be wirings having the shapes illustrated in FIG. 5A and FIG. 5B in combination. The wiring EIL[1] to the wiring EIL[m] are not necessarily parallel to each other. The wiring interval between the wiring EIL[1] to the wiring EIL[m] is preferably the same as the wiring interval between the wiring XCL[1] to the wiring XCL[m], for example.

Figure 6:
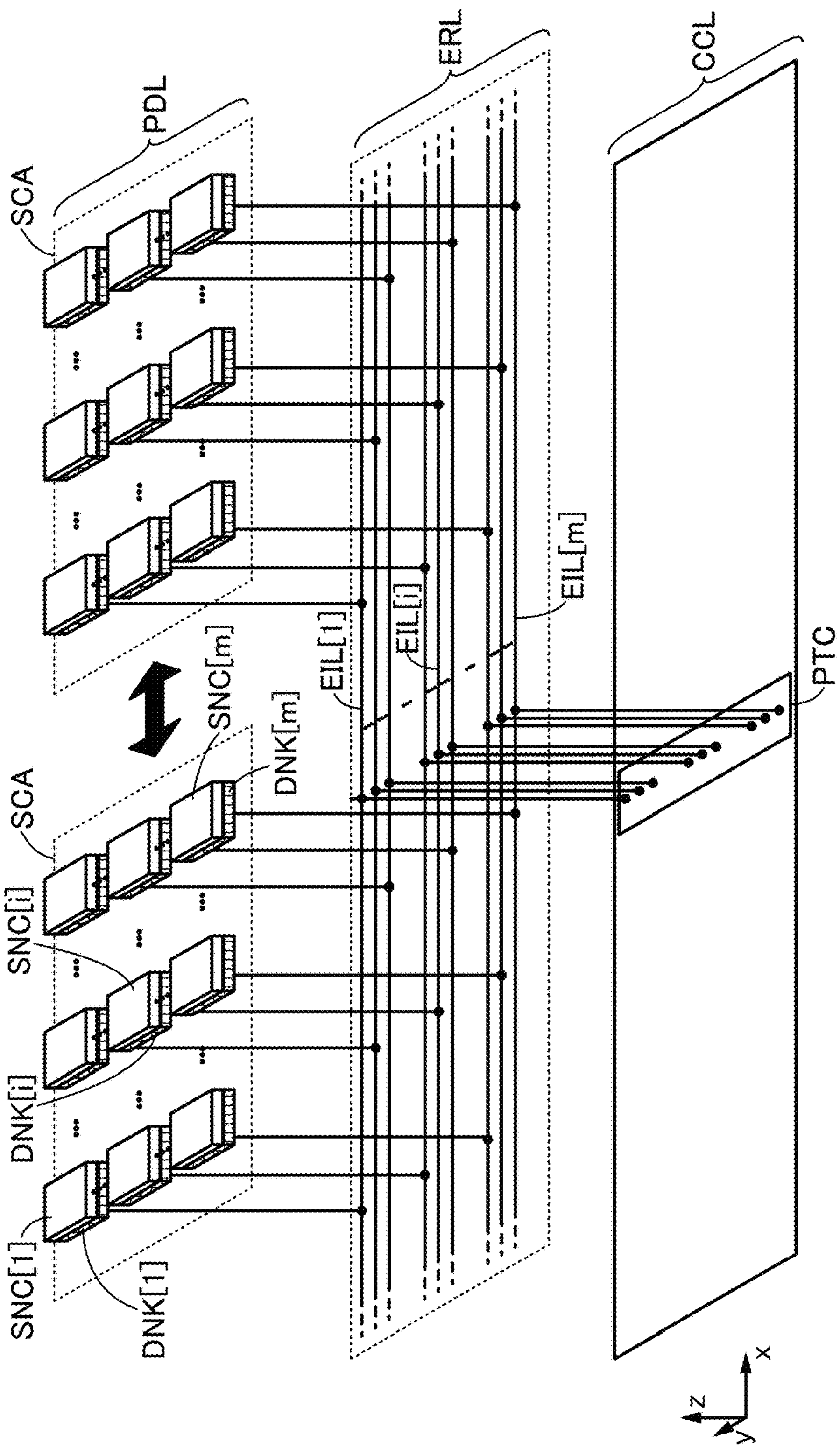
FIG. 6 is a schematic perspective view illustrating a structure example of a semiconductor device.

When the wiring EIL[1] to the wiring EIL[m] are arranged in one direction, a region where the layer PDL above the layer ERL is formed can be freely determined along the one direction. Specifically, as illustrated in FIG. 6, the placement of the sensor array SCA in the layer PDL can be freely determined in the direction in which the wiring EIL[1] to the wiring EIL[m] extend in the layer ERL (the direction of a black arrow in FIG. 6).

As described above, the use of the semiconductor device SDV illustrated in FIG. 1 to FIG. 3 and the like allows substantially free determination of the placement position of the sensor array SCA on a semiconductor chip including the arithmetic circuit (the layer CCL). Thus, the sensor array SCA can be placed in the center of or the vicinity of the center of the semiconductor chip in the top view, for example. The layout of the arithmetic circuit included in the layer CCL does not depend on the installation position of the sensor array SCA; thus, flexibility in the layout of the arithmetic circuit and the peripheral wirings and the like can be increased.

Configuration Examples of Arithmetic Circuits

Next, specific configuration examples of circuits included in the layer CCL in the semiconductor device SDV illustrated in FIG. 1 are described.

Figure 7:
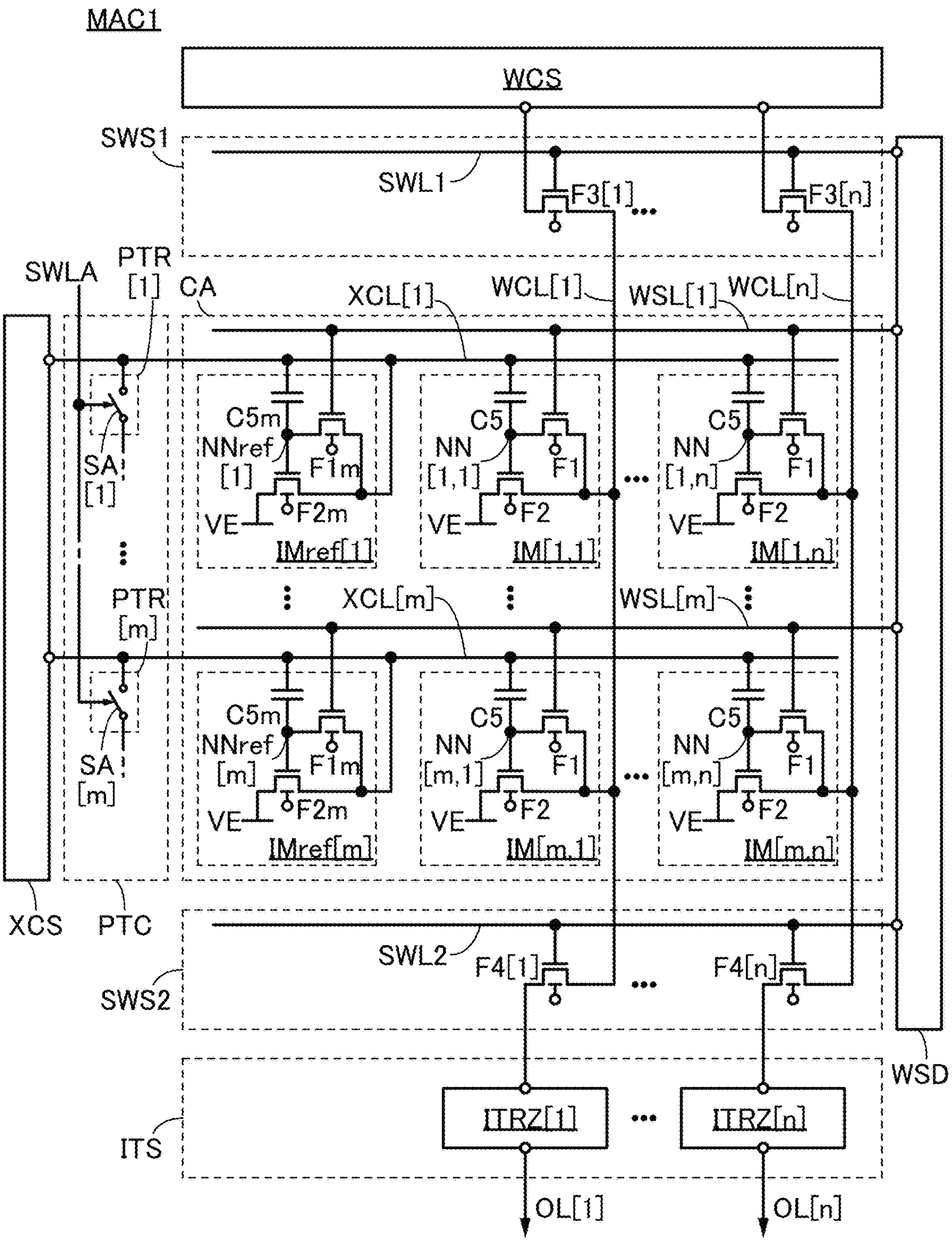
FIG. 7 is a block diagram illustrating a structure example of a semiconductor device.

FIG. 7 illustrates a configuration example of an arithmetic circuit that performs product-sum operation of positive or "0" first data and positive or "0" second data, which can be the arithmetic circuit included in the layer CCL in FIG. 1. An arithmetic circuit MAC1 illustrated in FIG. 7 is a circuit that performs product-sum operation of the first data corresponding to a potential retained in each cell and the input second data, and performs arithmetic operation of an activation function with the use of the product-sum operation result. Note that the first data and the second data can be analog data or multilevel data (discrete data), for example.

Like the layer CCL in FIG. 1, the arithmetic circuit MAC1 includes the circuit WCS, the circuit XCS, the circuit WSD, the circuit PTC, the circuit SWS1, the circuit SWS2, the circuit ITS, and the cell array CA.

The cell array CA includes a cell IM[1,1] to a cell IM[m,n] and a cell IMref[1] to a cell IMref[m]. The cell IM[1,1] to the cell IM[m,n] have a function of retaining a potential corresponding to a current amount corresponding to the first data, and the cell IMref[1] to the cell IMref[m] have a function of supplying a potential corresponding to the second data necessary for performing product-sum operation with the retained potential to the wiring XCL[1] to the wiring XCL[m].

In the cell array CA in FIG. 7, cells are arranged in a matrix of m rows and n+1 columns; the cell array CA has a structure in which cells are arranged in a matrix of one or more rows and two or more columns.

The cell IM[1,1] to the cell IM[m,n] each include a transistor F1, a transistor F2, and a capacitor C5, and the cell IMref[1] to the cell IMref[m] each include a transistor F1*m*, a transistor F2*m*, and a capacitor C5*m*, for example.

It is particularly preferable that the sizes of the transistors F1 (e.g., the channel lengths, the channel widths, and the transistor structures) included in the cell IM[1,1] to the cell IM[m,n] be equal to each other, and the sizes of the transistors F2 included in the cell IM[1,1] to the cell IM[m,n] be equal to each other. It is preferable that the sizes of the transistors F1*m* included in the cell IMref[1] to the cell IMref[m] be equal to each other, and the sizes of the transistors F2*m* included in the cell IMref[1] to the cell IMref[m] be equal to each other. It is also preferable that the sizes of the transistor F1 and the transistor F1*m* be equal to each other, and the sizes of the transistor F2 and the transistor F2*m* be equal to each other.

By making the transistors have the same size, the transistors can have almost the same electrical characteristics. Thus, by making the transistors F1 included in the cell IM[1,1] to the cell IM[m,n] have the same size and the transistors F2 included in the cell IM[1,1] to the cell IM[m,n] have the same size, the cell IM[1,1] to the cell IM[m,n] can perform almost the same operation when being in the same conditions as each other. The same conditions here mean, for example, potentials of a source, a drain, a gate, and the like of the transistor F1, potentials of a source, a drain, a gate, and the like of the transistor F2, and voltage input to the cell IM[1,1] to the cell IM[m,n]. By making the transistors F1*m* included in the cell IMref[1] to the cell IMref[m] have the same size and the transistors F2*m* included in the cell IMref[1] to the cell IMref[m] have the same size, the cell IMref[1] to the cell IMref[m] can exhibit almost the same performance and yield almost the same results, for example. In the case of the same condition, the cell IMref[1] to the cell IMref[m] can exhibit almost the same performance. The same conditions here mean, for example, potentials of a source, a drain, a gate, and the like of the transistor F1*m*, potentials of a source, a drain, a gate, and the like of the transistor F2*m*, and voltage input to the cell IMref[1] to the cell IMref[m].

Unless otherwise specified, the transistor F1 and the transistor F1*m* in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor F1 and the transistor F1*m* in an on state may operate in a saturation region or may operate both in a linear region and in a saturation region.

Unless otherwise specified, the transistor F2 and the transistor F2*m* may operate in a subthreshold region (i.e., the gate-source voltage may be lower than the threshold voltage in the transistor F2 or the transistor F2*m*, further preferably, the drain current increases exponentially with respect to the gate-source voltage). In other words, the gate voltage, the source voltage, and the drain voltage of each of the above transistors may be appropriately biased to voltages in the range where the transistor operates in the subthreshold region. Thus, the transistor F2 and the transistor F2*m* may operate such that the off-state current flows between the source and the drain.

The transistor F1 and/or the transistor F1*m* are/is preferably an OS transistor, for example. In addition, it is further preferable that a channel formation region in the transistor F1 and/or the transistor F1*m* be an oxide containing at least one of indium, gallium, and zinc. Instead of the oxide, an oxide containing at least one of indium, an element M (as the element M, for example, one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc may be used. It is further preferable that the transistor F1 and/or the transistor F1*m* have especially a transistor structure described in Embodiment 5.

With the use of an OS transistor as the transistor F1 and/or the transistor F1*m*, the leakage current of the transistor F1 and/or the transistor F1*m* can be suppressed, so that the power consumption of the arithmetic circuit can be reduced. Specifically, in the case where the transistor F1 and/or the transistor F1*m* are/is in the non-conduction state, the amount of leakage current from a retention node to a write word line can be extremely small and thus the frequency of refresh operation for the potential of the retention node can be reduced. By reducing the frequency of refresh operation, the power consumption of the arithmetic circuit can be reduced. An extremely low leakage current from the retention node to the wiring WCL or the wiring XCL allows cells to retain the potential of the retention node for a long time, increasing the arithmetic operation accuracy of the arithmetic circuit.

The use of an OS transistor also as the transistor F2 and/or the transistor F2*m* enables operation with a wide range of current in the subthreshold region, leading to a reduction in the current consumption. With the use of an OS transistor also as the transistor F2 and/or the transistor F2*m*, the transistor F2 and/or the transistor F2*m* can be manufactured concurrently with the transistor F1 and the transistor F1*m*; thus, the manufacturing process of the arithmetic circuit can sometimes be shortened. The transistor F2 and/or the transistor F2*m* can be, other than an OS transistor, a transistor containing silicon in its channel formation region (hereinafter, referred to as a Si transistor). As the silicon, amorphous silicon (sometimes referred to as hydrogenated amorphous silicon), microcrystalline silicon, polycrystalline silicon, single crystal silicon, or the like can be used, for example.

When a semiconductor device or the like is highly integrated into a chip or the like, heat may be generated in the chip by circuit operation. This heat generation increases the temperature of a transistor to change the characteristics of the transistor; thus, the field-effect mobility thereof might change or the operation frequency thereof might decrease, for example. Since an OS transistor has a higher heat resistance than a Si transistor, a change in the field-effect mobility and a decrease in the operation frequency due to a temperature change are unlikely to occur. Even when having a high temperature, an OS transistor is likely to keep a property of the drain current increasing exponentially with respect to the gate-source voltage. With the use of an OS transistor, arithmetic operation, processing, or the like can thus be easily performed even in a high temperature environment. To fabricate a semiconductor device highly resistant to heat due to operation, an OS transistor is preferably used as its transistor.

In each of the cell IM[1,1] to the cell IM[m,n], a first terminal of the transistor F1 is electrically connected to a gate of the transistor F2. A first terminal of the transistor F2 is electrically connected to a wiring VE. A first terminal of the capacitor C5 is electrically connected to the gate of the transistor F2.

In each of the cell IMref[1] to the cell IMref[m], a first terminal of the transistor F1*m* is electrically connected to a gate of the transistor F2*m*. A first terminal of the transistor F2*m* is electrically connected to the wiring VE. A first terminal of the capacitor C5*m* is electrically connected to the gate of the transistor F2*m*.

In each of the transistor F1, the transistor F2, the transistor F1*m*, and the transistor F2*m* in FIG. 7, a back gate is illustrated but the connection structure of the back gate is not illustrated; however, a point to which the back gate is electrically connected can be determined at the design stage. That is, for example, in a transistor including aback gate, a gate and the back gate may be electrically connected to each other to increase the on-state current of the transistor. For example, a gate and the back gate of the transistor F1 may be electrically connected to each other, and a gate and the back gate of the transistor F1*m* may be electrically connected to each other. Alternatively, for example, in a transistor including a back gate, a wiring for electrically connecting the back gate of the transistor to an external circuit or the like may be provided and a potential may be supplied to the back gate of the transistor with the external circuit or the like to change the threshold voltage of the transistor or to reduce the off-state current of the transistor.

The transistor F1 and the transistor F2 illustrated in FIG. 7 have back gates; however, the semiconductor device of one embodiment of the present invention is not limited thereto. For example, the transistor F1 and the transistor F2 illustrated in FIG. 7 may each be a transistor having a structure not including a back gate, i.e., a single-gate structure. It is also possible that some transistors have a structure including a back gate and the other transistors have a structure not including a back gate.

The transistor F1 and the transistor F2 illustrated in FIG. 7 are n-channel transistors; however, the semiconductor device of one embodiment of the present invention is not limited thereto. For example, some or all of the transistors F1 and the transistors F2 may be replaced with p-channel transistors.

The above-described examples of changes in the structure and polarity of the transistor are not limited to the transistor F1 and the transistor F2. For example, the same applies to the transistor F1*m*, the transistor F2*m*, a transistor F3[1] to a transistor F3[n] and a transistor F4[1] to a transistor F4[n], which are described later, a transistor described in other parts of the specification, and a transistor illustrated in other drawings.

The wiring VE functions as a wiring for flowing a current between the first terminal and a second terminal of the transistor F2 of each of the cell IM[1,1], the cell IM[m,1], the cell IM[1,*n*], and the cell IM[m,n] and a wiring for flowing a current between the first terminal and the second terminal of the transistor F2 of each of the cell IMref[1] and the cell IMref[m]. The wiring VE functions as a wiring for supplying a constant voltage, for example. The constant voltage can be, for example, a low-level potential, a ground potential, or the like.

In the cell IM[1,1], a second terminal of the transistor F1 is electrically connected to the wiring WCL[1], and the gate of the transistor F1 is electrically connected to the wiring WSL[1]. The second terminal of the transistor F2 is electrically connected to the wiring WCL[1], and a second terminal of the capacitor C5 is electrically connected to the wiring XCL[1]. In the cell IM[1,1] in FIG. 7, a connection portion of the first terminal of the transistor F1, the gate of the transistor F2, and the first terminal of the capacitor C5 is a node NN[1,1].

In the cell IM[m,1], the second terminal of the transistor F1 is electrically connected to the wiring WCL[1], and the gate of the transistor F1 is electrically connected to the wiring WSL[m]. The second terminal of the transistor F2 is electrically connected to the wiring WCL[1], and the second terminal of the capacitor C5 is electrically connected to the wiring XCL[m]. In the cell IM[m,1] in FIG. 7, a connection portion of the first terminal of the transistor F1, the gate of the transistor F2, and the first terminal of the capacitor C5 is a node NN[m,1].

In the cell IM[1,*n*], the second terminal of the transistor F1 is electrically connected to the wiring WCL[n], and the gate of the transistor F1 is electrically connected to the wiring WSL[1]. The second terminal of the transistor F2 is electrically connected to the wiring WCL[n], and the second terminal of the capacitor C5 is electrically connected to the wiring XCL[1]. In the cell IM[1,*n*] in FIG. 7, a connection portion of the first terminal of the transistor F1, the gate of the transistor F2, and the first terminal of the capacitor C5 is a node NN[1,*n*].

In the cell IM[m,n], the second terminal of the transistor F1 is electrically connected to the wiring WCL[n], and the gate of the transistor F1 is electrically connected to the wiring WSL[m]. The second terminal of the transistor F2 is electrically connected to the wiring WCL[n], and the second terminal of the capacitor C5 is electrically connected to the wiring XCL[m]. In the cell IM[m,n] in FIG. 7, a connection portion of the first terminal of the transistor F1, the gate of the transistor F2, and the first terminal of the capacitor C5 is a node NN[m,n].

In the cell IMref[1], a second terminal of the transistor F1*m* is electrically connected to the wiring XCL[1], and the gate of the transistor F1*m* is electrically connected to the wiring WSL[1]. A second terminal of the transistor F2*m* is electrically connected to the wiring XCL[1], and the second terminal of the capacitor C5 is electrically connected to the wiring XCL[1]. In the cell IMref[1] in FIG. 7, a connection portion of the first terminal of the transistor F1*m*, the gate of the transistor F2*m*, and the first terminal of the capacitor C5 is a node NNref[1].

In the cell IMref[m], the second terminal of the transistor F1*m* is electrically connected to the wiring XCL[m], and the gate of the transistor F1*m* is electrically connected to the wiring WSL[m]. The second terminal of the transistor F2*m* is electrically connected to the wiring XCL[m], and the second terminal of the capacitor C5 is electrically connected to the wiring XCL[m]. In the cell IMref[m] in FIG. 7, a connection portion of the first terminal of the transistor F1*m*, the gate of the transistor F2*m*, and the first terminal of the capacitor C5 is a node NNref[m].

The node NN[1,1] to the node NN[m,n], and the node NNref[1] to the node NNref[m] function as retention nodes of the cells.

In the case where the transistor F1 is turned on in each of the cell IM[1,1] to the cell IM[m,n], for example, the transistor F2 is a diode-connected transistor. When a constant voltage supplied from the wiring VE is a ground potential (GND), the transistor F1 is turned on, and current with a current amount I flows from the wiring WCL to the second terminal of the transistor F2, the potential of the gate of the transistor F2 (the node NN) is determined in accordance with the current amount I Since the transistor F1 is in the on state, the potential of the second terminal of the transistor F2 is ideally equal to that of the gate of the transistor F2 (the node NN). By turning off the transistor F1, the potential of the gate of the transistor F2 (the node NN) is retained. Accordingly, the transistor F2 can make current with the current amount I corresponding to the ground potential of the first terminal of the transistor F2 and the potential of the gate of the transistor F2 (the node NN) flow between a source and a drain of the transistor F2. In this specification and the like, such operation is called "setting (programing) the amount of current flowing between the source and the drain of the transistor F2 in the cell IM to I".

The circuit PTC includes the circuit PTR[1] to the circuit PTR[m] as described above. Furthermore, the circuit PTR[1] to the circuit PTR[m] include a switch SA[1] to a switch SA[m], respectively, for example.

As each of the switch SA[1] to the switch SA[m], an electrical switch such as an analog switch or a transistor can be used, for example. When a transistor is used as each of the switch SA[1] to the switch SA[m], for example, the transistor can be a transistor having a structure similar to that of the transistor F1 and the transistor F2. A mechanical switch may be used other than the electrical switch.

A first terminal of the switch SA[1] is electrically connected to the wiring XCL[1], and a control terminal of the switch SA[1] is electrically connected to a wiring SWLA. Although not illustrated, a second terminal of the switch SA[1] is, for example, electrically connected to the wiring EIL[1] in the layer ERL of the semiconductor device SDV in FIG. 1. Similarly, a first terminal of the switch SA[m] is electrically connected to the wiring XCL[m], and a control terminal of the switch SA[m] is electrically connected to the wiring SWLA. Although not illustrated, a second terminal of the switch SA[m] is, for example, electrically connected to the wiring EIL[m] in the layer ERL of the semiconductor device SDV in FIG. 1.

The wiring SWLA functions as a wiring for switching an on state and an off state of the switch SA[1] to the switch SA[m], for example. Accordingly, the wiring SWLA is supplied with a high-level potential or a low-level potential.

The circuit SWS1 includes the transistor F3[1] to the transistor F3[n], for example. A first terminal of the transistor F3[1] is electrically connected to the wiring WCL[1], a second terminal of the transistor F3[1] is electrically connected to the circuit WCS, and a gate of the transistor F3[1] is electrically connected to a wiring SWL1. A first terminal of the transistor F3[n] is electrically connected to the wiring WCL[n], a second terminal of the transistor F3[n] is electrically connected to the circuit WCS, and a gate of the transistor F3[n] is electrically connected to the wiring SWL1.

The wiring SWL1 functions as a wiring for switching an on state and an off state of the transistor F3[1] to the transistor F3[n], for example. Accordingly, the wiring SWL1 is supplied with a high-level potential or a low-level potential.

As each of the transistor F3[1] to the transistor F3[n], for example, a transistor that can be used as the transistor F1 and/or the transistor F2 can be used. It is particularly preferable to use an OS transistor as each of the transistor F3[1] to the transistor F3[n]. Instead of the transistor F3[1] to the transistor F3[n], electrical switches such as analog switches, or mechanical switches may be used.

As described above, the circuit SWS1 functions as a circuit that establishes or breaks electrical continuity between the circuit WCS and each of the wiring WCL[1] to the wiring WCL[n]. In other words, the circuit SWS1 switches electrical continuity and discontinuity between the circuit WCS and each of the wiring WCL[1] to the wiring WCL[n] by using the transistor F3[1] to the transistor F3[n] as switching elements.

The circuit SWS2 includes the transistor F4[1] to the transistor F4[n], for example. A first terminal of the transistor F4[1] is electrically connected to the wiring WCL[1], a second terminal of the transistor F4[1] is electrically connected to an input terminal of a converter circuit ITRZ[1] to be described later, and agate of the transistor F4[1] is electrically connected to a wiring SWL2. A first terminal of the transistor F4[n] is electrically connected to the wiring WCL[n], a second terminal of the transistor F4[n] is electrically connected to an input terminal of the converter circuit ITRZ[n] to be described later, and a gate of the transistor F4[n] is electrically connected to the wiring SWL2.

The wiring SWL2 functions as a wiring for switching an on state and an off state of the transistor F4[1] to the transistor F4[n], for example. Accordingly, the wiring SWL2 is supplied with a high-level potential or a low-level potential.

As each of the transistor F4[1] to the transistor F4[n], for example, a transistor that can be used as the transistor F1 and/or the transistor F2 can be used. It is particularly preferable to use an OS transistor as each of the transistor F4[1] to the transistor F4[n]. Instead of the transistor F4[1] to the transistor F4[n], electrical switches such as analog switches, or mechanical switches may be used.

As described above, the circuit SWS2 has a function of establishing or breaking electrical continuity between the circuit ITS and each of the wiring WCL[1] to the wiring WCL[n]. In other words, the circuit SWS1 switches electrical continuity and discontinuity between the circuit ITS and each of the wiring WCL[1] to the wiring WCL[n] by using the transistor F4[1] to the transistor F4[n] as switching elements.

As described above, the circuit WCS has a function of supplying, to the wiring WCL[1] to the wiring WCL[n], a current in an amount corresponding to the first data. In other words, the circuit WCS supplies, when the transistor F3[1] to the transistor F3[n] are in an on state, the first data that is to be stored in each cell of the cell array CA.

As described above, the circuit XCS has a function of supplying a current in an amount corresponding to reference data to be described later or a current in an amount corresponding to the second data to the wiring XCL[1] to the wiring XCL[m]. That is, in the arithmetic circuit MAC1 in FIG. 7, the circuit XCS supplies a current in an amount corresponding to the reference data or a current in an amount corresponding to the second data to each of the cell IMref[1] to the cell IMref[m] included in the cell array CA.

As described above, the circuit WSD has a function of selecting a row of the cell array CA to which the first data is written, by supplying a predetermined signal to the wiring WSL[1] to the wiring WSL[m] at the time of writing the first data to the cell IM[1,1] to the cell IM[m,n]. For example, when the circuit WSD supplies the wiring WSL[1] with a high-level potential and supplies the wiring WSL[2] (not illustrated) to the wiring WSL[m] with a low-level potential, the transistor F1 whose gate is electrically connected to the wiring WSL[1] can be turned on and the transistor F1 whose gate is electrically connected to the wiring WSL[2] to the wiring WSL[m] can be turned off.

In the arithmetic circuit MAC1 in FIG. 7, the circuit WSD is electrically connected to the wiring SWL1 and the wiring SWL2, for example. The circuit WSD has a function of establishing or breaking electrical continuity between the circuit WCS and the cell array CA by supplying a predetermined signal to the wiring SWL1, and a function of establishing or breaking electrical continuity between the cell array CA and each of the converter circuit ITRZ[1] to the converter circuit ITRZ[n] to be described later by supplying a predetermined signal to the wiring SWL2.

The circuit ITS includes the converter circuit ITRZ[1] to the converter circuit ITRZ[n].

The converter circuit ITRZ[1] to the converter circuit ITRZ[n] each include an input terminal and an output terminal, for example. An output terminal of the converter circuit ITRZ[1] is electrically connected to the wiring OL[1], and an output terminal of the converter circuit ITRZ[n] is electrically connected to the wiring OL[n], for example.

The converter circuit ITRZ[1] to the converter circuit ITRZ[n] each have a function of converting a current input to the input terminal into a voltage corresponding to the amount of the current and outputting the voltage from the output terminal. The voltage can be, for example, an analog voltage, a digital voltage, and the like. The converter circuit ITRZ[1] to the converter circuit ITRZ[n] may each include an arithmetic circuit of a function system. In that case, for example, the arithmetic circuit may perform arithmetic operation of a function with the use of the converted voltage and may output the arithmetic operation results to the wiring OL[1] to the wiring OL[n].

In particular, in the case of performing arithmetic operation of the hierarchical neural network, a sigmoid function, a tanh function, a softmax function, a ReLU function, a threshold function, or the like can be used as the above-described function.

<<Circuit WCS and Circuit XCS>>

Here, specific examples of the circuit WCS and the circuit XCS are described.

Figure 8A:
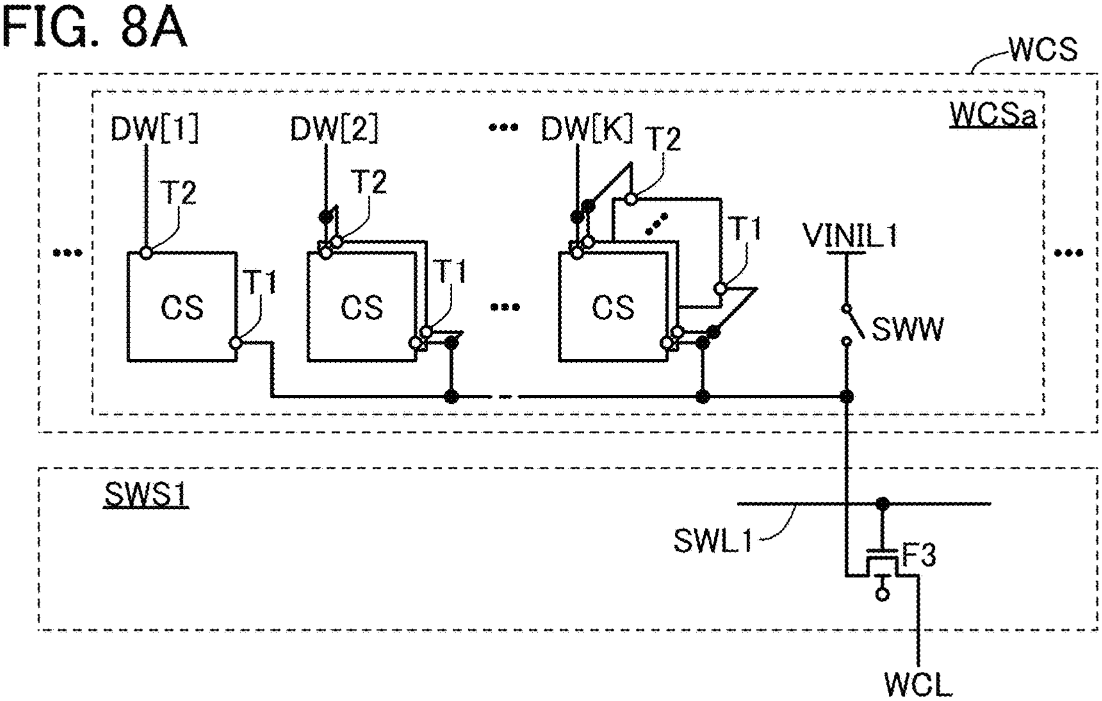
FIG. 8A to FIG. 8C are block diagrams each illustrating a configuration example of a circuit included in a semiconductor device.

First, the circuit WCS is described. FIG. 8A is a block diagram illustrating an example of the circuit WCS. In FIG. 8A, to illustrate the electrical connection between the circuit WCS and its peripheral circuits, the circuit SWS1, the transistor F3, the wiring SWL1, and the wiring WCL are also illustrated.

The circuit WCS includes, for example, circuits WCSa the number of which is the same as that of wirings WCL. That is, the circuit WCS includes n circuits WCSa.

The circuit SWS1 includes the transistors F3 the number of which is the same as that of wirings WCL. That is, the circuit SWS1 includes n transistors F3.

Accordingly, the transistor F3 illustrated in FIG. 8A can be any one of the transistor F3[1] to the transistor F3[n] included in the arithmetic circuit MAC1 in FIG. 7. Similarly, the wiring WCL can be any one of the wiring WCL[1] to the wiring WCL[n] included in the arithmetic circuit MAC1 in FIG. 7.

Thus, the wiring WCL[1] to the wiring WCL[n] are electrically connected to the respective circuits WCSa through the respective transistors F3.

The circuit WCSa illustrated in FIG. 8A includes a switch SWW, for example. A first terminal of the switch SWW is electrically connected to the second terminal of the transistor F3, and a second terminal of the switch SWW is electrically connected to a wiring VINIL1. The wiring VINIL1 functions as a wiring for supplying an initialization potential to the wiring WCL, and the initialization potential can be set to a ground potential (GND), a low-level potential, a high-level potential, or the like. The switch SWW is turned on only when the initialization potential is supplied to the wiring WCL; otherwise, the switch is in the off state.

As the switch SWW, an electrical switch such as an analog switch or a transistor can be used, for example. When a transistor is used as the switch SWW, for example, the transistor can be a transistor having a structure similar to that of the transistor F1 and the transistor F2. A mechanical switch may be used other than the electrical switch.

The circuit WCSa in FIG. 8A includes a plurality of current sources CS, for example. Specifically, the circuit WCSa has a function of outputting K-bit first data ($2^K$ values) (K is an integer greater than or equal to 1) as the current amount; in this case, the circuit WCSa includes $2^K-1$ current sources CS. The circuit WCSa includes one current source CS that outputs information corresponding to the first bit value as current, two current sources CS that output information corresponding to the second bit value as current, and the $2^{K-1}$ current sources CS that output information corresponding to the K-th bit value as current.

Each of the current sources CS in FIG. 8A includes a terminal T1 and a terminal T2. The terminal T1 of each of the current sources CS is electrically connected to the second terminal of the transistor F3 included in the circuit SWS1. The terminal T2 of the one current source CS is electrically connected to a wiring DW[1], the terminals T2 of the two current sources CS are electrically connected to a wiring DW[2], and the terminals T2 of the $2^{K-1}$ current sources CS are electrically connected to a wiring DW[K].

The plurality of current sources CS included in the circuit WCSa have a function of outputting the same constant currents $I_{Wut}$ from the terminals T1. Actually, at the manufacturing stage of the arithmetic circuit MAC1, the transistors included in the current sources CS may have different electrical characteristics; this may yield errors. The errors in the constant currents $I_{Wut}$ output from the terminals T1 of the plurality of current sources CS are thus preferably within 10%, further preferably within 5%, still further preferably within 1%. In this embodiment, the description is made on the assumption that there is no error in the constant currents $I_{Wut}$ output from the terminals T1 of the plurality of current sources CS included in the circuit WCSa.

The wiring DW[1] to the wiring DW[K] function as wirings for transmitting control signals to make the current sources CS, which are electrically connected to the wiring DW[1] to the wiring DW[K], output the constant currents $I_{Wut}$. Specifically, for example, when a high-level potential is supplied to the wiring DW[1], the current source CS electrically connected to the wiring DW[1] supplies $I_{Wut}$ as a constant current to the second terminal of the transistor F3, and when a low-level potential is supplied to the wiring DW[1], the current source CS electrically connected to the wiring DW[1] does not output $I_{Wut}$. For example, when a high-level potential is supplied to the wiring DW[2], the two current sources CS electrically connected to the wiring DW[2] supply the sum of constant currents $2I_{Wut}$ to the second terminal of the transistor F3, and when a low-level potential is supplied to the wiring DW[2], the current sources CS electrically connected to the wiring DW[2] do not output the sum of constant currents $2I_{Wut}$. For example, when a high-level potential is supplied to the wiring DW[K], the $2^{K-1}$ current sources CS electrically connected to the wiring DW[K] supply the sum of constant currents $2^{K-1}$ $I_{Wut}$ to the second terminal of the transistor F3, and when a low-level potential is supplied to the wiring DW[K], the current sources CS electrically connected to the wiring DW[K] do not output the sum of constant currents $2^{K-1}$ $I_{Wut}$.

The current flowing from the one current source CS electrically connected to the wiring DW[1] corresponds to the value of the first bit, the current flowing from the two current sources CS electrically connected to the wiring DW[2] corresponds to the value of the second bit, and the amount of current flowing from the K current sources CS electrically connected to the wiring DW[K] corresponds to the value of the K-th bit. The circuit WCSa with K of 2 is considered. For example, when the value of the first bit is "1" and the value of the second bit is "0", a high-level potential is supplied to the wiring DW[1], and a low-level potential is supplied to the wiring DW[2]. In this case, the constant current $I_{Wut}$ flows to the second terminal of the transistor F3 of the circuit SWS1 from the circuit WCSa. For example, when the value of the first bit is "0" and the value of the second bit is "1", a low-level potential is supplied to the wiring DW[1], and a high-level potential is supplied to the wiring DW[2]. In this case, the constant current $2I_{Wut}$ flows to the second terminal of the transistor F3 of the circuit SWS1 from the circuit WCSa. For example, when the value of the first bit is "1" and the value of the second bit is "1", a high-level potential is supplied to the wiring DW[1] and the wiring DW[2]. In this case, the constant current $3I_{Wut}$ flows to the second terminal of the transistor F3 of the circuit SWS1 from the circuit WCSa. For example, when the value of the first bit is "0" and the value of the second bit is "0", a low-level potential is supplied to the wiring DW[1] and the wiring DW[2]. In this case, the constant current does not flow from the circuit WCSa to the second terminal of the transistor F3 of the circuit SWS1.

FIG. 8A illustrates the circuit WCSa with K of an integer greater than or equal to 3; when K is 1, the current sources CS electrically connected to the wiring DW[2] to the wiring DW[K] are not provided in the circuit WCSa in FIG. 8A. When K is 2, the current sources CS electrically connected to the wiring DW[3] to the wiring DW[K] are not provided in the circuit WCSa in FIG. 8A.

Next, a specific structure example of the current source CS is described.

Figure 9A:
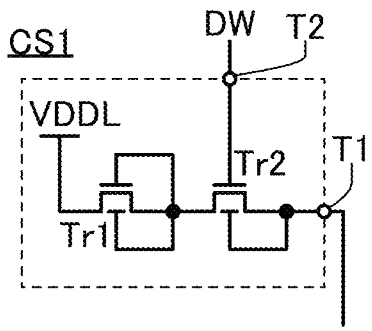
FIG. 9A to FIG. 9D are circuit diagrams each illustrating a configuration example of a circuit included in a semiconductor device.

A current source CS1 illustrated in FIG. 9A is a circuit that can be used as the current source CS included in the circuit WCSa in FIG. 8A, and the current source CS1 includes a transistor Tr1 and a transistor Tr2.

A first terminal of the transistor Tr1 is electrically connected to a wiring VDDL, and a second terminal of the transistor Tr1 is electrically connected to a gate of the transistor Tr1, a back gate of the transistor Tr1, and a first terminal of the transistor Tr2. A second terminal of the transistor Tr2 is electrically connected to the terminal T1, and a gate of the transistor Tr2 is electrically connected to the terminal T2. The terminal T2 is electrically connected to the wiring DW.

The wiring DW is any one of the wiring DW[1] to the wiring DW[n] in FIG. 8A.

The wiring VDDL functions as a wiring for supplying a constant voltage. The constant voltage can be a high-level potential, for example.

When a constant voltage supplied from the wiring VDDL is set at a high-level potential, a high-level potential is input to the first terminal of the transistor Tr1. The potential of the second terminal of the transistor Tr1 is lower than the high-level potential. At this time, the first terminal of the transistor Tr1 functions as a drain, and the second terminal of the transistor Tr1 functions as a source. Since the gate of the transistor Tr1 is electrically connected to the second terminal of the transistor Tr1, the gate-source voltage of the transistor Tr1 is 0 V. When the threshold voltage of the transistor Tr1 is within an appropriate range, current in the current range of the subthreshold region (drain current) flows between the first terminal and the second terminal of the transistor Tr1. The amount of the current is preferably smaller than or equal to $1.0\times10^{-8}$ A, further preferably smaller than or equal to $1.0\times10^{-12}$ A, still further preferably smaller than or equal to $1.0\times10^{-15}$ A, for example, when the transistor Tr1 is an OS transistor. For example, the current is further preferably within a range where the current exponentially increases with respect to the gate-source voltage. That is, the transistor Tr1 functions as a current source for supplying current within a current range of the transistor Tr1 operating in the subthreshold region. The current corresponds to $I_{Wut}$ described above or $I_{Xut}$ described later.

The transistor Tr2 functions as a switching element. When the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected to each other, a back gate-source voltage becomes 0 V. Thus, when the threshold voltage of the transistor Tr2 is within an appropriate range and a high-level potential is input to the gate of the transistor Tr2, the transistor Tr2 is turned on; when a low-level potential is input to the gate of the transistor Tr2, the transistor Tr2 is turned off. Specifically, when the transistor Tr2 is in the on state, current within the current range of the subthreshold region flows from the second terminal of the transistor Tr1 to the terminal T1, and when the transistor Tr2 is in the off state, the current does not flow from the second terminal of the transistor Tr1 to the terminal T1.

Figure 9B:
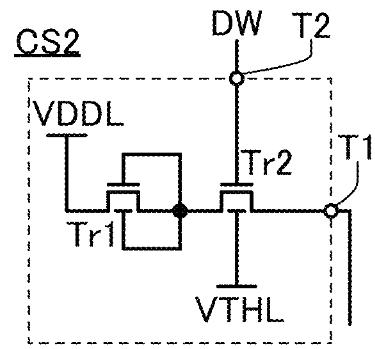

The circuit that can be used as the current source CS included in the circuit WCSa in FIG. 8A is not limited to the current source CS1 in FIG. 9A. For example, the current source CS1 has a structure in which the back gate of the transistor Tr2 and the second terminal of the transistor Tr2 are electrically connected to each other; however, the back gate of the transistor Tr2 may be electrically connected to another wiring. Such a structure example is illustrated in FIG. 9B. In a current source CS2 illustrated in FIG. 9B, the back gate of the transistor Tr2 is electrically connected to a wiring VTHL. When the wiring VTHL of the current source CS2 is electrically connected to an external circuit or the like, the external circuit or the like supplies a predetermined potential to the wiring VTHL and the back gate of the transistor Tr2 can be supplied with the predetermined potential. This can change the threshold voltage of the transistor Tr2. In particular, the off-state current of the transistor Tr2 can be reduced by an increase in the threshold voltage of the transistor Tr2.

Figure 9C:
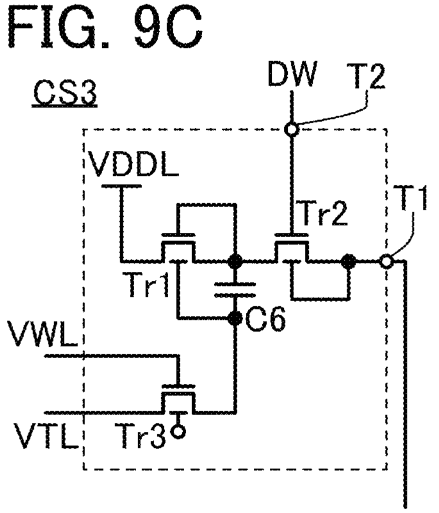

For example, the current source CS1 has a structure in which the back gate of the transistor Tr1 and the second terminal of the transistor Tr1 are electrically connected to each other; however, the voltage between the back gate and the second terminal of the transistor Tr2 may be retained with a capacitor. Such a structure example is illustrated in FIG. 9C. A current source CS3 illustrated in FIG. 9C includes a transistor Tr3 and a capacitor C6 in addition to the transistor Tr1 and the transistor Tr2. The current source CS3 is different from the current source CS1 in that the second terminal of the transistor Tr1 and the back gate of the transistor Tr1 are electrically connected to each other through the capacitor C6, and the back gate of the transistor Tr1 and a first terminal of the transistor Tr3 are electrically connected to each other. In the current source CS3, a second terminal of the transistor Tr3 is electrically connected to a wiring VTL, and a gate of the transistor Tr3 is electrically connected to a wiring VWL. In the current source CS3, the wiring VWL is supplied with a high-level potential to turn on the transistor Tr3, so that electrical continuity can be established between the wiring VTL and the back gate of the transistor Tr1. In this case, a predetermined potential can be input to the back gate of the transistor Tr1 from the wiring VTL. The wiring VWL is supplied with a low-level potential to turn off the transistor Tr3, so that voltage between the second terminal of the transistor Tr1 and the back gate of the transistor Tr1 can be retained with the capacitor C6. The threshold voltage of the transistor Tr1 can be changed when the voltage supplied to the back gate of the transistor Tr1 is determined by the wiring VTL, and the threshold voltage of the transistor Tr1 can be fixed with the transistor Tr3 and the capacitor C6.

Figure 9D:
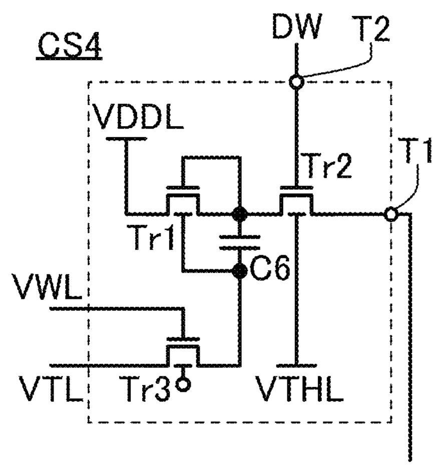

For example, as the circuit that can be used as the current source CS included in the circuit WCSa in FIG. 8A, a current source CS4 illustrated in FIG. 9D may be used. The current source CS4 is different from the current source CS3 in FIG. 9C in that the back gate of the transistor Tr2 is electrically connected not to the second terminal of the transistor Tr2 but to the wiring VTHL. That is, the current source CS4 can change the threshold voltage of the transistor Tr2 with the potential supplied from the wiring VTHL, as in the current source CS2 in FIG. 9B.

When a high current flows between the first terminal and the second terminal of the transistor Tr1 in the current source CS4, the on-state current of the transistor Tr2 needs to be increased to supply the current from the terminal T1 to the outside of the current source CS4. In this case, in the current source CS4, the wiring VTHL is supplied with a high-level potential to decrease the threshold voltage of the transistor Tr2 and increase the on-state current of the transistor Tr2, whereby a high current flowing between the first terminal and the second terminal of the transistor Tr1 can be supplied from the terminal T1 to the outside of the current source CS4.

The use of the current source CS1 to the current source CS4 illustrated in FIG. 9A to FIG. 9D as the current sources CS included in the circuit WCSa in FIG. 8A enables the circuit WCSa to output current corresponding to the K-bit first data. The amount of the current can be the amount of current flowing between the first terminal and the second terminal of the transistor F1 in the range where the transistor F1 operates in the subthreshold region.

Figure 8B:
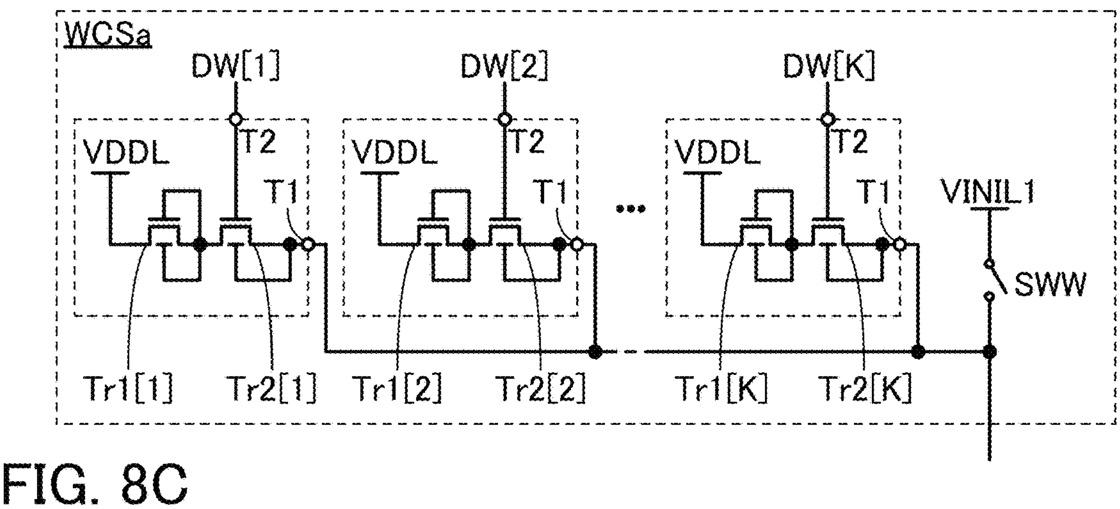

As the circuit WCSa in FIG. 8A, the circuit WCSa illustrated in FIG. 8B can be used. In the circuit WCSa in FIG. 8B, one current source CS in FIG. 9A is connected to each of the wiring DW[1] to the wiring DW[K]. When the channel width of a transistor Tr1[1] is w[1], the channel width of a transistor Tr1 [2] is w[2], and the channel width of a transistor Tr1 [K] is w[K], the ratio of the channel widths is w[1]:w[2]:w[K]=1:2:$2^{K-1}$. Since current flowing between a source and a drain of a transistor that operates in the subthreshold region is proportional to the channel width, the circuit WCSa illustrated in FIG. 8B can output current corresponding to the K-bit first data like the circuit WCSa in FIG. 8A.

As the transistor Tr1 (including the transistor Tr1[1] to the transistor Tr1[K]), the transistor Tr2 (including the transistor Tr2[1] to the transistor Tr2[K]), and the transistor Tr3, a transistor that can be used as the transistor F1 and/or the transistor F2 can be used, for example. In particular, as the transistor Tr1 (including the transistor Tr1[1] to the transistor Tr1[K]), the transistor Tr2 (including the transistor Tr2[1] to the transistor Tr2[K]), and the transistor Tr3, OS transistors are preferably used.

Next, a specific example of the circuit XCS is described.

Figure 8C:
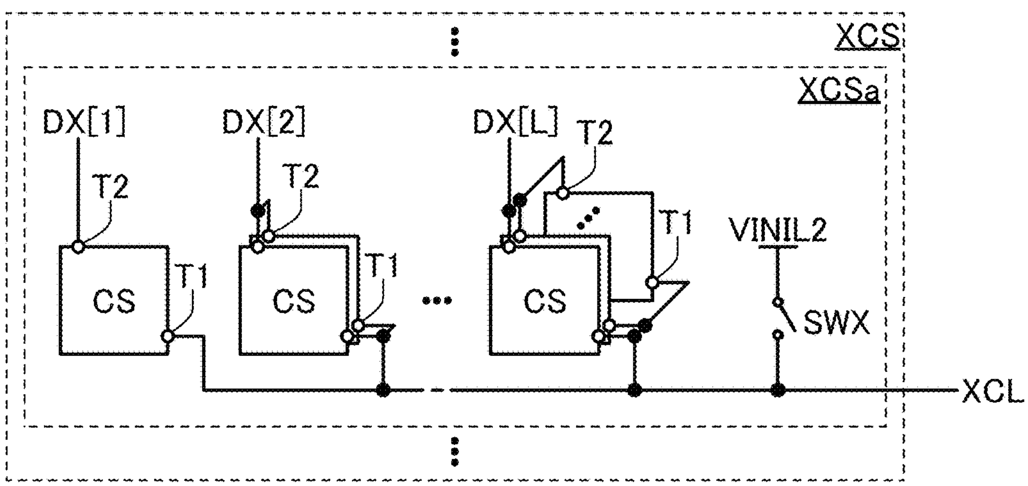

FIG. 8C is a block diagram illustrating an example of the circuit XCS. FIG. 8C also illustrates the wiring XCL to show the electrical connection between the circuit XCS and its peripheral circuits.

The circuit XCS includes, for example, circuits XCSa the number of which is the same as that of wirings XCL. That is, the circuit XCS includes m circuits XCSa.

Thus, the wiring XCL illustrated in FIG. 8C can be any one of the wiring XCL[1] to the wiring XCL[m] included in the arithmetic circuit MAC1 in FIG. 7. Accordingly, the wiring XCL[1] to the wiring XCL[m] are electrically connected to the respective circuits XCSa.

The circuit XCSa illustrated in FIG. 8C includes a switch SWX, for example. A first terminal of the switch SWX is electrically connected to the second terminal of the transistor F4, and a second terminal of the switch SWX is electrically connected to a wiring VINIL2. The wiring VINIL2 functions as a wiring for supplying an initialization potential to the wiring XCL, and the initialization potential can be set to a ground potential (GND), a low-level potential, a high-level potential, or the like. The initialization potential supplied from the wiring VINIL2 can be the same as the potential supplied from the wiring VINIL1. The switch SWX is turned on only when the initialization potential is supplied to the wiring XCL; otherwise, the switch is turned off.

As the switch SWX, a switch that can be used as the switch SWW can be used, for example.

The circuit XCSa in FIG. 8C can have almost the same configuration as that of the circuit WCSa in FIG. 9A. Specifically, the circuit XCSa has a function of outputting reference data as the current amount, and a function of outputting L-bit second data ($2^L$ values) (L is an integer greater than or equal to 1) as the current amount; in this case, the circuit XCSa includes $2^L-1$ current sources CS. The circuit XCSa includes one current source CS that outputs information corresponding to the first bit value as current, two current sources CS that output information corresponding to the second bit value as current, and $2^{L-1}$ current sources CS that output information corresponding to the L-th bit value as current.

The reference data output from the circuit XCSa as current can be information in which the first bit value is "1" and the second and subsequent bit values are "0", for example.

In FIG. 8C, the terminal T2 of the one current source CS is electrically connected to the wiring DX[1], the terminals T2 of the two current sources CS are electrically connected to the wiring DX[2], and the terminals T2 of the $2^{L-1}$ current sources CS are electrically connected to the wiring DX[L].

The plurality of current sources CS included in the circuit XCSa has a function of outputting the same constant currents $I_{Xut}$ from the terminals T1. The wiring DX[1] to the wiring DX[L] electrically connected to the current sources CS function as wirings for transmitting control signals to make the current sources CS output $I_{Xut}$. In other words, the circuit XCSa has a function of supplying current with the amount corresponding to the L-bit data transmitted from the wiring DX[1] to the wiring DX[L] to the wiring XCL.

Specifically, the circuit XCSa with L of 2 is considered here. For example, when the value of the first bit is "1" and the value of the second bit is "0", a high-level potential is supplied to the wiring DX[1], and a low-level potential is supplied to the wiring DX[2]. In this case, the constant current $I_{Xut}$ flows from the circuit XCSa to the circuit XCL. For example, when the value of the first bit is "0" and the value of the second bit is "1", a low-level potential is supplied to the wiring DX[1], and a high-level potential is supplied to the wiring DX[2]. In this case, the constant current $2I_{Xut}$ flows from the circuit XCSa to the wiring XCL. For example, when the value of the first bit is "1" and the value of the second bit is "1", a high-level potential is supplied to the wiring DX[1] and the wiring DX[2]. In this case, the constant current $3I_{Xut}$ flows from the circuit XCSa to the wiring XCL. For example, when the value of the first bit is "0" and the value of the second bit is "0", a low-level potential is supplied to the wiring DX[1] and the wiring DX[2]. In this case, the constant current does not flow from the circuit XCSa to the wiring XCL. In this specification and the like, this case is sometimes rephrased as "current with the amount zero flows from the circuit XCSa to the wiring XCL". The current amount zero, $I_{Xut}$, $2I_{Xut}$, $3I_{Xut}$, or the like output from the circuit XCSa can be the second data output from the circuit XCSa; particularly, the current amount $I_{Xut}$ output from the circuit XCSa can be the reference data output from the circuit XCSa.

When the transistors in the current sources CS included in the circuit XCSa have different electrical characteristics and this yields errors, the errors in the constant currents $I_{Xut}$ output from the terminals T1 of the plurality of current sources CS are preferably within 10%, further preferably within 5%, still further preferably within 1%. In this embodiment, the description is made on the assumption that there is no error in the constant currents $I_{Xut}$ output from the terminals T1 of the plurality of current sources CS included in the circuit XCSa.

As the current source CS of the circuit XCSa, any of the current source CS1 to the current source CS4 in FIG. 9A to FIG. 9D can be used as the current source CS of the circuit WCSa. In that case, the wiring DW illustrated in FIG. 9A to FIG. 9C is replaced with the wiring DX. This allows the circuit XCSa to make current within the current range of the subthreshold region flow through the wiring XCL as the reference data or the L-bit second data.

The circuit XCSa in FIG. 8C can have a circuit configuration similar to that of the circuit WCSa illustrated in FIG. 8B. In this case, the circuit WCSa illustrated in FIG. 8B is replaced with the circuit XCSa, the wiring DW[1] is replaced with the wiring DX[1], the wiring DW[2] is replaced with the wiring DX[2], the wiring DW[K] is replaced with the wiring DX[L], the switch SWW is replaced with the switch SWX, and the wiring VINIL1 is replaced with the wiring VINIL2.

<<Converter Circuit ITRZ[1] to Converter Circuit ITRZ[n]>>

Here, a specific example of a circuit that can be used as the converter circuit ITRZ[1] to the converter circuit ITRZ[n] included in the circuit ITS illustrated in FIG. 7 is described.

Figure 10A:
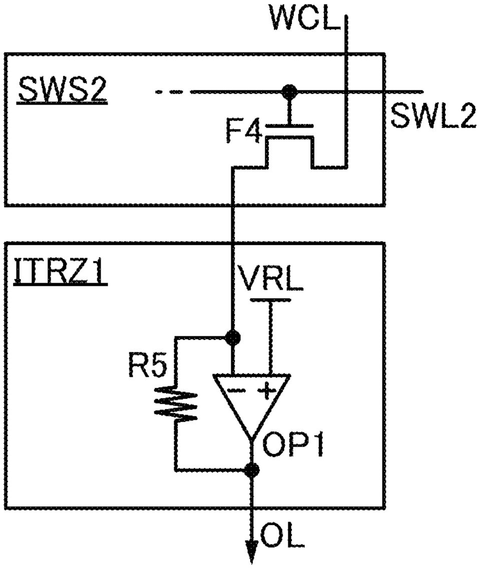
FIG. 10A to FIG. 10C are circuit diagrams each illustrating a configuration example of a circuit included in a semiconductor device.

The converter circuit ITRZ1 illustrated in FIG. 10A is an example of a circuit that can be used as the converter circuit ITRZ[1] to the converter circuit ITRZ[n] in FIG. 7. FIG. 10A also illustrates the circuit SWS2, the wiring WCL, the wiring SWL2, and the transistor F4 to show the electrical connection between the converter circuit ITRZ1 and its peripheral circuits. The wiring WCL is any one of the wiring WCL[1] to the wiring WCL[n] included in the arithmetic circuit MAC1 in FIG. 7, and the transistor F4 is any one of the transistor F4[1] to the transistor F4[n] included in the arithmetic circuit MAC1 in FIG. 7.

The converter circuit ITRZ1 in FIG. 10A is electrically connected to the wiring WCL through the transistor F4. The converter circuit ITRZ1 is electrically connected to the wiring OL. The converter circuit ITRZ1 has a function of converting the amount of current flowing from the converter circuit ITRZ1 to the wiring WCL, or the amount of current flowing from the wiring WCL to the converter circuit ITRZ1 into an analog voltage and outputting the analog voltage to the wiring OL. That is, the converter circuit ITRZ1 includes a current-voltage converter circuit.

The converter circuit ITRZ1 in FIG. 10A includes a resistor R5 and an operational amplifier OP1, for example.

An inverting input terminal of the operational amplifier OP1 is electrically connected to a first terminal of the resistor R5 and a second terminal of the transistor F4. A non-inverting input terminal of the operational amplifier OP1 is electrically connected to a wiring VRL. An output terminal of the operational amplifier OP1 is electrically connected to a second terminal of the resistor R5 and the wiring OL.

The wiring VRL functions as a wiring for supplying a constant voltage. The constant voltage can be a ground potential (GND), a low-level potential, or the like, for example.

The converter circuit ITRZ1 with the configuration in FIG. 10A can convert the amount of current flowing from the wiring WCL to the converter circuit ITRZ1 through the transistor F4 or the amount of current flowing from the converter circuit ITRZ1 to the wiring WCL through the transistor F4 into an analog voltage to output it to the wiring OL.

In particular, by setting the constant voltage supplied from the wiring VRL to a ground potential (GND), the inverting input terminal of the operational amplifier OP1 is virtually grounded, and the analog voltage output to the wiring OL can be voltage with reference to the ground potential (GND).

Figure 10B:
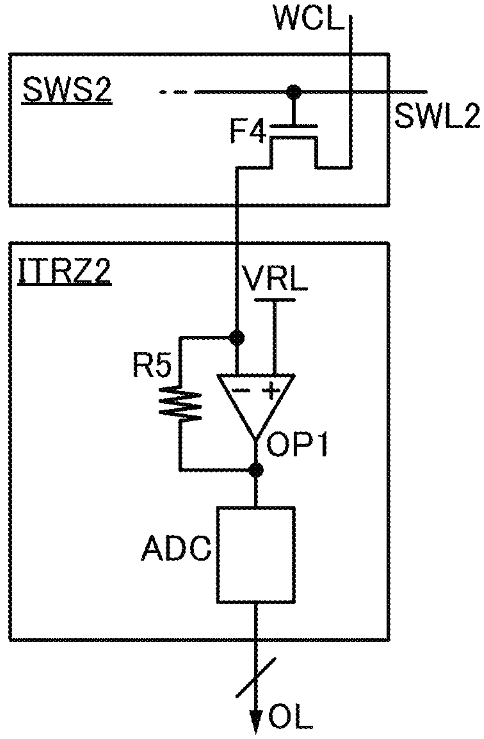

The converter circuit ITRZ1 in FIG. 10A outputs an analog voltage; however, a circuit configuration that can be used for the converter circuit ITRZ[1] to the converter circuit ITRZ[n] in FIG. 7 is not limited thereto. For example, the converter circuit ITRZ1 may include an analog-digital converter circuit ADC as illustrated in FIG. 10B. Specifically, in a converter circuit ITRZ2 in FIG. 10B, an input terminal of the analog-digital converter circuit ADC is electrically connected to an output terminal of the operational amplifier OP1 and the second terminal of the resistor R5, and an output terminal of the analog-digital converter circuit ADC is electrically connected to the wiring OL. With such a configuration, the converter circuit ITRZ2 in FIG. 10B can output a digital signal to the wiring OL.

Figure 10C:
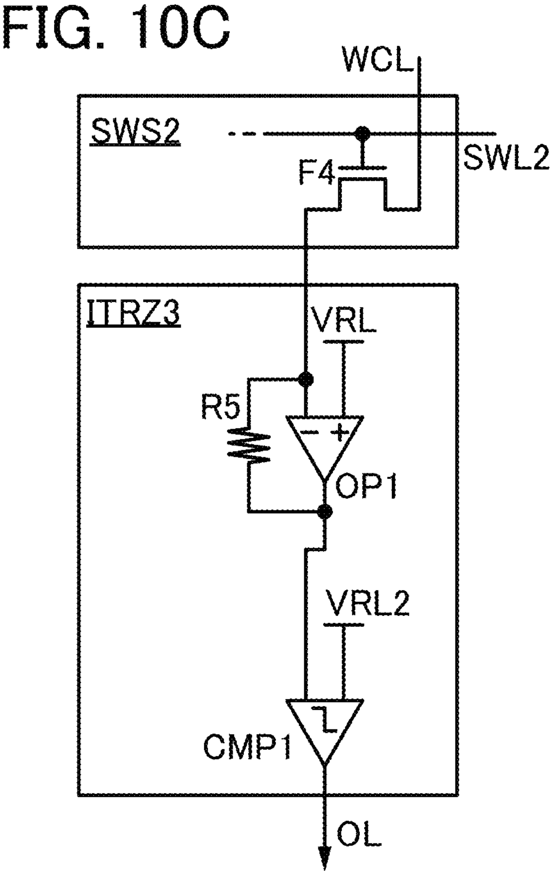

When the digital signal output to the wiring OL is 1 bit (binary) in the converter circuit ITRZ2, the converter circuit ITRZ2 may be replaced with a converter circuit ITRZ3 illustrated in FIG. 10C. The converter circuit ITRZ3 in FIG. 10C has a configuration in which a comparator CMP1 is provided in the converter circuit ITRZ1 in FIG. 10A. Specifically, the converter circuit ITRZ3 has a configuration in which a first input terminal of the comparator CMP1 is electrically connected to the output terminal of the operational amplifier OP1 and the second terminal of the resistor R5, a second input terminal of the comparator CMP1 is electrically connected to a wiring VRL2, and an output terminal of the comparator CMP1 is electrically connected to the wiring OL. The wiring VRL2 functions as a wiring for supplying a potential to be compared with the potential of the first terminal of the comparator CMP1. With such a configuration, the converter circuit ITRZ3 in FIG. 10C can output a low-level potential or a high-level potential (a binary digital signal) to the wiring OL in accordance with the magnitude relationship between the voltage converted with the current-voltage converter circuit from the amount of current flowing between the source and the drain of the transistor F4 and the voltage supplied from the wiring VRL2.

The converter circuit ITRZ[1] to the converter circuit ITRZ[n] that can be used for the arithmetic circuit MAC1 in FIG. 7 are not limited to the converter circuit ITRZ1 to the converter circuit ITRZ3. When the arithmetic circuit MAC1 is used for arithmetic operation of the hierarchical neural network, for example, the converter circuit ITRZ1 to the converter circuit ITRZ3 preferably have arithmetic circuits of a function system. As an arithmetic circuit of a function system, an arithmetic circuit with a sigmoid function, a tanh function, a softmax function, a ReLU function, a threshold function, or the like can be used.

Figure 11:
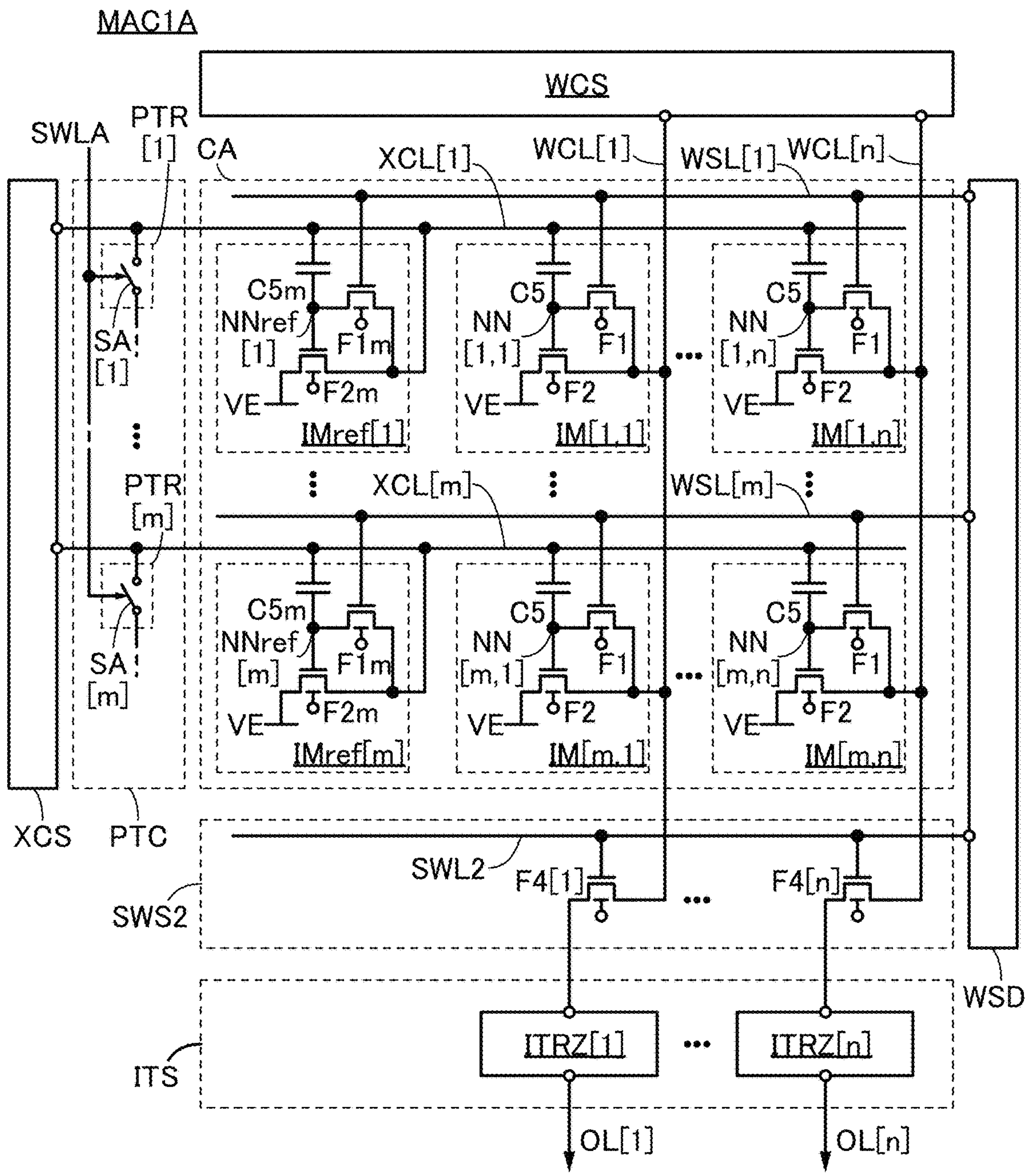
FIG. 11 is a block diagram illustrating a structure example of a semiconductor device.

One embodiment of the present invention is not limited to the circuit configuration of the arithmetic circuit MAC1 described in this embodiment. The circuit configuration of the arithmetic circuit MAC1 can be changed depending on circumstances. For example, the arithmetic circuit MAC1 may be changed to a configuration without the circuit SWS1 like an arithmetic circuit MAC1A illustrated in FIG. 11. The arithmetic circuit MAC1 can stop current flowing from the circuit WCS to the wiring WCL[1] to the wiring WCL[n] with the circuit SWS1; the arithmetic circuit MAC1A stops current flowing from the circuit WCS to the wiring WCL[1] to the wiring WCL[n] with the circuit WCS. Specifically, when the circuit WCSa in FIG. 8A is used as the circuit WCSa included in the circuit WCS of the arithmetic circuit MAC1A and the current source CS1 in FIG. 9A is used as the current source CS, for example, a low-level potential is input to the wiring DW[1] to the wiring DW[K] and the switch SWW is turned off. By performing operations of the circuit WCSa in this manner, current flowing from the circuit WCS to the wiring WCL[1] to the wiring WCL[n] can be stopped. In this manner, current flowing from the circuit WCS to the wiring WCL[1] to the wiring WCL[n] is stopped, whereby arithmetic operation can be performed using the arithmetic circuit MAC1A instead of the arithmetic circuit MAC1.

Operation Example 1 of Arithmetic Circuit

Next, an operation example of the arithmetic circuit MAC1 is described.

Figure 12:
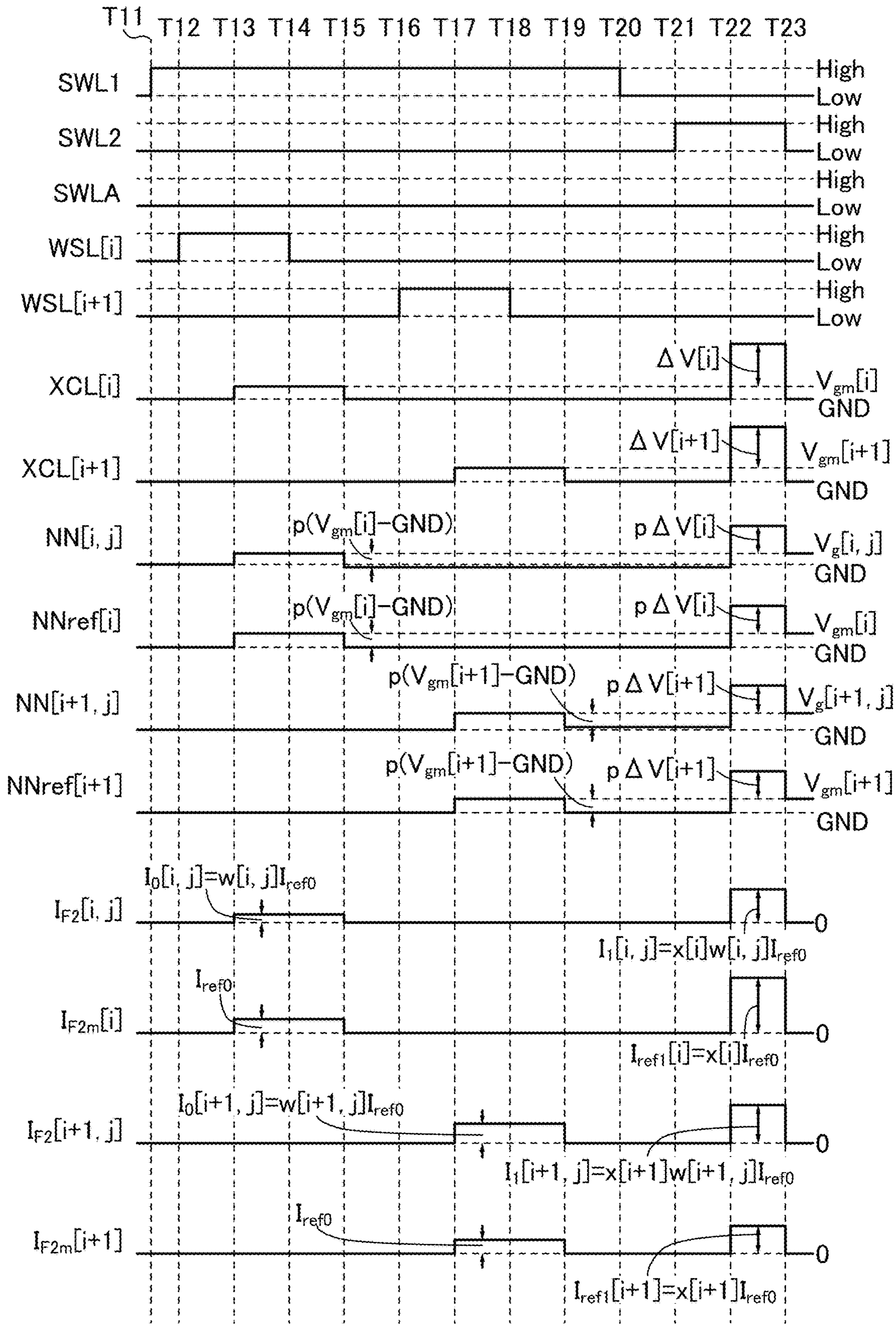
FIG. 12 is a timing chart showing an operation example of a semiconductor device.

FIG. 12 is a timing chart showing an operation example of the arithmetic circuit MAC1. The timing chart in FIG. 12 shows changes in the potentials of the wiring SWL1, the wiring SWL2, the wiring SWLA, the wiring WSL[i] (i is an integer greater than or equal to 1 and less than or equal to m−1), the wiring WSL[i+1], the wiring XCL[i], the wiring XCL[i+1], the node NN[i,j] (j is an integer greater than or equal to 1 and less than or equal to n−1), the node NN[i+1, j], the node NNref[i], and the node NNref[i+1] in the period from Time T11 to Time T23 and the vicinity thereof. The timing chart in FIG. 12 also shows changes in the amount of current $I_{F2}[i,j]$ flowing between the first terminal and the second terminal of the transistor F2 included in the cell IM[i,j]; the amount of current $I_{F2m}[i]$ flowing between the first terminal and the second terminal of the transistor F2*m* included in the cell IMref[i]; the amount of current $I_{F2}[i+1, j]$ flowing between the first terminal and the second terminal of the transistor F2 included in the cell IM[i+1, j]; and the amount of current $I_{F2m}[i+1]$ flowing between the first terminal and the second terminal of the transistor F2*m* included in the cell IMref[i+1].

The circuit WCS in FIG. 8A is used as the circuit WCS of the arithmetic circuit MAC1, and the circuit XCS in FIG. 8C is used as the circuit XCS of the arithmetic circuit MAC1.

Note that in this operation example, the potential of the wiring VE is a ground potential GND. Before Time T11, each potential of the node NN[i,j], the node NN[i+1, j], the node NNref[i], and the node NNref[i+1] is the ground potential GND. Specifically, for example, the initialization potential of the wiring VINIL1 in FIG. 8A is set to the ground potential GND, and the switch SWW, the transistor F3, and the transistor F1 included in each of the cell IM[i,j] and the cell IM[i+1,j] are turned on, whereby the potentials of the node NN[i,j] and the node NN[i+1,j] can be set to the ground potential GND. For example, the initialization potential of the wiring VINIL2 in FIG. 8C is set to the ground potential GND, and the switch SWX and the transistor F1*m* included in each of the cell IMref[i,j] and the cell IMref[i+1, j] are turned on, whereby the potentials of the node NNref [i,j] and the node NNref[i+1,j] can be set to the ground potential GND.

In this operation example, each of the switch SA[1] to the switch SA[m] is turned on when a high-level potential is input to its control terminal and is turned off when a low-level potential is input to the control terminal. The potential supplied from the wiring SWLA is always a low-level potential (shown as Low in FIG. 12). Thus, in this operation example, the switch SA[1] to the switch SA[m] are always turned off.

<<From Time T11 to Time T12>>

In the period from Time T11 to Time T12, a high-level potential (shown as High in FIG. 12) is applied to the wiring SWL1, and a low-level potential (shown as Low in FIG. 12) is applied to the wiring SWL2. Accordingly, the high-level potential is applied to each of the gates of the transistor F3[1] to the transistor F3[n] so that the transistor F3[1] to the transistor F3[n] are turned on, and the low-level potential is applied to each of the gates of the transistor F4[1] to the transistor F4[n] so that the transistor F4[1] to the transistor F4[n] are turned off.

In the period from Time T11 to Time T12, a low-level potential is applied to the wiring WSL[i] and the wiring WSL[i+1]. Accordingly, in the i-th row of the cell array CA, a low-level potential is applied to the gates of the transistors F1 included in the cell IM[i,1] to the cell IM[i,n] and the gate of the transistor F1*m* included in the cell IMref[i] so that the transistors F1 and the transistor F1*m* are turned off. In addition, in the i+1-th row of the cell array CA, a low-level potential is applied to the gates of the transistors F1 included in the cell IM[i+1,1] to the cell IM[i+1,n] and the gate of the transistor F1*m* included in the cell IMref[i+1] so that the transistors F1 and the transistor F1*m* are turned off.

In the period from Time T11 to Time T12, the ground potential GND is applied to the wiring XCL[i] and the wiring XCL[i+1]. Specifically, for example, when the wiring XCL illustrated in FIG. 8C is the wiring XCL[i] and the wiring XCL[i+1], the initialization potential of the wiring VINIL2 is set to the ground potential GND, and the switch SWX is turned on, the potentials of the wiring XCL[i] and the wiring XCL[i+1] can be set to the ground potential GND.

In the period from Time T11 to Time T12, the first data is not input to the wiring DW[1] to the wiring DW[K] in the circuits WCSa in FIG. 8A, which are electrically connected to the wiring WCL[i] to the wiring WCL[n] through the respective transistors F3. In that case, the low-level potential is input to the wiring DW[i] to the wiring DW[K] in each of the circuits WCSa in FIG. 8A. In the period from Time T11 to Time T12, the second data is not input to the wiring DX[i] to the wiring DX[L] in the circuits XCSa in FIG. 8C, which are electrically connected to the wiring XCL[1] to the wiring XCL[m]. In that case, the low-level potential is input to the wiring DX[1] to the wiring DX[L] in each of the circuits XCSa in FIG. 8C.

In the period from Time T11 to Time T12, current does not flow through a wiring WCL[j], the wiring XCL[i], and the wiring XCL[i+1]. Therefore, $I_{F2}$[i,j], $I_{F2m}$[i], $I_{F2}$[i+1, j], and $I_{F2m}$[i+1] are each 0.

<<From Time T12 to Time T13>>

In the period from Time T12 to Time T13, a high-level potential is applied to the wiring WSL[i]. Accordingly, in the i-th row of the cell array CA, a high-level potential is applied to the gates of the transistors F1 included in the cell IM[i,1] to the cell IM[i,n] and the gate of the transistor F1*m* included in the cell IMref[i] so that the transistors F1 and the transistor F1*m* are turned on. Furthermore, in the period from Time T12 to Time T13, a low-level potential is applied to the wiring WSL[1] to the wiring WSL[m] other than the wiring WSL[i], and in the cell array CA, the transistors F1 included in the cell IM[1,1] to the cell IM[m,n] in the rows other than the i-th row and the transistors F1*m* included in the cell IMref[1] to the cell IMref[m] in the rows other than the i-th row are in the off state.

The ground potentials GND have been continuously applied to the wiring XCL[1] to the wiring XCL[m] since before Time T12.

<<From Time T13 to Time T14>>

In the period from Time T13 to Time T14, current with a current amount $I_0$[i,j] flows as the first data from the circuit WCS to the cell array CA through the transistor F3[j]. Specifically, when the wiring WCL illustrated in FIG. 8A is the wiring WCL[j], signals corresponding to the first data are input to the wiring DW[1] to the wiring DW[K], whereby the current $I_0$[i,j] flows from the circuit WCSa to the second terminal of the transistor F3[j]. That is, when the value of the K-bit signal input as the first data is α[i,j] (α[i,j] is an integer greater than or equal to 0 and less than or equal to $2^K-1$), $I_0$[i,j] is equal to α[i,j]×$I_{Wut}$.

Since $I_0$[i,j] is equal to 0 when α[i,j] is 0, current does not flow from the circuit WCSa to the cell array CA through the transistor F3[j] in a strict sense, but in this specification and the like, the expression such as "current with $I_0$[i,j]=0 flows" is sometimes used.

In the period from Time T13 to Time T14, electrical continuity is established between the wiring WCL[j] and the first terminal of the transistor F1 included in the cell IM[i,j] in the i-th row of the cell array CA, and electrical continuity is not established between the wiring WCL[j] and the first terminals of the transistors F1 included in the cell IM[1,j] to the cell IM[m,j] in the rows other than the i-th row of the cell array CA; accordingly, current with the current amount $I_0$[i,j] flows from the wiring WCL[j] to the cell IM[i,j].

When the transistor F1 included in the cell IM[i,j] is turned on, the transistor F2 included in the cell IM[i,j] has a diode-connected structure. Therefore, when current flows from the wiring WCL[j] to the cell IM[i,j], the potentials of the gate of the transistor F2 and the second terminal of the transistor F2 are substantially equal to each other. The potentials are determined by the amount of current flowing from the wiring WCL[j] to the cell IM[i,j], the potential of the first terminal of the transistor F2 (here, GND), and the like. In this operation example, the current with the current amount $I_0$[i,j] flows from the wiring WCL[j] to the cell IM[i,j], whereby the potential of the gate of the transistor F2 (the node NN[i,j]) becomes $V_g$[i,j]. That is, the gate-source voltage of the transistor F2 is $V_g$[i,j]−GND, and the current with the amount $I_0$[i,j] is set as current flowing between the first terminal and the second terminal of the transistor F2.

Here, when the threshold voltage of the transistor F2 is $V_{th}$[i,j], the current with the amount $I_0$[i,j] in the case where the transistor F2 operates in the subthreshold region can be expressed by the following formula.

[Formula 1]

$$I_0[i,j]=I_a\exp\{J(V_g[i,j]-V_{th}[i,j])\} \tag{1.1}$$

Note that $I_a$ is a drain current for the case where $V_g[i,j]$ is $V_{th}[i,j]$, and J is a correction coefficient determined by the temperature, the device structure, and the like.

In the period from Time T13 to Time T14, current with a current amount $I_{ref0}$ flows as the reference data from the circuit XCS to the wiring XCL[i]. Specifically, when the wiring XCL illustrated in FIG. 8C is the wiring XCL[i], a high-level potential is input to the wiring DX[1], a low-level potential is input to the wiring DX[2] to the wiring DX[K], and the current $I_{ref0}$ flows from the circuit XCSa to the wiring XCL[i]. In other words, $I_{ref0}$ is equal to $I_{Xut}$.

In the period from Time T13 to Time T14, since electrical continuity is established between the first terminal of the transistor F1*m* included in the cell IMref[i] and the wiring XCL[i], the current with the current amount $I_{ref0}$ flows from the wiring XCL[i] to the cell IMref[i].

As in the cell IM[i,j], when the transistor F1*m* included in the cell IMref[i] is turned on, the transistor F2*m* included in the cell IMref[i] has a diode-connected structure. Therefore, when current flows from the wiring XCL[i] to the cell IMref[i], the potentials of the gate of the transistor F2*m* and the second terminal of the transistor F2*m* are substantially equal to each other. The potentials are determined by the amount of current flowing from the wiring XCL[i] to the cell IMref[i], the potential of the first terminal of the transistor F2*m* (here, GND), and the like. In this operation example, the current with the current amount $I_{ref0}$ flows from the wiring XCL[i] to the cell IMref[i], whereby the potential of the gate of the transistor F2 (the node NNref[i]) becomes $V_{gm}[i]$; at this time, the potential of the wiring XCL[i] is also $V_{gm}[i]$. That is, the gate-source voltage of the transistor F2*m* is $V_{gm}[i]-GND$, and the current with the amount $I_{ref0}$ is set as current flowing between the first terminal and the second terminal of the transistor F2*m*.

Here, when the threshold voltage of the transistor F2*m* is $V_{thm}[i]$, the current amount $I_{ref0}$ in the case where the transistor F2*m* operates in the subthreshold region can be expressed by the following formula. Note that the correction coefficient J is the same as that of the transistor F2 included in the cell IM[i,j]. For example, the same device structure and the same size (channel length and channel width) are used for the transistors. Furthermore, although variations in manufacturing cause variations in the correction coefficient J among the transistors, the variations are suppressed to the extent that the argument described later can be made with sufficient precision for practical purposes.

[Formula 2]

$$I_{ref0}=I_{\alpha}\exp\{J(V_{gm}[i]-V_{thm}[i])\} \quad (1.2)$$

Here, a weight coefficient w[i,j] that is the first data is defined as follows.

[Formula 3]

$$w[i,j]=\exp\{(V_g[i,j]-V_{th}[i,j]-V_{gm}[i]+V_{thm}[i])\} \quad (1.3)$$

Therefore, Formula (1.1) can be rewritten to the following formula.

[Formula 4]

$$I_0[i,j]=w[i,j]I_{ref0}\leftrightarrow\alpha[i,j]I_{Wut}=w[i,j]I_{Xut} \quad (1.4)$$

When the current $I_{Wut}$ output from the current source CS of the circuit WCSa in FIG. 8A is equal to the current $I_{Xut}$ output from the current source CS of the circuit XCSa in FIG. 8C, w[i,j] is equal to α[i,j]. That is, when $I_{Wut}$ is equal to $I_{Xut}$, α[i,j] corresponds to the value of the first data; thus, $I_{Wut}$ and $I_{Xut}$ are preferably equal to each other.

<<From Time T14 to Time T15>>

In the period from Time T14 to Time T15, a low-level potential is applied to the wiring WSL[i]. Accordingly, in the i-th row of the cell array CA, a low-level potential is applied to the gates of the transistors F1 included in the cell IM[i,1] to the cell IM[i,n] and the gate of the transistor F1*m* included in the cell IMref[i] so that the transistors F1 and the transistor F1*m* are turned off.

When the transistor F1 included in the cell IM[i,j] is turned off, $V_{gm}[i,j]-V_{gm}[i]$, which is a difference between the potential of the gate of the transistor F2 (the node NN[i,j]) and the potential of the wiring XCL[i], is retained in the capacitor C5. When the transistor F1 included in the cell IMref[i] is turned off, 0, which is a difference between the potential of the gate of the transistor F2*m* (the node NNref[i]) and the potential of the wiring XCL[i], is retained in the capacitor C5*m*. In the operation from Time T13 to Time T14, the voltage retained in the capacitor C5*m* might be voltage that is not 0 (for example, Vas here) depending on the transistor characteristics and the like of the transistor F1*m* and/or the transistor F2*m*. In this case, the potential of the node NNref[i] is regarded as a potential obtained by adding Vas to the potential of the wiring XCL[i].

<<From Time T15 to Time T16>>

In the period from Time T15 to Time T16, GND is applied to the wiring XCL[i]. Specifically, for example, when the wiring XCL illustrated in FIG. 8C is the wiring XCL[i], the initialization potential of the wiring VINIL2 is set to the ground potential GND, and the switch SWX is turned on, the potential of the wiring XCL[i] can be set to the ground potential GND.

Thus, the potentials of the node NN[i,1] to the node NN[i,n] change because of capacitive coupling of the capacitors C5 included in the cell IM[i,1] to the cell IM[i,n] in the i-th row, and the potential of the node NNref[i] changes because of capacitive coupling of the capacitor C5*m* included in the cell IMref[i].

The amount of change in the potentials of the node NN[i,1] to the node NN[i,n] is a potential obtained by multiplying the amount of change in the potential of the wiring XCL[i] by a capacitive coupling coefficient determined by the structures of the cell IM[i,1] to the cell IM[i,n] included in the cell array CA. The capacitive coupling coefficient is calculated using the capacitance of the capacitor C5, the gate capacitance of the transistor F2, the parasitic capacitance, and the like. When the capacitive coupling coefficient due to the capacitor C5 is p in each of the cell IM[i,1] to the cell IM[i,n], the potential of the node NN[i,j] in the cell IM[i,j] decreases by $p(V_{gm}[i]-GND)$ from the potential of the period from Time T14 to Time T15.

Similarly, when the potential of the wiring XCL[i] changes, the potential of the node NNref[i] also changes because of capacitive coupling of the capacitor C5*m* included in the cell IMref[i]. In the case where the capacitive coupling coefficient due to the capacitor C5*m* is p as with the capacitor C5, the potential of the node NNref[i] in the cell IMref[i] decreases by $p(V_{gm}[i]-GND)$ from the potential of the period from Time T14 to Time T15.

In the timing chart in FIG. 12, p is equal to 1, for example. Thus, the potential of the node NNref[i] is GND in the period from Time T15 to Time T16.

Accordingly, the potential of the node NN[i,j] of the cell IM[i,j] decreases, so that the transistor F2 is turned off; similarly, the potential of the node NNref[i] of the cell IMref[i] decreases, so that the transistor F2*m* is also turned off. Therefore, $I_{F2}[i,j]$ and $I_{F2m}[i]$ are each 0 in the period from Time T15 to Time T16.

<<From Time T16 to Time T17>>

In the period from Time T16 to Time T17, a high-level potential is applied to the wiring WSL[i+1]. Accordingly, in the i+1-th row of the cell array CA, a high-level potential is applied to the gates of the transistors F1 included in the cell IM[i+1,1] to the cell IM[i+1,n] and the gate of the transistor F1*m* included in the cell IMref[i+1] so that the transistors F1 and the transistor F1*m* are turned on. Furthermore, in the period from Time T16 to Time T17, a low-level potential is applied to the wiring WSL[1] to the wiring WSL[m] other than the wiring WSL[i+1], and in the cell array CA, the transistors F1 included in the cell IM[1,1] to the cell IM[m,n] in the rows other than the i+1-th row and the transistors F1*m* included in the cell IMref[1] to the cell IMref[m] in the rows other than the i+1-th row are in an off state.

The ground potential GND has been continuously applied to the wiring XCL[1] to the wiring XCL[m] since before Time T16.

<<From Time T17 to Time T18>>

In the period from Time T17 to Time T18, current with a current amount $I_0$[i+1, j] flows as the first data from the circuit WCS to the cell array CA through the transistor F3[j]. Specifically, when the wiring WCL illustrated in FIG. 8A is the wiring WCL[j+1], signals corresponding to the first data are input to the wiring DW[1] to the wiring DW[K], whereby the current $I_0$[i+1 j] flows from the wiring WCSa to the second terminal of the transistor F3[j]. That is, when the value of the K-bit signal input as the first data is α[i+1 j] (α[i+1 j] is an integer greater than or equal to 0 and less than or equal to $2^K-1$), $I_0$[i+1, j] is equal to α[i+1, j]×$I_{Wut}$.

Since $I_0$[i+1, j] is 0 when α[i+1, j] is 0, current does not flow from the circuit WCSa to the cell array CA through the transistor F3[j] in a strict sense, but in this specification and the like, the expression such as "current with $I_0$[i+1, j]=0 flows" is sometimes used, as in the case of $I_0$[i,j]=0.

At this time, electrical continuity is established between the wiring WCL[j] and the first terminal of the transistor F1 included in the cell IM[i+1, j] in the i+1-th row of the cell array CA, and electrical continuity is not established between the wiring WCL[j] and the first terminals of the transistors F1 included in the cell IM[1,j] to the cell IM[m,j] in the rows other than the i+1-th row of the cell array CA; accordingly, the current with the current amount $I_0$[i+1,j] flows from the wiring WCL[j] to the cell IM[i+1, j].

When the transistor F1 included in the cell IM[i+1, j] is turned on, the transistor F2 included in the cell IM[i+1, j] has a diode-connected structure. Therefore, when current flows from the wiring WCL[j] to the cell IM[i+1, j], the potentials of the gate of the transistor F2 and the second terminal of the transistor F2 are substantially equal to each other. The potentials are determined by the amount of current flowing from the wiring WCL[j] to the cell IM[i+1, j], the potential of the first terminal of the transistor F2 (here, GND), and the like. In this operation example, the current with the current amount $I_0$[i+1, j] flows from the wiring WCL[j] to the cell IM[i+1, j], whereby the potential of the gate of the transistor F2 (the node NN[i+1, j]) becomes $V_g$[i+1,j]. That is, the gate-source voltage of the transistor F2 is $V_g$[i+1,j]−GND, and the current amount $I_0$[i+1, j] is set as current flowing between the first terminal and the second terminal of the transistor F2.

Here, when the threshold voltage of the transistor F2 is $V_{th}$[i+1, j], the current amount $I_0$[i+1, j] in the case where the transistor F2 operates in the subthreshold region can be expressed by the following formula. Note that the correction coefficient is J, which is the same as those of the transistor F2 included in the cell IM[i,j] and the transistor F2*m* included in the cell IMref[i].

[Formula 5]

$$I_0[i+1,j]=I_\alpha\exp\{J(V_g[i+1,j]-V_{th}[i+1,j])\} \quad (1.5)$$

In the period from Time T17 to Time T18, the current with the current amount $I_{ref0}$ flows as the reference data from the circuit XCS to the wiring XCL[i+1]. Specifically, as in the period from Time T13 to Time T14, when the wiring XCL illustrated in FIG. 8C is the wiring XCL[i+1], a high-level potential is input to the wiring DX[1], a low-level potential is input to the wiring DX[2] to the wiring DX[K], and the current $I_{ref0}=I_{Xut}$ flows from the circuit XCSa to the wiring XCL[i+1].

In the period from Time T17 to Time T18, since electrical continuity is established between the first terminal of the transistor F1*m* included in the cell IMref[i+1] and the wiring XCL[i+1], the current with the current amount $I_{ref0}$ flows from the wiring XCL[i+1] to the cell IMref[i+1].

As in the cell IM[i+1, j], when the transistor F1*m* included in the cell IMref[i+1] is turned on, the transistor F2*m* included in the cell IMref[i+1, j] has a diode-connected structure. Therefore, when current flows from the wiring XCL[i+1] to the cell IMref[i+1], the potentials of the gate of the transistor F2*m* and the second terminal of the transistor F2*m* are substantially equal to each other. The potentials are determined by the amount of current flowing from the wiring XCL[i+1] to the cell IMref[i+1], the potential of the first terminal of the transistor F2*m* (here, GND), and the like. In this operation example, the current with the current amount $I_{ref0}$ flows from the wiring XCL[i+1] to the cell IMref[i+1], whereby the potential of the gate of the transistor F2 (the node NNref[i+1]) becomes $V_{gm}$[i+1]; at this time, the potential of the wiring XCL[i+1] is also $V_{gm}$[i+1]. That is, the gate-source voltage of the transistor F2*m* is $V_{gm}$[i+1]−GND, and the current amount $I_{ref0}$ is set as current flowing between the first terminal and the second terminal of the transistor F2*m*.

Here, when the threshold voltage of the transistor F2*m* is $V_{thm}$[i+1, j], the current amount $I_{ref0}$ in the case where the transistor F2*m* operates in the subthreshold region can be expressed by the following formula. Note that the correction coefficient J is the same as that of the transistor F2 included in the cell IM[i+1, j].

[Formula 6]

$$I_{ref0}=I_\alpha\exp\{J(V_{gm}[i+1]-V_{thm}[i+1])\} \quad (1.6)$$

Here, a weight coefficient w[i+1, j] that is the first data is defined as follows.

[Formula 7]

$$w[i+1,j]=\exp\{J(V_g[i+1,j]-V_{th}[i+1,j]-V_{gm}[i+1]+V_{thm}[i+1])\} \quad (1.7)$$

Therefore, Formula (1.5) can be rewritten to the following formula.

[Formula 8]

$$I_0[i+1,j]=w[i+1,j]I_{ref0} \Leftrightarrow \alpha[i+1,j]I_{Wut}=w[i+1,j]I_{Xut} \quad (1.8)$$

When the current $I_{Wut}$ output from the current source CS of the circuit WCSa in FIG. 8A is equal to the current $I_{Xut}$ output from the current source CS of the circuit XCSa in FIG. 8C, w[i+1, j] is equal to α[i+1, j]. That is, when $I_{Wut}$ is equal to $I_{Xut}$, α[i+1, j] corresponds to the value of the first data; accordingly, $I_{Wut}$ and $I_{Xut}$ are preferably equal to each other.

<<From Time T18 to Time T19>>

In the period from Time T18 to Time T19, a low-level potential is applied to the wiring WSL[i+1]. Accordingly, in the i+1-th row of the cell array CA, a low-level potential is applied to the gates of the transistors F1 included in the cell IM[i+1,1] to the cell IM[i+1,n] and the gate of the transistor F1*m* included in the cell IMref[i+1] so that the transistors F1 and the transistor F1*m* are turned off.

When the transistor F1 included in the cell IM[i+1, j] is turned off, $V_g$[i+1,j]−$V_{gm}$[i+1], which is a difference between the potential of the gate of the transistor F2 (the node NN[i+1, j]) and the potential of the wiring XCL[i+1], is retained in the capacitor C5. When the transistor F1 included in the cell IMref[i+1] is turned off, 0, which is a difference between the potential of the gate of the transistor F2*m* (the node NNref[i+1]) and the potential of the wiring XCL[i+1], is retained in the capacitor C5*m*. In the operation from Time T18 to Time T19, the voltage retained in the capacitor C5*m* might be voltage that is not 0 (for example, Vas here) depending on the transistor characteristics and the like of the transistor F1*m* and/or the transistor F2*m*. In this case, the potential of the node NNref[i+1] is regarded as a potential obtained by adding Vas to the potential of the wiring XCL[i+1].

<<From Time T19 to Time T20>>

In the period from Time T19 to Time T20, the ground potential GND is applied to the wiring XCL[i+1]. Specifically, for example, when the wiring XCL illustrated in FIG. 8C is the wiring XCL[i+1], the potential of the wiring XCL[i+1] can be set to the ground potential GND by setting the initialization potential of the wiring VINIL2 to the ground potential GND and turning on the switch SWX.

Thus, the potentials of the node NN[i,1] to the node NN[i+1,n] change because of capacitive coupling of the capacitors C5 included in the cell IM[i+1,1] to the cell IM[i+1,n] in the i+1-th row, and the potential of the node NNref[i+1] changes because of capacitive coupling of the capacitor C5*m* included in the cell IMref[i+1].

The amount of change in the potentials of the node NN[i+1,1] to the node NN[i+1,n] is a potential obtained by multiplying the amount of change in the potential of the wiring XCL[i+1] by a capacitive coupling coefficient determined by the structures of the cell IM[i+1,1] to the cell IM[i+1,n] included in the cell array CA. The capacitive coupling coefficient is calculated using the capacitance of the capacitor C5, the gate capacitance of the transistor F2, the parasitic capacitance, and the like. In the case where the capacitive coupling coefficient due to the capacitor C5 in each of the cell IM[i+1,1] to the cell IM[i+1,n] is p, which is the same as the capacitive coupling coefficient due to the capacitor C5 in each of the cell IM[i,1] to the cell IM[i,n], the potential of the node NN[i+1,j] in the cell IM[i+1,j] decreases by p($V_{gm}$[i+1]−GND) from the potential of the period from Time T18 to Time T19.

Similarly, when the potential of the wiring XCL[i+1] changes, the potential of the node NNref[i+1] also changes because of capacitive coupling of the capacitor C5*m* included in the cell IMref[i+1]. In the case where the capacitive coupling coefficient due to the capacitor C5*m* is p as with the capacitor C5, the potential of the node NNref[i+1] in the cell IMref[i+1] decreases by p($V_{gm}$[i+1]−GND) from the potential of the period from Time T18 to Time T19.

In the timing chart in FIG. 12, p is equal to 1, for example. Thus, the potential of the node NNref[i+1] is GND in the period from Time T20 to Time T21.

Accordingly, the potential of the node NN[i+1,j] of the cell IM[i+1, j] decreases, so that the transistor F2 is turned off, similarly, the potential of the node NNref[i+1] of the cell IMref[i+1] decreases, so that the transistor F2*m* is also turned off. Therefore, $I_{F2}$[i+1, j] and $I_{F2m}$[i+1] are each 0 in the period from Time T19 to Time T20.

<<From Time T20 to Time T21>>

In the period from Time T20 to Time T21, a low-level potential is applied to the wiring SWL1. Accordingly, a low-level potential is applied to each of the gates of the transistor F3[1] to the transistor F3[n], whereby the transistor F3[1] to the transistor F3[n] are turned off.

<<From Time T21 to Time T22>>

In the period from Time T21 to Time T22, a high-level potential is applied to the wiring SWL2. Accordingly, a high-level potential is applied to each of the gates of the transistor F4[1] to the transistor F4[n], whereby the transistor F4[1] to the transistor F4[n] are turned on.

<<From Time T22 to Time T23>>

In the period from Time T22 to Time T23, current x[i]$I_{ref0}$, which is x[i] times as high as the current with the amount $I_{ref0}$, flows as the second data from the circuit XCS to the wiring XCL[i]. Specifically, for example, when the wiring XCL illustrated in FIG. 8C is the wiring XCL[i], a high-level potential or a low-level potential is input to the wiring DX[1] to the wiring DX[K] in accordance with the value of x[i], and the current with the amount x[i]$I_{ref0}$=x[i]$I_{Xut}$ flows from the circuit XCSa to the wiring XCL[i]. In this operation example, x[i] corresponds to the value of the second data. At this time, the potential of the wiring XCL[i] changes from 0 to $V_{gm}$[i]+ΔV[i].

When the potential of the wiring XCL[i] changes, the potentials of the node NN[i,1] to the node NN[i,n] also change because of the capacitive coupling of the capacitors C5 included in the cell IM[i,1] to the cell IM[i,n] in the i-th row of the cell array CA. Thus, the potential of the node NN[i,j] in the cell IM[i,j] becomes $V_{gm}$[i,j]+pΔV[i].

Similarly, when the potential of the wiring XCL[i] changes, the potential of the node NNref[i] also changes because of capacitive coupling of the capacitor C5*m* included in the cell IMref[i]. Thus, the potential of the node NNref[i] in the cell IMref[i] becomes $V_{gm}$[i]+pΔV[i].

Accordingly, current with an amount $I_1$[i,j] that flows between the first terminal and the second terminal of the transistor F2 and current with an amount $I_{ref1}$[i,j] that flows between the first terminal and the second terminal of the transistor F2*m* in the period from Time T22 to Time T23 can be expressed as follows.

[Formula 9]

$$I_1[i,j]=I_\alpha \exp\{J(V_g[i,j]+p\Delta V_{th}[i,j])\}=I_0[i,j]\exp(Jp\Delta V[i]) \quad (1.9)$$

[Formula 10]

$$I_{ref1}[i]I_\alpha \exp\{J(V_{gm}[i]+p\Delta V[i]-V_{thm}[i]))\}=x[i]I_{ref0} \quad (1.10)$$

Note that x[i] is as expressed by the following formula.

[Formula 11]

$$x[i]=\exp(Jp\Delta V[i]) \quad (1.11)$$

Therefore, Formula (1.9) can be rewritten into the following formula with the use of Formula (1.4) and Formula (1.11).

[Formula 12]

$$I_1[i,j]=x[i]w[i,j]I_{ref0} \quad (1.2)$$

That is, the amount of current flowing between the first terminal and the second terminal of the transistor F2 included in the cell IM[i,j] is proportional to the product of the first data w[i,j] and the second data x[i].

In the period from Time T22 to Time T23, current $x[i+1]I_{ref0}$, which is x[i+1] times as high as the current with the amount $I_{ref0}$, flows as the second data from the circuit XCS to the wiring XCL[i+1]. Specifically, for example, when the wiring XCL illustrated in FIG. 8C is the wiring XCL[i+1], a high-level potential or a low-level potential is input to the wiring DX[1] to the wiring DX[K] in accordance with the value of x[i+1], and the current with the amount $x[i+1]I_{ref0}=x[i+1]I_{Xut}$ flows from the circuit XCSa to the wiring XCL[i+1]. In this operation example, x[i+1] corresponds to the value of the second data. At this time, the potential of the wiring XCL[i+1] changes from 0 to $V_{gm}[i+1]+\Delta V[i+1]$.

When the potential of the wiring XCL[i+1] changes, the potentials of the node NN[i+1,1] to the node NN[i+1,n] also change because of the capacitive coupling of the capacitors C5 included in the cell IM[i+1,1] to the cell IM[i+1,n] in the i+1-th row of the cell array CA. Thus, the potential of the node NN[i+1, j] in the cell IM[i+1,j] becomes $V_g[i+1, j]+p\Delta V[i+1]$.

Similarly, when the potential of the wiring XCL[i+1] changes, the potential of the node NNref[i+1] also changes because of capacitive coupling of the capacitor C5*m* included in the cell IMref[i+1]. Thus, the potential of the node NNref[i+1] in the cell IMref[i+1] becomes $V_{gm}[i+1]+p\Delta V[i+1]$.

Accordingly, current with an amount $I_1[i+1, j]$ that flows between the first terminal and the second terminal of the transistor F2 and current with an amount $I_{ref1}[i+1,j]$ that flows between the first terminal and the second terminal of the transistor F2*m* in the period from Time T22 to Time T23 can be expressed as follows.

[Formula 13]

$$I_1[i+1,j]=I_\alpha\exp\{J(V_g[i+1,j]+p\Delta V[i+1]-V_{th}[i+1,j])\}=I_0[i+1,j]\exp(Jp\Delta V[i+1]) \quad (1.13)$$

[Formula 14]

$$I_{ref1}[i+1]=I_\alpha\exp\{J(V_{gm}[i+1]+p\Delta V[i+1]-V_{thm}[i+1])\}=x[i+1]I_{ref0} \quad (1.14)$$

Note that x[i+1] is as expressed by the following formula.

[Formula 15]

$$x[i+1]=\exp(Jp\Delta V[i+1]) \quad (1.15)$$

Therefore, Formula (1.13) can be rewritten into the following formula with the use of Formula (1.8) and Formula (1.15).

[Formula 16]

$$I_1[i+1,j]=x[i+1]w[i+1,j]I_{ref0} \quad (1.16)$$

That is, the amount of current flowing between the first terminal and the second terminal of the transistor F2 included in the cell IM[i+1, j] is proportional to the product of the first data w[i+1, j] and the second data x[i+1].

Here, the sum of the amounts of current flowing from the converter circuit ITRZ[j] to the cell IM[i,j] and the cell IM[i+1, j] through the transistor F4[j] and the wiring WCL [j] is considered. According to Formula (1.12) and Formula (1.16), when the sum of the amounts of current is $I_S[j]$, $I_S[j]$ can be expressed by the following formula.

[Formula 17]

$$I_S[j]=I_1[i,j]=I_1[i+1,j]=I_{ref0}(x[i]w[i,j]+x[i+1]w[i+1,j]) \quad (1.17)$$

Thus, the amount of current output from the converter circuit ITRZ[j] is the amount of current proportional to the sum of products of the weight coefficients w[i,j] and w[i+1, j] that are the first data and the values x[i] and x[i+1] of the signals of the neurons that are the second data.

Although the sum of the amounts of current flowing to the cell IM[i,j] and the cell IM[i+1 j] is described in the above-described operation example, the sum of the amounts of current flowing to a plurality of cells, the cell IM[1,j] to the cell IM[m,j], may be described. In this case, Formula (1.17) can be rewritten to the following formula.

[Formula 18]

$$I_S[j]=I_{ref0}\sum_{i=1}^{m}x[i]w[i,j] \quad (1.18)$$

Thus, even in the case of the arithmetic circuit MAC1 including the cell array CA with three or more rows and two or more columns, product-sum operation can be performed in the above-described manner. In the arithmetic circuit MAC1 of such a case, cells in one of the plurality of columns are used for retaining $I_{ref0}$ and $xI_{ref0}$ as the amount of current, whereby product-sum operations, the number of which corresponds to the number of rest of the columns among the plurality of columns, can be executed concurrently. That is, when the number of columns in a memory cell array increases, a semiconductor device that achieves high-speed product-sum operation can be provided.

Operation Example 2 of Arithmetic Circuit

Next, an operation example of the arithmetic circuit MAC1 which is different from the above operation example is described.

Figure 13:
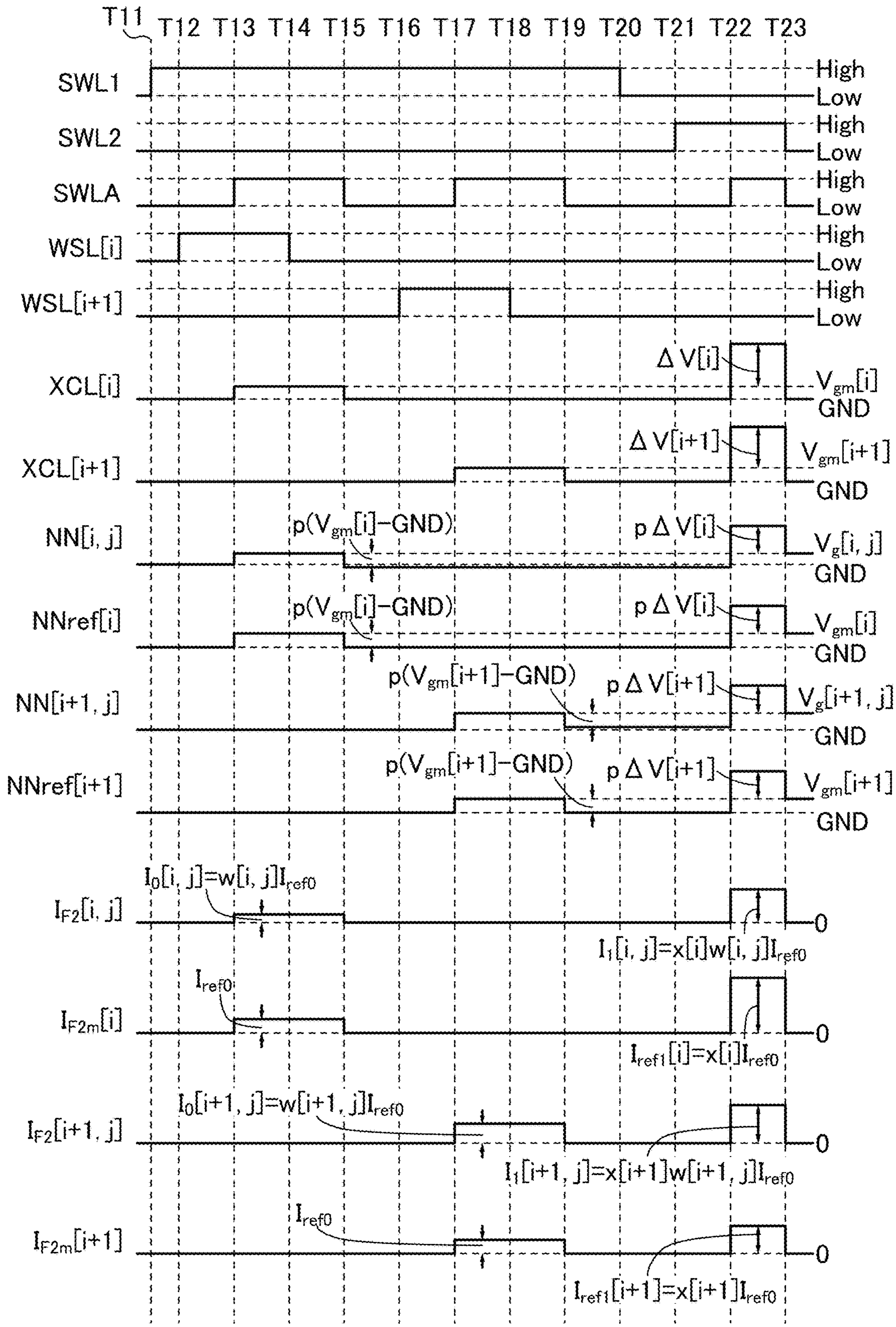
FIG. 13 is a timing chart showing an operation example of a semiconductor device.

FIG. 13 is a timing chart showing the operation example of the arithmetic circuit MAC1. As the timing chart in FIG. 12, the timing chart in FIG. 13 shows changes in the potentials of the wiring SWL1, the wiring SWL2, the wiring SWLA, the wiring WSL[i] (i is an integer greater than or equal to 1 and less than or equal to m−1), the wiring WSL[i+1], the wiring XCL[i], the wiring XCL[i+1], the node NN[i,j] (j is an integer greater than or equal to 1 and less than or equal to n−1), the node NN[i+1, j], the node NNref[i], and the node NNref[i+1], and the changes in the amount of current $I_{F2}[i,j]$, the amount of current $I_{F2m}[i]$, the amount of current $I_{F2}[i+1,j]$, and the amount of current $I_{F2m}[i+1]$ in the period from Time T11 to Time T23 and the vicinity thereof.

Note that the operation example of the timing chart in FIG. 13 is different from that of the timing chart in FIG. 12 in that a high-level potential is input to the wiring SWLA at a predetermined timing. That is, the operation example of the timing chart in FIG. 13 is different from that of the timing chart in FIG. 12 in that the sensor SNC[1] to the sensor SNC[m] are utilized. Thus, for the description of the operation example of the timing chart in FIG. 13, the contents of the operation example of the timing chart in FIG.

12 are referred to and differences from the operation example of the timing chart in FIG. 12 are mainly described.

Before Time T11 and in the period from Time T11 to Time T13 in the timing chart in FIG. 13, the operation is performed in a manner similar to that in the timing chart in FIG. 12.

The case where a high-level potential is input to the wiring SWLA in the period from Time T13 to Time T15 is considered. Note that in the period from Time T13 to Time T15 in the timing chart in FIG. 13, the potential change of the wiring SWLA of this case is indicated by a solid line.

When a high-level potential is input to the wiring SWLA, the switch SA[1] to the switch SA[m] including terminals electrically connected to the wiring SWLA are turned on.

When the switch SA[1] to the switch SA[m] are turned on, electrical continuity is established between the wiring XCL[1] to the wiring XCL[m] and the wiring EIL[1] to the wiring EIL[m], respectively, in FIG. 1. Since the wiring EIL[1] to the wiring EIL[m] are electrically connected to the sensor SNC[1] to the sensor SNC[m], respectively, electrical continuity is established between the wiring XCL[1] to the wiring XCL[m] and the sensor SNC[1] to the sensor SNC [m], respectively.

Note that in the case where a high-level potential is input to the wiring SWLA in the period from Time T13 to Time T15, the constant current does not flow from the circuit XCS to the wiring XCL[1] to the wiring XCL[m]. That is, in the period from Time T13 to Time T15, a low-level potential is input to all the wiring DX[1] to the wiring DX[L] that are electrically connected to the circuit XCSa.

In the period from Time T13 to Time T15 in the timing chart in FIG. 13, the current with the amount $I_{ref0}$ flows from the sensor SNC[i] in the layer PDL to the wiring XCL[i] through the wiring EIL[i]. For example, $I_{ref0}$ can be the amount of current (sometimes referred to as reference current) output from the sensor SNC[i] in FIG. 1 by sensing the reference first data. In the circuit XCS, when the switch SWX of the circuit XCSa in the i-th row is turned off, the potential of the wiring XCL[i] is, for example, $V_{gm}$[i].

From Time T13 to Time T15 in the timing chart in FIG. 13, the sensor SNC[1] to the sensor SNC[m] other than the sensor SNC[i] do not necessarily perform sensing. At this time, it is preferable that, in the circuit XCS, all the switches SWX included in the circuits XCSa in the rows other than the i-th row be turned on and the potentials of the wiring XCL[1] to the wiring XCL[m] other than the wiring XCL[i] be ground potentials.

In the period from Time T15 to Time T17 in the timing chart in FIG. 13, the operation is performed in a manner similar to that in the timing chart in FIG. 12.

From Time T17 to Time T19 in the timing chart in FIG. 13, the current with the amount $I_{ref0}$ flows from the sensor SNC[i+1] in the layer PDL to the wiring XCL[i+1]. For example, $I_{ref0}$ can be reference current output from the sensor SNC[i] in FIG. 1 by sensing the reference first data. Note that from Time T13 to Time T15 in the timing chart in FIG. 13, the first data may be the same as or different from the first data sensed by the sensor SNC[i]. In the circuit XCS, when the switch SWX of the circuit XCSa in the i+1-th row is turned off, the potential of the wiring XCL[i+1] is, for example, $V_{gm}$[i+1].

From Time T17 to Time T19 in the timing chart in FIG. 13, the sensor SNC[1] to the sensor SNC[m] other than the sensor SNC[i+1] do not necessarily perform sensing. At this time, it is preferable that, in the circuit XCS, all the switches SWX included in the circuits XCSa in the rows other than the i-th row be turned on and the potentials of the wiring XCL[1] to the wiring XCL[m] other than the wiring XCL[i] be ground potentials.

In the period from Time T19 to Time T22 in the timing chart in FIG. 13, the operation is performed in a manner similar to that in the timing chart in FIG. 12.

From Time T22 to Time T23 in the timing chart in FIG. 13, the current with the amount x[i]$I_{ref0}$, which is x[i] times larger than $I_{ref0}$, flows from the sensor SNC[i] in the layer PDL to the wiring XCL[i]. For example, the current x[i]$I_{ref0}$ can be current output from the sensor SNC[i] in FIG. 1 by sensing the second data. That is, in the sensor SNC[i], the output current corresponding to the second data corresponds to x[i] times the output current corresponding to the first data. In the circuit XCS, when the switch SWX of the circuit XCSa in the i-th row is turned off, the potential of the wiring XCL[i] changes to, for example, $V_{gm}$[i]+ΔV[i].

From Time T22 to Time T23 in the timing chart in FIG. 13, the current with the amount x[i+1]$I_{ref0}$, which is x[i+1] times larger than $I_{ref0}$, flows from the sensor SNC[i+1] in the layer PDL to the wiring XCL[i+1]. For example, x[i+1]$I_{ref0}$ can be current output from the sensor SNC[i+1] in FIG. 1 by sensing the second data. That is, in the sensor SNC[i+1], the output current corresponding to the second data corresponds to x[i+1] times the output current corresponding to the first data. In the circuit XCS, when the switch SWX of the circuit XCSa in the i+1-th row is turned off, the potential of the wiring XCL[i+1] changes to, for example, $V_{gm}$[i+1]+ΔV[i+1].

Then, as in the timing chart in FIG. 12, the amount of current flowing between the converter circuit ITRZ[j] and the wiring WCL[j] is the sum of the amount of current $I_1$[i,j] flowing between the first terminal and the second terminal of the transistor F2 in the cell IM[i,j] and the amount of current $I_1$[i+1, j] flowing between the first terminal and the second terminal of the transistor F2 in the cell IM[i+1,j] (corresponding to Formula (1.17)). Thus, the amount of current output from the converter circuit ITRZ[j] to the wiring WCL[j] is the amount of current proportional to the sum of products of the weight coefficients w[i,j] and w[i+1, j] that are the first data and the values x[i] and x[i+1] of the signals of the neurons that are the second data, i.e., x[i]w[i,j]+x[i+1]w[i+1 j].

The semiconductor device SDV illustrated in FIG. 1 can perform arithmetic operation of a hierarchical neural network from its first-layer (input layer) to its second layer (intermediate layer), for example. That is, the information (value) obtained through sensing by the sensor SNC[1] to the sensor SNC[m] corresponds to the signal transmitted from the first-layer neuron to the second-layer neuron. When the weight coefficient between the first-layer neuron and the second-layer neuron is retained in the cell IM[1,j] to the cell IM[m,j], the arithmetic circuit MAC1 can perform product-sum operation of the information (value) and the weight coefficient.

The hierarchical neural network will be described in detail in Embodiment 4.

The above operation example of the semiconductor device SDV is suitable when product-sum operation of the positive first data and the positive second data is performed. Embodiment 2 will describe an operation example in which product-sum operation of the positive or the negative first data and the positive second data is performed, and an operation example in which product-sum operation of the positive or the negative first data and the positive or the negative second data is performed.

Although this embodiment describes the case where the transistors included in the semiconductor device SDV are OS transistors or Si transistors, one embodiment of the present invention is not limited thereto. The transistor included in the semiconductor device SDV can be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, or a transistor including an organic semiconductor in a channel formation region.

Note that this embodiment can be combined with any of the other embodiments described in this specification as appropriate.

EMBODIMENT 2

In Embodiment 1, the arithmetic circuit that performs the product-sum operation of the positive or "0" first data and the positive or "0" second data and its operation example are described; in this embodiment, an arithmetic circuit that can perform product-sum operation of the positive, the negative, or "0" first data and the positive or "0" second data, and product-sum operation of the positive or "0" first data and "1" or "0" (a binary value, a 1-bit digital value) second data is described.

Configuration Example 1 of Arithmetic Circuit

Figure 14:
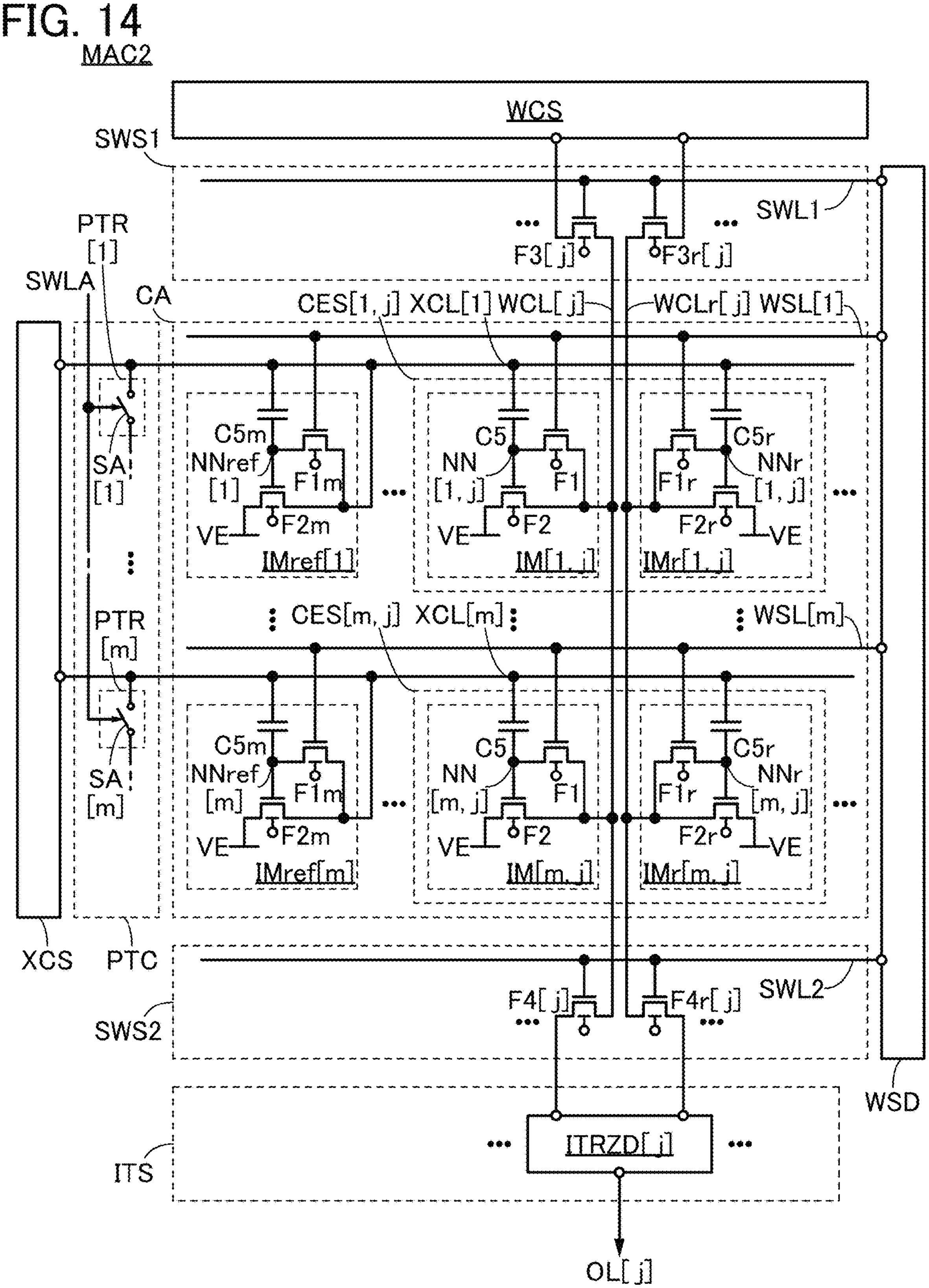
FIG. 14 is a block diagram illustrating a structure example of a semiconductor device.

FIG. 14 illustrates a configuration example of an arithmetic circuit that performs product-sum operation of the positive, the negative, or "0" first data and the positive or "0" second data. An arithmetic circuit MAC2 illustrated in FIG. 14 has a configuration in which the arithmetic circuit MAC1 in FIG. 7 is changed. Thus, the description of the portions in the arithmetic circuit MAC2 that are the same as those in the arithmetic circuit MAC1 is omitted.

The cell array CA illustrated in FIG. 14 includes a circuit CES[1,j] to a circuit CES[m,j], the circuit CES[1,j] includes the cell IM[1,j] and a cell IMr[1,j], and the circuit CES[m,j] includes the cell IM[m,j] and a cell IMr[m,j]. In FIG. 14, the circuit CES[1,j] and the circuit CES[m,j] are illustrated, and the other circuits CES are omitted. In this specification and the like, when the circuit CES[1,j] to the circuit CES[m,j], the cell IM[1,j], the cell IMr[1,j], the cell IM[m,j], the cell IMr[m,j], and the like are described, [m,n] and the like added to reference numerals are sometimes omitted.

The cells IM can have a structure similar to that of the cell IM[1,1] to the cell IM[m,n] included in the cell array CA in the arithmetic circuit MAC1 in FIG. 7.

The cells IMr can have a structure similar to that of the cells IM. FIG. 14 illustrates the cells IMr having a structure similar to that of the cells IM, for example. To distinguish the transistors, the capacitors, and the like included in the cells IM and the cells IMr, "r" is added to the reference numerals representing the transistors and the capacitors included in the cells IMr.

Specifically, the cells IMr each include a transistor Fir, a transistor F2*r*, and a capacitor C5*r*. The transistor Fir corresponds to the transistor F1 in the cell IM, the transistor F2*r* corresponds to the transistor F2 in the cell IM, and the capacitor C5*r* corresponds to the capacitor C5 in the cell IM. Thus, for the electrical connection structure between the transistor Fir, the transistor F2*r*, and the capacitor C5*r*, refer to the description of IM[1,1] to the cell IM[m,n] in Embodiment 1.

In the cell IMr, a connection portion of a first terminal of the transistor Fir, a gate of the transistor F2*r*, and a first terminal of the capacitor C5*r* is a node NNr.

In the circuit CES[1,j], the second terminal of the capacitor C5 is electrically connected to the wiring XCL[1], the gate of the transistor F1 is electrically connected to the wiring WSL[1], and the second terminal of the transistor F1 and the second terminal of the transistor F2 are electrically connected to the wiring WCL[j]. A second terminal of the capacitor C5*r* is electrically connected to the wiring XCL[1], a gate of the transistor Fir is electrically connected to the wiring WSL[1], and a second terminal of the transistor Fir and a second terminal of the transistor F2*r* are electrically connected to a wiring WCLr[j].

Similarly, in the circuit CES[m,j], the second terminal of the capacitor C5 is electrically connected to the wiring XCL[m], the gate of the transistor F1 is electrically connected to the wiring WSL[m], and the second terminal of the transistor F1 and the second terminal of the transistor F2 are electrically connected to the wiring WCL[j]. The second terminal of the capacitor C5*r* is electrically connected to the wiring XCL[m], the gate of the transistor Fir is electrically connected to the wiring WSL[m], and the second terminal of the transistor Fir and the second terminal of the transistor F2*r* are electrically connected to the wiring WCLr[j].

The wiring WCL[j] and the wiring WCLr[j] function as, for example, wirings that supply current from the circuit WCS to the cells IM and the cells IMr included in the circuits CES, like the wiring WCL[1] to the wiring WCL[n] described in Embodiment 1. For example, the wiring WCL[j] and the wiring WCLr[j] function as wirings that supply current from a converter circuit ITRZD[j] to the cells IM and the cells IMr included in the circuits CES.

In the arithmetic circuit MAC2 in FIG. 14, the circuit SWS1 includes the transistor F3[j] and a transistor F3*r*[j]. The first terminal of the transistor F3[j] is electrically connected to the wiring WCL[j], the second terminal of the transistor F3[j] is electrically connected to the circuit WCS, and a gate of the transistor F3[j] is electrically connected to the wiring SWL1. A first terminal of the transistor F3*r*[j] is electrically connected to the wiring WCLr[j], a second terminal of the transistor F3*r*[j] is electrically connected to the circuit WCS, and a gate of the transistor F3*r*[j] is electrically connected to the wiring SWL1.

In the arithmetic circuit MAC2 in FIG. 14, the circuit SWS2 includes the transistor F4[j] and a transistor F4*r*[j]. A first terminal of the transistor F4[j] is electrically connected to the wiring WCL[j], a second terminal of the transistor F4[j] is electrically connected to the converter circuit ITRZD[j], and a gate of the transistor F4[j] is electrically connected to the wiring SWL2. A first terminal of the transistor F4*r*[j] is electrically connected to the wiring WCLr[j], a second terminal of the transistor F4*r*[j] is electrically connected to the converter circuit ITRZD[j], and a gate of the transistor F4*r*[j] is electrically connected to the wiring SWL2.

In the arithmetic circuit MAC2 in FIG. 14, the circuit ITS includes the converter circuit ITRZD[j]. The converter circuit ITRZD[j] is a circuit corresponding to the converter circuit ITRZ[j] in the arithmetic circuit MAC1; for example, the converter circuit ITRZD[j] has a function of generating voltage corresponding to the difference between the amount of current flowing from the converter circuit ITRZD[j] to the wiring WCL[j] and the amount of current flowing from the converter circuit ITRZD[j] to the wiring WCLr[j] and outputting the voltage to the wiring OL[j].

Figure 15A:
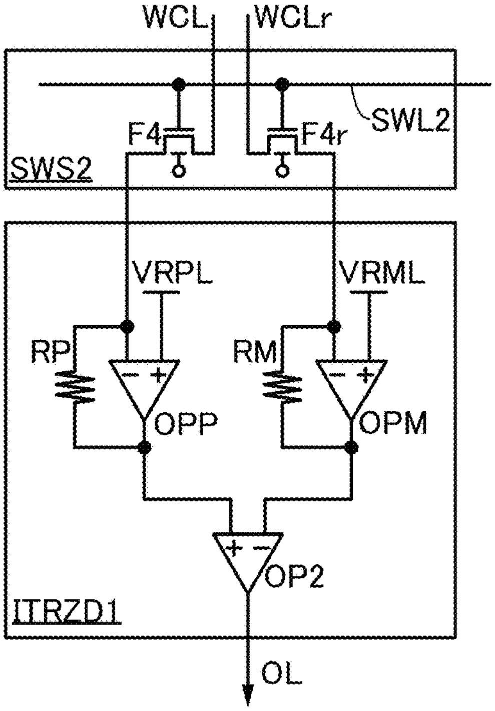
FIG. 15A to FIG. 15C are circuit diagrams each illustrating a configuration example of a circuit included in a semiconductor device.

FIG. 15A illustrates a specific configuration example of the converter circuit ITRZD[j]. A converter circuit ITRZD1 illustrated in FIG. 15A is an example of a circuit that can be used as the converter circuit ITRZD[j] in FIG. 14. FIG. 15A also illustrates the circuit SWS2, the wiring WCL, the wiring WCLr, the wiring SWL2, the transistor F4, and the transistor F4*r* to show the electrical connection between the converter circuit ITRZD1 and its peripheral circuits. The wiring WCL [j] and the wiring WCLr[j] included in the arithmetic circuit MAC2 in FIG. 14 can be respectively used as the wiring WCL and the wiring WCLr, for example, and the transistor F4[j] and the transistor F4*r*[j] included in the arithmetic circuit MAC2 in FIG. 14 can be respectively used as the transistor F4 and the transistor F4*r*, for example.

The converter circuit ITRZD1 in FIG. 15A is electrically connected to the wiring WCL through the transistor F4. The converter circuit ITRZD1 is electrically connected to the wiring WCLr through the transistor F4*r*. The converter circuit ITRZD1 is electrically connected to the wiring OL. The converter circuit ITRZD1 has a function of converting the amount of current flowing from the converter circuit ITRZD1 to the wiring WCL or the amount of current flowing from the wiring WCL to the converter circuit ITRZD1 into a first voltage, a function of converting the amount of current flowing from the converter circuit ITRZD1 to the wiring WCLr or the amount of current flowing from the wiring WCLr to the converter circuit ITRZD1 into a second voltage, and a function of outputting, to the wiring OL, an analog voltage corresponding to the difference between the first voltage and the second voltage.

The converter circuit ITRZD1 in FIG. 15A includes a resistor RP, a resistor RM, an operational amplifier OPP, an operational amplifier OPM, and an operational amplifier OP2, for example.

An inverting input terminal of the operational amplifier OPP is electrically connected to a first terminal of the resistor RP and the second terminal of the transistor F4. A non-inverting input terminal of the operational amplifier OPP is electrically connected to a wiring VRPL. An output terminal of the operational amplifier OPP is electrically connected to a second terminal of the resistor RP and a non-inverting input terminal of the operational amplifier OP2. An inverting input terminal of the operational amplifier OPM is electrically connected to a first terminal of the resistor RM and the second terminal of the transistor F4*r*. A non-inverting input terminal of the operational amplifier OPM is electrically connected to a wiring VRML. An output terminal of the operational amplifier OPM is electrically connected to a second terminal of the resistor RM and an inverting input terminal of the operational amplifier OP2. An output terminal of the operational amplifier OP2 is electrically connected to the wiring OL.

The wiring VRPL functions as a wiring for supplying a constant voltage. The constant voltage can be, for example, a ground potential (GND), a low-level potential, or the like. The wiring VRML functions as a wiring for supplying a constant voltage. The constant voltage can be, for example, a ground potential (GND), a low-level potential, or the like. The constant voltages supplied from the wiring VRPL and the wiring VRML may be equal to each other or different from each other. In particular, by setting the constant voltages supplied from the wiring VRPL and the wiring VRML to ground potentials (GND), the inverting input terminal of the operational amplifier OPP and the inverting input terminal of the operational amplifier OPM can be virtually grounded.

The converter circuit ITRZD1 with the configuration in FIG. 15A can convert the amount of current flowing from the wiring WCL to the converter circuit ITRZD1 through the transistor F4 or the amount of current flowing from the converter circuit ITRZD1 to the wiring WCL through the transistor F4 into the first voltage. The converter circuit ITRZD1 can convert the amount of current flowing from the wiring WCLr to the converter circuit ITRZD1 through the transistor F4*r* or the amount of current flowing from the converter circuit ITRZD1 to the wiring WCLr through the transistor F4*r* into the second voltage. Then, the converter circuit ITRZD1 can output, to the wiring OL, an analog voltage corresponding to the difference between the first voltage and the second voltage.

Figure 15B:
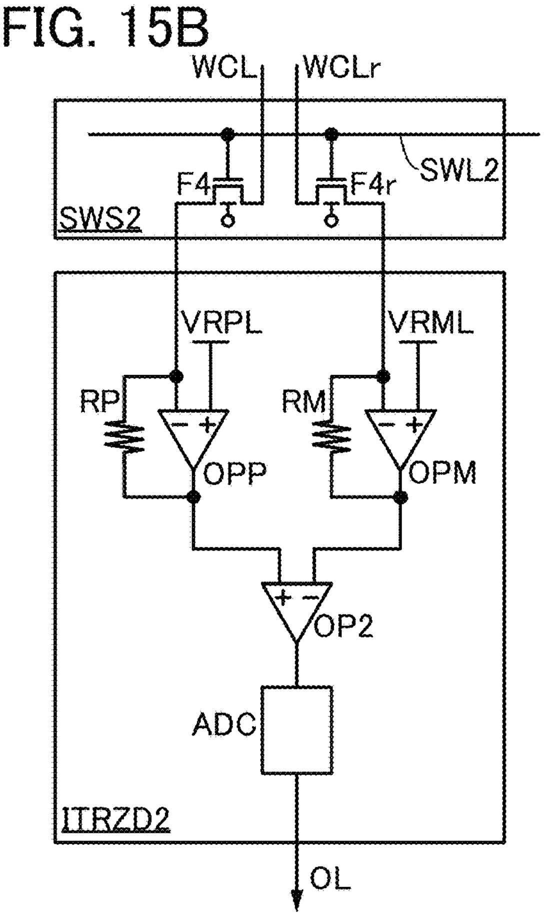

The converter circuit ITRZD1 in FIG. 15A outputs an analog voltage; however, the circuit configuration that can be used for the converter circuit ITRZD[j] in FIG. 14 is not limited thereto. For example, the converter circuit ITRZD1 may include, as in FIG. 10B, the analog-digital converter circuit ADC as illustrated in FIG. 15B. Specifically, in a converter circuit ITRZD2 in FIG. 15B, the input terminal of the analog-digital converter circuit ADC is electrically connected to the output terminal of the operational amplifier OP2, and the output terminal of the analog-digital converter circuit ADC is electrically connected to the wiring OL. With such a configuration, the converter circuit ITRZD2 in FIG. 15B can output a digital signal to the wiring OL.

Figure 15C:
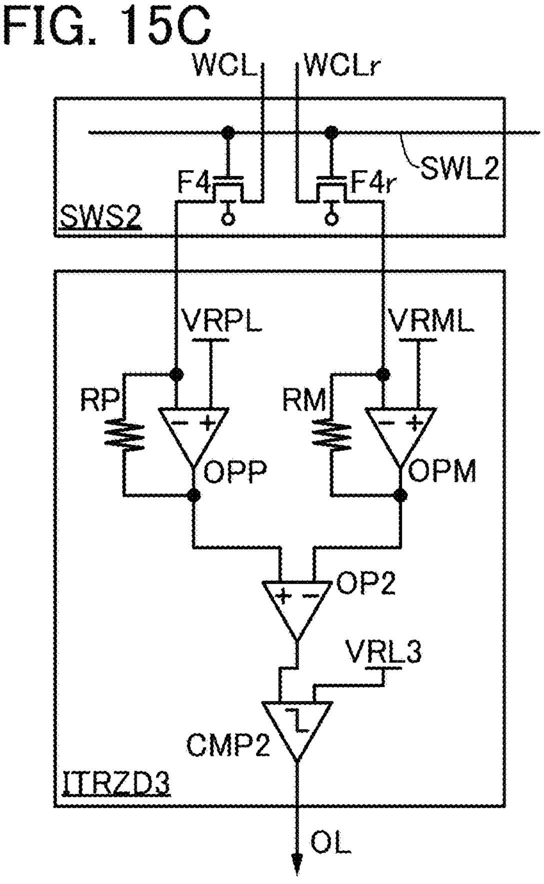

When the digital signal output to the wiring OL is 1 bit (binary) in the converter circuit ITRZD2, the converter circuit ITRZ2 may be replaced with a converter circuit ITRZD3 illustrated in FIG. 15C. The converter circuit ITRZ3 in FIG. 15C has a configuration in which a comparator CMP2 is provided in the converter circuit ITRZD1 in FIG. 15A, as in FIG. 10C. Specifically, the converter circuit ITRZD3 has a configuration in which a first input terminal of the comparator CMP2 is electrically connected to the output terminal of the operational amplifier OP2, a second input terminal of the comparator CMP2 is electrically connected to a wiring VRL3, and an output terminal of the comparator CMP2 is electrically connected to the wiring OL. The wiring VRL3 functions as a wiring for supplying a potential to be compared with the potential of the first terminal of the comparator CMP2. With such a configuration, the converter circuit ITRZD3 in FIG. 15C can output, to the wiring OL, a low-level potential or a high-level potential (a binary digital signal) in accordance with the magnitude relationship between the voltage supplied from the wiring VRL3 and the difference between the first voltage converted from the amount of current flowing between the source and the drain of the transistor F4 and the second voltage converted from the amount of current flowing between the source and the drain of the transistor F4*r*.

Example of Retaining First Data

Next, an example of the circuit CES in the arithmetic circuit MAC2 in FIG. 14 that retains the first data for performing product-sum operation of the positive, the negative, or "0" first data and the positive or "0" second data is described.

Since the circuit CES includes the cell IM and the cell IMr, the circuit CES can use the two circuits, the cell IM and the cell IMr, to retain the first data. Two current amounts are set for the circuit CES and potentials corresponding to the current amounts can be retained in the cell IM and the cell IMr. The first data can thus be represented with the current amount set in the cell IM and the current amount set in the cell IMr. The positive first data, the negative first data, or the "0" first data to be retained in the circuit CES is defined as follows.

To retain the positive first data in the circuit CES[1,j], the cell IM[1,j] is set such that current with an amount corresponding to the absolute value of the positive first data flows between the first terminal and the second terminal of the transistor F2 in the cell IM[1,j], for example. Specifically, a potential corresponding to the current amount is retained in the gate of the transistor F2 (the node NN[1,j]). By contrast, the cell IMr[1,j] is set such that current does not flow between the first terminal and the second terminal of the transistor F2*r* in the cell IMr[1,j], for example. Specifically, the gate of the transistor F2*r* (the node NNr[1,j]) retains the potential supplied from the wiring VE, the initialization potential supplied from the wiring VINIL1 of the circuit WCSa in FIG. 8A, or the like.

To retain the negative first data in the circuit CES[1,j], the cell IMr[1,j] is set such that current with an amount corresponding to the absolute value of the negative first data flows through the transistor F2*r* in the cell IMr[1,j], for example. Specifically, a potential corresponding to the current amount is retained in the gate of the transistor F2*r* (the node NNr[1,j]). By contrast, the cell IM[1,j] is set such that current does not flow through the transistor F2 in the cell IM[1,j], for example. Specifically, the gate of the transistor F2 (the node NN[1,j]) retains the potential supplied from the wiring VE, the initialization potential supplied from the wiring VINIL1 of the circuit WCSa in FIG. 8A, or the like.

To retain the "0" first data in the circuit CES[1,j], current is set not to flow through the transistor F2 in the cell IM[1,j] and the transistor F2*r* in the cell Imr[1,j], for example. Specifically, the gate of the transistor F2 (the node NN[1,j]) and the gate of the transistor F2*r* (the node NNr[1,j]) retain the potential supplied from the wiring VE, the initialization potential supplied from the wiring VINIL1 of the circuit WCSa in FIG. 8A, or the like.

To retain the positive first data or the negative first data in another circuit CES, current with an amount corresponding to the first data is set to flow through one of the path between the cell IM and the wiring WCL and the path between the cell IMr and the wiring WCLr while current is set not to flow through the other of the path between the cell IM and the wiring WCL and the path between the cell IMr and the wiring WCLr, as in the circuit CES[1,j]. To retain the "0" first data in another circuit CES, current is set not to flow between the cell IM and the wiring WCL and between the cell IMr and the wiring WCLr, as in the circuit CES[1,j].

For example, to retain each of "+3", "+2", "+1", "0", "−1", "−2", and "−3" as the first data in the circuit CES, the amount of current flowing from the wiring WCL to the cell IM and the amount of current flowing from the wiring WCLr to the cell IMr are set as described above, whereby each of "+3", "+2", "+1", "0", "−1", "−2", and "−3" as the first data can be defined as in the following table.

TABLE 1

| First data | Current flowing from wiring WCL to cell IM | Current flowing from wiring WCLr to cell IMr |
|---|---|---|
| +3 | $3I_{Wut}$ | 0 |
| +2 | $2I_{Wut}$ | 0 |
| +1 | $I_{Wut}$ | 0 |
| 0 | 0 | 0 |
| −1 | 0 | $I_{Wut}$ |
| −2 | 0 | $2I_{Wut}$ |
| −3 | 0 | $3I_{Wut}$ |

Here, the case is considered in which each of the circuit CES[1,j] to the circuit CES[m,j] retains the first data and the second data is input to each of the wiring XCL[1] to the wiring XCL[m] in the arithmetic circuit MAC2 in FIG. 14. In that case, a low-level potential is supplied to the wiring SWL1 to turn off the transistor F3[j] and the transistor F3*r*[j], and a high-level potential is supplied to the wiring SWL2 to turn on the transistor F4[j] and the transistor F4*r*[j]. Electrical continuity is thus established between the converter circuit ITRZD[j] and the wiring WCL[j], and current sometimes flows from the converter circuit ITRZD[j] to the wiring WCL[j]. In addition, electrical continuity is established between the converter circuit ITRZD[j] and the wiring WCLr[j], and current sometimes flows from the converter circuit ITRZD[j] to the wiring WCLr[j]. When the sum of the amounts of current flowing from the converter circuit ITRZD[j] to the wiring WCL[j] is $I_S[j]$ and the sum of the amounts of current flowing from the converter circuit ITRZD[j] to the wiring WCLr[j] is $I_{Sr}[j]$, $I_S[j]$ and $I_{Sr}[j]$ can be expressed by the following formulae, according to the operation example of the arithmetic circuit MAC1 described in Embodiment 1.

[Formula 19]

$$I_S[j] = I_{ref0}\sum_{i=1}^{m} x[i]w[i, j] \tag{2.1}$$

$$I_{Sr}[j] = I_{ref0}\sum_{i=1}^{m} x[i]w_r[i, j] \tag{2.2}$$

Note that w[i,j] shown in Formula (2.1) is the value of the first data written to the cell IM[i,j], and $w_r[i,j]$ shown in Formula (2.2) is the value of the first data written to the cell Imr[i,j]. When the value of one of w[i,j] and $w_r[i,j]$ is not "0", the other of w[i,j] and $w_r[i,j]$ is set to the value of "0", whereby the first data retained in the circuit CES[i,j] can follow the definition shown in Table 1, for example.

The converter circuit ITRZD[j] converts the sum $I_S[j]$ of the amounts of current flowing through the wiring WCL into the first voltage, and the sum $I_{Sr}[j]$ of the amounts of current flowing through the wiring WCLr into the second voltage, for example. Then, the converter circuit ITRZD[j] can output voltage corresponding to the difference between the first voltage and the second voltage to the wiring OL.

The converter circuit ITRZD1 to the converter circuit ITRZD3 illustrated in FIG. 15A to FIG. 15C each have a circuit configuration that outputs voltage to the wiring OL; however, one embodiment of the present invention is not limited thereto. For example, the converter circuit ITRZD[j] included in the arithmetic circuit MAC2 in FIG. 14 may have a circuit configuration that outputs current.

Figure 16:
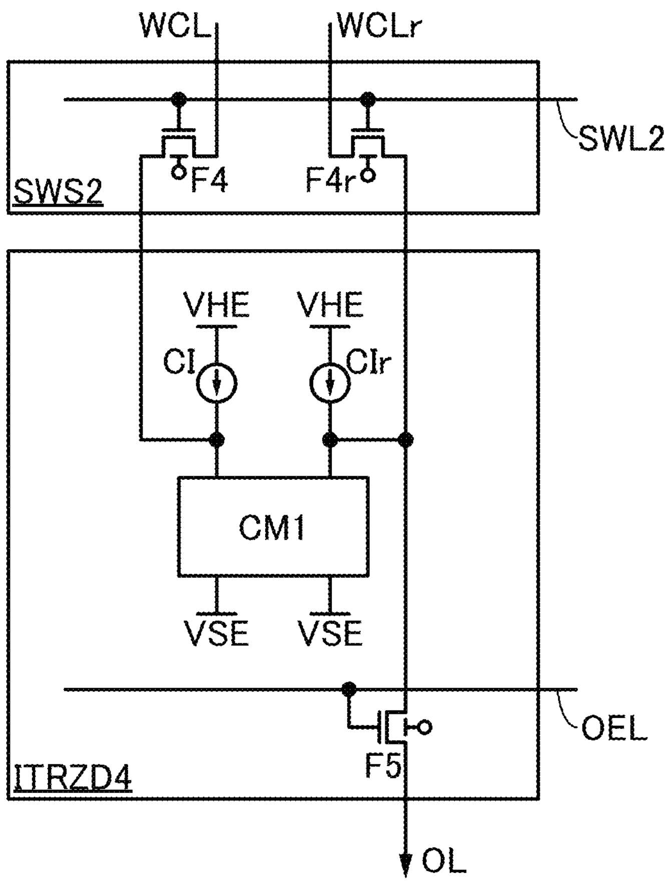
FIG. 16 is block diagram illustrating configuration examples of circuits included in a semiconductor device.

A converter circuit ITRZD4 illustrated in FIG. 16 is a circuit that can be used as the converter circuit ITRZD[j] included in the arithmetic circuit MAC2 in FIG. 14 and has a circuit configuration that outputs the results of product-sum operation and activation function operation as a current amount.

FIG. 16 also illustrates the circuit SWS2, the wiring WCL, the wiring WCLr, the wiring OL, the transistor F4, and the transistor F4*r* to show the electrical connection between the converter circuit ITRZD4 and its peripheral circuits. The wiring WCL[j] and the wiring WCLr[j] included in the arithmetic circuit MAC2 in FIG. 14 can be respectively used as the wiring WCL and the wiring WCLr, for example, and the transistor F4[j] and the transistor F4*r*[j] included in the arithmetic circuit MAC2 in FIG. 14 can be respectively used as the transistor F4 and the transistor F4*r*, for example.

The converter circuit ITRZD4 in FIG. 16 is electrically connected to the wiring WCL through the transistor F4. The converter circuit ITRZD4 is electrically connected to the wiring WCLr through the transistor F4*r*. The converter circuit ITRZD4 is electrically connected to the wiring OL. The converter circuit ITRZD4 has a function of obtaining the difference current between one of the amount of current flowing from the converter circuit ITRZD4 to the wiring WCL and the amount of current flowing from the wiring WCL to the converter circuit ITRZD4, and one of the amount of current flowing from the converter circuit ITRZD4 to the wiring WCLr and the amount of current flowing from the wiring WCLr to the converter circuit ITRZD4. The converter circuit ITRZD4 has a function of making the difference current flow between the converter circuit ITRZD4 and the wiring OL.

The converter circuit ITRZD4 in FIG. 16 includes, for example, a transistor F5, a current source CI, a current source CIr, and a current mirror circuit CM1.

The second terminal of the transistor F4 is electrically connected to a first terminal of the current mirror circuit CM1 and an output terminal of the current source CI, and the second terminal of the transistor F4*r* is electrically connected to a second terminal of the current mirror circuit CM1, an output terminal of the current source CIr, and a first terminal of the transistor F5. An input terminal of the current source CI is electrically connected to a wiring VHE, and an input terminal of the current source CIr is electrically connected to the wiring VHE. A third terminal of the current mirror circuit CM1 is electrically connected to a wiring VSE, and a fourth terminal of the current mirror circuit CM1 is electrically connected to the wiring VSE.

A second terminal of the transistor F5 is electrically connected to the wiring OL, and a gate of the transistor F5 is electrically connected to a wiring OEL.

The current mirror circuit CM1 has, for example, a function of making current with an amount corresponding to the potential of the first terminal of the current mirror circuit CM1 flow between the first terminal and the third terminal of the current mirror circuit CM1 and between the second terminal and the fourth terminal of the current mirror circuit CM1.

The wiring VHE functions as a wiring for supplying a constant voltage, for example. Specifically, the constant voltage can be a high-level potential or the like, for example.

The wiring VSE functions as a wiring for supplying a constant voltage, for example. Specifically, the constant voltage can be, for example, a low-level potential, a ground potential, or the like.

The wiring OEL functions as, for example, a wiring for transmitting a signal to switch the on state and the off state of the transistor F5. Specifically, for example, a high-level potential or a low-level potential is input to the wiring OEL.

The current source CI has a function of making a constant current flow between the input terminal and the output terminal of the current source CI. The current source CIr has a function of making a constant current flow between the input terminal and the output terminal of the current source CIr. The amount of current flowing from the current source CI and the amount of current flowing from the current source CIr are preferably equal to each other in the converter circuit ITRZD4 in FIG. 16.

An operation example of the converter circuit ITRZD4 in FIG. 16 is described here.

First, the amount of current flowing from the converter circuit ITRZD4 to the wiring WCL through the transistor F4 is set to Is, and the amount of current flowing from the converter circuit ITRZD4 to the wiring WCLr through the transistor F4*r* is set to $I_{S_r}$. The amount of current flowing from each of the current source CI and the current source CIr is set to $I_0$.

In the arithmetic circuit MAC2 in FIG. 14, $I_S$ is the sum of the amounts of current flowing through the cell IM[1,j] to the cell IM[m,j] positioned in the j-th row, for example. In the arithmetic circuit MAC2 in FIG. 14, $I_{S_r}$ is the sum of the amounts of current flowing through the cell IMr[1,j] to the cell IMr[m,j] positioned in the j-th row, for example.

When a high-level potential is input to the wiring SWL2, the transistor F4 and the transistor F4*r* are turned on. Accordingly, the amount of current flowing from the first terminal to the third terminal of the current mirror circuit CM1 becomes $I_0-I_S$. Due to the current mirror circuit CM1, the current with the amount $I_0-I_S$ flows from the second terminal to the second terminal of the current mirror circuit CM1.

Next, a high-level potential is input to the wiring OEL to turn on the transistor F5. When the amount of current flowing through the wiring OL is $I_{out}$, $I_{out}$ is $I_0-(I_0-I_S)-I_{S_r}=I_S-I_{S_r}$.

For retention of the first data in the circuit CES to perform product-sum operation of the positive, the negative, or "0" first data and the positive or "0" second data in the arithmetic circuit MAC2 in FIG. 14, refer to the above example of retaining the first data.

That is, to retain the positive first data in the circuit CES[i,j], the cell IM[i,j] is set such that the current with the amount corresponding to the absolute value of the positive first data flows between the first terminal and the second terminal of the transistor F2 in the cell IM[i,j], and the cell IMr[i,j] is set such that current does not flow between the first terminal and the second terminal of the transistor F2*r* in the cell IMr[i,j]. To retain the negative first data in the circuit CES[i,j], the cell IM[i,j] is set such that current does not flow between the first terminal and the second terminal of the transistor F2 in the cell IM[i,j], and the cell IMr[i,j] is set such that the current with the amount corresponding to the absolute value of the negative first data flows between the first terminal and the second terminal of the transistor F2*r* in the cell IMr[i,j]. To retain the "0" first data in the circuit CES[i,j], the cell IM[i,j] is set such that current does not flow between the first terminal and the second terminal of the transistor F2 in the cell IM[i,j], and the cell Imr[i,j] is set such that current does not flow between the first terminal and the second terminal of the transistor F2*r* in the cell IMr[i,j].

Here, in the case where the second data is input to each of the wiring XCL[1] to the wiring XCL[m] of the arithmetic circuit MAC2 in FIG. 14, the current with the amount flowing between the first terminal and the second terminal of the transistor F2 in the cell IM[i,j] and the current with the amount flowing between the first terminal and the second terminal of the transistor F2 in the cell IMr[i,j] are each proportional to the second data.

$I_S$ is the sum of the amounts of current flowing through the cell IM[1,j] to the cell IM[m,j] positioned in the j-th row. Thus, $I_S$ is the sum of the amounts of current flowing through the cells IM included in the circuits CES in which the positive first data is retained out of the circuit CES[1,j] to the circuit CES[m,j]; for example, Is can be expressed as in Formula (2.1). That is, $I_S$ corresponds to the result of product-sum operation of the absolute value of the positive first data and the second data. $I_{S_r}$ is the sum of the amounts of current flowing through the cell IMr[1,j] to the cell IMr[m,j] positioned in the j-th row. Thus, $I_{S_r}$ is the sum of the amounts of current flowing through the cells IMr included in the circuits CES in which the negative first data is retained out of the circuit CES[1,j] to the circuit CES[m,j]; for example, $I_{S_r}$ can be expressed as in Formula (2.2). That is, $I_{S_r}$ corresponds to the result of product-sum operation of the absolute value of the negative first data and the second data.

Thus, the current with the amount $I_{out}=I_S-I_{S_r}$ flowing to the wiring OL corresponds to the difference between the result of the product-sum operation of the absolute value of the positive first data and the second data and the result of the product-sum operation of the absolute value of the negative first data and the second data. That is, $I_{out}=I_S-I_{S_r}$ corresponds to the result of the product-sum operation of the negative, "0", or positive first data retained in the circuit CES[1,j] to the circuit CES[m,j] and the second data input to each of the wiring XCL[1] to the wiring XCL[m].

When the sum of the amounts of current flowing through the cell IM[1,j] to the cell IM[m,j] is larger than the sum of the amounts of current flowing through the cell IMr[1,j] to the cell IMr[m,j], i.e., $I_S$ is larger than $I_{S_r}$, $I_{out}$ is the current amount larger than 0 and flows from the converter circuit ITRZD4 to the wiring OL. By contrast, when the sum of the amounts of current flowing through the cell IM[1,j] to the cell IM[m,j] is smaller than the sum of the amounts of current flowing through the cell IMr[1,j] to the cell IMr[m,j], i.e., $I_S$ is smaller than $I_{S_r}$, current does not flow from the wiring OL to the converter circuit ITRZD4 in some cases. That is, when $I_S$ is smaller than $I_{S_r}$, $I_{out}$ can be approximately 0. Therefore, the converter circuit ITRZD4 can be regarded as a ReLU function, for example.

The ReLU function can be used as an activation function of a neural network, for example. In the arithmetic operation of the neural network, calculation of a product sum of the signal values (e.g., second data) from the neurons in the previous layer and the corresponding weight coefficient (e.g., first data) is required. In response to the result of the product sum, the value of an activation function needs to be calculated. Thus, when the activation function of the neural network is the ReLU function, the arithmetic operation of the neural network can be performed using the arithmetic circuit MAC2 including the converter circuit ITRZD4.

The hierarchical neural network will be described later in Embodiment 4.

Next, a specific circuit configuration example of the converter circuit ITRZD4 in FIG. 16 is described.

Figure 17A:
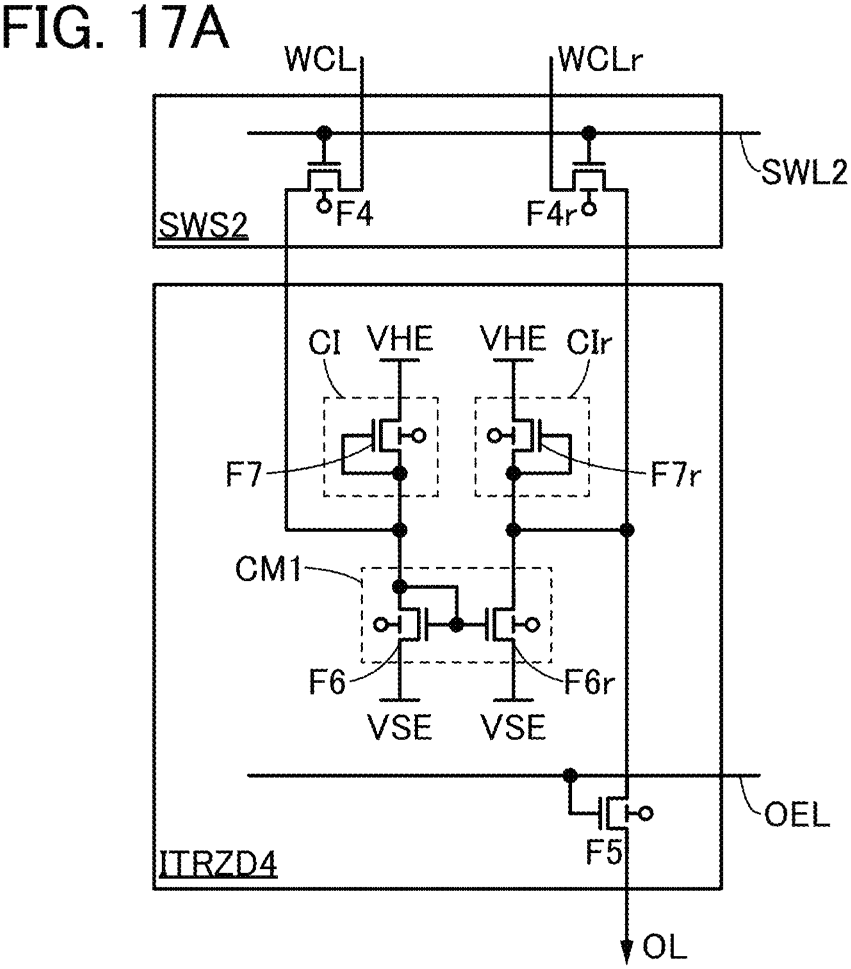
FIG. 17A is a circuit diagram illustrating configuration examples of circuits included in a semiconductor device.

The converter circuit ITRZD4 illustrated in FIG. 17A is an example of the converter circuit ITRZD4 in FIG. 16. Specifically, FIG. 17A illustrates configuration examples of the current mirror circuit CM1, the current source CI, and the current source CIr.

In the converter circuit ITRZD4 in FIG. 17A, the current mirror circuit CM1 includes a transistor F6 and a transistor F6*r*, the current source CI includes a transistor F7, and the current source CIr includes a transistor F7*r*, for example. The transistor F6, the transistor F6*r*, the transistor F7, and the transistor F7*r* are n-channel transistors.

For example, the first terminal of the current mirror circuit CM1 is electrically connected to a first terminal of the transistor F6, a gate of the transistor F6, and a gate of the transistor F6*r*, and the third terminal of the current mirror circuit CM1 is electrically connected to a second terminal of the transistor F6. The second terminal of the current mirror circuit CM1 is electrically connected to a first terminal of the transistor F6*r*, and the fourth terminal of the current mirror circuit CM1 is electrically connected to a second terminal of the transistor F6*r*.

The output terminal of the current source CI is electrically connected to a first terminal of the transistor F7 and a gate of the transistor F7, and the input terminal of the current source CI is electrically connected to a second terminal of the transistor F7, for example.

The output terminal of the current source CIr is electrically connected to a first terminal of the transistor F7*r* and a gate of the transistor F7*r*, and the input terminal of the current source CIr is electrically connected to a second terminal of the transistor F7*r*, for example.

The gate and the first terminal are electrically connected to each other in the transistor F7 and the transistor F7*r*, and their second terminals and the wiring VHE are electrically connected to each other. Thus, the gate-source voltage of each of the transistor F7 and the transistor F7*r* is 0 V, and when the threshold voltages of the transistor F7 and the transistor F7*r* are within an appropriate range, a constant current flows between the first terminal and the second terminal of each of the transistor F7 and the transistor F7*r*. In other words, the transistor F7 and the transistor F7*r* function as current sources.

The structures of the current source CI and the current source CIr included in the converter circuit ITRZD4 in FIG. 16 are not limited to those of the current source CI and the current source CIr illustrated in FIG. 17A. The structures of the current source CI and the current source CIr included in the converter circuit ITRZD4 may be changed depending on circumstances.

Figure 17B:
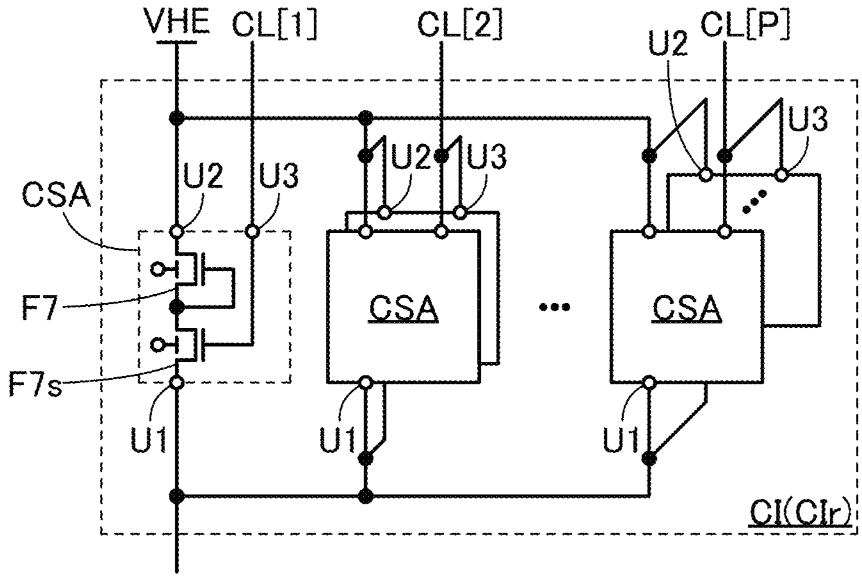
FIG. 17B is a block diagram illustrating a configuration example of a circuit included in the semiconductor device.

For example, the current source CI (current source CIr) illustrated in FIG. 17B may be used as the current source CI and the current source CIr included in the converter circuit ITRZD4 in FIG. 16.

The current source CI (current source CIr) in FIG. 17B includes a plurality of current sources CSA, for example. Each of the plurality of current sources CSA includes the transistor F7, a transistor F7*s*, a terminal U1, a terminal U2, and a terminal U3.

For example, the current sources CSA each have a function of making current with an amount $I_{CSA}$ flow between the terminal U2 and the terminal U1. When the current source CI (current source CIr) includes $2^P-1$ current source(s) CSA (P is an integer greater than or equal to 1), the current source CI (current source CIr) can make current with an amount $s\times I_{CSA}$ (s is an integer greater than or equal to 0 and less than or equal to $2^P-1$) flow to the output terminal.

Actually, in the manufacturing stage of the current source CI (current source CIr), the transistors included in the current sources CSA may have different electrical characteristics; this may yield errors. The errors in the constant currents $I_{CSA}$ output from the terminals U1 of the plurality of current sources CSA are thus preferably within 10%, further preferably within 5%, still further preferably within 1%. In this embodiment, the description is made on the assumption that there is no error in the constant currents $I_{CSA}$ output from the terminals U1 of the plurality of current sources CSA included in the current source CI (current source CIr).

In one of the plurality of current sources CSA, a first terminal of the transistor F7s is electrically connected to the terminal U1, and a gate of the transistor F7s is electrically connected to the terminal U3. The first terminal of the transistor F7 is electrically connected to the gate of the transistor F7 and a second terminal of the transistor F7s. The second terminal of the transistor F7 is electrically connected to the terminal U2.

Each of the terminals U1 of the plurality of current sources CSA is electrically connected to the output terminal of the current source CI (current source CIr). Each of the terminals U2 of the plurality of current sources CSA is electrically connected to the input terminal of the current source CI (current source CIr). That is, electrical continuity is established between each of the terminals U2 of the plurality of current sources CSA and the wiring VHE.

The terminal U3 of one current source CSA is electrically connected to a wiring CL[1], the terminals U3 of two current sources CSA are electrically connected to a wiring CL[2], and the terminals U3 of $2^{P-1}$ current sources CS are electrically connected to a wiring CL[P].

The wiring CL[1] to the wiring CL[P] each function as a wiring that transmits a control signal for outputting the constant currents $I_{CSA}$ from the current sources CSA, which are electrically connected to the wirings. Specifically, for example, when a high-level potential is supplied to the wiring CL[1], the current source CSA electrically connected to the wiring CL[1] supplies $I_{CSA}$ as a constant current to the terminal U1, and when a low-level potential is supplied to the wiring CL[1], the current source CSA electrically connected to the wiring CL[1] does not output $I_{CSA}$. When a high-level potential is supplied to the wiring CL[2], the two current sources CSA electrically connected to the wiring CL[2] supply $2I_{CSA}$ in total as a constant current to the terminals U1, and when a low-level potential is supplied to the wiring CL[2], the current sources CSA electrically connected to the wiring CL[2] do not output $2I_{CSA}$ in total, for example. When a high-level potential is supplied to the wiring CL[P], the $2^{P-1}$ current sources CSA electrically connected to the wiring CL[P] supply $2^{P-1}I_{CSA}$ in total as a constant current to the terminals U1, and when a low-level potential is supplied to the wiring CL[P], the current sources CSA electrically connected to the wiring CL[P] do not output $2^{P-1}$ $I_{CSA}$ in total, for example.

Accordingly, when one or more wirings selected from the wiring CL[1] to the wiring CL[P] are supplied with a high-level potential, the current source CI (current source CIr) can make current flow to the output terminal of the current source CI (current source CIr). The current amount can be determined by the combination of one or more wirings that are selected from the wiring CL[1] to the wiring CL[P] and supplied with a high-level potential. For example, when a high-level potential is supplied to the wiring CL[1] and the wiring CL[2] and a low-level potential is supplied to the wiring CL[3] to the wiring CL[P], the current source CI (current source CIr) can make currents with $3I_{CSA}$ in total flow to the output terminal of the current source CI (current source CIr).

As described above, with the use of the current source CI (current source CIr) in FIG. 17B, the amount of current supplied from the current source CI (current source CIr) to its output terminal can be changed depending on circumstances.

When the converter circuit ITRZD4 in FIG. 17A is used as the converter circuit ITRZD4 in FIG. 16, all the transistors included in the converter circuit ITRZD4 can be OS transistors. The cell array CA, the circuit WCS, the circuit XCS, and the like in the arithmetic circuit MAC2 can be formed using only OS transistors; thus, the converter circuit ITRZD4 can be formed concurrently with the cell array CA, the circuit WCS, the circuit XCS, and the like. Thus, the manufacturing process of the arithmetic circuit MAC2 can be shortened in some cases. The same applies to the case where the current source CI (current source CIr) in FIG. 17B is used as the current source CI and the current source CIr of the converter circuit ITRZD4 in FIG. 17A.

For example, since the current source CI and the current source CIr included in the converter circuit ITRZD4 in FIG. 16 need to supply the same current, the current source CI and the current source CIr may be replaced with a current mirror circuit.

Figure 18A:
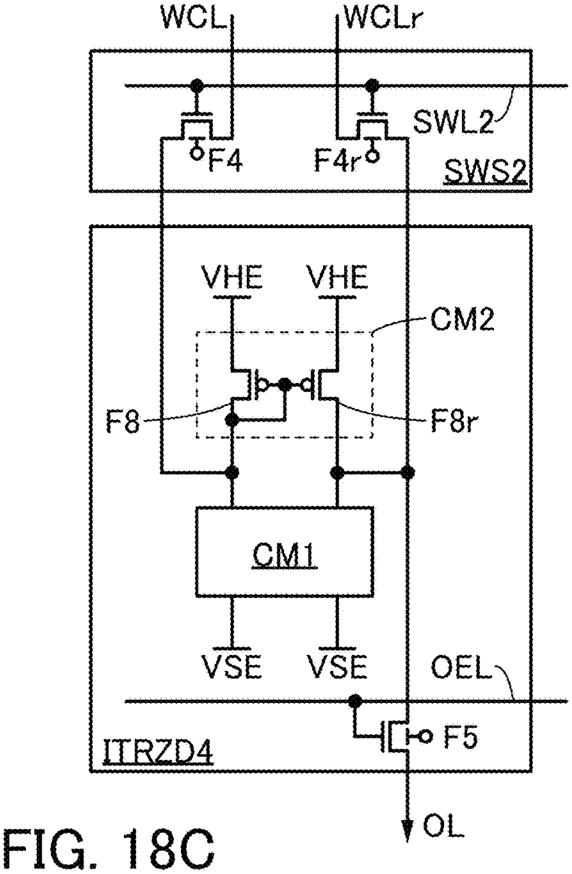
FIG. 18A and FIG. 18B are block diagrams each illustrating a configuration example of a circuit included in a semiconductor device.

The converter circuit ITRZD4 illustrated in FIG. 18A has a configuration in which the current source CI and the current source CIr included in the converter circuit ITRZD4 in FIG. 16 are replaced with a current mirror circuit CM2. The current mirror circuit CM2 includes a transistor F8 and a transistor F8r, for example. Note that the transistor F8 and the transistor F8r are p-channel transistors.

A first terminal of the transistor F8 is electrically connected to a gate of the transistor F8, a gate of the transistor F8r, the second terminal of the transistor F4, and the first terminal of the current mirror circuit CM1. A second terminal of the transistor F8 is electrically connected to the wiring VHE. A first terminal of the transistor F8r is electrically connected to the second terminal of the transistor F4r and the second terminal of the current mirror circuit CM1. A second terminal of the transistor F8r is electrically connected to the wiring VHE.

As in the converter circuit ITRZD4 in FIG. 18A, the current source CI and the current source CIr included in the converter circuit ITRZD4 in FIG. 16 are replaced with the current mirror circuit CM2, whereby currents with substantially the same amounts can flow through the connection point of the second terminal of the transistor F4 and the first terminal of the current mirror circuit CM1 and the connection point of the second terminal of the transistor F4r, the second terminal of the current mirror circuit CM1, and the first terminal of the transistor F5.

The current mirror circuit CM2 in FIG. 18A includes the transistor F8 and the transistor F8r; however, the circuit configuration of the current mirror circuit CM2 is not limited thereto. For example, as in FIG. 18C described later, the current mirror circuit CM2 may have a configuration in which the transistors included in the current mirror circuit CM2 have a cascode connection. As described above, the circuit configuration of the current mirror circuit CM2 in FIG. 18A may be changed depending on circumstances.

Figure 18B:
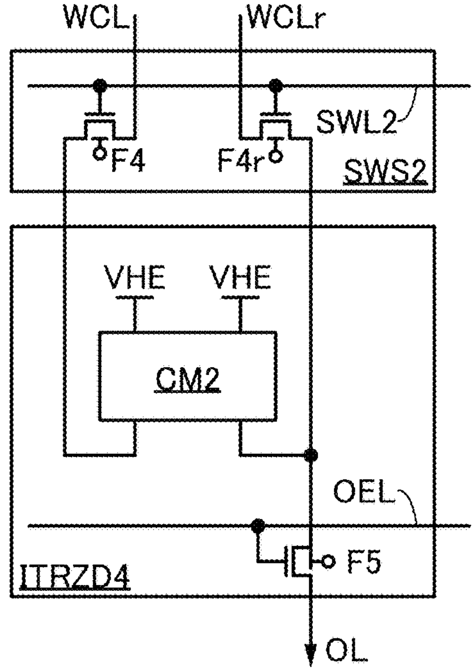

As in the configuration of the converter circuit ITRZD4 illustrated in FIG. 18B, the converter circuit ITRZD4 in FIG. 18A does not necessarily include the current mirror circuit CM1. In the converter circuit ITRZD4 illustrated in FIG. 18B, the amount of current flowing from the first terminal of the current mirror circuit CM2 to the second terminal of the transistor F4 can be substantially equal to the amount of current flowing from the second terminal of the current mirror circuit CM2 to the connection point of the second terminal of the transistor F4r, the wiring VSE, and the first terminal of the transistor F5. Therefore, in the case where $I_S$ is larger than $I_{Sr}$, the amount of current $I_{out}$ flowing through the wiring OL in FIG. 18B can be $I_S-I_{Sr}$ as in the converter circuit ITRZD4 in FIG. 16.

The converter circuit ITRZD4 in FIG. 18B does not include the current mirror circuit CM1, and thus can have a circuit area smaller than that of the converter circuit ITRZD4 in FIG. 18A. Since no constant current flows from the current mirror circuit CM2 to the current mirror circuit CM1, the converter circuit ITRZD4 in FIG. 18B can have lower power consumption than the converter circuit ITRZD4 in FIG. 18A.

FIG. 18B does not illustrate the transistor F8 and the transistor F8*r* but illustrates the current mirror circuit CM2 as a block diagram. Thus, the configuration of the current mirror circuit CM2 in FIG. 18B can be determined depending on circumstances, as in the current mirror circuit CM2 in FIG. 18A.

Figure 18C:
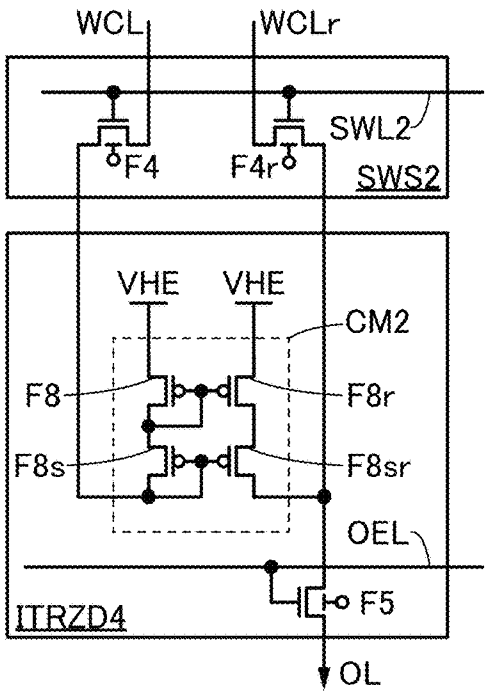
FIG. 18C and FIG. 18D are circuit diagrams each illustrating a configuration example of a circuit included in a semiconductor device.

For example, the current mirror circuit CM2 illustrated in FIG. 18C may be used as the current mirror circuit CM2 included in the converter circuit ITRZD4 in FIG. 18B. In the current mirror circuit CM2 illustrated in FIG. 18C, a p-channel transistor F8*s* and a p-channel transistor F8*sr* are further provided in the current mirror circuit CM2 illustrated in FIG. 18B; the transistor F8 and the transistor F8*s* are cascode-connected, and the transistor F8*r* and the transistor F8*sr* are cascode-connected. The transistors included in the current mirror circuit are cascode-connected as in FIG. 18C, whereby the operation of the current mirror circuit can be more stable.

The current mirror circuit CM1 included in the converter circuit ITRZD4 in FIG. 16 is not limited to the current mirror circuit CM1 illustrated in FIG. 17A. The configuration of the current mirror circuit CM1 included in the converter circuit ITRZD4 in FIG. 17A may be changed depending on circumstances.

Figure 18D:
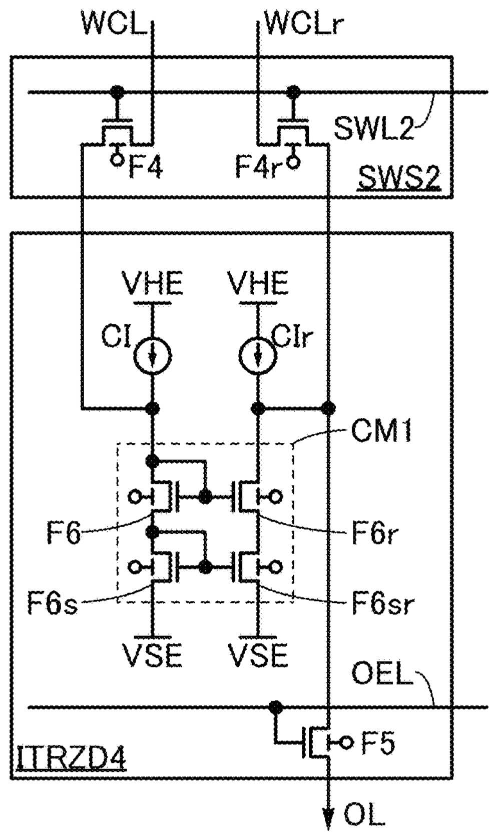

For example, the current mirror circuit CM1 illustrated in FIG. 18D may be used as the current mirror circuit CM1 included in the converter circuit ITRZD4 in FIG. 16. In the current mirror circuit CM1 illustrated in FIG. 18D, an n-channel transistor F6*s* and an n-channel transistor F6*sr* are further provided in the current mirror circuit CM1 illustrated in FIG. 17A; the transistor F6 and the transistor F6*s* are cascode-connected, and the transistor F6*r* and the transistor F6*sr* are cascode-connected. As in FIG. 18D, the transistors included in the current mirror circuit are cascode-connected, whereby the operation of the current mirror circuit can be more stable.

One embodiment of the present invention is not limited to the circuit configuration of the arithmetic circuit MAC2 described in this embodiment. The circuit configuration of the arithmetic circuit MAC2 can be changed depending on circumstances. For example, the capacitor C5 and the capacitor C5*r* included in the arithmetic circuit MAC2 can be gate capacitances of transistors (not illustrated). In the arithmetic circuit MAC2, the capacitor C5, the capacitor C5*r*, and the capacitor C5*m* are not necessarily provided when parasitic capacitances between the node NN, the node NNr, and the node NNref and their nearby wirings are large.

As described above, product-sum operation of the positive, the negative, or "0" first data and the positive or "0" second data can be performed using the arithmetic circuit MAC2.

Configuration Example 2 of Arithmetic Circuit

Figure 19:
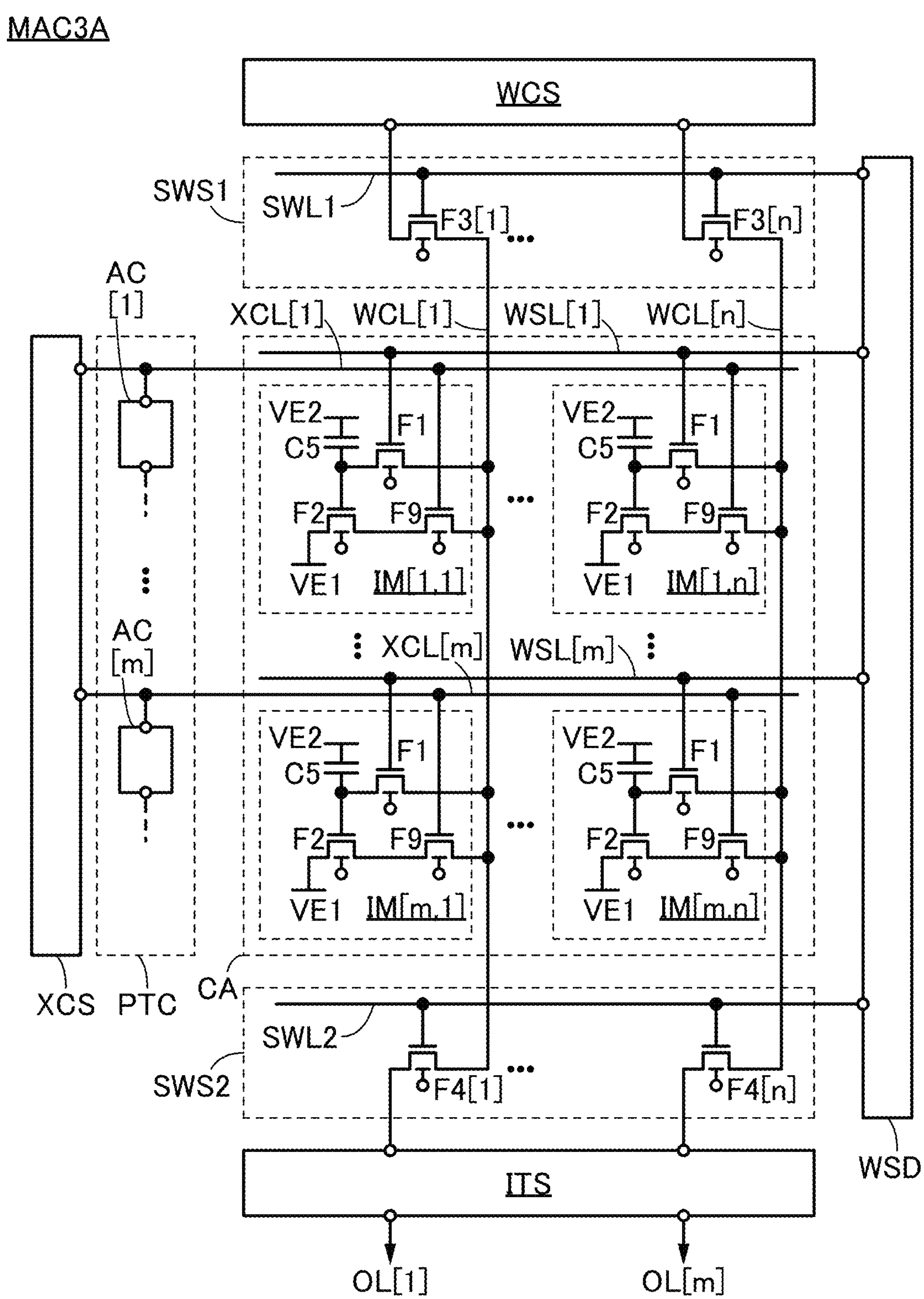
FIG. 19 is a circuit diagram illustrating a configuration example of a circuit included in a semiconductor device.

FIG. 19 illustrates a configuration example of an arithmetic circuit MAC3A that performs product-sum operation of the positive or "0" first data and "1" or "0" (a binary value, 1-bit digital value) second data. The arithmetic circuit MAC3A in FIG. 19 is different from the arithmetic circuit MAC1 in FIG. 7 in that in the cell array CA, the cell IM includes the transistor F1, the transistor F2, a transistor F9, and the capacitor C5, the second terminal of the capacitor C5 is electrically connected to a wiring VE2, and the like. Furthermore, the cell IMref included in the cell array CA illustrated in FIG. 7 is not necessarily provided in the cell array CA in FIG. 19.

Note that as the transistor F9, a transistor that can be used as the transistor F1 can be used, for example.

The cell array CA in FIG. 19 includes m×n cells IM that are arranged in a matrix. Note that in FIG. 19, the cell IM in the i-th row and the j-th column is shown as the cell IM[i,j] in order to distinguish the cells IM.

In each of the cells IM, the gate of the transistor F2 is electrically connected to the first terminal of the capacitor C5 and the first terminal of the transistor F1. The second terminal of the transistor F1 is electrically connected to the wiring WCL, and the gate of the transistor F1 is electrically connected to the wiring WSL. The second terminal of the capacitor C5 is electrically connected to the wiring VE2. The first terminal of the transistor F2 is electrically connected to a wiring VE1, and the second terminal of the transistor F2 is electrically connected to a first terminal of the transistor F9. A second terminal of the transistor F9 is electrically connected to the wiring WCL, and a gate of the transistor F9 is electrically connected to the wiring XCL.

Like the wiring VE illustrated in FIG. 7, the wiring VE1 is a wiring for supplying current between the first terminal and the second terminal of the transistor F2 and functions as a wiring for supplying a constant voltage. Note that the constant voltage can be, for example, a low-level potential, a ground potential, or the like. The wiring VE2 functions as a wiring for supplying a constant voltage. Note that the constant voltage can be, for example, a high-level potential, a low-level potential, a ground potential, or the like.

When the current amount is set in the transistor F2 in the cell IM, the transistor F1 and the transistor F9 are turned on to write the potential corresponding to the current amount to the gate of the transistor F2, and then the transistor F1 is turned off, so that the potential of the gate of the transistor F2 is retained in the first terminal of the capacitor C5. Thus, the first data transmitted from the wiring WCL can be retained in the cell IM.

Next, the case where the second data is input to the cell IM is considered. A high-level potential is applied to the wiring XCL when "1" is input to the cell IM as the second data, and a low-level potential is applied to the wiring XCL when "0" is input to the cell IM as the second data. When the second data is "1", the transistor F9 is turned on, so that the drain current of the transistor F2 can flow from the second terminal of the transistor F2 to the wiring WCL. Meanwhile, when the second data is "0", the transistor F9 is turned off, so that the drain current of the transistor F2 does not flow from the second terminal of the transistor F2 to the wiring WCL. In other words, current with a current amount of zero flows from the second terminal of the transistor F2 to the wiring WCL. Accordingly, current in an amount (including zero) corresponding to the product of the first data and the second data can flow from the second terminal of the transistor F2 to the wiring WCL.

The on state and the off state of the transistor F1 can be switched by operation similar to that of the circuit WSD illustrated in FIG. 7. Accordingly, as the circuit WSD illustrated in FIG. 19, a circuit similar to the circuit WSD illustrated in FIG. 7 is preferably used. Here, the wiring WSL[1] to the wiring WSL[m] in FIG. 19 are preferably electrically connected to the circuit WSD illustrated in FIG. 19.

The wiring XCL[1] to the wiring XCL[m] each have a function of a wiring not only for inputting the second data but also for selecting the cells IM. Thus, circuits electrically connected to the wiring XCL[1] to the wiring XCL[m] have a function of inputting a selection signal for selecting the cells IM to which the first data is to be written, in addition to a function of inputting the second data to each of the wiring XCL[1] to the wiring XCL[m].

In the case where the second data is input from the sensor SNC to the cells IM in FIG. 19, it is preferable that the current output from the sensor SNC be converted into voltage by a current-voltage converter circuit or the like, and the voltage be binarized by an analog-digital converter circuit, a comparator circuit, or the like and input to the wiring XCL[1] to the wiring XCL[m]. The current-voltage converter circuit, the analog-digital converter circuit, or the like may be included in the layer CCL. Specifically, for example, the circuit AC[1] to the circuit AC[m] illustrated in FIG. 19 can each have a configuration including the circuit PTR illustrated in FIG. 7 and the current-voltage converter circuit or the analog-digital converter circuit, for example. In FIG. 19, a first terminal of the circuit AC[1] is electrically connected to the wiring XCL[1], and a second terminal of the circuit AC[1] is electrically connected to the wiring EIL[1]. In FIG. 19, a first terminal of the circuit AC[m] is electrically connected to the wiring XCL[m], and a second terminal of the circuit AC[m] is electrically connected to the wiring EIL[m].

One embodiment of the present invention is not limited to the circuit configuration of the arithmetic circuit MAC3A illustrated in FIG. 19 described in this embodiment. The circuit configuration of the arithmetic circuit MAC3A illustrated in FIG. 19 can be changed depending on circumstances. For example, one embodiment of the present invention may have a circuit configuration of an arithmetic circuit MAC3B illustrated in FIG. 20. The arithmetic circuit MAC3B illustrated in FIG. 20 is different from the arithmetic circuit MAC3A in FIG. 19 in that the second terminal of the transistor F9 included in each of the cells IM is electrically connected to not the wiring WCL but a wiring RCL, the circuit SWS1 and the circuit SWS2 are not provided but a circuit SWS3 is provided, and the like.

Figure 20:
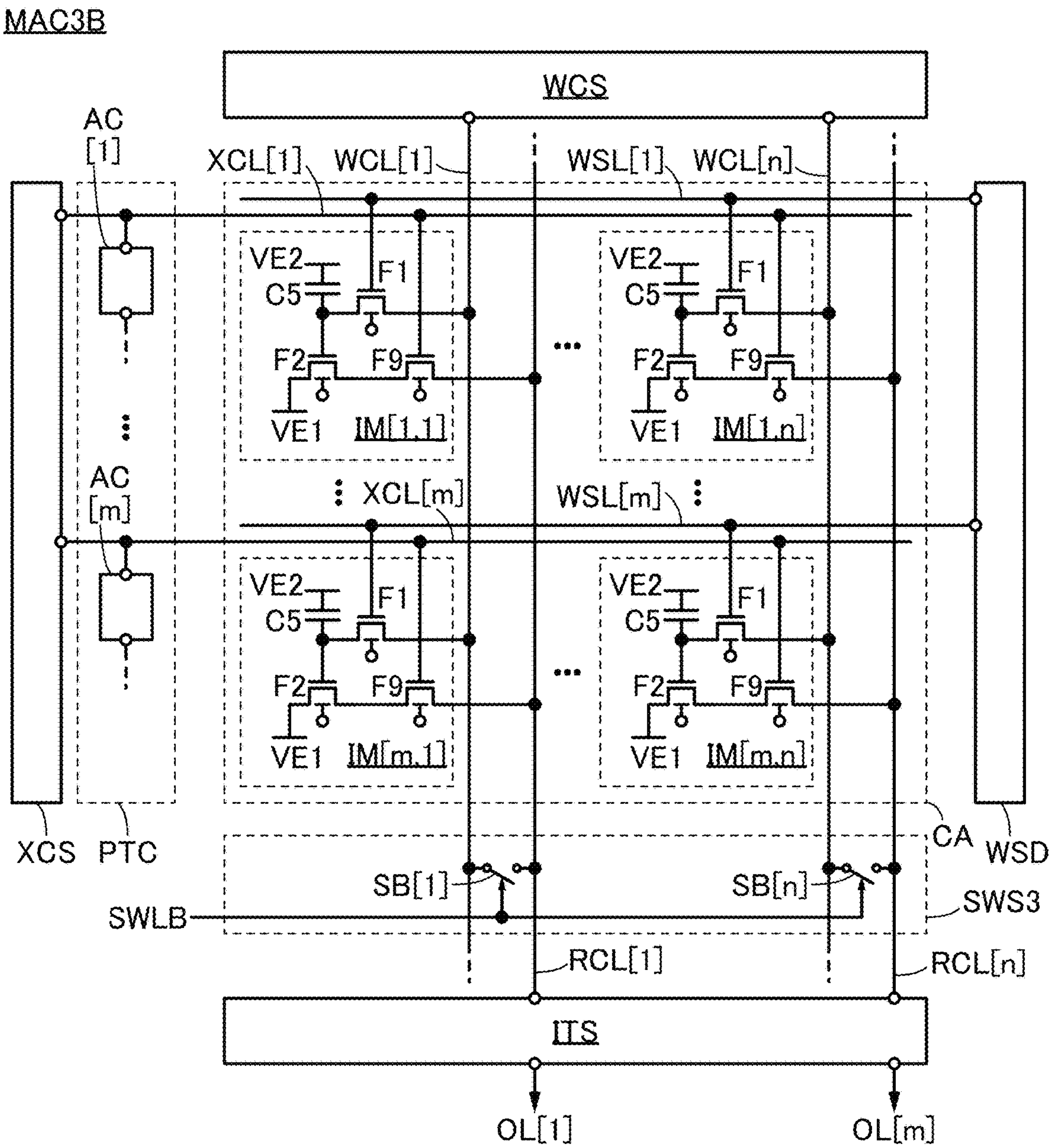
FIG. 20 is a circuit diagram illustrating a configuration example of a circuit included in a semiconductor device.

In FIG. 20, the circuit SWS3 includes a switch SB[1] to a switch SB[n]. As the switch SB[1] to the switch SB[n], for example, switches usable as the switch SA[1] to the switch SA[m] can be used.

A first terminal of the switch SB is electrically connected to the wiring WCL[1], and a second terminal of the switch SB is electrically connected to a wiring RCL[1]. A control terminal of the switch SB is electrically connected to a wiring SWLB.

The wiring SWLB functions as a wiring for switching an on state and an off state of the switch SB[1] to the switch SB[n], for example. Accordingly, the wiring SWLB is supplied with a high-level potential or a low-level potential.

The wiring RCL[1] to a wiring RCL[n] are electrically connected to the circuit ITS.

When the current amount is set in the transistor F2 in the cell IM, the transistor F1 and the transistor F9 are turned on and the switch SB is turned on to write the potential corresponding to the current amount to the gate of the transistor F2, and then the transistor F1 is turned off and the switch SB is turn off, so that the potential of the gate of the transistor F2 is retained in the first terminal of the capacitor C5. Thus, the first data transmitted from the wiring WCL can be retained in the cell IM.

When the second data is input to the cell IM, the switch SB is turned off in advance. After that, "1" (high-level potential) or "0" (low-level potential) is input to the wiring XCL as the second data, whereby current in an amount (including zero) corresponding to the product of the first data and the second data can flow from the second terminal of the transistor F2 to the wiring RCL.

When current flows from the cell IM to the wiring RCL by inputting the second data to the cell IM, voltage in the voltage range where the transistor F2 operates in the subthreshold region is input to the wiring RCL. In the cell IM illustrated in FIG. 20, the second terminal of the transistor F9 is electrically connected to not the wiring WCL but the wiring RCL; thus, the voltage is not input to the second terminal of the transistor F1. Accordingly, an electric load between the source and the drain of the transistor F1 can be reduced when current flows from the cell IM to the circuit ITS through the wiring RCL. Furthermore, because of the transistor F9 between the second terminal of the transistor F2 and the wiring RCL, the voltage lowered by the transistor F9 is input to the second terminal of the transistor F2. That is, when the transistor F9 is provided, an effect of inhibiting the input of overvoltage to the second terminal of the transistor F2 can also be obtained.

As described above, product-sum operation of the positive or "0" first data and the "1" or "0" second data can be performed using the arithmetic circuit MAC3A in FIG. 19 or the arithmetic circuit MAC3B illustrated in FIG. 20.

Note that this embodiment can be combined with any of the other embodiments in this specification as appropriate.

EMBODIMENT 3

In this embodiment, a circuit configuration for transmitting the second data to the circuit XCS included in the arithmetic circuit MAC1 or the arithmetic circuit MAC2 described in the above embodiment is described.

Figure 21A:
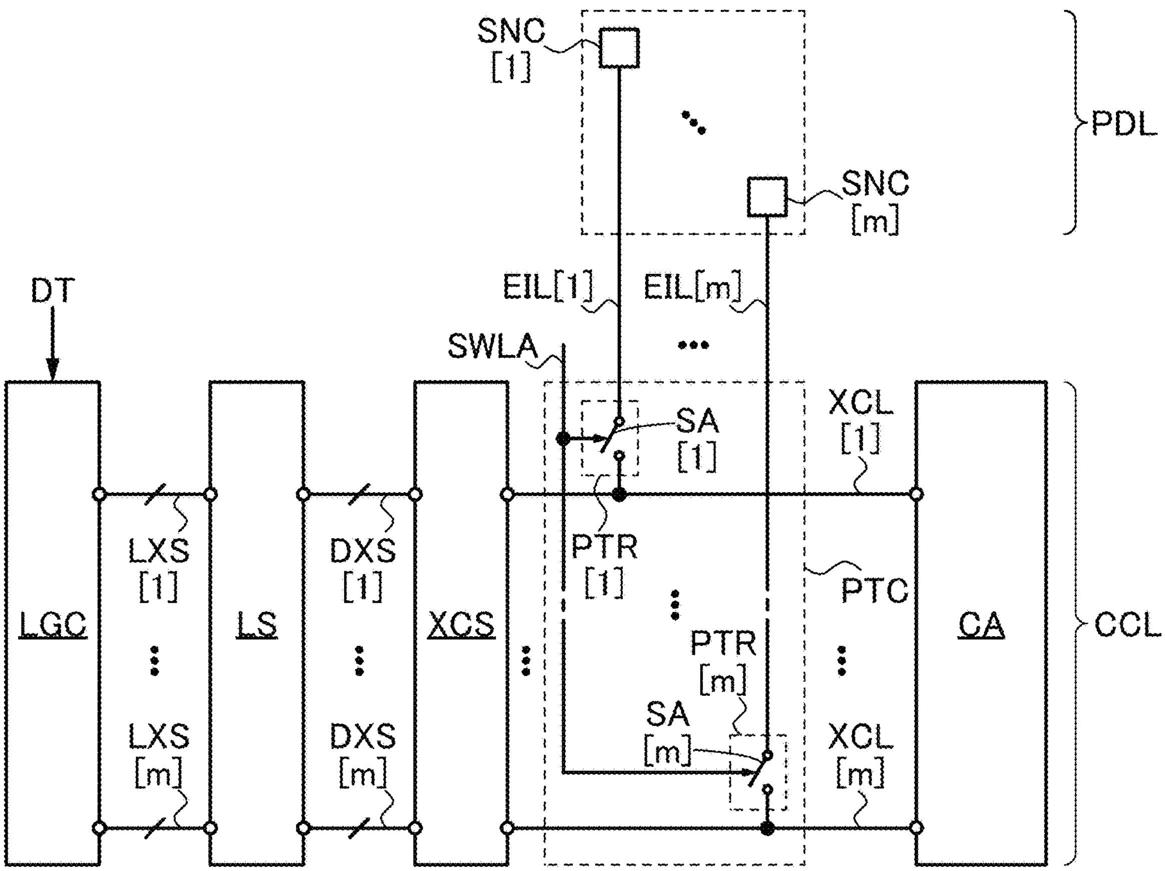
FIG. 21A is a block diagram illustrating a structure example of a semiconductor device.

A circuit configuration example illustrated in FIG. 21A illustrates a circuit LGC and a circuit LS for transmitting a signal corresponding to the second data to the circuit XCS. Note that FIG. 21A also illustrates the circuit XCS, the circuit PTC and the cell array CA included in the layer CCL, and the sensor SNC[1] to the sensor SNC[m] included in the layer PDL to show the connection with the circuit LGC and the circuit LS. In FIG. 21A, the circuit LGC and the circuit LS are included in the layer CCL, for example. The circuit configuration illustrated in FIG. 21A can increase the degree of freedom in current input from the wiring XCL[1] to the wiring XCL[m] to the cell array CA. Increasing the degree of freedom in current allows current corresponding to the reference data or the second data described in Embodiment 1 to be set in accordance with circumstances, for example.

The circuit LGC is electrically connected to the circuit LS through a wiring LXS[1] to a wiring LXS[m]. The circuit LS is electrically connected to the circuit XCS through a wiring DXS[1] to a wiring DXS[m].

As described in Embodiment 1, the circuit XCS has a function of supplying current with the amount corresponding to the reference data or current with the amount corresponding to the second data to each of the wiring XCL[1] to the wiring XCL[m]. The circuit XCS can have the configuration of the circuit XCS illustrated in FIG. 8C, for example.

In particular, in the case where the circuit XCS illustrated in FIG. 8C is used as the circuit XCS, the amount of current flowing through one of the wiring XCL[1] to the wiring XCL[m] is determined in accordance with a combination of potentials input to the wiring DX[1] to the wiring DX[L] of the circuit XCSa electrically connected to the one of the wirings. Here, in FIG. 21A, the wiring DXS[1] is the wiring DX[1] to the wiring DX[L] of the circuit XCSa electrically connected to the wiring XCL[1], and the wiring DXS[m] is the wiring DX[1] to the wiring DX[L] of the circuit XCSa electrically connected to the wiring XCL[m]. That is, one of the wiring DXS[1] to the wiring DXS[m] can be a bus wiring for transmitting a digital signal.

The circuit LS has a function of level-shifting an input potential to a desired potential, for example. Specifically, the circuit LS level-shifts a potential input from the wiring LXS[1] to a desired potential and outputs the level-shifted potential to the wiring DXS[1]. Thus, the number of wirings LXS[1] can be equal to the number of wirings DXS[1]. Similarly, the circuit LS level-shifts a potential input from the wiring LXS[m] to a desired potential and outputs the level-shifted potential to the wiring DXS[m]. Thus, the number of wirings LXS[m] can be equal to the number of wirings DXS[m]. One of the wiring LXS[1] to the wiring LXS[m] can be a bus wiring for transmitting a digital signal.

The circuit LGC has a function of sequentially retaining data DT input to the circuit LGC and outputting the data DT to the wiring LXS[1] to the wiring LXS[m] sequentially or concurrently in parallel at a desired timing, for example. The data DT here can be, for example, the reference data or the second data input to the wiring XCL[1] to the wiring XCL[m]. That is, in order to supply the current with the amount corresponding to the reference data or the current with the amount corresponding to the second data to the wiring XCL[1] to the wiring XCL[m] illustrated in FIG. 21A, the circuit LGC retains the reference data or the second data received from the outside of the circuit LGC and outputs the reference data or the second data to each of the wiring LXS[1] to the wiring LXS[m] at a predetermined timing. Note that a specific configuration example of the circuit LGC will be described later.

Note that in the case where a level shift of voltage output from the circuit LGC is not necessary, the circuit LS is not provided and the wiring LXS[1] to the wiring LXS[m] are electrically connected to the wiring DXS[1] to the wiring DXS[m], respectively, in the circuit configuration illustrated in FIG. 21A.

Figure 21B:
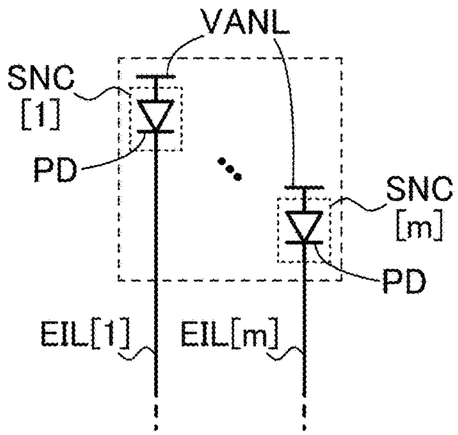
FIG. 21B and FIG. 21C are circuit diagrams each illustrating a configuration example of a circuit included in the semiconductor device.

Next, for example, described is a method for inputting current flowing from the wiring XCL[1] to the wiring XCL[m] to the cell array CA with the sensor SNC[1] to the sensor SNC[m] each of which has a structure of an optical sensor including the photodiode PD. Specifically, as illustrated in FIG. 21B, the sensors SNC included in the layer PDL each have a structure in which an input terminal of the photodiode PD is electrically connected to the wiring VANL, and an output terminal of the photodiode PD is electrically connected to the wiring EIL. Note that the wiring VANL functions as a wiring for supplying a constant voltage. The constant voltage can be a low-level potential, a ground potential, a negative potential, or the like. Thus, when the photodiode PD is irradiated with light, current flows from the output terminal of the photodiode PD to the wiring VANL through its input terminal.

As one example of a method for inputting current from the wiring XCL[i] to the cell array CA in the circuit configuration in FIG. 21A in which the sensor SNC[1] to the sensor SNC[m] have the same structures as those in FIG. 21B, a mode in which the switch SA[1] to the switch SA[m] are turned off is given. When the switch SA[1] to the switch SA[m] are turned off, current generated in the photodiode PD is not supplied to the wiring XCL[i]. Thus, current flowing from the wiring XCL[i] to the cell array CA can be current corresponding to the reference data or the second data generated by the circuit XCS.

As one example of a mode for inputting current from the wiring XCL[i] to the cell array CA in the circuit configuration in FIG. 21A in which the sensor SNC[1] to the sensor SNC[m] have the same structures as those in FIG. 21B, a mode in which the switch SA[1] to the switch SA[m] are turned on is given. When the switch SA[1] to the switch SA[m] are turned on, current flowing from the wiring XCL[i] to the cell array CA can be difference current between a desired current generated by the circuit XCS and current generated in the photodiode PD.

Figure 21C:
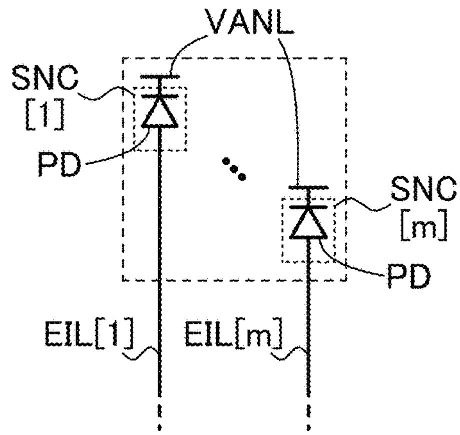

In the circuit configuration of the sensor SNC[1] to the sensor SNC[m], the input terminal and the output terminal of each of the photodiodes PD in FIG. 21B may be replaced with each other. Specifically, as illustrated in FIG. 21C, the sensor SNC has a structure in which the input terminal of the photodiode PD is electrically connected to the wiring EIL, and the output terminal of the photodiode PD is electrically connected to the wiring VANL. In that case, the constant voltage applied from the wiring VANL is a high-level potential or the like. Thus, when the photodiode PD is irradiated with light, current flows from the output terminal to the input terminal of the photodiode PD. Accordingly, when the photodiode PD is irradiated with light, current flows from the wiring VANL to the input terminal of the photodiode PD through its output terminal.

As one example of a mode for inputting current from the wiring XCL[i] to the cell array CA in the circuit configuration in FIG. 21A in which the sensor SNC[1] to the sensor SNC[m] have the same structures as those in FIG. 21C, a mode in which the switch SA[1] to the switch SA[m] are turned off is given. With the operation in this mode, current generated in the photodiode PD can stop flowing to the wiring XCL[i], and current flowing from the wiring XCL[i] to the cell array CA can be current corresponding to the reference data or the second data generated by the circuit XCS, as in the case where the switch SA[1] to the switch SA[m] are turned off in the circuit configuration in FIG. 21A in which the sensor SNC[1] to the sensor SNC[m] have the same structures as those in FIG. 21B.

As one example of a mode for inputting current from the wiring XCL[i] to the cell array CA in the circuit configuration in FIG. 21A in which the sensor SNC[1] to the sensor SNC[m] have the same structures as those in FIG. 21C, a mode in which the switch SA[1] to the switch SA[m] are turned on is given. When the switch SA[1] to the switch SA[m] are turned on with the operation in this mode, current flowing from the wiring XCL[i] to the cell array CA can be the sum of a desired current generated by the circuit XCS and current generated in the photodiode PD.

In that case, the amount of current flowing from the circuit XCS to the wiring XCL[i] is set to 0, i.e., the circuit XCS stops supplying current to a wiring SCL[i], so that only current generated in the photodiode PD can flow from the wiring XCL[i] to the cell array CA.

As described above, when the semiconductor device SDV or the like in FIG. 1 or FIG. 3 has the circuit configuration in FIG. 21A, the degree of freedom in current input to the cell array CA from the wiring XCL[1] to the wiring XCL[m] can be increased, which allows the current corresponding to the reference data or the second data described in Embodiment 1 to be set in accordance with circumstances.

When the reference data or the second data is input to the cell array CA and current generated by the sensor SNC is not used, the switch SA[1] to the switch SA[m] of the circuit PTC are turned off so that the current corresponding to the reference data or the second data is generated by the circuit XCS, and the current is supplied to the wiring XCL[1] to the wiring XCL[m].

For another example, when the reference data or the second data is input to the cell array CA and the current generated by the sensor SNC is used, the switch SA[1] to the switch SA[m] of the circuit PTC are turned on so that the current generated by the sensor SNC is supplied to the wiring XCL[1] to the wiring XCL[m]. Note that depending on circumstances, the amount of current flowing from the circuit XCS to the wiring XCL[1] to the wiring XCL[m] may be a desired amount or 0.

In particular, in the case where the semiconductor device SDV having the circuit configuration in FIG. 21A executes the operation example in the timing chart in FIG. 12, for example, the switch SA[1] to the switch SA[m] included in the circuit PTC are turned off in the period from Time T13 to Time T14 and the period from Time T17 to Time T19 so that the current corresponding to the reference data is supplied from the circuit XCS to the wiring XCL[1] to the wiring XCL[m]. In the period from Time T22 to Time T23, for example, the amount of current flowing from the circuit XCS to the wiring XCL[1] to the wiring XCL[m] is set to 0 and the switch SA[1] to the switch SA[m] included in the circuit PTC are turned on so that the current generated by the sensor SNC is supplied to the wiring XCL[1] to the wiring XCL[m].

When the reference data or the second data is input to the cell array CA in the semiconductor device SDV having the circuit configuration in FIG. 21A, for example, the sum of (or difference current between) the current generated by the circuit XCS and the current generated by the sensor SNC may be supplied as the reference data or the second data to the wiring XCL[1] to the wiring XCL[m]. Here, with the sensor SNC having a structure including the photodiode PD illustrated in FIG. 21B and FIG. 21C, current flowing to the wiring XCL[1] to the wiring XCL[m] corresponds to data captured by the photodiode PD. At this time, correction data for the captured data is generated as the current flowing from the circuit XCS to the wiring XCL[1] to the wiring XCL[m], so that current corresponding to the captured data subjected to correction can be supplied to the cell array CA from the wiring XCL[1] to the wiring XCL[m]. Examples of the correction include tone correction for adjusting the strength of a particular color.

Configuration Example of Circuit LGC

Next, a specific configuration example of the circuit LGC is described. When one of the wiring LXS[1] to the wiring LXS[m] is a bus wiring for transmitting a digital signal, the data DT (the reference data and the second data) input to the circuit LGC are preferably input as digital signals. The data DT is treated as a digital signal, so that the circuit LGC can be formed as a logic circuit.

Figure 22A:
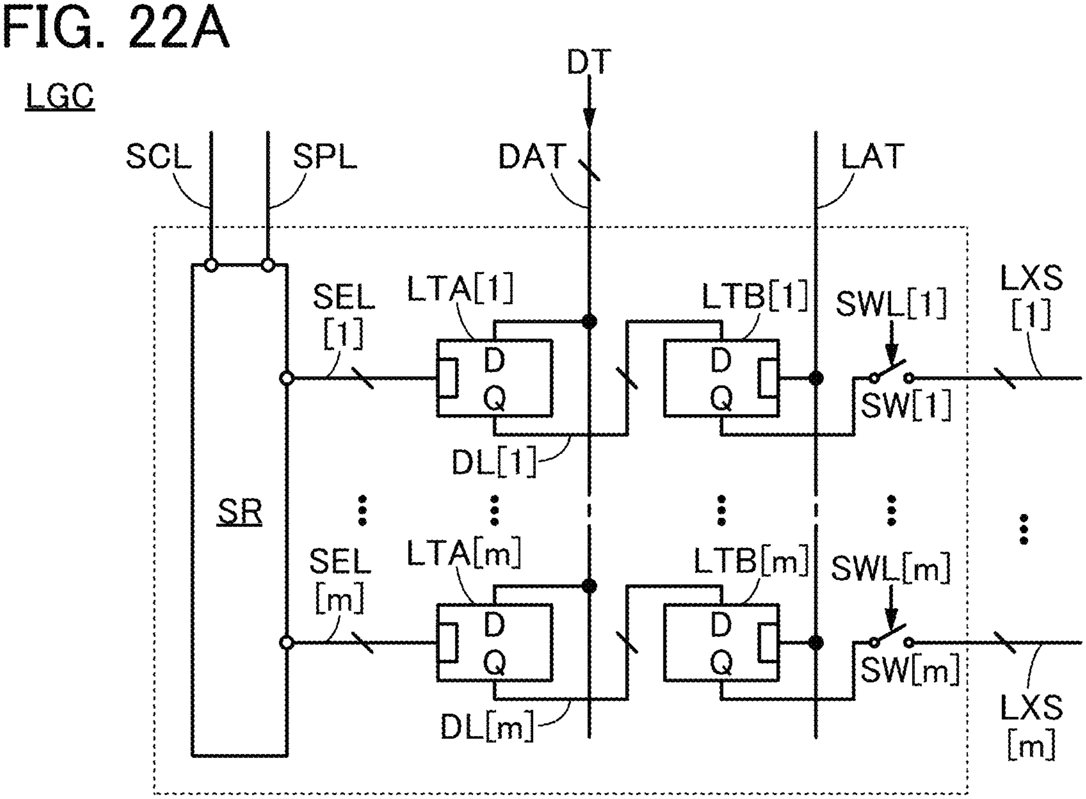
FIG. 22A and FIG. 22B are block diagrams each illustrating a configuration example of a circuit included in a semiconductor device.

When the circuit LGC is formed as a logic circuit, the circuit LGC can have a circuit configuration illustrated in FIG. 22A, for example. The circuit LGC illustrated in FIG. 22A includes a shift register SR, a latch circuit LTA[1] to a latch circuit LTA[m], a latch circuit LTB[1] to a latch circuit LTB[m], and a switch SW[1] to a switch SW[m].

The shift register SR is electrically connected to a wiring SPL, a wiring SCL, and a wiring SEL[1] to a wiring SEL[m].

The wiring SEL[1] to the wiring SEL[m] are electrically connected to control terminals (sometimes referred to as clock input terminals, enable signal input terminals, or the like) of the latch circuit LTA[1] to the latch circuit LTA[m], and a wiring LAT is electrically connected to control terminals of the latch circuit LTB[1] to the latch circuit LTB[m]. Input terminals D of the latch circuit LTA[1] to the latch circuit LTA[m] are electrically connected to a wiring DAT, and output terminals Q of the latch circuit LTA[1] to the latch circuit LTA[m] are electrically connected to a wiring DL[1] to a wiring DL[m]. Input terminals D of the latch circuit LTB[1] to the latch circuit LTB[m] are electrically connected to the wiring DL[1] to the wiring DL[m], and output terminals Q of the latch circuit LTB[1] to the latch circuit LTB[m] are electrically connected to first terminals of the switch SW[1] to the switch SW[m]. Second terminals of the switch SW[1] to the switch SW[m] are electrically connected to the wiring LXS[1] to the wiring LXS[m], and control terminals of the switch SW[1] to the switch SW[m] are electrically connected to a wiring SWL[1] to a wiring SWL[m].

As the switch SW[1] to the switch SW[m], an electrical switch such as an analog switch or a transistor can be used, for example. For another example, a mechanical switch may be used as the switch SW[1] to the switch SW[m]. In the case where a transistor is used as the switch SW[1] to the switch SW[m], the transistor can be an OS transistor or a Si transistor.

The switch SW[1] to the switch SW[m] illustrated in FIG. 22A are turned on when a high-level potential is input to their control terminals and are turned off when a low-level potential is input to their control terminals.

The wiring SWL[1] to the wiring SWL[m] function as wirings for switching between the conduction state and the non-conduction state of the switch SW[1] to the switch SW[m], for example.

The wiring SPL functions as a wiring for transmitting a start pulse signal to the shift register SR, for example.

The wiring SCL functions as a wiring for transmitting a clock signal to the shift register SR, for example.

The wiring DAT functions as a wiring for transmitting the data DT to the circuit LGC, for example.

The wiring SEL[1] to the wiring SEL[m], the wiring DL[1] to the wiring DL[m], and the wiring DAT can each be a wiring for transmitting a digital signal. Therefore, the wiring SEL[1] to the wiring SEL[m], the wiring DL[1] to the wiring DL[m], and the wiring DAT can each be a bus wiring. The wiring SWL can also be a bus wiring.

The shift register SR has a function of sequentially outputting a high-level potential to the wiring SEL[1] to the wiring SEL[m] in accordance with changes in potentials input to the wiring SPL and the wiring SCL, for example. Note that the shift register SR cannot output a high-level potential to two or more of the wiring SEL[1] to the wiring SEL[m]; thus, when any one of the wiring SEL[1] to the wiring SEL[m] outputs a high-level potential, the other wirings of the wiring SEL[1] to the wiring SEL[m] output a low-level potential.

For example, when a potential rises from a low-level potential to a high-level potential with a clock signal from the wiring SCL while a high-level potential is being input as a start pulse signal to the wiring SPL, the wiring SEL[1] outputs a high-level potential. Subsequently, when a potential rises from a low-level potential to a high-level potential again with the clock signal from the wiring SCL while a low-level potential is being input to the wiring SPL, the wiring SEL[1] outputs a low-level potential and the wiring SEL[2] outputs a high-level potential. After that, when the third potential rising occurs with the clock signal from the wiring SCL while a low-level potential is being input to the wiring SPL, for example, the wiring SEL[1] and the wiring SEL[2] output a low-level potential and the wiring SEL[3] outputs a high-level potential.

As described above, the shift register SR can sequentially output a high-level potential to one of the wiring SEL[1] to the wiring SEL[m] and a low-level potential to the other wirings every time the potential rising due to the clock signal from the wiring SCL occurs.

The latch circuit LTA[1] to the latch circuit LTA[m] and the latch circuit LTB[1] to the latch circuit LTB[m] are each brought into an enable state when a high-level potential is input to their control terminals, for example, to have a function of retaining data that has been input to the input terminal D and outputting the data to the output terminal Q. Note that the latch circuit LTA[1] to the latch circuit LTA[m] and the latch circuit LTB[1] to the latch circuit LTB[m] are each brought into a disable state when a low-level potential is input to their control terminals, for example, so that the data that has been input to the input terminal D is not retained and the data is not output to the output terminal Q.

Here, an operation example of the circuit LGC is described.

Figure 23A:
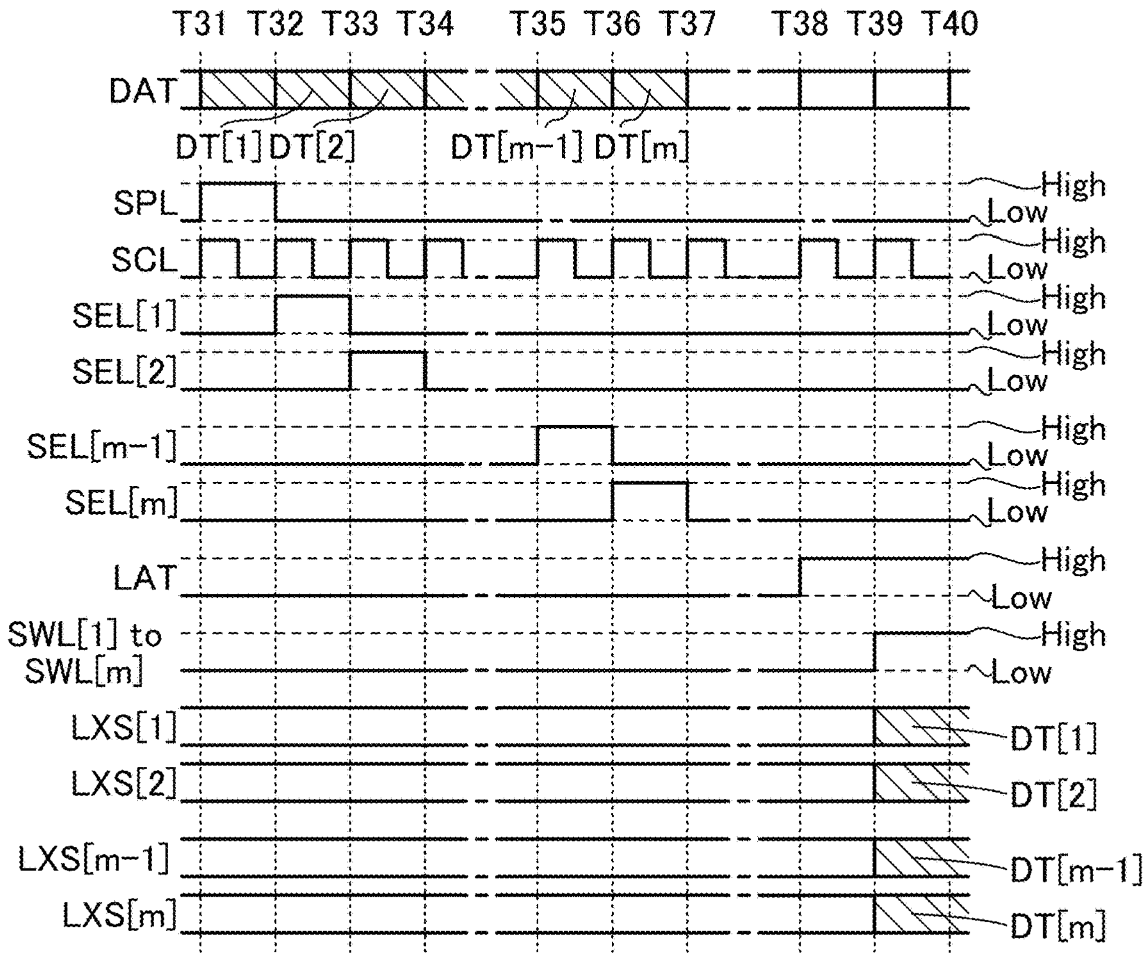
FIG. 23A and FIG. 23B are timing charts each showing operation examples of a semiconductor device.

FIG. 23A is a timing chart showing an operation example of the circuit LGC. The timing chart shows potential changes in the wiring SPL, the wiring SCL, the wiring SEL[1], the wiring SEL[2], the wiring SEL[m−1], the wiring SEL[m], the wiring SWL[1] to the wiring SWL[m], and the wiring LAT, and also shows data that have been input to the wiring DAT, the wiring LXS[1], the wiring LXS[2], the wiring LXS[3], the wiring LXS[m−1], and the wiring LXS[m]. Note that as for the wiring SPL, the wiring SCL, the wiring SEL[1], the wiring SEL[2], the wiring SEL[m−1], the wiring SEL[m], the wiring SWL[1] to the wiring SWL[m], and the wiring LAT, a high-level potential is shown as High and a low-level potential is shown as Low.

The timing chart in FIG. 23A shows an operation example in which the circuit LGC concurrently outputs the data DT to the wiring LXS[1] to the wiring LXS[m] in the period from Time T31 to Time T40 and the vicinity thereof. This operation example is conducted in the period from Time T21 to Time T23 in the timing chart in FIG. 12, for example.

In the period before Time T31, a low-level potential has been input to the wiring LAT, and a low-level potential has been input to the wiring SWL[1] to the wiring SWL[m]. In addition, the shift register SR has output a low-level potential to the wiring SEL[1] to the wiring SEL[m].

In the period from Time T31 to Time T32, a high-level potential is input as a start pulse signal to the wiring SPL. A pulse voltage is input as a clock signal to the wiring SCL. When the rising of the pulse voltage as the clock signal is input, the shift register SR obtains a high-level potential as the start pulse signal to be input to the wiring SPL.

In the period from Time T32 to Time T33, data DT[1] is input to the wiring DAT. The pulse voltage is input as the clock signal to the wiring SCL for the second time. When the second rising of the pulse voltage as the clock signal is input, the shift register SR outputs a high-level potential to the wiring SEL[1].

At this time, the latch circuit LTA[1] is brought into an enable state and thus retains the data DT[1] that has been input to the input terminal D and outputs the data DT[1] to the output terminal Q. The data DT[1] is input to the input terminal D of the latch circuit LTB[1]. Since a low-level potential has been input to the control terminal of the latch circuit LTB[1] at this time, the latch circuit LTB[1] does not retain the data DT[1] input to the input terminal D of the latch circuit LTB[1] and does not output the data DT[1] input to the output terminal Q of the latch circuit LTB[1].

In the period from Time T33 to Time T34, data DT[2] is input to the wiring DAT. The pulse voltage is input as the clock signal to the wiring SCL for the third time. When the third rising of the pulse voltage as the clock signal is input, the shift register SR outputs a low-level potential to the wiring SEL[1] and a high-level potential to the wiring SEL[2].

At this time, the latch circuit LTA[1] is brought into a disable state and thus does not retain the data DT[2] input to the input terminal D of the latch circuit LTA[1]. The latch circuit LTA[1] has retained the data DT[1] continuously since before Time T33, and outputs the data DT[1] from the output terminal Q.

In addition, the latch circuit LTA[2] is brought into an enable state and thus retains the data DT[2] that has been input to the input terminal D and outputs the data DT[2] to the output terminal Q. The data DT[2] is input to the input terminal D of the latch circuit LTB[2]. Since a low-level potential has been input to the control terminal of the latch circuit LTB[2] at this time, the latch circuit LTB[2] does not retain the data DT[2] input to the input terminal D of the latch circuit LTB[2] and does not output the data DT[2] input to the output terminal Q of the latch circuit LTB[2].

In the period from Time T34 to Time T35, data DT[3] to DT[m−2] are sequentially input to the wiring DAT, and the shift register SR sequentially inputs a high-level potential to the wiring SEL[3] to the wiring SEL[m−2]. Thus, the data DT[3] to the data DT[m−2] are respectively retained in the latch LTA[3] to the latch circuit LTA[m−2]. The data DT[3] to the data DT[m−2] are output from the output terminals Q of the latch LTA[3] to the latch circuit LTA[m−2], respectively.

In the period from Time T35 to Time T36, data DT[m−1] is input to the wiring DAT. The pulse voltage is input as the clock signal to the wiring SCL for the m-th time. When the m-th rising of the pulse voltage as the clock signal is input, the shift register SR outputs a low-level potential to the wiring SEL[m−2] and a high-level potential to the wiring SEL[m−1].

At this time, the latch circuit LTA[m−2] is brought into a disable state and thus does not retain the data DT[m−1] input to the input terminal D of the latch circuit LTA[m−2]. The latch circuit LTA[m−2] has retained the data DT[m−2] continuously since before Time T35, and outputs the data DT[m−2] from the output terminal Q.

In addition, the latch circuit LTA[m−1] is brought into an enable state and thus retains the data DT[m−1] that has been input to the input terminal D and outputs the data DT[m−1] to the output terminal Q. The data DT[m−1] is input to the input terminal D of the latch circuit LTB[m−1]. Since a low-level potential has been input to the control terminal of the latch circuit LTB[m−1] at this time, the latch circuit LTB[m−1] does not retain the data DT[m−1] input to the input terminal D of the latch circuit LTB[m−1] and does not output the data DT[m−1] input to the output terminal Q of the latch circuit LTB[m−1].

In the period from Time T36 to Time T37, data DT[m] is input to the wiring DAT. The pulse voltage is input as the clock signal to the wiring SCL for the m+1-th time. When the m+1-th rising of the pulse voltage as the clock signal is input, the shift register SR outputs a low-level potential to the wiring SEL[m−1] and a high-level potential to the wiring SEL[m].

At this time, the latch circuit LTA[m−1] is brought into a disable state and thus does not retain the data DT[m] input to the input terminal D of the latch circuit LTA[m−1]. The latch circuit LTA[m−1] has retained the data DT[m−1] continuously since before Time T36, and outputs the data DT[m−1] from the output terminal Q.

In addition, the latch circuit LTA[m] is brought into an enable state and thus retains the data DT[m] that has been input to the input terminal D and outputs the data DT[m] to the output terminal Q. The data DT[m] is input to the input terminal D of the latch circuit LTB[m]. Since a low-level potential has been input to the control terminal of the latch circuit LTB[m] at this time, the latch circuit LTB[m] does not retain the data DT[m] input to the input terminal D of the latch circuit LTB[m] and does not output the data DT[m] input to the output terminal Q of the latch circuit LTB[m].

In the period from Time T38 to Time T39, a high-level potential is input to the wiring LAT. Thus, a high-level potential is input to the control terminals of the latch circuit LTB[1] to the latch circuit LTB[m], so that the latch circuit LTB[1] to the latch circuit LTB[m] are each brought into an enable state. Accordingly, the latch circuit LTB[1] to the latch circuit LTB[m] retain the data DT[1] to the data DT[m] that have been input to their input terminals D, and output the data DT[1] to the data DT[m] from their output terminals Q.

In the period from Time T39 to Time T40, a high-level potential is input to the wiring SWL[1] to the wiring SWL[m]. Thus, the switch SW[1] to the switch SW[m] are turned on, so that electrical continuity is established between the output terminals Q of the latch circuit LTB[1] to the latch circuit LTB[m] and the wiring LXS[1] to the wiring LXS [m]. Accordingly, the circuit LGC can concurrently output the data DT[1] to the data DT[m] from the wiring LXS[1] to the wiring LXS[m].

By the operation in the timing chart shown in FIG. 23A, the circuit LGC can output the data DT[1] to the data DT[m], which are sequentially input to the circuit LGC, to the wiring LXS[1] to the wiring LXS[m] concurrently in parallel. This allows desired currents to be concurrently supplied to the wiring XCL[1] to the wiring XCL[m] of the arithmetic circuit illustrated in FIG. 21 in the period from Time T21 to Time T23 in the timing chart in FIG. 12, for example.

Figure 23B:
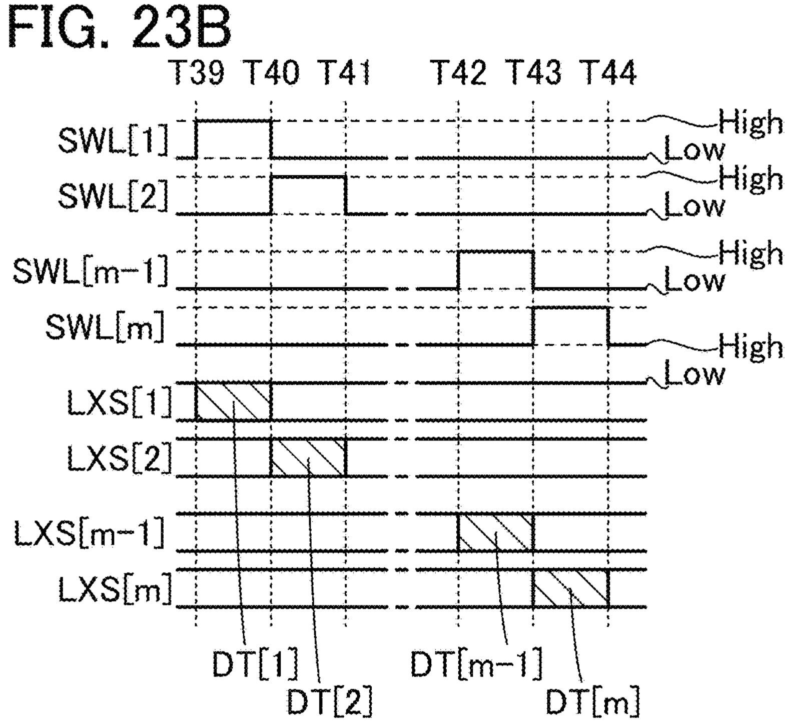

Although the timing chart in FIG. 23A shows the operation example in which the circuit LGC concurrently outputs the data DT to the wiring LXS[1] to the wiring LXS[m], the circuit LGC may sequentially output the data DT to the wiring LXS[1] to the wiring LXS[m]. A timing chart in FIG. 23B shows an operation example in which the circuit LGC sequentially outputs the data DT to the wiring LXS[1] to the wiring LXS[m]. As operation before Time T39 in the timing chart in FIG. 23, the operation example in the timing chart in FIG. 23A from before Time T31 to Time T39 is assumed to be conducted.

The timing chart in FIG. 23B shows potential changes in the wiring SWL[1], the wiring SWL[2], the wiring SWL [m−1], and the wiring SWL[m], and also shows data that have been input to the wiring LXS[1], the wiring LXS[2], the wiring LXS[m−1], and the wiring LXS[m]. Note that as for the wiring SWL[1], the wiring SWL[2], the wiring SWL[m−1], and the wiring SWL[m], a high-level potential is shown as High and a low-level potential is shown as Low.

In the period from Time T39 to Time T40, a high-level potential is input to the wiring SWL[1]. Thus, the switch SW[1] is turned on to establish electrical continuity between the output terminal Q of the latch circuit LTB[1] and the wiring LXS[1], so that the data DT[1] output from the output terminal Q of the latch circuit LTB is transmitted to the wiring LXS[1].

In the period from Time T40 to Time T41, a low-level potential is input to the wiring SWL[1] and a high-level potential is input to the wiring SWL[2]. Thus, the switch SW[1] is turned off and the switch SW[2] is turned on. Electrical continuity is not established between the output terminal Q of the latch circuit LTB[1] and the wiring LXS[1], so that the data DT[1] output from the output terminal Q of the latch circuit LTB is not transmitted to the wiring LXS[1]. In addition, electrical continuity is established between the output terminal Q of the latch circuit LTB[2] and the wiring LXS[2], so that the data DT[2] output from the output terminal Q of the latch circuit LTB is transmitted to the wiring LXS[2].

In the period from Time T41 to Time T42, a high-level potential is input to the wiring SWL[3] to the wiring SWL[m−2] sequentially, so that the switch SW[3] to the switch SW[m−2] are sequentially turned on. Thus, the data DT[3] to the data DT[m−2] that have been output to the output terminals Q of the latch circuit LTB[3] to the latch circuit LTB[m−2] are sequentially output from the wiring LXS[3] to the wiring LXS[m−2], respectively.

In the period from Time T42 to Time T43, a low-level potential is input to the wiring SWL[m−2] and a high-level potential is input to the wiring SWL[m−1]. Thus, the switch SW[m−2] is turned off and the switch SW[m−1] is turned on. Electrical continuity is not established between the output terminal Q of the latch circuit LTB[m−2] and the wiring LXS[m−2], so that the data DT[m−2] output from the output terminal Q of the latch circuit LTB is not transmitted to the wiring LXS[m−2]. In addition, electrical continuity is established between the output terminal Q of the latch circuit LTB[m−1] and the wiring LXS[m−1], so that the data DT[m−1] output from the output terminal Q of the latch circuit LTB is transmitted to the wiring LXS[m−1].

In the period from Time T43 to Time T44, a low-level potential is input to the wiring SWL[m−1] and a high-level potential is input to the wiring SWL[m]. Thus, the switch SW[m−1] is turned off and the switch SW[m] is turned on. Electrical continuity is not established between the output terminal Q of the latch circuit LTB[m−1] and the wiring LXS[m−1], so that the data DT[m−1] output from the output terminal Q of the latch circuit LTB is not transmitted to the wiring LXS[m−1]. In addition, electrical continuity is established between the output terminal Q of the latch circuit LTB[m] and the wiring LXS[m], so that the data DT[m] output from the output terminal Q of the latch circuit LTB is transmitted to the wiring LXS[m].

The circuit LGC performs the operation until Time T39 in the timing chart shown in FIG. 23A and then performs the operation in the timing chart shown in FIG. 23B, whereby the data DT[1] to the data DT[m], which are sequentially input to the circuit LGC, can be sequentially output to the wiring LXS[1] to the wiring LXS[m].

Although the timing chart shown in FIG. 23B shows the operation example in which the switch SWL[1] to the switch SWL[m] are sequentially turned on to output the data DT[1] to the data DT[m] to the wiring LXS[1] to the wiring LXS[m] sequentially, operation may be employed in which one of the switch SWL[1] to the switch SWL[m] is selected to be turned on so that the data DT is output to a wiring selected from the wiring LXS[1] to the wiring LXS[m].

With the above-described operation example, a desired current can be supplied to any one of the wiring XCL[1] to the wiring XCL[m] of the arithmetic circuit MAC1 in FIG. 7 in the period from Time T13 to Time T15 or the period from Time T17 to Time T19 in the timing chart in FIG. 12, for example.

Figure 22B:
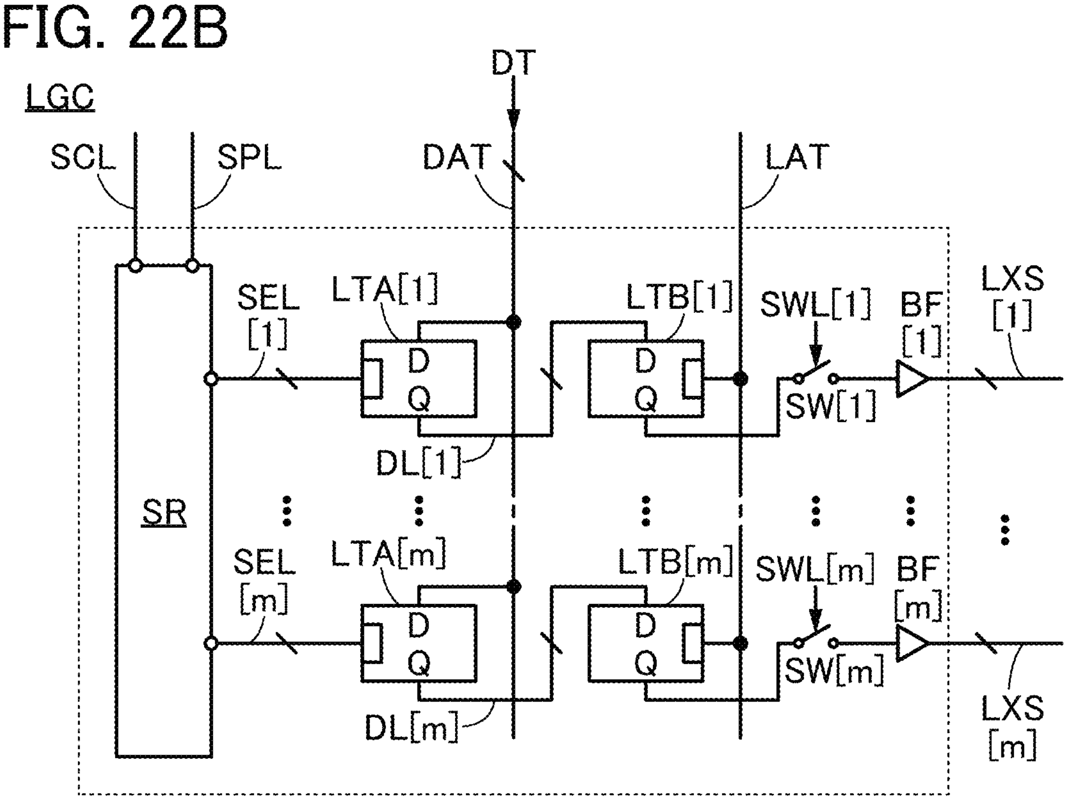

The circuit LGC in FIG. 21A included in the semiconductor device of one embodiment of the present invention is not limited to the circuit LGC illustrated in FIG. 22A and may have a circuit configuration changed from that of the circuit LGC in FIG. 22A depending on circumstances. For example, the circuit LGC in FIG. 22A may have a configuration in which buffer circuits are provided between the switch SW[1] to the switch SW[m] and the wiring LXS[1] to the wiring LXS[m], respectively, illustrated in FIG. 22A. The circuit LGC illustrated in FIG. 22B has a configuration in which a buffer circuit BF[1] to a buffer circuit BF[m] are provided between the switch SW[1] to the switch SW[m] and the wiring LXS[1] to the wiring LXS[m], respectively. Providing the buffer circuit BF[1] to the buffer circuit BF[m] in the circuit LGC as illustrated in FIG. 22B can stabilize electric signals (potentials) output from the circuit LGC to the wiring LXS[1] to the wiring LXS[m].

With the use of the arithmetic circuit illustrated in FIG. 18A, current generated by the circuit XCS and/or current generated by the sensor SNC can be input as current corresponding to the reference data or the second data to the cell array CA.

Note that this embodiment can be combined with any of the other embodiments described in this specification as appropriate.

EMBODIMENT 4

A hierarchical neural network is described in this embodiment. Arithmetic operation of a hierarchical neural network can be performed using the semiconductor device described in the above embodiments.

<Hierarchical Neural Network>

Figure 24A:
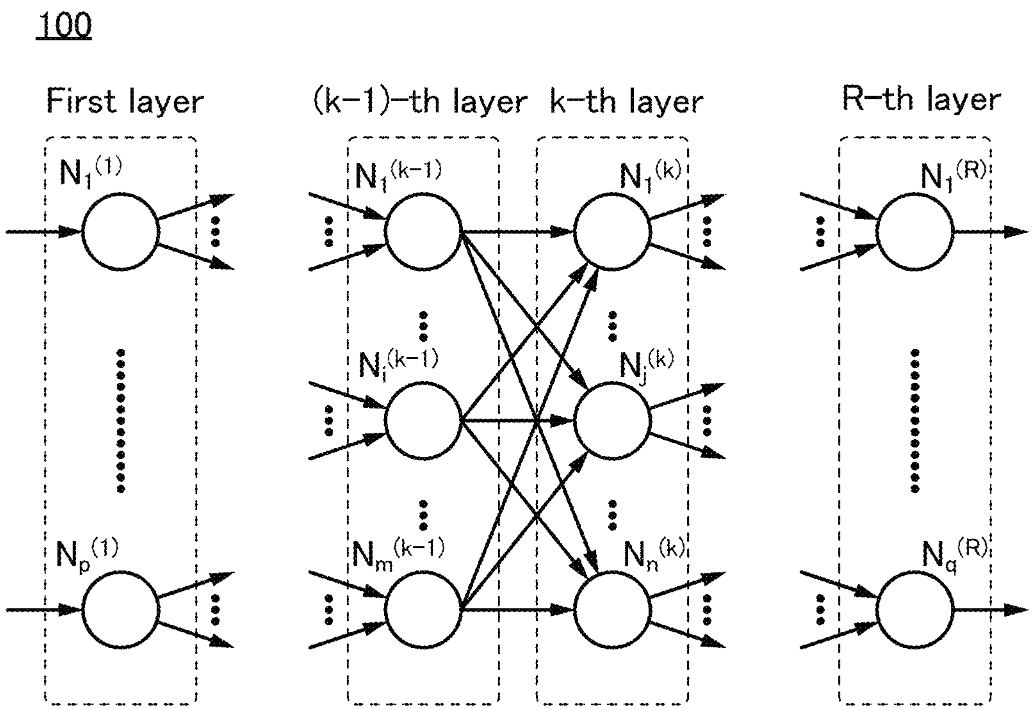
FIG. 24A and FIG. 24B are diagrams illustrating a hierarchical neural network.

A hierarchical neural network includes one input layer, one or a plurality of intermediate layers (hidden layers), and one output layer, for example, and is configured with a total of at least three layers. A hierarchical neural network 100 illustrated in FIG. 24A is one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 24A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 24A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

FIG. 24A illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{1}$), the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made focusing on the neuron $N_j^{(k)}$ in the k-th layer.

Figure 24B:
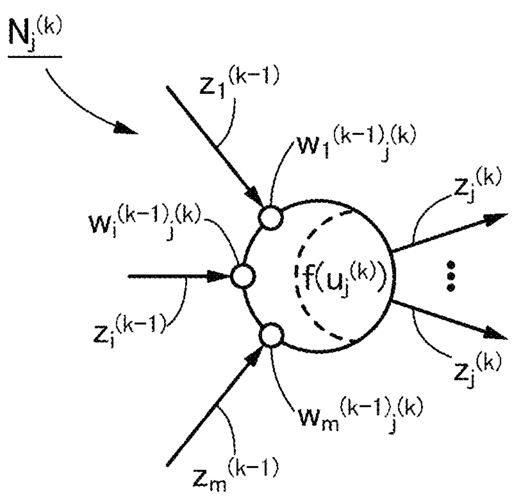

FIG. 24B illustrates the neuron $N_j^{(k)}$ in the k-th layer, signals input to the neuron $N_j^{(k)}$ and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter, referred to as a weight coefficient) of the synapse that connects the neurons to each other. In the neural network 100, a signal output from a neuron in one layer is multiplied by the corresponding weight coefficient and then is input to a neuron in the subsequent layer. When i is an integer greater than or equal to 1 and less than or equal to m and the weight coefficient of the synapse between the neuron $N_f^{(k-1)}$ in the (k−1)-th layer and the neuron $N_j^{(k)}$ in the k-th layer is $w_i^{(k-1)}{}_j^{(k)}$, a signal input to the neuron $N_j^{(k)}$ in the k-th layer can be expressed by Formula (4.1).

[Formula 20]

$$w_i^{(k-1)}{}_j^{(k)} \cdot z_i^{(k-1)} \tag{4.1}$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by the respective weight coefficients ($w_1^{(k-1)}{}_j^{(k)}$ to $w_m^{(k-1)}{}_j^{(k)}$). Then, $w_1^{(k-1)}{}_j^{(k)} \cdot z_1^{(k-1)}$ to $w_m^{(k-1)}{}_j^{(k)} \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (4.2).

[Formula 21]

$$u_j^{(k)} = \sum_{i=1}^{m} w_i^{(k-1)}{}_j^{(k)} \cdot z_i^{(k-1)} \tag{4.2}$$

In addition, a bias may be added to the product-sum result of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ of the neurons. When the bias is denoted by b, Formula (4.2) can be rewritten to the following formula.

[Formula 22]

$$u_j^{(k)} = \sum_{i=1}^{m} w_i^{(k-1)}{}_j^{(k)} \cdot z_i^{(k-1)} + b \tag{4.3}$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 23]

$$z_j^{(k)} = f(u_j^{(k)}) \tag{4.4}$$

A function $f(u_j^{(k)})$ is an activation function in a hierarchical neural network, and a step function, a linear ramp function, a sigmoid function, or the like can be used. Note that the activation function may be the same or different among all neurons. In addition, the neuron activation function may be the same or different between the layers.

Signals output from the neurons in the layers, the weight coefficients w, or the bias b may be an analog value or a digital value. For example, a binary or ternary digital value may be used. A value having a larger number of bits may be used. In the case of an analog value, for example, a linear ramp function or a sigmoid function is used as the activation function. In the case of a binary digital value, for example, a step function with an output of −1 or 1 or an output of 0 or 1 is used. Alternatively, the neurons in the layers may each output a ternary or higher-level signal; in this case, a step function with an output of three or more values, for example, an output of −1, 0, or 1 or an output of 0, 1, or 2 is used as an activation function. Furthermore, as an activation function for outputting five values, a step function with an output of −2, −1, 0, 1, or 2 may be used, for example. Using a digital value as at least one of the signals output from the neurons in the layers, the weight coefficients w, and the bias b enables a reduction in the circuit scale, a reduction in power consumption, or an increase in operation speed, for example. Furthermore, the use of an analog value as at least one of the signals output from the neurons in the layers, the weight coefficients w, and the bias b can improve the arithmetic operation accuracy.

The neural network 100 performs operation in which by input of an input signal to the first layer (the input layer), output signals are sequentially generated in the layers from the first layer (the input layer) to the last layer (the output layer) according to Formula (4.1), Formula (4.2) (or Formula (4.3)), and Formula (4.4) on the basis of the signals input from the previous layers, and the output signals are output to the subsequent layers. The signal output from the last layer (the output layer) corresponds to the calculation results of the neural network 100.

In the case where the arithmetic circuit MAC1 described in Embodiment 1 is used as the above-described hidden layer, the weight coefficient $w_{s[k-1]}{}^{(k-1)}{}_{s[k]}{}^{(k)}$(s[k−1] is an integer greater than or equal to 1 and less than or equal to m, and s[k] is an integer greater than or equal to 1 and less than or equal to n) is used as the first data, the current amount corresponding to the first data is stored in the cells IM in the same column sequentially, the output signal $z_{s[k-1]}{}^{(k-1)}$ from the neuron $N_{s[k-1]}{}^{(k-1)}$ in the (k−1)-th layer is used as the second data, and the current with the amount corresponding to the second data is made to flow from the circuit XCS to the wiring XCL in each row, so that the product-sum of the first data and the second data can be obtained from the current amount Is input to the converter circuit ITRZ. In addition, the value of the activation function is obtained using the value of the sum of products, so that the value of the activation function can be the output signal $z_{s[k]}{}^{(k)}$ of the neuron $N_{s[k]}{}^{(k)}$ in the k-th layer.

In the case where the arithmetic circuit MAC1 described in Embodiment 1 is used as the above-described output layer, the weight coefficient $w_{s[R-1]}{}^{(R-1)}{}_{s[R]}{}^{(R)}$(s[R−1] is an integer greater than or equal to 1, and s[R] is an integer greater than or equal to 1 and less than or equal to q) is used as the first data, the current amount corresponding to the first data is stored in the cells IM in the same column sequentially, the output signal $z_{s[R-1]}{}^{(R-1)}$ from the neuron $N_{s[R-1]}{}^{(R-1)}$ in the (R−1)-th layer is used as the second data, and the current with the amount corresponding to the second data is made to flow from the circuit XCS to the wiring XCL in each row, so that the sum of products of the first data and the second data can be obtained from the current amount Is input to the converter circuit ITRZ. In addition, the value of the activation function is obtained using the value of the sum of products, so that the value of the activation function can be the output signal $z_{s[R]}{}^{(R)}$ of the neuron $N_{s[R]}{}^{(R)}$ in the R-th layer.

Note that the input layer described in this embodiment may function as a buffer circuit that outputs an input signal to the second layer.

When the arithmetic circuit MAC2 described in Embodiment 2 in which the converter circuit ITRZD4 in FIG. 16 is used as the converter circuit ITRZD[j] is used as the above-described hidden layer, the weight coefficient $w_{s[k-1]}{}^{(k-1)}{}_{s[k]}{}^{(k)}$ is used as the first data, the current amount corresponding to the first data is stored in the cells IM and the cells IMr of the circuit CES in the same row sequentially, the output signal $z_{s[k-1]}{}^{(k-1)}$ from the neuron $N_{s[k-1]}{}^{(k-1)}$ in the (k−1)-th layer is used as the second data, and the current with the amount corresponding to the second data is made to flow from the circuit XCS to the wiring XCL in each row, whereby the value of the activation function corresponding to the sum of products of the first data and the second data can be obtained from the current amounts Is and $I_{S_r}$ input to the converter circuit ITRZD4. That is, the value can be the output signal $z_{s[k]}{}^{(k)}$ from the neuron $N_{s[k]}{}^{(k)}$ in the k-th layer. Since the converter circuit ITRZD4 outputs the current amount corresponding to the value, the output signal $z_{s[k]}{}^{(k)}$ from the neuron $N_{s[k]}{}^{(k)}$ in the k-th layer input to the (k+1)-th layer can be current, for example. That is, in the case where the arithmetic circuit MAC2 is used as the (k+1)-th hidden layer, the output signal $z_{s[k]}{}^{(k)}$ from the neuron $N_{s[k]}{}^{(k)}$ in the k-th layer input to the wiring XCL of the arithmetic circuit MAC2 is not generated in the circuit XCS but can be current output from the converter circuit ITRZD4 of the arithmetic circuit MAC2 of the k-th hidden layer.

Figure 25:
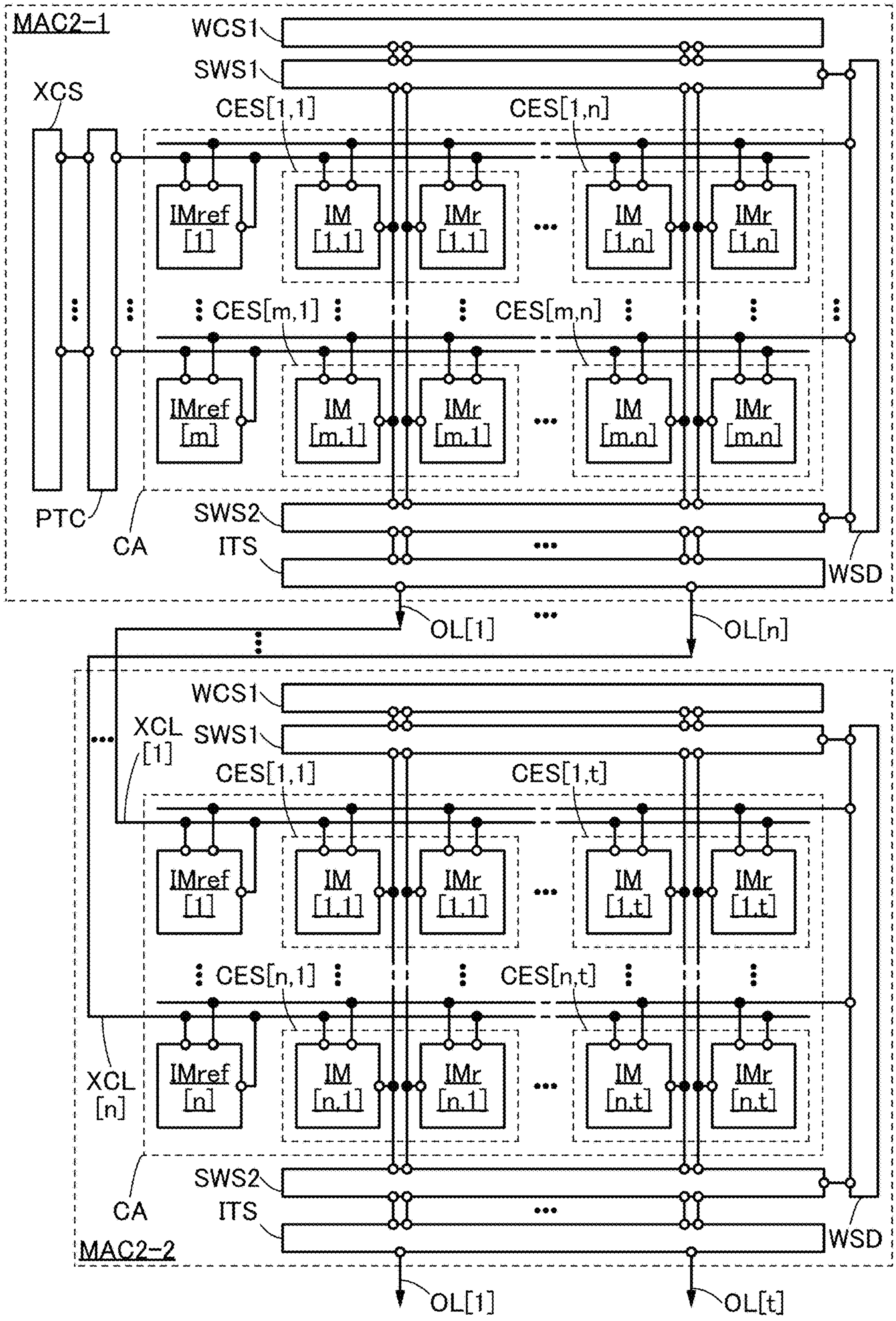
FIG. 25 is a block diagram illustrating a structure example of a semiconductor device.

Specifically, with the use of the arithmetic circuit illustrated in FIG. 25, the arithmetic operation of the hierarchical neural network can be performed. The arithmetic circuit in FIG. 25 includes, for example, an arithmetic circuit MAC2-1 having a configuration similar to that of the arithmetic circuit MAC2 in FIG. 14 and an arithmetic circuit MAC2-2 having a configuration in which the circuit XCS and the circuit PTC in the arithmetic circuit MAC2 in FIG. 14 are not provided. In the cell array CA of the arithmetic circuit MAC2-1, m×n circuits CES are arranged in a matrix, and in the cell array CA of the arithmetic circuit MAC2-2, n×t circuits CES (t is an integer greater than or equal to 1) are arranged in a matrix. The wiring OL[1] to the wiring OL[n] of the arithmetic circuit MAC2-1 are electrically connected to the wiring XCL[1] to the wiring XCL[n] of the arithmetic circuit MAC2-2, respectively.

For example, in the arithmetic circuit MAC2-1 in FIG. 25, the weight coefficient between the neurons in the (k−1)-th layer and the neurons in the k-th layer is used as the first data and retained in the circuit CES[1,1] to the circuit CES[m,n] of the cell array CA, the output signal $z_{s[k-1]}{}^{(k-1)}$ from the neuron $N_{s[k-1]}{}^{(k-1)}$ in the (k−1)-th layer is used as the second data, and the current with the amount corresponding to the second data is made to flow from the circuit XCS to the wiring XCL in each row, whereby the output signals $z_1^{(k)}$ to $z_n^{(k)}$ of the neuron $N_1^{(k)}$ to the neuron $N_n^{(k)}$ in the k-th layer can be output from the wiring OL[1] to the wiring OL[n]. The values of the output signals $z_1^{(k)}$ to $z_n^{(k)}$ can be represented as the amounts of current output from the converter circuit ITRZD4[1] to the converter circuit ITRZD4[n].

In the arithmetic circuit MAC2-2 in FIG. 25, the weight coefficient between the neurons in the k-th layer and the neurons in the (k+1)-th layer is used as the first data and retained in the circuit CES[1,1] to the circuit CES[n,t] of the cell array CA, and the amount of current flowing through the wiring XCL in each row, i.e., the output signals $z_1^{(k)}$ to $z_n^{(k)}$ from the neuron $N_1^{(k)}$ to the neuron $N_n^{(k)}$ in the k-th layer, is used as the second data, whereby the wiring OL[s[k+1]] (here, s[k+1] is an integer greater than or equal to 1 and less than or equal to t) can output the output signal $z_{s[k+1]}^{(k+1)}$ of the neuron $N_{s[k+1]}^{(k+1)}$ in the (k+1)-th layer.

As described in Embodiment 2, any one of the converter circuits ITRZD4 in FIG. 16, FIG. 17A, and FIG. 18A to FIG. 18C is used as the converter circuit ITRZD4[1] to the converter circuit ITRZD4[n] of the arithmetic circuit MAC2-1 in FIG. 25, whereby the converter circuit ITRZD4 [1] to the converter circuit ITRZD4[n] function as ReLU functions. Thus, when the result of the product-sum operation in the circuit CES[1,j] to the circuit CES[m,j] is "negative", the amount of current flowing from the converter circuit ITRZD4 to the wiring OL[j] is preferably ideally 0. However, in some actual cases, a minute amount of current flows from the converter circuit ITRZD4 to the wiring OL[j], or a minute amount of current flows from the wiring OL[j] to the converter circuit ITRZD4.

Figure 26:
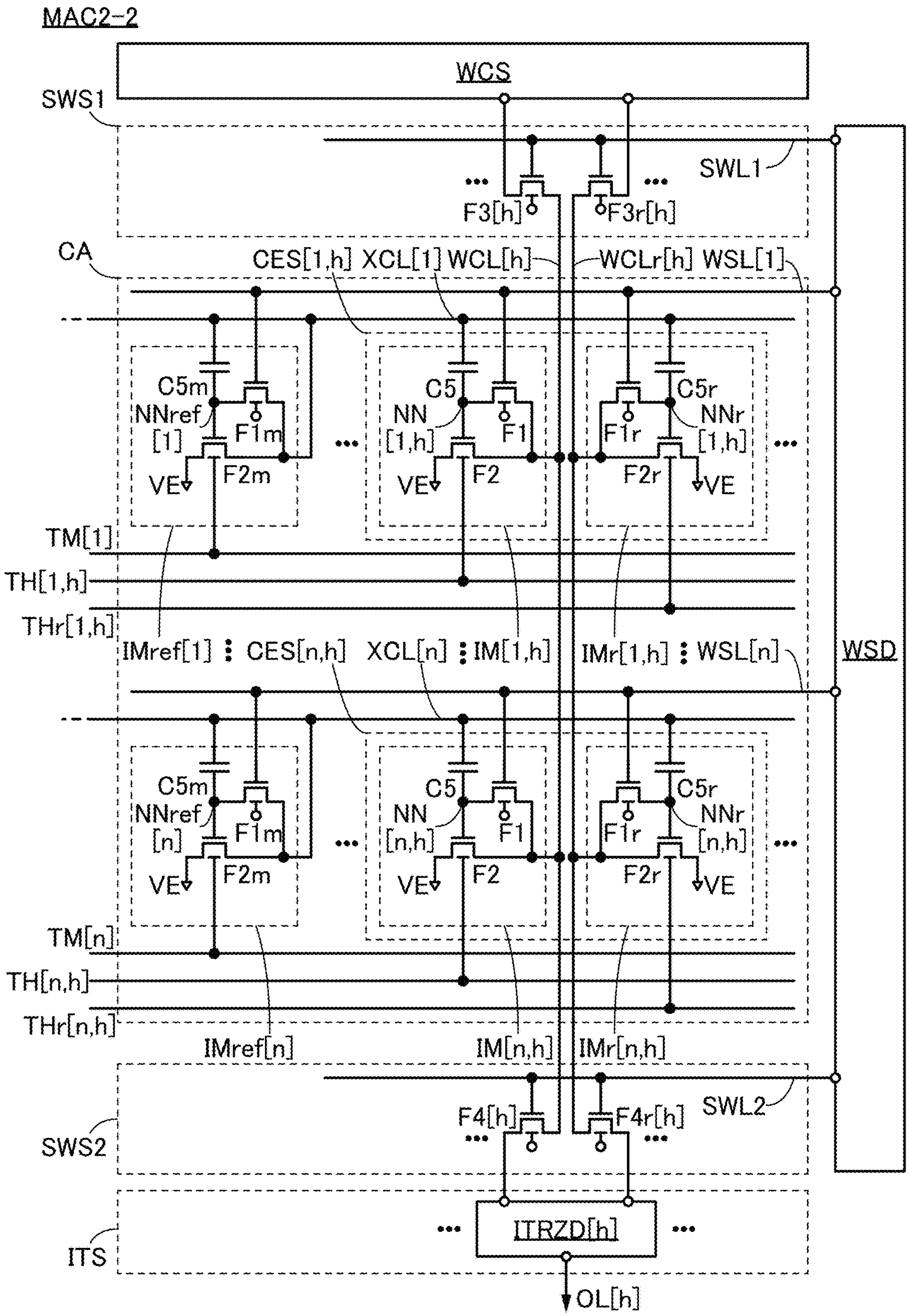
FIG. 26 is a block diagram illustrating a structure example of a semiconductor device.

Accordingly, FIG. 26 illustrates a configuration example of the arithmetic circuit MAC2-2 for properly performing arithmetic operation in the subsequent layers of the hierarchical neural network. The arithmetic circuit MAC2-2 illustrated in FIG. 26 has a configuration in which the circuits CES arranged in a matrix of m×n in the cell array CA in the arithmetic circuit MAC2 in FIG. 14 are changed to those arranged in a matrix of n×t and the circuit XCS is not provided. Since the circuits CES in the cell array CA of the arithmetic circuit MAC2-2 are arranged in a matrix of n×t, the values of the coordinates and the like in the square brackets such as [ ] with the reference numerals of the wirings, the circuits, and the like illustrated in FIG. 26 are also changed.

FIG. 26 illustrates an example of a circuit configuration of the arithmetic circuit MAC2-2 in which a wiring TM[1], a wiring TM[n], a wiring TH[1,*h*] (h is an integer greater than or equal to 1 and less than or equal to t), a wiring TH[n,h], a wiring THr[1,*h*], and a wiring THr[n,h] are provided in the arithmetic circuit MAC2-2. In the arithmetic circuit MAC2-2 in FIG. 26, the wiring TM[1] is electrically connected to the back gate of the transistor F2*m* in the cell IMref[1], the wiring TM[n] is electrically connected to the back gate of the transistor F2*m* in the cell IMref[n], the wiring TH[1,*h*] is electrically connected to the back gate of the transistor F2 in the cell IM[1,*h*], the wiring THr[1,*h*] is electrically connected to the back gate of the transistor F2*r* in the cell IMr[1,*h*], the wiring TH[n,h] is electrically connected to the back gate of the transistor F2 in the cell IM[n,h], and the wiring THr[n,h] is electrically connected to the back gate of the transistor F2*r* in the cell IMr[n,h].

A low-level potential is supplied to the wiring TM[1], the wiring TM[n], the wiring TH[1,*h*], the wiring TH[n,h], the wiring THr[1,*h*], and the wiring THr[n,h], whereby the threshold voltages of the transistors whose back gates are electrically connected to these wirings can be increased. This can prevent a minute amount of current flowing through the wiring OL of the arithmetic circuit MAC2-1 from flowing to the wiring VE through the cell IMref of the arithmetic circuit MAC2-2. That is, the output characteristics of the converter circuit ITRZD4[1] to the converter circuit ITRZD4[n] can be close to ReLU functions. Thus, the arithmetic operation in the subsequent layer of the hierarchical neural network can be performed properly.

For example, the configuration of the arithmetic circuit MAC2-2 in FIG. 26 can be used for the arithmetic circuit MAC2-1 in FIG. 25. With such a configuration, the threshold voltages of the transistor F2, the transistor F2*r*, and the transistor F2*m* included in the arithmetic circuit MAC2-1 can be changed, as in the arithmetic circuit MAC2-2.

FIG. 26 illustrates the wiring TM[1], the wiring TM[n], the wiring TH[1,*h*], the wiring TH[n,h], the wiring THr[1,*h*], and the wiring THr[n,h]; however, the arithmetic circuit MAC2-2 in FIG. 26 can have a configuration in which the wiring TM[1], the wiring TH[1,*h*], and the wiring THr[1,*h*] are combined into one wiring, and the wiring TM[n], the wiring TH[n,h], and the wiring THr[n,h] are combined into one wiring, for example.

With the arithmetic circuit in FIG. 25, as described above, the value of the output signal of the neuron (current amount) output from the arithmetic circuit MAC2-1 can be directly input to the arithmetic circuit MAC2-2, whereby arithmetic operation of a hierarchical neural network can be performed successively from the first layer, for example. The output signals output from the wiring OL[1] to the wiring OL[n] of the arithmetic circuit MAC2-1 need not be temporarily stored with an external circuit or the like; thus, a memory device for temporarily storing the signal need not be provided. That is, with the arithmetic circuit in FIG. 25, the circuit area can be reduced and power necessary for transmitting data to be temporarily stored can be reduced.

Note that this embodiment can be combined with any of the other embodiments described in this specification as appropriate.

EMBODIMENT 5

This embodiment describes structure examples of the semiconductor device described in the above embodiment and structure examples of transistors that can be used in the semiconductor device described in the above embodiment.

Structure Example of Semiconductor Device

Figure 27:
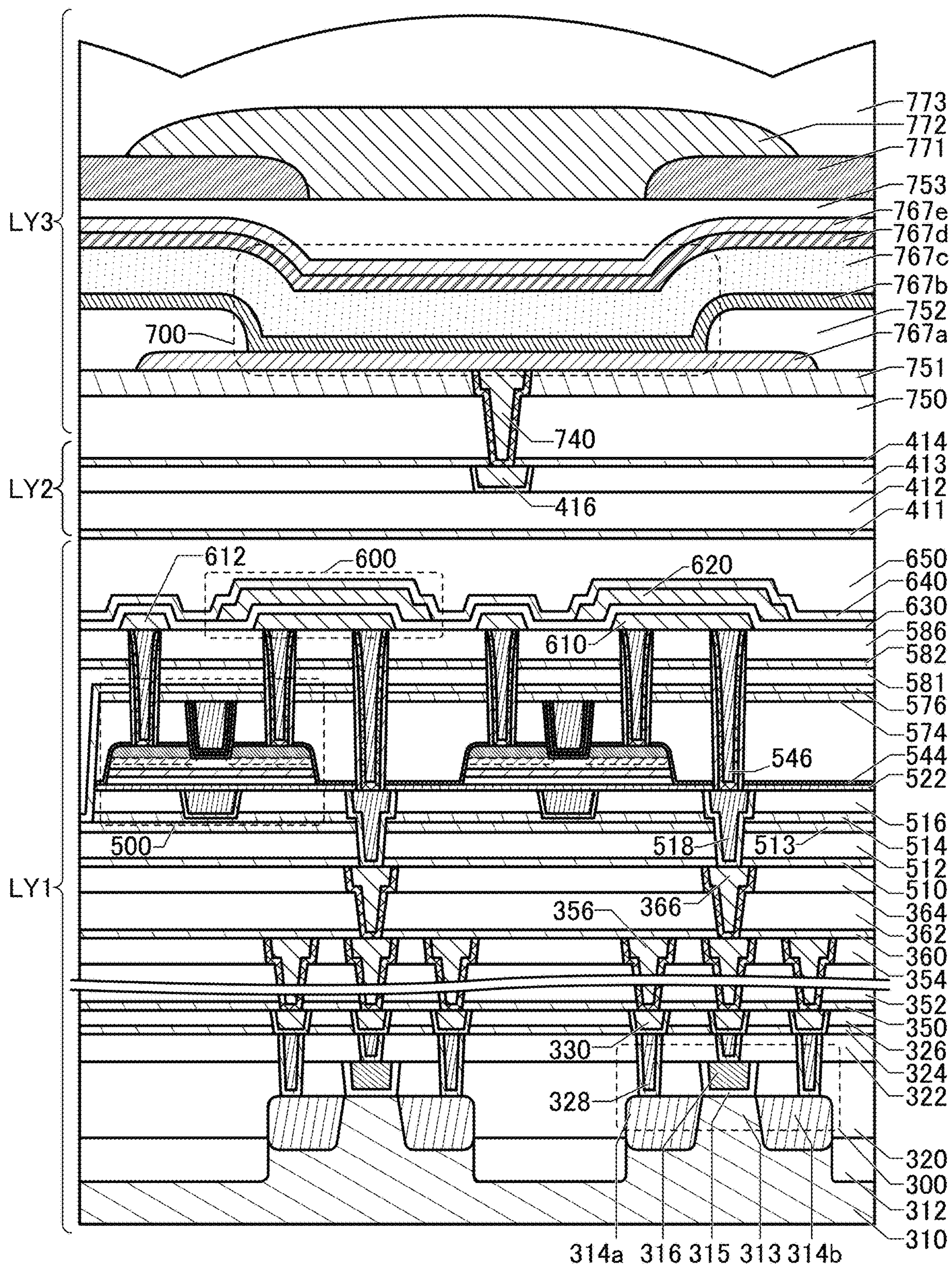
FIG. 27 is a schematic cross-sectional view illustrating a structure example of a semiconductor device.
Figure 29A:
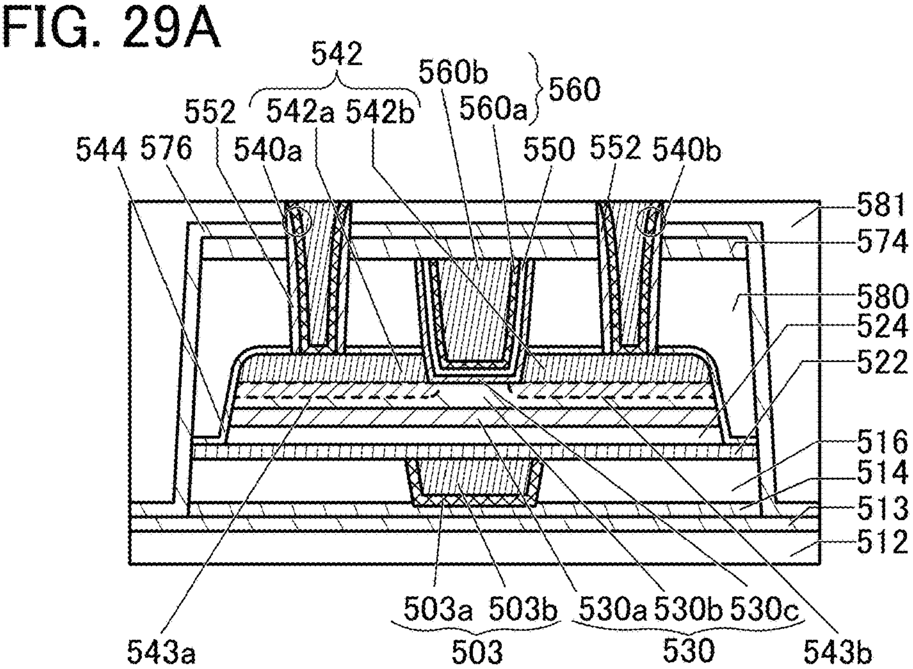
FIG. 29A to FIG. 29C are schematic cross-sectional views illustrating structure examples of transistors.
Figure 29B:
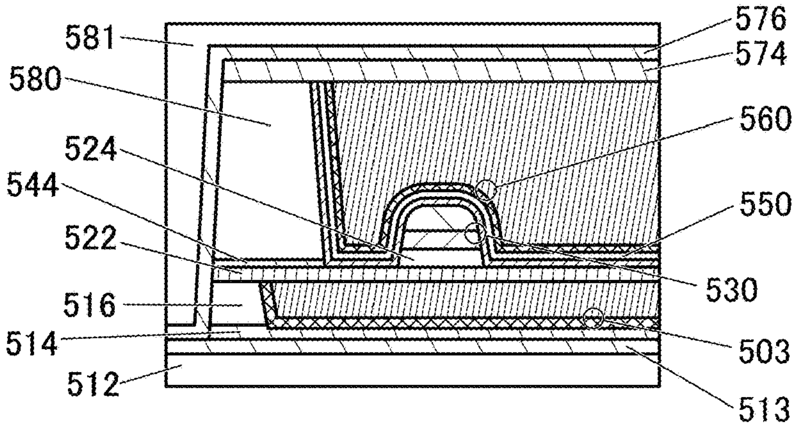
Figure 29C:
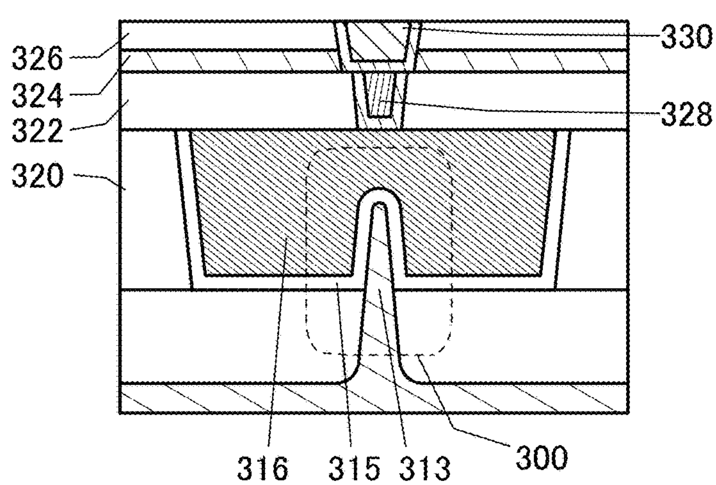

FIG. 27 illustrates an example of a structure in which a photoelectric conversion element is used as the photodiode in the sensor SNC in the semiconductor device SDV described in Embodiment 1. Specifically, the semiconductor device illustrated in FIG. 27 includes a layer LY1, a layer LY2, and a layer LY3, and the layer LY1 includes a transistor 300, a transistor 500, and a capacitor 600, and the layer LY3 includes a photoelectric conversion element 700. FIG. 29A is a cross-sectional view of the transistor 500 in the channel length direction, FIG. 29B is a cross-sectional view of the transistor 500 in the channel width direction, and FIG. 29C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as a transistor included in a semiconductor device, for example, the arithmetic circuit MAC1, the arithmetic circuit MAC1A, the arithmetic circuit MAC2, the arithmetic circuit MAC3A, the arithmetic circuit MAC3B, or the like described in the above embodiments, whereby a semiconductor device whose operating performance is less likely to degrade even at high temperatures can be obtained. In particular, by utilizing the feature of a low off-state current, the transistor 500 can be used as the transistor F1 and the transistor F1*m*, in which case potentials written to the cell IM, the cell IMref, and the like can be retained for a long time.

First, the layer LY1 is described. For example, the circuit included in the layer CCL of the semiconductor device SDV in FIG. 1 can be formed in the layer LY1. In the layer LY1, for example, the circuits included in the layer CCL and the layer PHL of the semiconductor device in FIG. 3 can be formed.

Note that in this specification and the like, the layer LY1 is sometimes rephrased as a circuit layer or a structure body, for example.

The transistor 500 is provided above the transistor 300, and the capacitor 600 is provided above the transistor 300 and the transistor 500, for example. The photoelectric conversion element 700 is provided above the capacitor 600, for example. The capacitor 600 can be used as the capacitor or the like included in the arithmetic circuit MAC1, the arithmetic circuit MAC1A, the arithmetic circuit MAC2, the arithmetic circuit MAC3A, the arithmetic circuit MAC3B, or the like described in the above embodiment. Note that depending on a circuit configuration, the capacitor 600 illustrated in FIG. 27 is not necessarily provided.

The transistor 300 is provided on a substrate 310 and includes an element isolation layer 312, a conductor 316, an insulator 315, a semiconductor region 313 that is part of the substrate 310, and a low-resistance region 314*a* and a low-resistance region 314*b* functioning as a source region and a drain region. Note that the transistor 300 can be used as, for example, the transistors or the like included in the arithmetic circuit MAC1, the arithmetic circuit MAC1A, the arithmetic circuit MAC2, the arithmetic circuit MAC3A, the arithmetic circuit MAC3B, or the like described in the above embodiment. Specifically, the transistor 300 can be used as a transistor included in the operational amplifier OP1 or the like included in the converter circuit ITRZ1 to the converter circuit ITRZ3 in FIG. 10A and FIG. 10B, for example. Note that FIG. 27 illustrates a structure in which a gate of the transistor 300 is electrically connected to one of a source and a drain of the transistor 500 through a pair of electrodes of the capacitor 600; however, depending on the configurations of the arithmetic circuit MAC1, the arithmetic circuit MAC1A, the arithmetic circuit MAC2, the arithmetic circuit MAC3A, the arithmetic circuit MAC3B, and the like, a structure in which one of a source and a drain of the transistor 300 is electrically connected to one of the source and the drain of the transistor 500 through the pair of electrodes of the capacitor 600 may be employed, a structure in which one of the source and the drain of the transistor 300 is electrically connected to a gate of the transistor 500 through the pair of electrodes of the capacitor 600 may be employed, or a structure in which the terminals of the transistor 300 are not electrically connected to the terminals of the transistor 500 and the terminals of the capacitor 600 may be employed.

A semiconductor substrate (e.g., a single crystal substrate or a silicon substrate) is preferably used as the substrate 310.

In the transistor 300, a top surface and a side surface in the channel width direction of the semiconductor region 313 are covered with the conductor 316 with the insulator 315 therebetween, as illustrated in FIG. 29C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314*a* and the low-resistance region 314*b* functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 28:
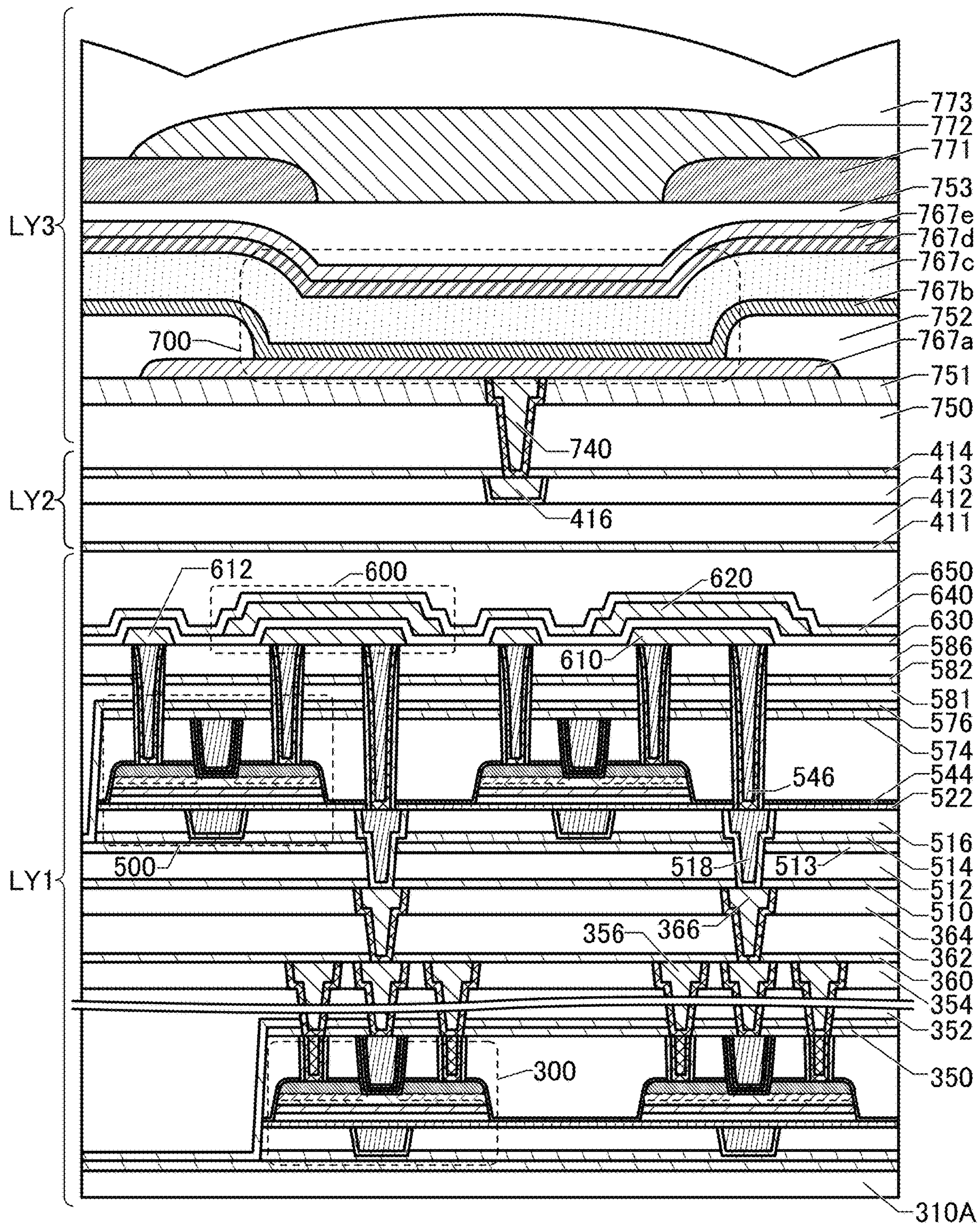
FIG. 28 is a schematic cross-sectional view illustrating a structure example of a semiconductor device.

Note that the transistor 300 illustrated in FIG. 27 is an example and the structure is not limited thereto; an appropriate transistor is used in accordance with a circuit configuration, a driving method, or the like. For example, the transistor 300 may have a planar structure instead of a FIN-type structure illustrated in FIG. 29C. For example, when a semiconductor device is configured as a single-polarity circuit using only OS transistors, the transistor 300 can have a structure similar to that of the transistor 500 using an oxide semiconductor, as illustrated in FIG. 28. Note that the details of the transistor 500 will be described later.

Note that in FIG. 28, the transistor 300 is provided over a substrate 310A; in this case, a semiconductor substrate may be used as the substrate 310A as in the case of the substrate 310 in the semiconductor device in FIG. 27. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. The examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

Over the transistor 300 illustrated in FIG. 27, an insulator 320, an insulator 322, an insulator 324, and an insulator 326 are sequentially stacked from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320 and the insulator 322. For example, atop surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 27, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are sequentially stacked over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. For example, like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and the conductor 366 is embedded to fill the opening portion. The conductor 366 may also be formed over part of the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 513, an insulator 514, and an insulator 516 are sequentially stacked over the insulator 364 and the conductor 366. A substance with a barrier property against oxygen, hydrogen, or the like is preferably used for any of the insulator 510, the insulator 512, the insulator 513, the insulator 514, and the insulator 516.

For example, as the insulator 510 and the insulator 514, it is preferable to use a film having a barrier property that prevents diffusion of hydrogen, impurities, or the like from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

In addition, the insulator 513 is preferably formed using a film having a barrier property that prevents diffusion of impurities such as water and hydrogen, like the insulator 510 and the insulator 514. In particular, in FIG. 27, the insulator 513 functions as a film sealing the transistor 500 with an insulator 576 described later. Thus, the insulator 513 is preferably formed using any of the materials usable for the insulator 576. Alternatively, the insulator 513 may be formed using any of the materials usable for the insulator 510 or the insulator 514.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

A conductor 518, a conductor included in the transistor 500 (e.g., a conductor 503 illustrated in FIG. 29A and FIG. 29B), and the like are embedded in the insulator 510, the insulator 512, the insulator 513, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 516.

As illustrated in FIG. 29A and FIG. 29B, the transistor 500 includes the conductor 503 positioned to be embedded in the insulator 514 and the insulator 516, an insulator 522 positioned over the insulator 516 and the conductor 503, an insulator 524 positioned over the insulator 522, an oxide 530*a* positioned over the insulator 524, an oxide 530*b* positioned over the oxide 530*a*, a conductor 542*a* and a conductor 542*b* positioned apart from each other over the oxide 530*b*, an insulator 580 that is positioned over the conductor 542*a* and the conductor 542*b* and is provided with an opening formed to overlap with a region between the conductor 542*a* and the conductor 542*b*, an oxide 530*c* positioned on a bottom surface and a side surface of the opening, an insulator 550 positioned on a formation surface of the oxide 530*c*, and a conductor 560 positioned on a formation surface of the insulator 550. Note that the conductor 542*a* and the conductor 542*b* are collectively referred to as a conductor 542 in this specification and the like.

As illustrated in FIG. 29A and FIG. 29B, an insulator 544 is preferably positioned between the insulator 580 and the oxide 530*a*, the oxide 530*b*, the conductor 542*a*, and the conductor 542*b*. In addition, as illustrated in FIG. 29A and FIG. 29B, the conductor 560 preferably includes a conductor 560*a* provided inside the insulator 550 and a conductor 560*b* provided to be embedded inside the conductor 560*a*. As illustrated in FIG. 29A and FIG. 29B, an insulator 574 is preferably positioned over the insulator 580, the conductor 560, and the insulator 550.

Hereinafter, the oxide 530*a*, the oxide 530*b*, and the oxide 530*c* may be collectively referred to as an oxide 530.

The transistor 500 having a structure in which the three layers of the oxide 530*a*, the oxide 530*b*, and the oxide 530*c* are stacked in the region where the channel is formed and its vicinity is illustrated; however, one embodiment of the present invention is not limited thereto. For example, a single-layer structure of the oxide 530*b*, a two-layer structure of the oxide 530*b* and the oxide 530*a*, a two-layer structure of the oxide 530*b* and the oxide 530*c*, or a stacked-layer structure of four or more layers may be employed. Furthermore, although the conductor 560 is illustrated to have a stacked-layer structure of two layers in the transistor 500, one embodiment of the present invention is not limited thereto. For example, the conductor 560 may have a single-layer structure or a stacked-layer structure of three or more layers. Moreover, the transistor 500 illustrated in FIG. 27, FIG. 29A, and FIG. 29B is an example and the structure is not limited thereto; an appropriate transistor can be used in accordance with a circuit configuration, a driving method, or the like.

Here, the conductor 560 functions as a gate electrode of the transistor, and the conductor 542*a* and the conductor 542*b* function as a source electrode and a drain electrode. As described above, the conductor 560 is formed to be embedded in an opening in the insulator 580 and the region sandwiched between the conductor 542*a* and the conductor 542*b*. The positions of the conductor 560, the conductor 542*a*, and the conductor 542*b* are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542*a* and the conductor 542*b* in a self-aligned manner, the conductor 560 includes neither a region overlapping with the conductor 542*a* nor the region overlapping with the conductor 542*b*. Thus, parasitic capacitance formed between the conductor 560 and each of the conductor 542*a* and the conductor 542*b* can be reduced. As a result, the transistor 500 can have increased switching speed and excellent frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503*a* is formed in contact with an inner wall of the opening in the insulator 514 and the insulator 516, and a conductor 503*b* is formed on the inner side. Although the transistor 500 having a structure in which the conductor 503*a* and the conductor 503*b* are stacked is illustrated, one embodiment of the present invention is not limited thereto. For example, the conductor 503 may be provided as a single layer or to have a stacked-layer structure of three or more layers.

Here, for the conductor 503*a*, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductor 503*a* has a function of inhibiting diffusion of oxygen, a reduction in conductivity of the conductor 503*b* due to oxidation can be inhibited.

When the conductor 503 also functions as a wiring, for the conductor 503*b*, it is preferable to use a conductive material that has high conductivity and contains tungsten, copper, or aluminum as its main component. In the case where the conductivity of the wiring can be kept high, the conductor 503*a* is not necessarily provided. Note that the conductor 503*b* is illustrated as a single layer but may have a stacked-layer structure, for example, a stack of any of the above conductive materials and titanium or titanium nitride.

The insulator 522 and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved. Note that in this specification and the like, an oxygen vacancy in a metal oxide is sometimes referred to as Vo.

A transistor using a metal oxide is likely to change its electrical characteristics when impurities or oxygen vacancies (Vo) exist in a region of the metal oxide where a channel is formed, which might degrade the reliability. In some cases, hydrogen in the vicinity of an oxygen vacancy (Vo) forms a defect that is an oxygen vacancy (Vo) into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be $H_2O$, and removed from the oxide 530 or an insulator near the oxide 530 in some cases. Part of hydrogen is diffused into or gettered (also referred to as gettering) by the conductor 542*a* and the conductor 542*b* in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator near the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

In the case where the insulator 524 includes an excess-oxygen region, it is preferable that the insulator 522 have a function of inhibiting diffusion of oxygen (e.g., an oxygen atom and an oxygen molecule) (or the above oxygen be less likely to pass through the insulator 522).

The insulator 522 preferably has a function of inhibiting diffusion of oxygen, impurities, or the like in which case oxygen contained in the oxide 530 is not diffused to the conductor 503 and the insulator 516 side. Furthermore, the conductor 503 can be inhibited from reacting with oxygen contained in the insulator 524 and/or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), for example. As miniaturization and high integration of transistors progress, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits, for example, release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

Note that in the transistor 500 in FIG. 29A and FIG. 29B, the insulator 522 and the insulator 524 are illustrated as the second gate insulating film having a stacked-layer structure of two layers; however, the second gate insulating film may be a single layer or may have a stacked-layer structure of three or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide that can be used as the oxide 530 is preferably a CAAC-OS (C-Axis Aligned Crystalline Oxide Semiconductor) or a CAC-OS (Cloud-Aligned Composite Oxide Semiconductor). Furthermore, an In—Ga oxide, an In—Zn oxide, an In oxide, or the like may be used as the oxide 530.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron serving as a carrier. Thus, a transistor using a metal oxide containing a large amount of hydrogen is likely to have normally-on characteristics. Moreover, hydrogen in a metal oxide is easily transferred by a stress such as heat or an electric field; thus, a large amount of hydrogen contained in a metal oxide might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to fill oxygen vacancies by supplying oxygen to the metal oxide (sometimes described as oxygen adding treatment) to obtain a metal oxide whose VoH is reduced enough. When a metal oxide in which impurities such as VoH are sufficiently reduced is used for a channel formation region of a transistor, stable electrical characteristics can be given.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, stable electrical characteristics can be given.

In the case where a metal oxide is used as the oxide 530, the metal oxide is an intrinsic (also referred to as I-type) or substantially intrinsic semiconductor that has a large band gap, and the carrier concentration of the metal oxide in the channel formation region is preferably lower than $1\times10^{18}$ cm$^{-3}$, further preferably lower than $1\times10^{17}$ cm$^{-3}$, still further preferably lower than $1\times10^{16}$ cm$^3$, yet further preferably lower than $1\times10^{13}$ cm$^3$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^3$.

In the case where a metal oxide is used as the oxide 530, contact between the oxide 530 and each of the conductor 542*a* and the conductor 542*b* may diffuse oxygen in the oxide 530 into the conductor 542*a* and the conductor 542*b*, resulting in oxidation of the conductor 542*a* and the conductor 542*b*. It is highly possible that oxidation of the conductor 542*a* and the conductor 542*b* lowers the conductivity of the conductor 542*a* and the conductor 542*b*. Note that diffusion of oxygen from the oxide 530 into the conductor 542*a* and the conductor 542*b* can be rephrased as absorption of oxygen in the oxide 530 by the conductor 542*a* and the conductor 542*b*.

When oxygen in the oxide 530 diffuses into the conductor 542*a* and the conductor 542*b*, a layer is sometimes formed between the conductor 542*a* and the oxide 530*b* and between the conductor 542*b* and the oxide 530*b*. The layer contains a larger amount of oxygen than the conductor 542*a* and the conductor 542*b* and thus presumably has an insulating property. In this case, a three-layer structure of the conductor 542*a* or the conductor 542*b*, the layer, and the oxide 530*b* can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that the different layer is not necessarily formed between the oxide 530*b* and each of the conductor 542*a* and the conductor 542*b*; for example, the different layer is formed between the oxide 530*c* and each of the conductor 542*a* and the conductor 542*b* in some cases.

The metal oxide functioning as the channel formation region in the oxide 530 has a band gap of preferably 2 eV or more, further preferably 2.5 eV or more. With the use of a metal oxide having such a wide band gap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530*a* is preferably higher than the atomic proportion of the element M in the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*. As the oxide 530*c*, it is possible to use a metal oxide that can be used as the oxide 530*a* or the oxide 530*b*.

Specifically, as the oxide 530*a*, a metal oxide in which an atomic ratio of In to Ga and Zn is In:Ga:Zn=1:3:4 or 1:1:0.5 is used. In addition, as the oxide 530*b*, a metal oxide in which an atomic ratio of In to Ga and Zn is In:Ga:Zn=4:2:3 or 1:1:1 is used. In addition, as the oxide 530*c*, a metal oxide in which an atomic ratio of In to Ga and Zn is In:Ga:Zn=1:3:4 or an atomic ratio of Ga to Zn is Ga:Zn=2:1 or Ga:Zn=2:5 is used. Specific examples of the case where the oxide 530*c* has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element M in the metal oxide used as the oxide 530*a* is lower than the atomic ratio of In to the element M in the metal oxide used as the oxide 530*b*, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530*b*.

As the oxide 530*b*, it is also possible to use a metal oxide having a composition of In:Zn=2:1, a composition of In:Zn=5:1, a composition of In:Zn=10:1, or a composition in the neighborhood of any one of these compositions, other than the above-described compositions.

The oxide 530*a*, the oxide 530*b*, and the oxide 530*c* are preferably combined to satisfy the above relationship of the atomic ratios. For example, it is preferable that the oxide 530*a* and the oxide 530*c* each be a metal oxide having a composition of In:Ga:Zn=1:3:4 or a composition in the neighborhood thereof and the oxide 530*b* be a metal oxide having a composition of In:Ga:Zn=4:2:3 to 4.1 or a composition in the neighborhood thereof. Note that the above composition represents the atomic ratio of an oxide formed over a base or the atomic ratio of a sputtering target. Moreover, the proportion of In is preferably increased in the composition of the oxide 530*b* because the transistor can have a higher on-state current, higher field-effect mobility, or the like.

The energy of the conduction band minimum of the oxide 530*a* and the oxide 530*c* is preferably higher than the energy of the conduction band minimum of the oxide 530*b*. In other words, the electron affinity of the oxide 530*a* and the oxide 530*c* is preferably smaller than the electron affinity of the oxide 530*b*.

Here, the energy level of the conduction band minimum gradually changes at junction portions of the oxide 530*a*, the oxide 530*b*, and the oxide 530*c*. In other words, the energy level of the conduction band minimum at the junction portions of the oxide 530*a*, the oxide 530*b*, and the oxide 530*c* continuously changes or is continuously connected. To change the energy level gradually, the density of defect states in a mixed layer formed at the interface between the oxide 530*a* and the oxide 530*b* and the interface between the oxide 530*b* and the oxide 530*c* is preferably made low.

Specifically, when the oxide 530*a* and the oxide 530*b* or the oxide 530*b* and the oxide 530*c* contain a common element (as a main component) in addition to oxygen, a mixed layer with a low density of defect states can be formed. For example, in the case where the oxide 530*b* is an In—Ga—Zn oxide, it is preferable to use an In—Ga—Zn oxide, a Ga—Zn oxide, gallium oxide, or the like as the oxide 530*a* and the oxide 530*c*.

At this time, the oxide 530*b* serves as a main carrier path. When the oxide 530*a* and the oxide 530*c* have the above structure, the density of defect states at the interface between the oxide 530*a* and the oxide 530*b* and the interface between the oxide 530*b* and the oxide 530*c* can be made low. Thus, the influence of interface scattering on carrier conduction is small, and the transistor 500 can have a high on-state current.

The conductor 542*a* and the conductor 542*b* functioning as the source electrode and the drain electrode are provided over the oxide 530*b*. For the conductor 542*a* and the conductor 542*b*, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Furthermore, a metal nitride film of tantalum nitride or the like is preferable because it has a barrier property against hydrogen or oxygen.

The conductor 542*a* and the conductor 542*b* are illustrated to have a single-layer structure in FIG. 29A and FIG. 29B, but may have a stacked-layer structure of two or more layers. For example, it is preferable to stack a tantalum nitride film and a tungsten film. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed thereover; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

As illustrated in FIG. 29A, a region 543*a* and a region 543*b* are sometimes formed as low-resistance regions in the oxide 530 at and near the interface with the conductor 542*a* (the conductor 542*b*). In this case, the region 543*a* functions as one of a source region and a drain region, and the region 543*b* functions as the other of the source region and the drain region. Furthermore, the channel formation region is formed in a region sandwiched between the region 543*a* and the region 543*b*.

When the conductor 542*a* (the conductor 542*b*) is provided to be in contact with the oxide 530, the oxygen concentration in the region 543*a* (the region 543*b*) sometimes decreases. In addition, a metal compound layer that contains the metal contained in the conductor 542*a* (the conductor 542*b*) and the component of the oxide 530 is sometimes formed in the region 543*a* (the region 543*b*). In such a case, the carrier concentration of the region 543*a* (the region 543*b*) increases, and the region 543*a* (the region 543*b*) becomes a low-resistance region.

The insulator 544 is provided to cover the conductor 542*a* and the conductor 542*b* and inhibits oxidation of the conductor 542*a* and the conductor 542*b*. At this time, the insulator 544 may be provided to cover side surfaces of the oxide 530 and the insulator 524 and to be in contact with the insulator 522.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542*a* and the conductor 542*b* are oxidation-resistant materials or do not significantly lose the conductivity even after absorbing oxygen. Design is determined as appropriate in consideration of required transistor characteristics.

With the insulator 544, diffusion of impurities such as water and hydrogen contained in the insulator 580 into the oxide 530*b* through the oxide 530*c* and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with the inner side (the top surface and the side surface) of the oxide 530*c*. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator that releases oxygen by heating is provided as the insulator 550 in contact with the top surface of the oxide 530*c*, oxygen can be effectively supplied from the insulator 550 to the channel formation region of the oxide 530*b* through the oxide 530*c*. Furthermore, as in the insulator 524, the concentration of impurities such as water and hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness is maintained. Furthermore, the stacked-layer structure can be thermally stable and have a high dielectric constant.

The conductor 560 functioning as the first gate electrode is illustrated to have a two-layer structure in FIG. 29A and FIG. 29B, but may have a single-layer structure or a stacked-layer structure of three or more layers.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560*a* has a function of inhibiting diffusion of oxygen, it is possible to inhibit a reduction in conductivity of the conductor 560*b* due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560*a*, the oxide semiconductor that can be used as the oxide 530 can be used. In that case, when the conductor 560*b* is formed by a sputtering method, the conductor 560*a* can have a reduced electrical resistance value to be a conductor. This can be referred to as an OC (Oxide Conductor) electrode.

For the conductor 560*b*, it is preferable to use a conductive material containing tungsten, copper, or aluminum as its main component. Furthermore, the conductor 560*b* also functions as a wiring and thus a conductor having high conductivity is preferably used for the conductor 560*b*. For example, a conductive material containing tungsten, copper, or aluminum as its main component can be used. Moreover, the conductor 560*b* may have a stacked-layer structure, for example, a stacked-layer structure of any of the above conductive materials and titanium or titanium nitride.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride, which have thermal stability, are particularly preferable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530*c*, oxygen in the insulator 580 can be efficiently supplied to the oxide 530 through the oxide 530*c*. The concentration of impurities such as water and hydrogen in the insulator 580 is preferably lowered.

The opening in the insulator 580 is formed to overlap with the region between the conductor 542*a* and the conductor 542*b*. Accordingly, the conductor 560 is formed to be embedded in the opening in the insulator 580 and the region sandwiched between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with a top surface of the insulator 580, atop surface of the conductor 560, and atop surface of the insulator 550. When the insulator 574 is formed by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Thus, aluminum oxide formed by a sputtering method serves as an oxygen supply source and can also have a function of a barrier film against impurities such as hydrogen.

An opening is formed by removing parts of the insulator 574, the insulator 580, the insulator 544, the insulator 522, the insulator 516, and the insulator 514 to surround the transistor 500 and expose the insulator 513, and then the insulator 576 having a high barrier property against hydrogen or water is formed. Accordingly, side surfaces of the insulator 574, the insulator 580, the insulator 544, the insulator 522, the insulator 516, and the insulator 514 are each in contact with the insulator 576. This can prevent entry of moisture and hydrogen into the transistor 500 from the outside.

As described above, it is preferable that the insulator 513 and the insulator 576 have higher capability of inhibiting diffusion of hydrogen (e.g., at least one of a hydrogen atom, a hydrogen molecule, and the like) or a water molecule. For example, for the insulator 513 and the insulator 576, silicon nitride or silicon nitride oxide that is a material having a high hydrogen barrier property is preferably used. This can inhibit diffusion of hydrogen or the like into the oxide 530, thereby inhibiting the degradation of the characteristics of the transistor 500. Consequently, the reliability of the semiconductor device of one embodiment of the present invention can be increased.

An insulator 581 functioning as an interlayer film and a planarization film is preferably provided over the insulator 576. As in the insulator 524 and the like, the concentration of impurities such as water and hydrogen in the insulator 581 is preferably lowered.

An insulator 582 is provided over the insulator 581. A substance having a barrier property against oxygen, hydrogen, or the like is preferably used for the insulator 582. Therefore, a material similar to that for the insulator 514 can be used for the insulator 582. For example, a metal oxide such as aluminum oxide, hafnium oxide, or tantalum oxide is preferably used for the insulator 582.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

In addition, an insulator 552 is provided on a side surface of an opening formed in the insulator 586, the insulator 582, the insulator 581, the insulator 576, the insulator 574, the insulator 580, and the insulator 544. Then, a conductor 540*a* and a conductor 540*b* are each provided to be in contact with a side surface of the insulator 552 and a bottom surface of the opening. Note that in FIG. 29A, the conductor 540*a* and the conductor 540*b* are provided to face each other with the conductor 560 therebetween. The conductor 540*a* and the conductor 540*b* have a structure similar to that of a conductor 546 described later.

The insulator 552 is provided in contact with the insulator 581, the insulator 576, the insulator 574, the insulator 580, and the insulator 544, for example. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because it is a material having a high hydrogen barrier property. The use of a material having a high hydrogen barrier property for the insulator 552 can inhibit diffusion of impurities such as water and hydrogen from the insulator 580 and the like into the oxide 530 through the conductor 540*a* and the conductor 540*b*. Furthermore, oxygen contained in the insulator 580 can be inhibited from being absorbed by the conductor 540*a* and the conductor 540*b*. As described above, the reliability of the semiconductor device of one embodiment of the present invention can be increased.

The conductor 540*a* and the conductor 540*b* can be provided using, for example, materials similar to those for the conductor 328, the conductor 330, the conductor 503, and the like. It is particularly preferable that the conductor 540*a* and the conductor 540*b* each have a stacked-layer structure of two or more layers in which the first layer that is in contact with the insulator 552 is formed using a conductive material having a function of inhibiting diffusion of impurities such as a hydrogen atom, a hydrogen molecule, a water molecule, or a copper atom (through which the impurities are less likely to pass) and the second and subsequent layers are formed using a conductive material containing tungsten, copper, aluminum, or the like as its main component and having high conductivity.

The insulator 552, the conductor 546, and the like are embedded in the insulator 522, the insulator 524, the insulator 544, the insulator 580, the insulator 574, the insulator 581, the insulator 582, and the insulator 586.

The conductor 546 has a function of a plug or a wiring that is connected to the capacitor 600, the transistor 500, or the transistor 300. Note that the conductor 546 can be provided using a material similar to those for the conductor 540*a* and the conductor 540*b*.

Figure 30A:
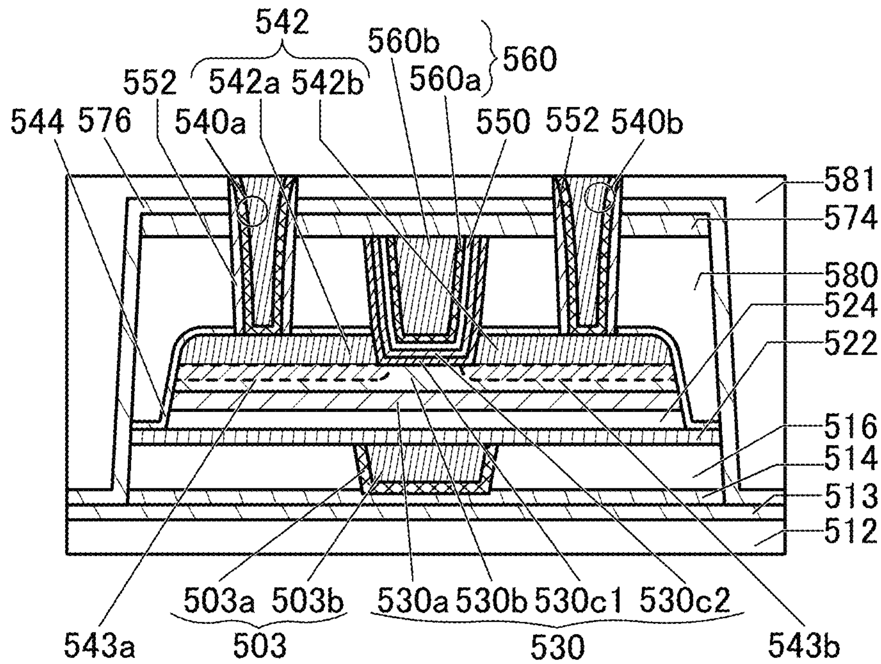
FIG. 30A and FIG. 30B are schematic cross-sectional views illustrating a structure example of a transistor.
Figure 30B:
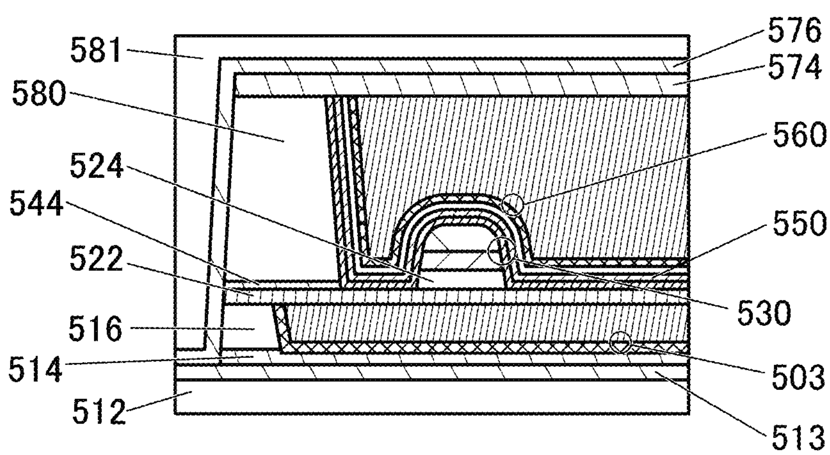

The transistor structure of the transistor 500 illustrated in FIG. 30A and FIG. 30B may be changed depending on circumstances. As the modification example of the transistor 500 illustrated in FIG. 30A and FIG. 30B, a transistor illustrated in FIG. 30A and FIG. 30B can be employed, for example. FIG. 30A is a cross-sectional view of the transistor in the channel length direction and FIG. 30B is a cross-sectional view of the transistor in the channel width direction. The transistor illustrated in FIG. 30A and FIG. 30B is different from the transistor illustrated in FIG. 30A and FIG. 30B in that the oxide 530*c* has a two-layer structure of an oxide 530*c*1 and an oxide 530*c*2.

The oxide 530*c*1 is in contact with a side surface of the insulator 524, a side surface of the oxide 530*a*, a top surface and a side surface of the oxide 530*b*, side surfaces of the conductor 542*a* and the conductor 542*b*, a side surface of the insulator 544, and a side surface of the insulator 580. The oxide 530*c*2 is in contact with the insulator 550.

An In—Zn oxide can be used as the oxide 530*c*1, for example. As the oxide 530*c*2, it is possible to use a material similar to a material that can be used for the oxide 530*c* when the oxide 530*c* has a single-layer structure. As the oxide 530*c*2, a metal oxide with In:Ga:Zn=1:3:4 [atomic ratio], Ga:Zn=2:1 [atomic ratio], or Ga:Zn=2:5 [atomic ratio] can be used, for example.

When the oxide 530*c* has a two-layer structure of the oxide 530*c*1 and the oxide 530*c*2, the on-state current of the transistor can be increased as compared with the case where the oxide 530*c* has a single-layer structure. Thus, the transistor can be used as a power MOS transistor, for example. Note that the oxide 530*c* included in the transistor having the structure illustrated in FIG. 29A and FIG. 29B can also have a two-layer structure of the oxide 530*c*1 and the oxide 530*c*2.

The transistor having the structure illustrated in FIG. 30A and FIG. 30B can be used as the transistor 300 illustrated in FIG. 27 or FIG. 28, for example. In addition, for example, the transistor 300 can be used as a transistor included in the semiconductor device described in the above embodiments, for example, the arithmetic circuit MAC1, the arithmetic circuit MAC1A, the arithmetic circuit MAC2, the arithmetic circuit MAC3A, and the arithmetic circuit MAC3B described in the above embodiments, as described above. Note that the transistor illustrated in FIG. 30A and FIG. 30B can be used as a transistor included in the semiconductor device of one embodiment of the present invention, other than the transistors 300 and 500.

Next, the capacitor 600 and peripheral wirings or plugs included in the semiconductor device in FIG. 27 and FIG. 28 are described. The capacitor 600 and the wiring or the plug are provided above the transistor 500.

The capacitor 600 includes, for example, a conductor 610, a conductor 620, and an insulator 630.

The conductor 610 is provided over one of the conductor 540*a* and the conductor 540*b*, the conductor 546, and the insulator 586. The conductor 610 has a function of one of the pair of electrodes of the capacitor 600.

A conductor 612 is provided over the other of the conductor 540*a* and the conductor 540*b*, the insulator 586, and the conductor 546. The conductor 612 has a function of a plug, a wiring, a terminal, or the like that electrically connects the transistor 500 to the photoelectric conversion element 700 above the transistor 500. Specifically, the conductor 612 can be the wiring WCL of the arithmetic circuit MAC1 described in Embodiment 1, for example.

Note that the conductor 612 and the conductor 610 can be formed at the same time.

As the conductor 612 and the conductor 610, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 are each illustrated to have a single-layer structure in FIG. 27; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 serves as a dielectric sandwiched between the pair of electrodes of the capacitor 600.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

Alternatively, for the insulator 630, a stacked-layer structure using a material with high dielectric strength such as silicon oxynitride and a high permittivity (high-k) material may be used, for example. In the capacitor 600A having such a structure, a sufficient capacitance can be ensured owing to the high permittivity (high-k) insulator, and the dielectric strength can be increased owing to the insulator with high dielectric strength, so that the electrostatic breakdown of the capacitor 600 can be inhibited.

Examples of the insulator of a high permittivity (high-k) material (high dielectric constant material) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of semiconductor devices progress, a problem such as leakage current from a transistor or a capacitor might arise because of a thinner gate insulator and a thinner dielectric used in the capacitor. When a high-k material is used as a gate insulator and an insulator functioning as a dielectric used for a capacitor, a gate potential during operation of the transistor can be lowered and capacitance of the capacitor can be ensured while the physical thickness is maintained.

The conductor 620 is provided to overlap with the conductor 610 with the insulator 630 therebetween. The conductor 610 has a function of one of the pair of electrodes of the capacitor 600. For example, the conductor 620 can be the wiring XCL of the arithmetic circuit MAC1 described in Embodiment 1.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used. For example, the conductor 620 can be formed using a material that can be used for the conductor 610. Furthermore, the conductor 620 may have a single-layer structure or a stacked structure of two or more layers.

An insulator 640 is provided over the conductor 620 and the insulator 630. As the insulator 640, a film having a barrier property that prevents diffusion of hydrogen or impurities into the region where the transistor 500 is formed is preferably used. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials usable for the insulator 324, for example.

In each of the semiconductor devices illustrated in FIG. 27 and FIG. 28, the capacitor 600 is formed of the conductor 610, the conductor 620, and the insulator 630 as described above. FIG. 27 and FIG. 28 illustrate the planar capacitor 600.

Figure 31A:
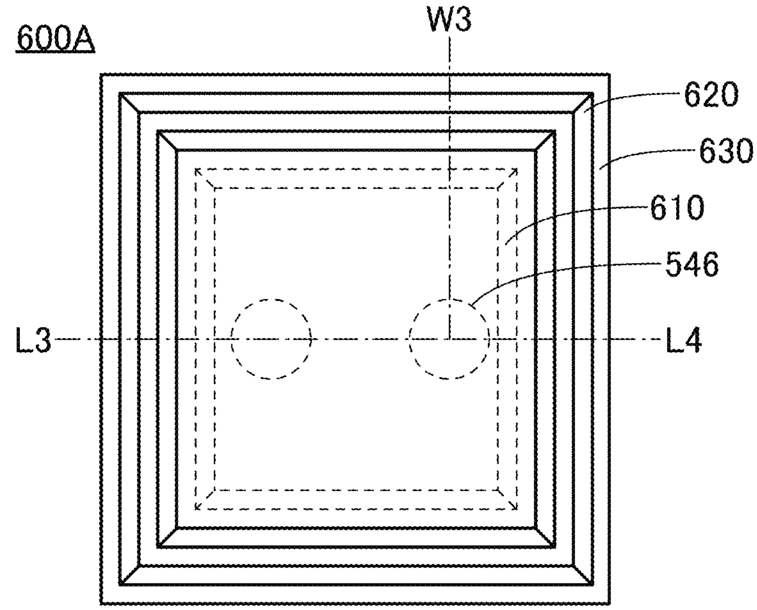
FIG. 31A is a top view illustrating a structure example of a capacitor.
Figure 31B:
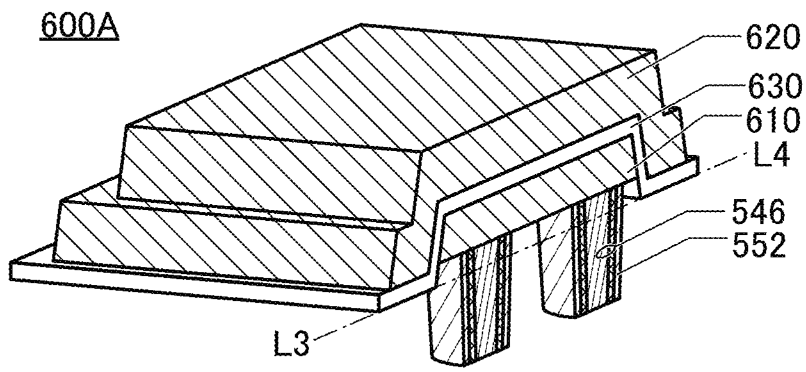
FIG. 31B and FIG. 31C are cross-sectional perspective views illustrating the structure example of the capacitor.
Figure 31C:
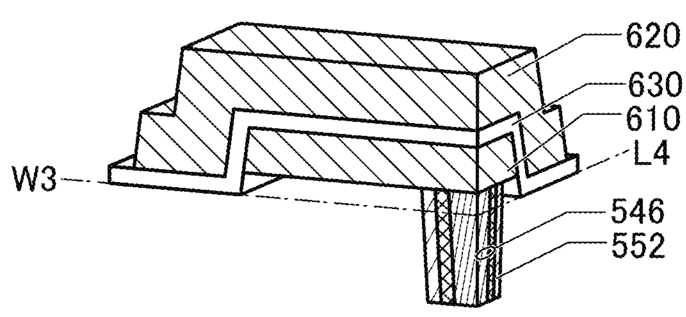

The capacitor 600A illustrated in FIG. 31A to FIG. 31C is a planar capacitor that can be used as the capacitors of the semiconductor devices illustrated in FIG. 27 and FIG. 28. FIG. 31A is a top view of the capacitor 600A, FIG. 31B is a perspective view illustrating a cross section of the capacitor 600A along the dashed-dotted line L3-L4, and FIG. 31C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric sandwiched between the pair of electrodes.

A bottom portion of the conductor 610 in the capacitor 600 is electrically connected to the conductor 546. Although not illustrated in FIG. 31, as in the semiconductor devices illustrated in FIG. 27 and FIG. 28, the capacitor 600 is electrically connected to one of the conductor 540*a* and the conductor 540*b*. The conductor 546 functions as a plug or a wiring for connection to another circuit element.

For clarification of the drawing, the insulator 586 in which the conductor 546 is embedded and the insulator 640 and the insulator 650 that cover the conductor 620 and the insulator 630 are omitted in FIG. 31.

Although the capacitor 600 illustrated in each of FIG. 27, FIG. 28, FIG. 31A, FIG. 31B, and FIG. 31C is a planar capacitor, the shape of the capacitor is not limited thereto. For example, the capacitor 600 may be a cylindrical capacitor 600B illustrated in FIG. 32A to FIG. 32C.

Figure 32A:
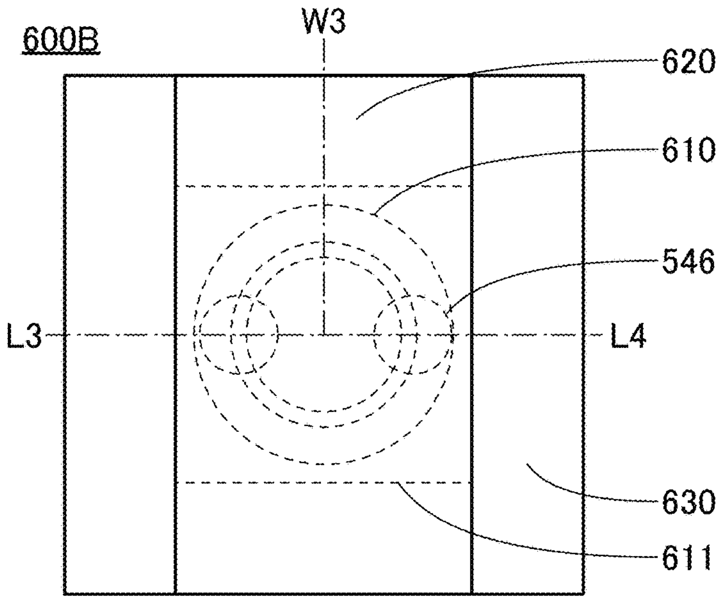
FIG. 32A is a top view illustrating a structure example of a capacitor.
Figure 32B:
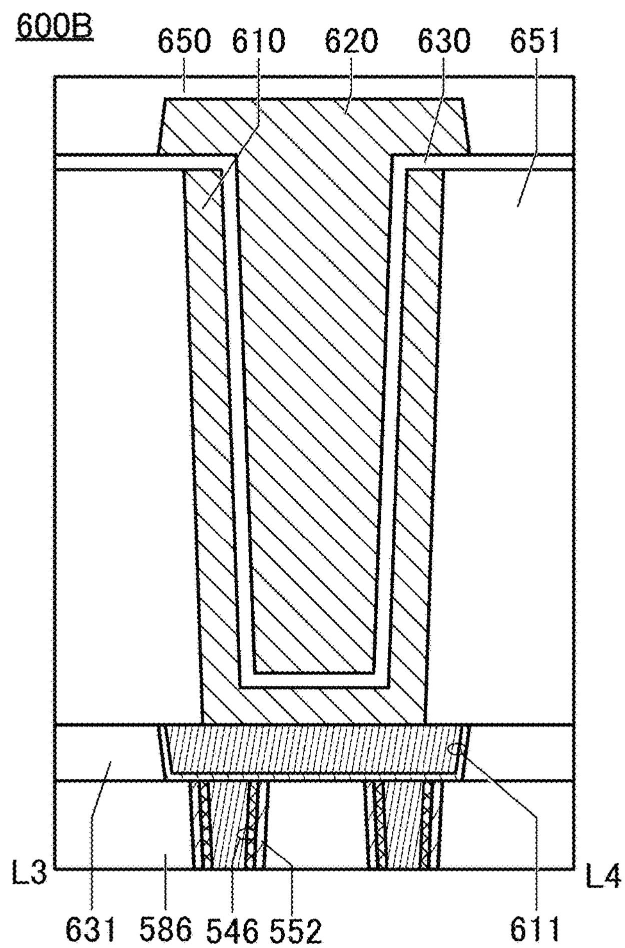
FIG. 32B is a cross-sectional view illustrating the structure example of the capacitor.
Figure 32C:
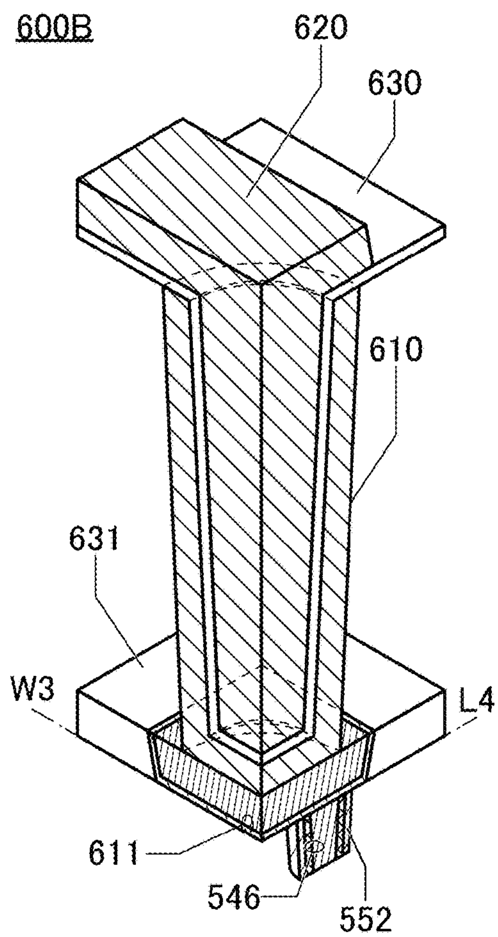
FIG. 32C is a cross-sectional perspective view illustrating the structure example of the capacitor.

FIG. 32A is a top view of the capacitor 600B, FIG. 32B is a cross-sectional view of the capacitor 600B along the dashed-dotted line L3-L4, and FIG. 32C is a perspective view illustrating a cross section of the capacitor 600B along the dashed-dotted line W3-L4.

In FIG. 32B, the capacitor 600B includes an insulator 631 over the insulator 586 in which the conductor 546 is embedded, an insulator 651 having an opening portion, the conductor 610 functioning as one of a pair of electrodes, and the conductor 620 functioning as the other of the pair of electrodes.

For clarification of the drawing, the insulator 586, the insulator 650, and the insulator 651 are omitted in FIG. 32C.

For the insulator 631, a material similar to that for the insulator 586 can be used, for example.

A conductor 611 is embedded in the insulator 631 to be electrically connected to the conductor 546. For the conductor 611, a material similar to those for the conductor 330 and the conductor 518 can be used, for example.

For the insulator 651, a material similar to that for the insulator 586 can be used, for example.

The insulator 651 has an opening portion as described above, and the opening portion overlaps with the conductor 611.

The conductor 610 is formed on the bottom portion and the side surface of the opening portion. In other words, the conductor 610 overlaps with the conductor 611 and is electrically connected to the conductor 611.

The conductor 610 is formed in such a manner that an opening portion is formed in the insulator 651 by an etching method or the like, and then the conductor 610 is formed by a sputtering method, an ALD method, or the like. After that, the conductor 610 formed over the insulator 651 is removed by a CMP method or the like while the conductor 610 formed in the opening portion is left.

The insulator 630 is positioned over the insulator 651 and the formation surface of the conductor 610. Note that the insulator 630 functions as a dielectric sandwiched between the pair of electrodes in the capacitor.

The conductor 620 is formed over the insulator 630 so as to fill the opening portion of the insulator 651.

The insulator 650 is formed to cover the insulator 630 and the conductor 620.

The capacitance value of the cylindrical capacitor 600B illustrated in FIG. 32 can be higher than that of the planar capacitor 600A.

Next, the layer LY2 positioned above the capacitor 600 is described. Note that the layer LY2 can form the wirings included in the layer ERL of the semiconductor device SDV illustrated in FIG. 1 and FIG. 3. That is, the layer LY2 functions as a wiring layer.

Note that in this specification and the like, the layer LY2 is sometimes rephrased as a wiring layer or a structure body, for example.

In FIG. 27, an insulator 411, an insulator 412, and an insulator 413 are stacked in this order above the insulator 650. Furthermore, a conductor 416 is embedded in the insulator 411, the insulator 412, and the insulator 413. The conductor 416 has a function of a plug or a wiring that is connected to the transistor 500. Note that the conductor 416 can be provided using a material similar to those for the conductor 328 and the conductor 330. In particular, the conductor 416 can be the wiring EIL[1] to the wiring EIL[m] of the semiconductor device SDV described in Embodiment 1.

For example, like the insulator 324, the insulator 411 is preferably formed using an insulator having a barrier property against impurities such as hydrogen and water. The insulator 412 and the insulator 413 are preferably formed using an insulator having a relatively low dielectric constant to reduce the parasitic capacitance generated between wirings, like the insulator 326. Furthermore, the conductor 416 preferably contains a conductor having a barrier property against impurities such as hydrogen and water. In particular, the conductor having a barrier property against hydrogen is formed in an opening portion included in the insulator 411, the insulator 412, and the insulator 413 having a barrier property against hydrogen. With this structure, the transistor 500 and the photoelectric conversion element 700 can be separated by the barrier layer, so that diffusion of hydrogen from the photoelectric conversion element 700 into the transistor 500 can be inhibited.

An insulator 414 is provided over the insulator 413 and the conductor 416.

For example, like the insulator 324 or the like, the insulator 414 is preferably formed using an insulator having a barrier property against impurities such as water and hydrogen. Thus, the insulator 414 can be formed using any of the materials usable for the insulator 324 or the like, for example.

Next, the layer LY3 provided above the capacitor 600 in FIG. 27 and FIG. 28 and the photoelectric conversion element 700 included in the layer LY3 are described. In the layer LY1, for example, the sensor array SCA using the sensors SNC as optical sensors included in the layer PDL of the semiconductor device SDV in FIG. 1 and FIG. 3 can be formed.

Note that in this specification and the like, the layer LY3 is sometimes rephrased as a sensor layer or a structure body, for example.

The photoelectric conversion element 700 includes a layer 767*a*, a layer 767*b*, a layer 767*c*, a layer 767*d*, and a layer 767*e*, for example.

The photoelectric conversion element 700 illustrated in FIG. 27 and FIG. 28 is an example of an organic optical conductive film; the layer 767*a* is a lower electrode, the layer 767*e* is an upper electrode having a light-transmitting property, and the layer 767*b*, the layer 767*c*, and the layer 767*d* correspond to a photoelectric conversion portion. Note that instead of the photoelectric conversion element 700 illustrated in FIG. 27 and FIG. 28, a pn-junction photodiode, an avalanche photodiode, or the like may be used, for example.

The layer 767*a* serving as the lower electrode can be one of an anode and a cathode, and the layer 767*b* serving as the upper electrode can be the other of the anode and the cathode. Note that in this embodiment, the layer 767*a* is the cathode and the layer 767*b* is the anode.

The lower electrode of the layer 767*a* can be, for example, the electrode DNK in the layer PDL described in Embodiment 1.

The layer 767*a* is preferably a low-resistance metal layer or the like, for example. Specifically, for example, aluminum, titanium, tungsten, tantalum, silver, or a stack thereof can be used as the layer 767*a*.

As the layer 767*e*, for example, a conductive layer having a high visible-light-transmitting property is preferably used. Specifically, for example, an indium oxide, a tin oxide, a zinc oxide, an indium tin oxide, a gallium zinc oxide, an indium gallium zinc oxide, graphene, or the like can be used for the layer 767*e*. Note that the layer 767*e* can be omitted.

One of the layer 767*b* and the layer 767*d* in the photoelectric conversion portion can be a hole-transport layer and the other can be an electron-transport layer. The layer 767*c* can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used.

In each of the semiconductor devices in FIG. 27 and FIG. 28, an insulator 750 is provided above the insulator 414. In addition, an opening portion is provided in regions of the insulator 414, the insulator 750, and the insulator 751 that overlap with the conductor 416, and a conductor 740 is provided to fill the opening portion. The insulator 751 is provided over the insulator 650, and the layer 767*a* is provided over the insulator 751 and the conductor 740. An insulator 752 is provided over the insulator 751 and the layer 767*a*. The layer 767*b* is provided over the insulator 752 and the layer 767*a*.

The layer 767*c*, the layer 767*d*, the layer 767*e*, and an insulator 753 are provided in this order to be stacked over the layer 767*b*.

The insulator 751 functions as an interlayer insulating film, for example. Like the insulator 324, the insulator 751 is preferably formed using an insulator having a barrier property against hydrogen, for example. The use of an insulator having a barrier property against hydrogen as the insulator 751 can inhibit diffusion of hydrogen into the transistor 500. Thus, the insulator 751 can be formed using any of the materials that can be used for the insulator 324, for example.

The conductor 740 serves as a plug or a wiring that electrically connects the photoelectric conversion element 700 to the conductor 416. The conductor 740 can be provided using a material similar to those for the conductor 328 and the conductor 330.

The insulator 752 functions as an element isolation layer, for example. The insulator 752 is provided to prevent a short circuit with an adjacent photoelectric conversion element, which is not illustrated. An organic insulator or the like is preferably used as the insulator 752, for example.

The insulator 753 functions as a planarization film having a light-transmitting property, for example. The insulator 753 can be formed using a material such as silicon oxide, silicon oxynitride, silicon nitride oxide, or silicon nitride, for example.

A light-blocking layer 771, an optical conversion layer 772, and a microlens array 773 are provided above the insulator 753, for example.

The light-blocking layer 771 provided over the insulator 753 can suppress entry of light into an adjacent pixel. As the light-blocking layer 771, a metal layer of aluminum, tungsten, or the like can be used. The metal layer and a dielectric film having a function of an anti-reflection film may be stacked.

A color filter can be used as the optical conversion layer 772 provided over the insulator 753 and the light-blocking layer 771. When colors of R (red), G (green), B (blue), Y (yellow), C (cyan), M (magenta), and the like are assigned to the color filters of respective pixels, a color image can be obtained.

When a wavelength cut filter is used as the optical conversion layer 772, an imaging device can capture images in various wavelength regions.

For example, when a filter that blocks light having a wavelength shorter than or equal to that of visible light is used as the optical conversion layer 772, an infrared imaging device can be obtained. When a filter that blocks light having a wavelength shorter than or equal to that of near-infrared light is used as the optical conversion layer 772, a far-infrared imaging device can be obtained. When a filter that blocks light having a wavelength longer than or equal to that of visible light is used as the optical conversion layer 772, an ultraviolet imaging device can be obtained.

Furthermore, when a scintillator is used as the optical conversion layer 772, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion element 700 senses the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin, ceramics, or the like in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

The microlens array 773 is provided over the light-blocking layer 771 and the optical conversion layer 772. Light passing through an individual lens of the microlens array 773 goes through the optical conversion layer 772 directly under the lens, and the photoelectric conversion element 700 is irradiated with the light. With the microlens array 773, collected light can be incident on the photoelectric conversion element 700; thus, photoelectric conversion can be efficiently performed. The microlens array 773 is preferably formed using a resin, glass, or the like with a high visible-light-transmitting property.

Although FIG. 27 and FIG. 28 each illustrate the structure of the semiconductor device in which the photoelectric conversion element 700 using an organic optical conductive film is provided above the transistor 300 and the transistor 500, the semiconductor device of one embodiment of the present invention is not limited thereto. For example, the semiconductor device of one embodiment of the present invention may be provided with a back-surface irradiation type pn-junction photoelectric conversion element instead of the photoelectric conversion element 700.

Figure 33:
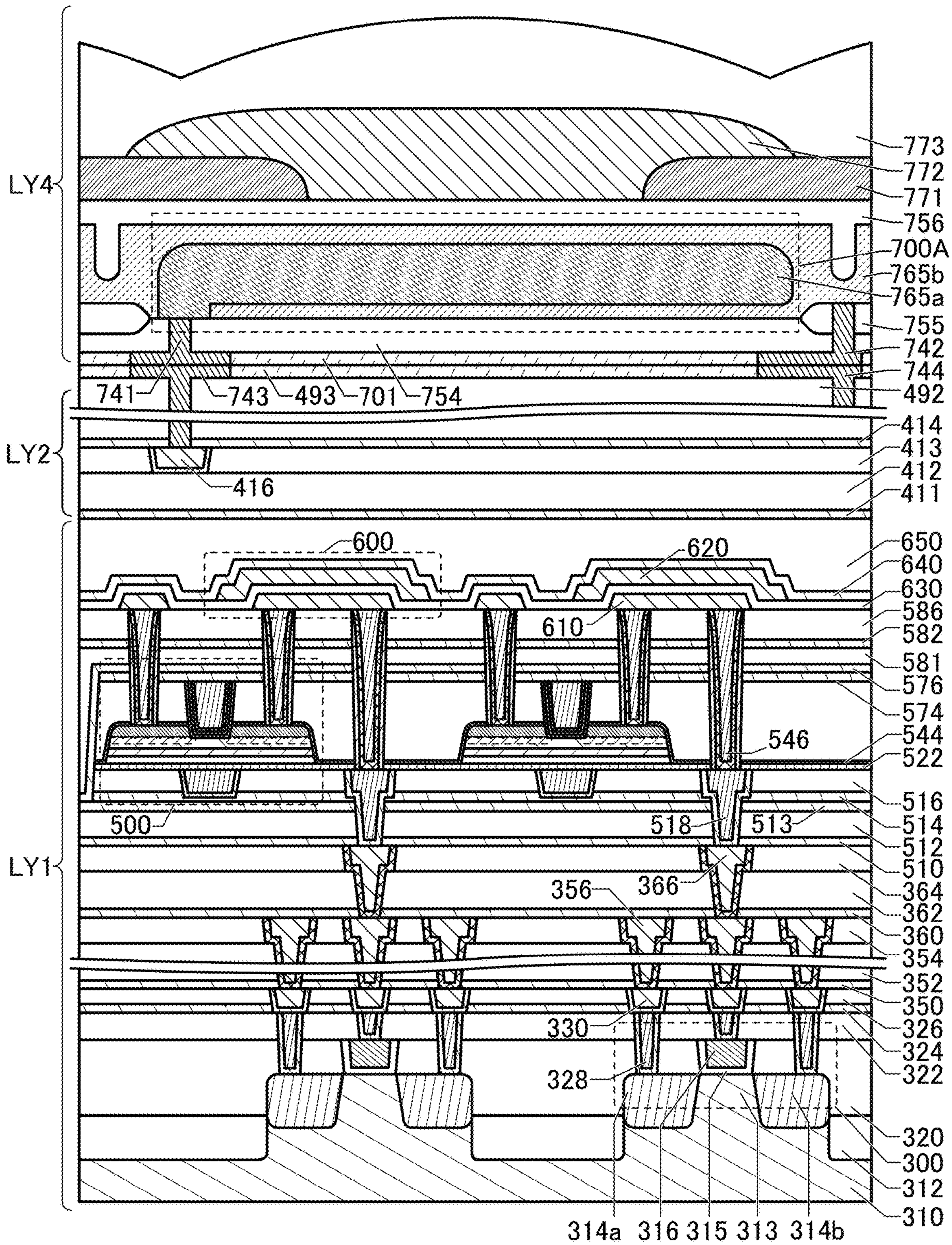
FIG. 33 is a schematic cross-sectional view illustrating a structure example of a semiconductor device.

FIG. 33 illustrates a structure example of a semiconductor device in which a back-surface irradiation type pn-junction photoelectric conversion element 700A is provided above the transistor 300 and the transistor 500. The semiconductor device illustrated in FIG. 33 has a structure in which a layer LY4 including the photoelectric conversion element 700A is attached onto the substrate 310 where the transistor 300, the transistor 500, and the capacitor 600 are provided. Note that the layer LY4 is a modification example of the layer LY3 described above, and in the LY4, the sensor array SCA using the sensors SNC as optical sensors included in the layer PDL of the semiconductor device SDV in FIG. 1 and FIG. 3 can be formed.

Note that in this specification and the like, the layer LY4 is sometimes rephrased as a sensor layer or a structure body, for example.

Note that the layer LY4 includes the light-blocking layer 771, the optical conversion layer 772, and the microlens array 773, and refer to the above description for these components.

The photoelectric conversion element 700A is a pn-junction photodiode formed on a silicon substrate and includes a layer 765*b* corresponding to a p-type region and a layer 765*a* corresponding to an n-type region. The photoelectric conversion element 700A is a pinned photodiode, which can suppress a dark current and reduce noise with the thin p-type region (part of the layer 765*b*) provided on the surface side (current extraction side) of the layer 765*a*.

An insulator 701, a conductor 741, and a conductor 742 function as bonding layers. An insulator 754 functions as an interlayer insulating film and a planarization film. An insulator 755 functions as an element isolation layer. An insulator 756 has a function of inhibiting carrier leakage.

The silicon substrate is provided with a groove that separates pixels, and the insulator 756 is provided on the top surface of the silicon substrate and in the groove. The insulator 756 can suppress leakage of carriers generated in the photoelectric conversion element 700A to an adjacent pixel. The insulator 756 also has a function of inhibiting entry of stray light. Therefore, the insulator 756 can inhibit color mixture. Note that an anti-reflection film may be provided between the top surface of the silicon substrate and the insulator 756.

The element isolation layer can be formed by a LOCOS method. Alternatively, an STI (Shallow Trench Isolation) method or the like may be used. As the insulator 756, for example, an inorganic insulating film of silicon oxide, silicon nitride, or the like or an organic insulating film of polyimide, acrylic, or the like can be used. The insulator 756 may have a multilayer structure.

The layer 765*a* (corresponding to the n-type region and the cathode) of the photoelectric conversion element 700A is electrically connected to the conductor 741. The layer 765*b* (corresponding to the p-type region and the anode) is electrically connected to the conductor 742. The conductor 741 and the conductor 742 each include a region embedded in the insulator 701. Furthermore, surfaces of the insulator 701, the conductor 741, and the conductor 742 are planarized to be level with each other.

Note that the layer 765*b* is electrically connected to a conductor 744 described later through the conductor 742. That is, the semiconductor device in FIG. 33 has a structure in which current or voltage is applied from the layer LY2 and the layer LY1 to an anode of the photoelectric conversion element 700A (not illustrated).

The semiconductor device illustrated in FIG. 33 is different from the semiconductor device in FIG. 27 in the structure of the insulator, the conductor, and the like provided above the insulator 414. Specifically, in the semiconductor device in FIG. 33, an insulator 492 and an insulator 493 are stacked in this order above the insulator 414. In addition, an opening portion is provided in regions of the insulator 492 and the insulator 493 that overlap with the conductor 416, and a conductor 743 is formed to fill the opening portion. Furthermore, another opening portion is provided in another region, and the conductor 744 is formed to fill the opening portion.

According to the structure described above, the conductor 416 is electrically connected to the layer 765*a* through the conductor 743 and the conductor 741. This corresponds to the case where the wiring EIL described in Embodiment 1 is electrically connected to an output terminal (cathode) of the photodiode included in the sensor SNC. Note that the semiconductor device in FIG. 33 may have a structure in which the conductor 416 corresponding to the wiring EIL is electrically connected to the layer 765*b* (an input terminal (anode) of the photodiode) through the conductor 744 and the conductor 742.

The conductor 741 can be, for example, the electrode DNK included in the layer PDL described in Embodiment 1. The conductor 743 can be, for example, a plug electrically connecting the wiring EIL and the sensor SNC described in Embodiment 1.

Any of the materials that can be used for the insulator 650 can be used for the insulator 492, for example.

Like the insulator 701, the insulator 493 functions as part of a bonding layer. In addition, like the conductor 741 and the conductor 742, the conductor 743 and the conductor 744 each function as part of a bonding layer.

For example, silicon oxide, silicon oxynitride, silicon nitride oxide, silicon nitride, titanium nitride, or the like can be used for the insulator 493 and the insulator 701. Since the insulator 493 and the insulator 701 are bonded to each other, it is particularly preferable that the insulator 493 and the insulator 701 be formed of the same components.

For example, copper, aluminum, tin, zinc, tungsten, silver, platinum, gold, or the like can be used for the conductor 741, the conductor 742, the conductor 743, and the conductor 744. It is particularly preferable to use copper, aluminum, tungsten, or gold for easy bonding of the conductor 741 and the conductor 743, and the conductor 742 and the conductor 744.

The conductor 741, the conductor 742, the conductor 743, and the conductor 744 may each have a multilayer structure including a plurality of layers. For example, a first conductor may be formed on the side surface of the opening portion in which the conductor 741, the conductor 742, the conductor 743, or the conductor 744 is provided, and then a second conductor may be formed to fill the opening portion. A conductor having a barrier property against hydrogen, such as tantalum nitride, can be used as the first conductor, and tungsten with high conductivity can be used as the second conductor, for example.

In a pre-process for bonding the bonding layer on the substrate 310 side and the bonding layer on the layer LY4 side, the surfaces of the insulator 493, the conductor 743, and the conductor 744 are planarized so that they are level with each other on the substrate 310 side. Similarly, the surfaces of the insulator 701, the conductor 741, and the conductor 742 are planarized so that they are level with each other on the layer LY4 side.

In the case where bonding of the insulator 493 and the insulator 701, i.e., bonding of insulating layers, is performed in the bonding step, a hydrophilic bonding method or the like can be employed in which, after high planarity is obtained by polishing or the like, the surfaces subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When bonding of the conductor 741 and the conductor 743 and bonding of the conductor 742 and the conductor 744, i.e., bonding of conductors, are performed, for example, a surface activated bonding method can be used in which an oxide film, a layer adsorbing impurities, and the like on the surface are removed by sputtering processing or the like and the cleaned and activated surfaces are brought into contact to be bonded to each other. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Through the above-described bonding step, the conductor 743 and the conductor 744 on the substrate 310 side can be electrically connected to the conductor 741 and the conductor 742 on the layer LY4 side. In addition, mechanically strong connection can be established between the insulator 493 on the substrate 310 side and the insulator 701 on the layer LY4 side.

When the substrate 310 and the layer LY4 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as gold. Note that a bonding method other than the above-mentioned methods may be used.

With the use of this structure described in this embodiment, a change in electrical characteristics can be inhibited and reliability can be improved in a semiconductor device using a transistor including an oxide semiconductor. Alternatively, a semiconductor device using a transistor including an oxide semiconductor can be miniaturized or highly integrated.

Note that this embodiment can be combined with any of the other embodiments described in this specification as appropriate.

EMBODIMENT 6

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 34A. FIG. 34A is a diagram showing the classification of crystal structures of an oxide semiconductor, typically IGZO (a metal oxide containing In, Ga, and Zn).

As shown in FIG. 34A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 34A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 34B shows an XRD spectrum, which is obtained by GIXD (Grazing-Incidence XRD) measurement, of a CAAC-IGZO film classified into "Crystalline" (the horizontal axis represents 2θ[deg.] and the vertical axis represents intensity in arbitrary unit (a.u.)). Note that a GIXD method is also referred to as a thin film method or a Seemann-Bohlin method. The XRD spectrum that is shown in FIG. 34B and obtained by GIXD measurement is hereinafter simply referred to as an XRD spectrum. The CAAC-IGZO film in FIG. 34B has a composition in the neighborhood of In:Ga:Zn=4:2:3 [atomic ratio]. The CAAC-IGZO film in FIG. 34B has a thickness of 500 nm.

As shown in FIG. 34B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 34B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 34C shows a diffraction pattern of the CAAC-IGZO film. FIG. 34C shows a diffraction pattern obtained by the NBED in which an electron beam is incident in the direction parallel to the substrate. The composition of the CAAC-IGZO film in FIG. 34C is In:Ga:Zn=4:2:3 [atomic ratio] or the neighborhood thereof. In the nanobeam electron diffraction method, electron diffraction is performed with a probe diameter of 1 nm.

As shown in FIG. 34C, a plurality of spots indicating c-axis alignment are observed in the diffraction pattern of the CAAC-IGZO film.

Structure of Oxide Semiconductor>>

Oxide semiconductors might be classified in a manner different from one shown in FIG. 34A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element Mmay be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 20) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion, for example, owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains avoid or a low-density region. That is, the a-like OS has low crystallinity as compared with the nc-OS and the CAAC-OS. Moreover, the a-like OS has a higher hydrogen concentration in the film than the nc-OS and the CAAC-OS.

Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{3}$, further preferably lower than or equal to $1\times10^{13}$ $cm^{3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon, carbon, or the like which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^{3}$, preferably lower than or equal to $2\times10^{17}$ atoms/$cm^{3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/$cm^{3}$, preferably lower than or equal to $2\times10^{16}$ atoms/$cm^{3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^{3}$, preferably lower than or equal to $5\times10^{18}$ atoms/$cm^{3}$, further preferably lower than or equal to $1\times10^{18}$ atoms/$cm^{3}$, still further preferably lower than or equal to $5\times10^{17}$ atoms/$cm^{3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^{3}$, preferably lower than $1\times10^{19}$ atoms/$cm^{3}$, further preferably lower than $5\times10^{18}$ atoms/$cm^{3}$, still further preferably lower than $1\times10^{18}$ atoms/$cm^{3}$.

When an oxide semiconductor with sufficiently reduced impurities is used for the channel formation region of the transistor, stable electrical characteristics can be given.

Note that this embodiment can be combined with any of the other embodiments described in this specification as appropriate.

EMBODIMENT 7

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 35A.

Figure 35A:
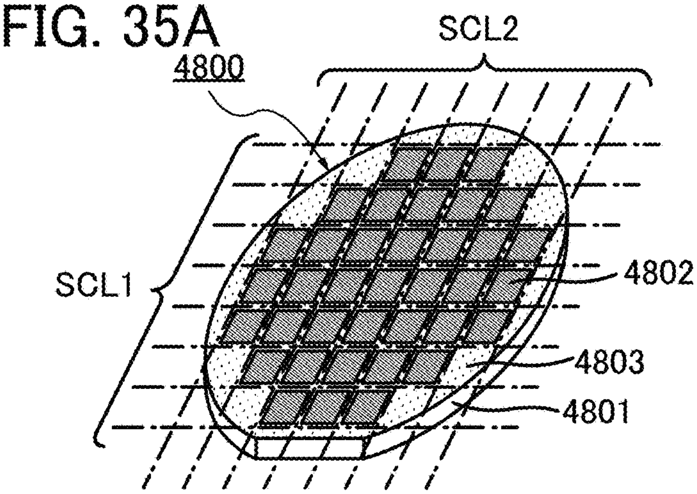
FIG. 35A is a perspective view illustrating an example of a semiconductor wafer.

A semiconductor wafer 4800 illustrated in FIG. 35A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided such that the plurality of scribe lines SCL1 are parallel to each other, the plurality of scribe lines SCL2 are parallel to each other, and the scribe lines SCL1 are perpendicular to the scribe lines SCL2.

Figure 35B:
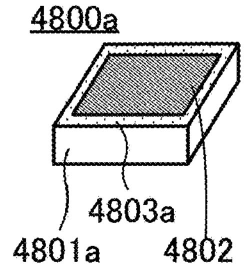
FIG. 35B is a perspective view illustrating an example of a chip.

With the dicing step, a chip 4800*a* as illustrated in FIG. 35B can be cut out from the semiconductor wafer 4800. The chip 4800*a* includes a wafer 4801*a*, the circuit portion 4802, and a spacing 4803*a*. Note that it is preferable to make the spacing 4803*a* as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 35A. The element substrate may be a rectangular semiconductor wafer, for example. The shape of the element substrate can be changed as appropriate, depending on a manufacturing process of an element and an apparatus for manufacturing the element.

<Electronic Component>

Figure 35C:
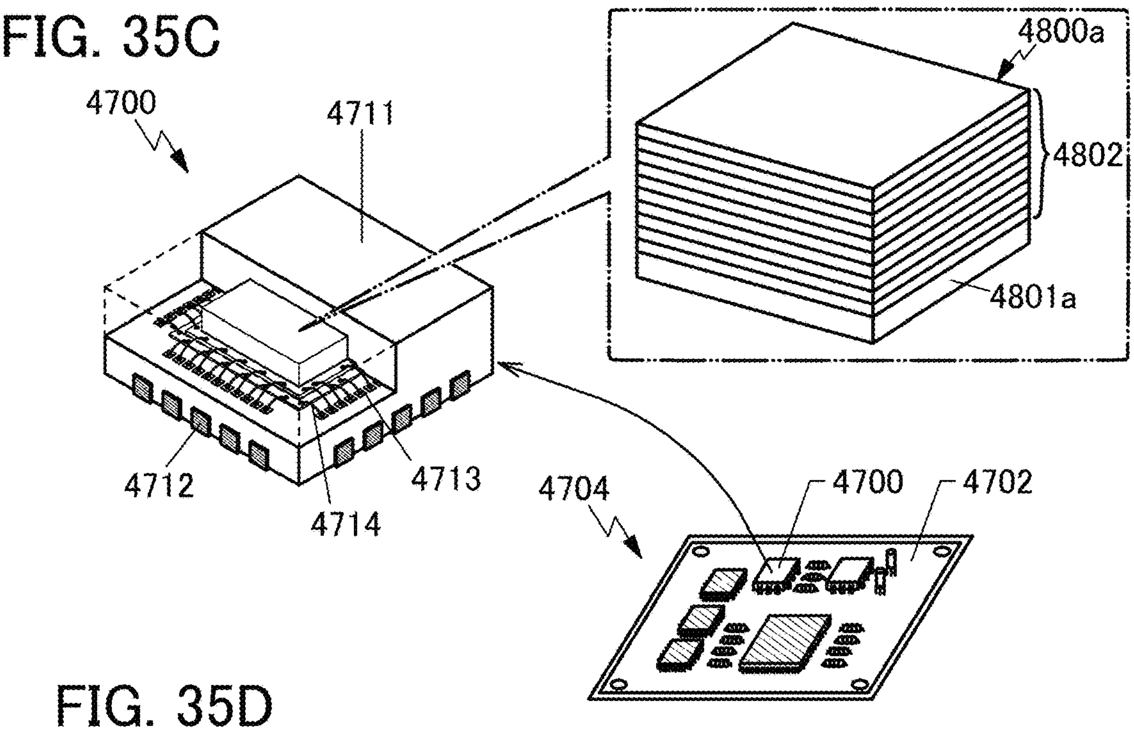
FIG. 35C and FIG. 35D are perspective views illustrating examples of electronic components.

FIG. 35C is a perspective view of an electronic component 4700 and a substrate (a mounting board 4704) on which the electronic component 4700 is mounted. The electronic component 4700 illustrated in FIG. 35C includes the chip 4800*a* in a mold 4711. Note that the chip 4800*a* illustrated in FIG. 35C may have a structure in which the circuit portions 4802 are stacked. To illustrate the inside of the electronic component 4700, some portions are omitted in FIG. 35C. The electronic component 4700 includes a land 4712 outside the mold 4711. The land 4712 is electrically connected to an electrode pad 4713, and the electrode pad 4713 is electrically connected to the chip 4800*a* through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 35D:
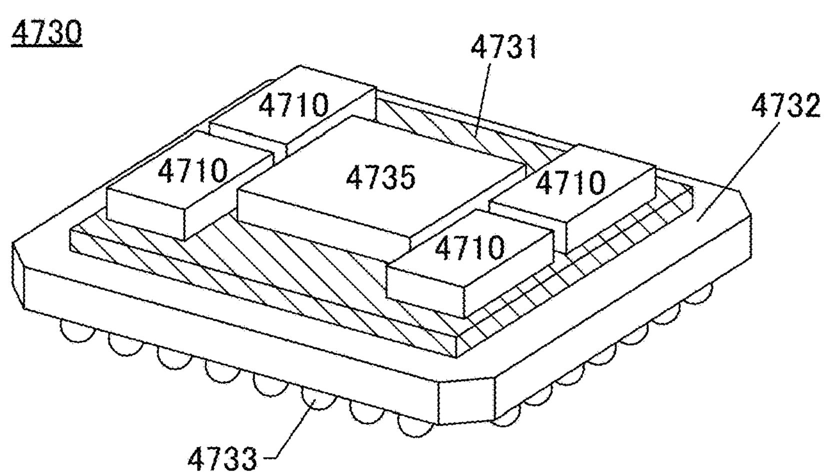

FIG. 35D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a “redistribution substrate” or an “intermediate substrate” in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 35D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Next, an electronic component including an image sensor chip (an imaging device) that includes a photoelectric conversion element is described.

Figure 36A:
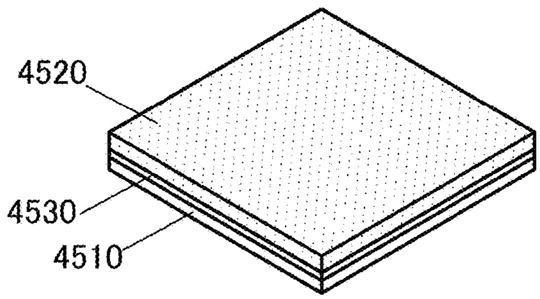
FIG. 36A to FIG. 36F are perspective views of a package or a module each including an imaging device.

FIG. 36A is an external perspective view of the top surface side of a package in which an image sensor chip is placed. The package includes a package substrate 4510 to which an image sensor chip 4550 (see FIG. 36C) is fixed, a cover glass 4520, an adhesive 4530 for bonding them, and the like.

Figure 36D:
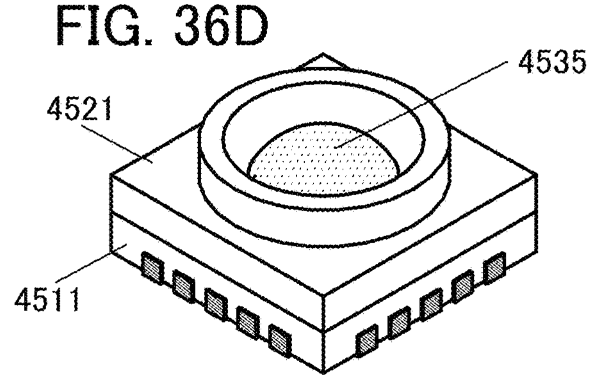
Figure 36B:
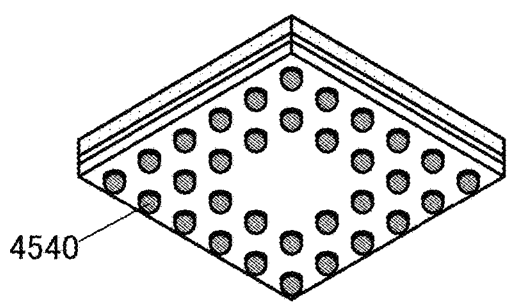

FIG. 36B is an external perspective view of the bottom surface side of the package. A BGA (Ball grid array) in which solder balls are used as bumps 4540 on the bottom surface of the package is employed. Note that, without being limited to the BGA, an LGA (Land grid array), a PGA (Pin Grid Array), or the like may be employed.

Figure 36E:
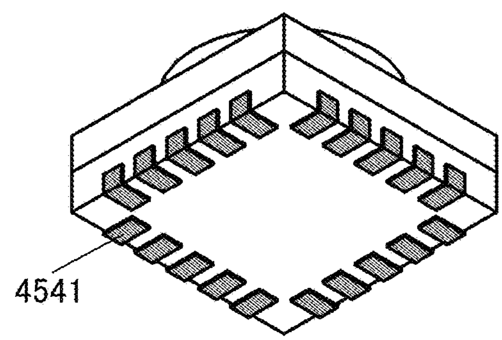
Figure 36C:
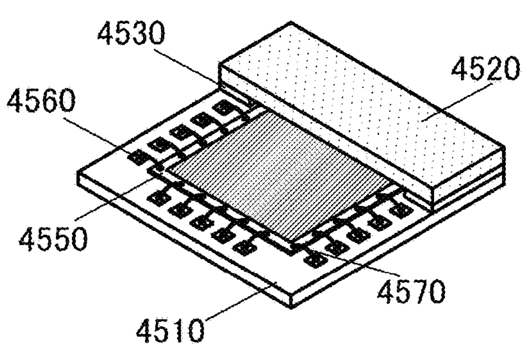

FIG. 36C is a perspective view of the package, in which parts of the cover glass 4520 and the adhesive 4530 are not illustrated. Electrode pads 4560 are formed over the package substrate 4510, and the electrode pads 4560 and the bumps 4540 are electrically connected to each other via through-holes. The electrode pads 4560 are electrically connected to the image sensor chip 4550 through wires 4570.

Figure 36F:
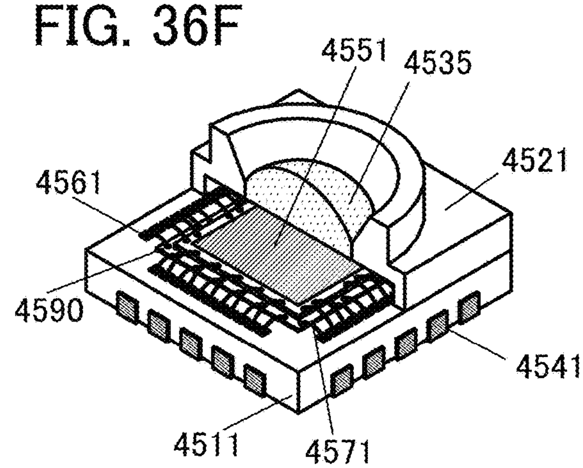

FIG. 36D is an external perspective view of the top surface side of a camera module in which an image sensor chip is placed in a package with a built-in lens. The camera module includes a package substrate 4511 to which an image sensor chip 4551 (FIG. 36F is fixed, a lens cover 4521, a lens 4535, and the like. Furthermore, an IC chip 4590 (FIG. 36F having functions of a driver circuit, a signal conversion circuit, and the like of the imaging device is provided between the package substrate 4511 and the image sensor chip 4551; thus, the structure as a SiP (System in package) is included.

FIG. 36E is an external perspective view of the bottom surface side of the camera module. A QFN (Quad flat no-lead package) structure in which lands 4541 for mounting are provided on the bottom surface and side surfaces of the package substrate 4511 is employed. Note that this structure is an example, and a QFP (Quad flat package) or the BGA may be provided.

FIG. 36F is a perspective view of the module, in which parts of the lens cover 4521 and the lens 4535 are not illustrated. The lands 4541 are electrically connected to electrode pads 4561, and the electrode pads 4561 are electrically connected to the image sensor chip 4551 or the IC chip 4590 through wires 4571.

The image sensor chip placed in a package having the above form can be easily mounted on a printed circuit board and the like; hence, the image sensor chip can be incorporated into a variety of semiconductor devices and electronic devices.

Note that this embodiment can be combined with any of the other embodiments described in this specification as appropriate.

EMBODIMENT 8

Figure 37:
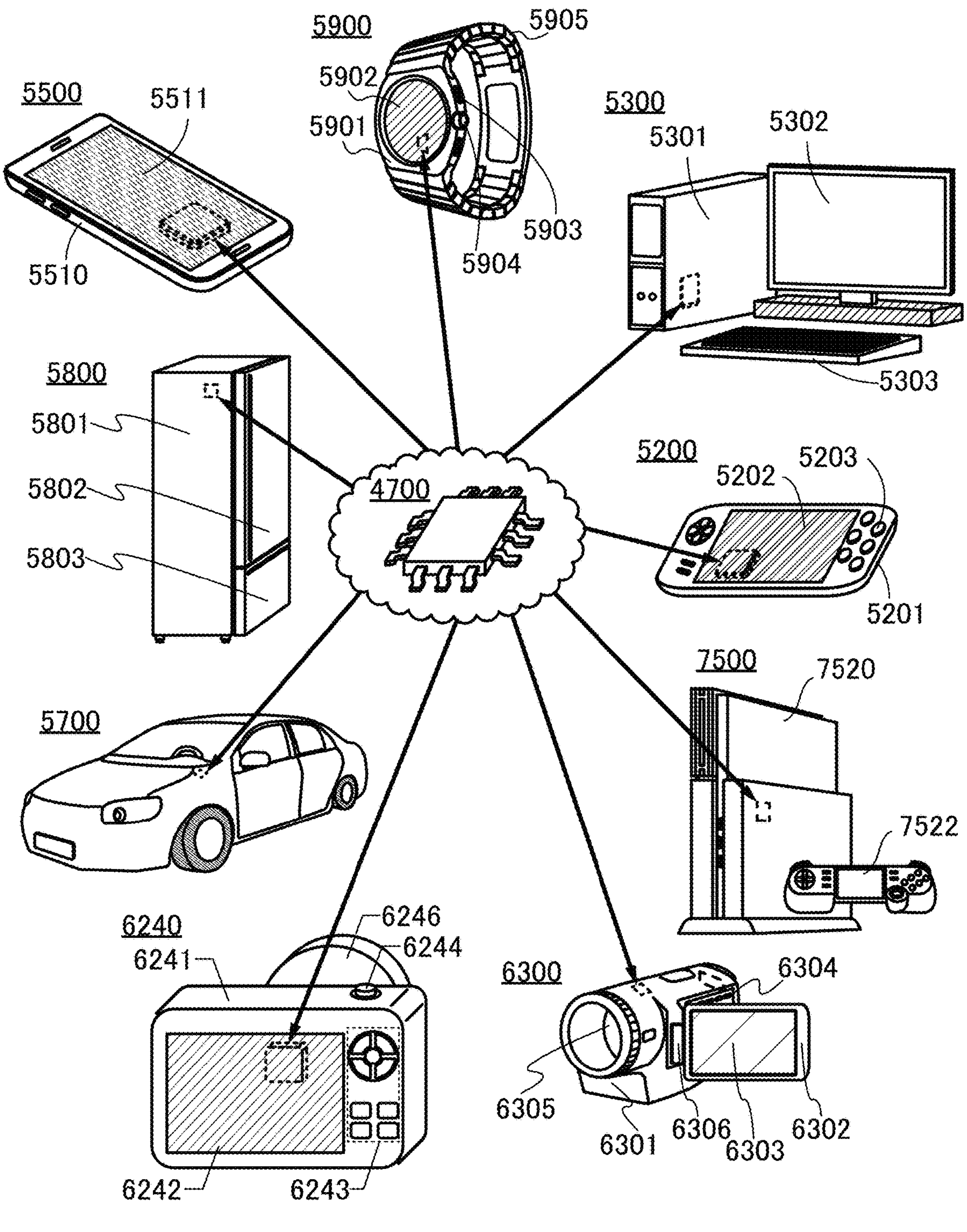
FIG. 37 is a perspective view illustrating examples of electronic devices.

This embodiment will show examples of electronic devices each including the semiconductor device described in the above embodiment. FIG. 37 illustrates electronic devices each including the electronic component 4700 including the semiconductor device.

[Mobile Phone]

An information terminal 5500 illustrated in FIG. 37 is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like.

[Wearable Terminal]

FIG. 37 illustrates a watch-type information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application for managing the health condition of the user of the wearable terminal and a navigation system that selects the optimal route and navigates the user on the basis of the input of the destination.

[Information Terminal]

FIG. 37 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500. Examples of the application utilizing artificial intelligence include design-support software, text correction software, and software for automatic menu generation. Furthermore, with the use of the desktop information terminal 5300, novel artificial intelligence can be developed.

Note that although FIG. 37 illustrates the smartphone, the desktop information terminal, and the wearable terminal as examples of the electronic device, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 37 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used for the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as a household appliance in this example, other examples of the household appliance include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machine]

FIG. 37 illustrates a portable game machine 5200 as an example of a game machine. The portable game machine 5200 includes a housing 5201, a display portion 5202, a button 5203, and the like.

FIG. 37 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 37, the controller 7522 can include a display portion that displays a game image, and an input interface besides a button, such as a touch panel, a stick, a rotating knob, and a sliding knob, for example. The shape of the controller 7522 is not limited to that in FIG. 37, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

A video of the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used for the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program. For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although FIG. 37 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 37 illustrates an automobile 5700 as an example of a moving vehicle.

An instrument panel that can display a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, display of an image taken by an imaging device provided on the outside of the automobile 5700 can compensate for blind areas and enhance safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Note that although an automobile is described above as an example of a moving vehicle, the moving vehicle is not limited to an automobile. Examples of the moving vehicle include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in the above embodiment can be used for a camera.

FIG. 37 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Although the lens 6246 of the digital camera 6240 is detachable from the housing 6241 for replacement here, the lens 6246 may be integrated with the housing 6241. A stroboscope, a view-finder, or the like may be additionally attached to the digital camera 6240.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used for the digital camera 6240, the digital camera 6240 including artificial intelligence can be achieved. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The semiconductor device described in the above embodiment can be used for a video camera.

FIG. 37 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When videos taken by the video camera 6300 are recorded, the videos need to be encoded in accordance with a data recording format. With the use of artificial intelligence, the video camera 6300 can perform the pattern recognition by artificial intelligence in encoding of the videos. The pattern recognition is used to calculate a difference in the human, the animal, the object, and the like between continuously taken image data, so that the data can be compressed.

[Expansion Device for PC]

The semiconductor device described in the above embodiment can be used in a calculator such as a PC (Personal Computer) and an expansion device for an information terminal.

Figure 38A:
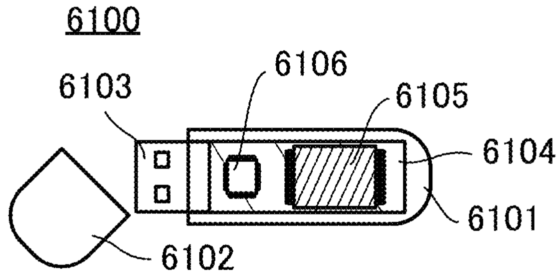
FIG. 38A to FIG. 38C are perspective views illustrating examples of electronic devices.

FIG. 38A illustrates, as an example of the expansion device, a portable expansion device 6100 that includes a chip capable of arithmetic processing and is externally attached to a PC. The expansion device 6100 can perform arithmetic processing using the chip when connected to a PC with a USB (Universal Serial Bus), for example. FIG. 38A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the expansion device 6100 for the PC and the like can increase the arithmetic processing performance of the PC. Thus, a PC with insufficient processing performance can perform arithmetic operation of artificial intelligence, moving image processing, and the like.

[Broadcasting System]

The semiconductor device described in the above embodiment can be used for a broadcasting system.

Figure 38B:
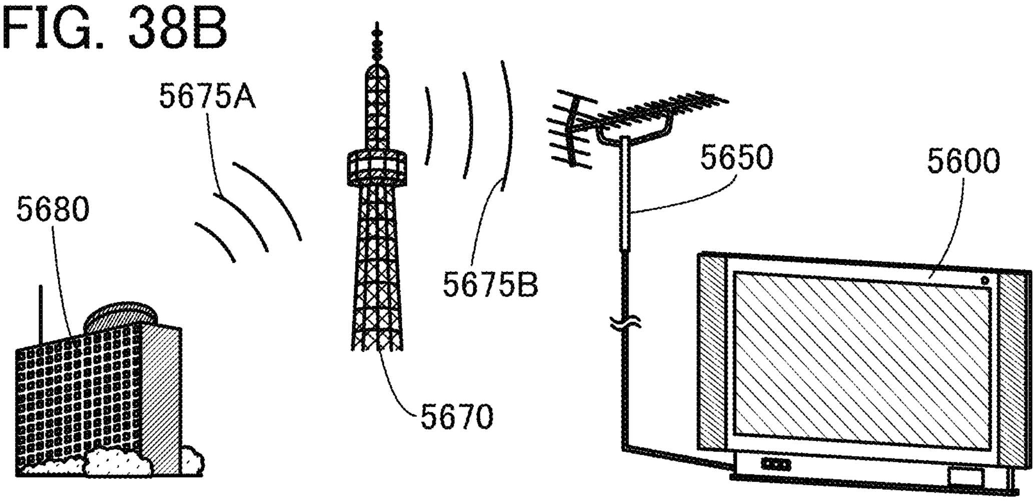

FIG. 38B schematically illustrates data transmission in a broadcasting system.

Specifically, FIG. 38B illustrates a path in which a radio wave (a broadcasting signal) transmitted from a broadcast station 5680 reaches a television receiver (TV) 5600 of each household. The TV 5600 includes a receiving device (not illustrated), and the broadcasting signal received by an antenna 5650 is transmitted to the TV 5600 through the receiving device.

Although a UHF (Ultra High Frequency) antenna is illustrated as the antenna 5650 in FIG. 38B, a BS/1100 CS antenna, a CS antenna, or the like can also be used as the antenna 5650.

A radio wave 5675A and a radio wave 5675B are broadcasting signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 38B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 of each household, the broadcast data is compressed with an encoder. When the antenna 5650 receives the compressed broadcast data, the compressed broadcast data is decompressed with a decoder of the receiving device in the TV 5600. Utilizing the artificial intelligence enables, for example, recognition of a display pattern included in a displayed image in motion compensation prediction, which is one of the compressing methods for the encoder. In-frame prediction utilizing artificial intelligence, for example, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

[Authentication System]

The semiconductor device described in the above embodiment can be used for an authentication system.

Figure 38C:
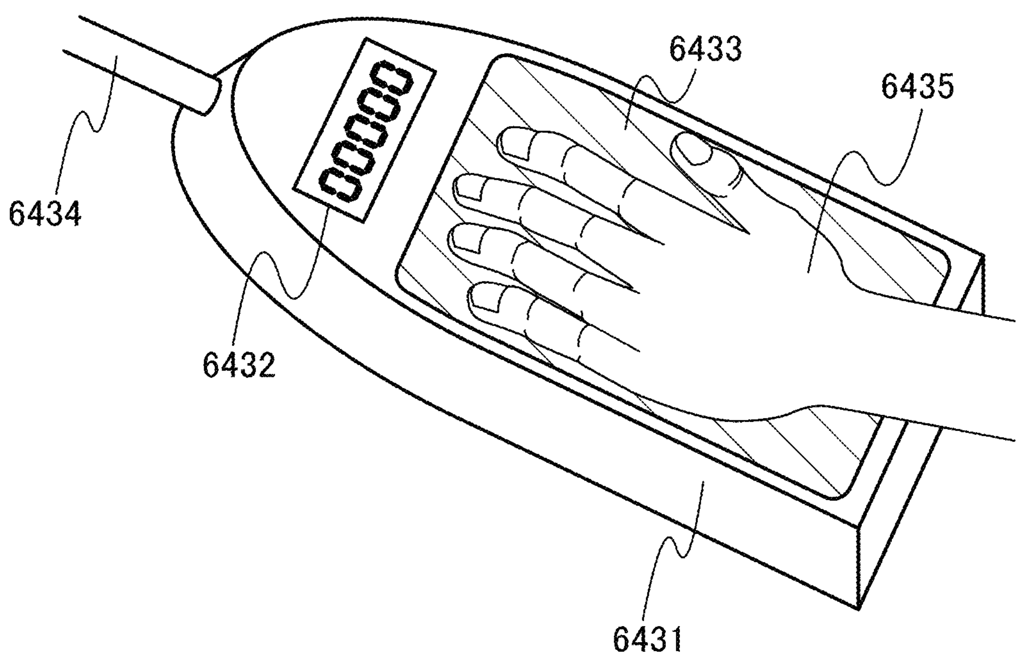

FIG. 38C illustrates a palm print authentication device including a housing 6431, a display portion 6432, a palm print reading portion 6433, and a wiring 6434.

In FIG. 38C, a palm print of a hand 6435 is obtained using the palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

[Alarm]

The semiconductor device described in the above embodiment can be used for an alarm.

Figure 39A:
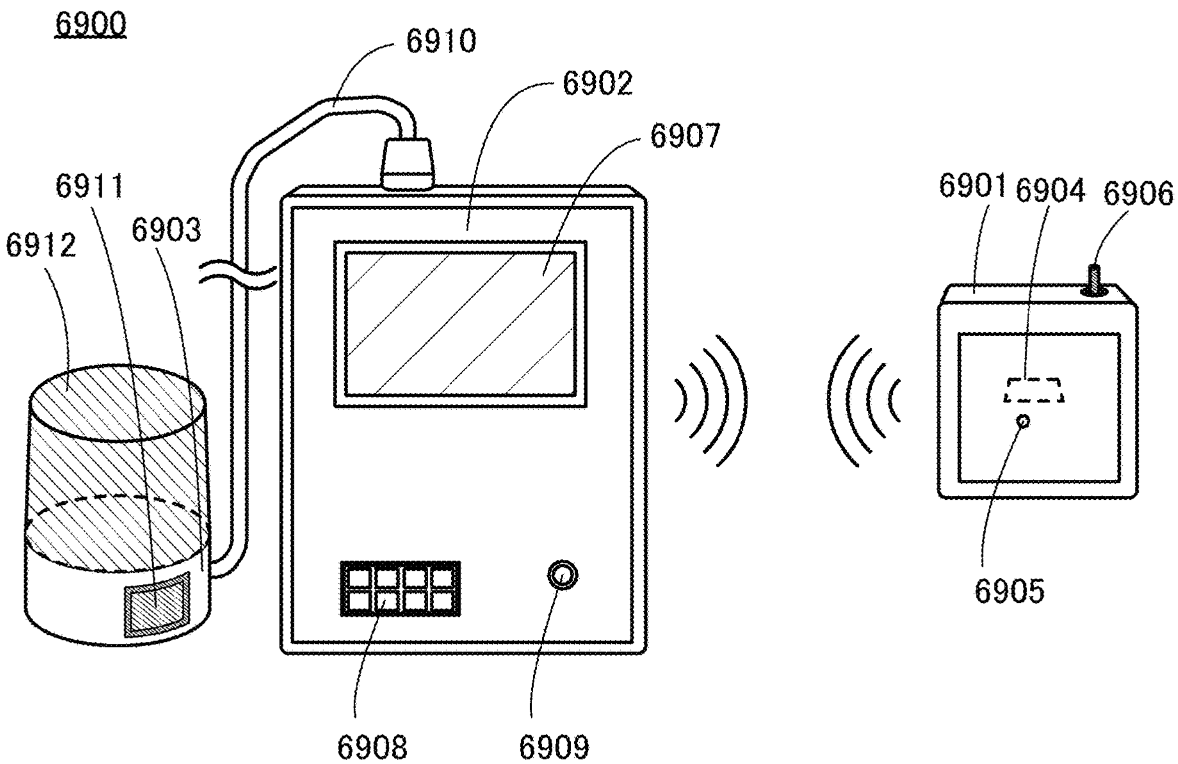
FIG. 39A to FIG. 39C are schematic views illustrating examples of electronic devices.

FIG. 39A illustrates an alarm 6900, which includes a sensor 6901, a receiver 6902, and a transmitter 6903.

The sensor 6901 includes a sensor circuit 6904, an air vent 6905, an operation key 6906, and the like. The detection object that passes through the air vent 6905 is sensed with the sensor circuit 6904. The sensor circuit 6904 can be, for example, a detector in which water leakage, electric leakage, gas leakage, fire, the water level of a river that may overflow, the seismic intensity of an earthquake, a radiation, or the like is the detection object.

For example, when the sensor circuit 6904 senses the detection object with a predetermined value or more, the sensor 6901 transmits information thereof to the receiver 6902. The receiver 6902 includes a display portion 6907, operation keys 6908, an operation key 6909, a wiring 6910, and the like. The receiver 6902 controls the operation of the transmitter 6903 in accordance with the information from the sensor 6901. The transmitter 6903 includes a speaker 6911, a lighting device 6912, and the like. The transmitter 6903 has a function of giving an alarm in accordance with a command from the transmitter 6903. Although FIG. 39A illustrates an example in which the transmitter 6903 gives a sound alarm using the speaker 6911 and gives an optical alarm using the lighting device 6912 such as red light, the transmitter 6903 may give any one of the alarms or another alarm.

In the case where the sensor circuit functions as a fire alarm, the receiver 6902 may command fire preventive equipment such as a shutter to perform a predetermined operation when an alarm is given. Although FIG. 39A illustrates an example in which signals are wirelessly transmitted and received between the receiver 6902 and the sensor 6901, signals may be transmitted and received via a wiring or the like. In addition, although FIG. 39A illustrates an example in which a signal is transmitted from the receiver 6902 to the transmitter 6903 via the wiring 6910, a signal may be wirelessly transmitted.

[Robot]

The semiconductor device described in the above embodiment can be used for a robot.

Figure 39B:
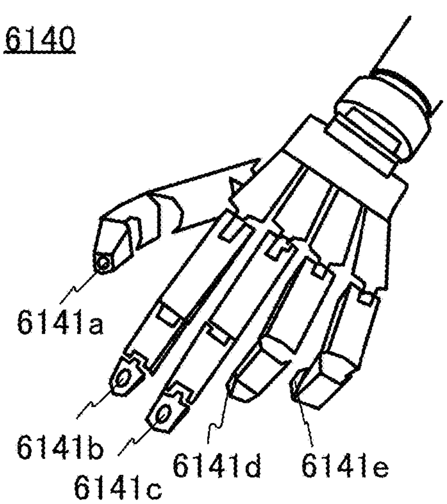

FIG. 39B illustrates an example of a robot. A robot 6140 includes a tactile sensor 6141*a* to a tactile sensor 6141*e*. The robot 6140 can grasp an object with the use of the tactile sensor 6141*a* to the tactile sensor 6141*e*. For example, the tactile sensor 6141*a* to the tactile sensor 6141*e* have a function such that current flows through the object in response to a contact area at the time of touching the object, and the robot 6140 can recognize that the robot 6140 grasps the object, from the amount of flowing current.

Figure 39C:
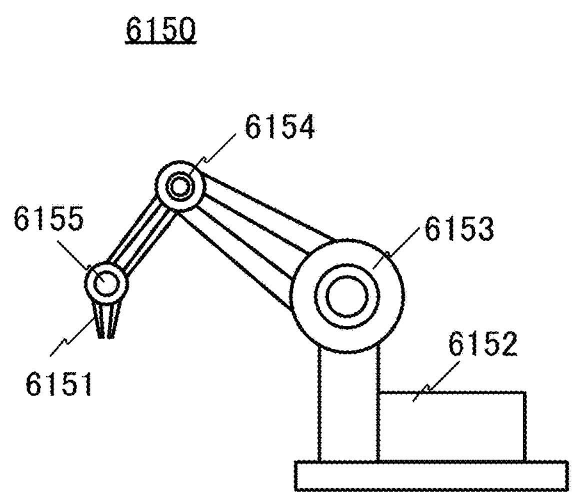

FIG. 39C illustrates an example of an industrial robot. The industrial robot preferably includes a plurality of drive shafts to control the driving range minutely. An example in which an industrial robot 6150 includes a function unit 6151, a control unit 6152, a drive shaft 6153, a drive shaft 6154, and a drive shaft 6155 is illustrated. The function unit 6151 preferably includes a sensor such as an image detection module.

The function unit 6151 preferably has one or more functions of grasping, cutting, welding, applying, and bonding an object, for example. The productivity of the industrial robot 6150 increases as the response is improved. In order that the industrial robot 6150 can operate precisely, a sensor that senses a minute current or the like is preferably provided.

Note that this embodiment can be combined with any of the other embodiments described in this specification as appropriate.

REFERENCE NUMERALS

SDV: semiconductor device, MAC1: arithmetic circuit, MAC1A: arithmetic circuit, MAC2: arithmetic circuit, MAC2-1: arithmetic circuit, MAC2-2: arithmetic circuit, MAC3A: arithmetic circuit, MAC3B: arithmetic circuit, WCS: circuit, WCSa: circuit, XCS: circuit, XCSa: circuit, WSD: circuit, ITS: circuit, ITRZ[1]: converter circuit, ITRZ[n]: converter circuit, ITRZ1: converter circuit, ITRZ2: converter circuit, ITRZ3: converter circuit, ITRZD[j]: converter circuit, ITRZD1: converter circuit, ITRZD2: converter circuit, ITRZD3: converter circuit, ITRZD4: converter circuit, ITRZD4[1]: converter circuit, ITRZD4[n]: converter circuit, SWS1: circuit, SWS2: circuit, SWS3: circuit, CA: cell array, LS: circuit, LGC: circuit, SCA: : sensor array, IM: cell, IM[1,1]: cell, IM[1,j]: cell, IM[m,j]: cell, IM[i,j]: cell, IM[m,1]: cell, IM[1,*n*]: cell, IM[m,n]: cell, IM[1,*h*]: cell, IM[n,h]: cell, IMr[1,j]: cell, IMr[i,j]: cell, IMr[m,j]: cell, IMr[1,*h*]: cell, IMr[n,h]: cell, IMref: cell, IMref[1]: cell, IMref[i]: cell, IMref[m]: cell, IMref[n]: cell, CES[1,j]: circuit, CES[i,j]: circuit, CES[m,j]: circuit, NN[1,1]: node, NN[m,1]: node, NN[1,j]: node, NN[m,j]: node, NN[1,*n*]: node, NN[m, n]: node, NNr[1,j]: node, NNr[m,j]: node, NNref[1]: node, NNref[m]: node, CS: current source, CS1: current source, CS2: current source, CS3: current source, CS4: current source, CI: current source, CIr: current source, CSA: current source, CM1: current mirror circuit, CM2: current mirror circuit, ADC: analog-digital converter circuit, C5: capacitor, C5*r*: capacitor, C5*m*: capacitor, C6: capacitor, CMP1: comparator, CMP2: comparator, F1: transistor, F1*m*: transistor, F1*r*: transistor, F2: transistor, F2*m*: transistor, F2*r*: transistor, F3: transistor, F3[1]: transistor, F3[j]: transistor, F3[n]: transistor, F3*r*: transistor, F3*r*[j]: transistor, F4: transistor, F4[1]: transistor, F4[j]: transistor, F4[n]: transistor, F4*r*: transistor, F4*r*[j]: transistor, F5: transistor, F6: transistor, F6*r*: transistor, F6*s*: transistor, F6*sr*: transistor, F7: transistor, F7*r*: transistor, F7*s*: transistor, F8: transistor, F8*r*: transistor, F8*s*: transistor, F8*sr*: transistor, F9: transistor, Tr1: transistor, Tr1[1]: transistor, Tr1[2]: transistor, Tr1[K]: transistor, Tr2: transistor, Tr2[1]: transistor, Tr2[2]: transistor, Tr2[K]: transistor, Tr3: transistor, R5: resistor, RP: resistor, RM: resistor, SNC: sensor, SNC[1]: sensor, SNC[m]: sensor, PD: photodiode, OP1: operational amplifier, OP2: operational amplifier, OPP: operational amplifier, OPM: operational amplifier, SWW: switch, SWX: switch, SW[1]: switch, SW[m]: switch, LTA[1]: latch circuit, LTA[m]: latch circuit, LTB[1]: latch circuit, LTB[m]: latch circuit, BF[1]: buffer circuit, BF[m]: buffer circuit, T1: terminal, T2: terminal, U1: terminal, U2: terminal, U3: terminal, SWL1: wiring, SWL2: wiring, WCL: wiring, WCL[1]: wiring, WCL[j]: wiring, WCL[n]: wiring, WCLr: wiring, WCLr[j]: wiring, XCL: wiring, XCL[i]: wiring, XCL[i]: wiring, XCL [m]: wiring, WSL: wiring, WSL[i]: wiring, WSL[j]: wiring, WSL[m]: wiring, OL: wiring, OL[i]: wiring, OL[j]: wiring, OL[n]: wiring, DW: wiring, DW[i]: wiring, DW[2]: wiring, DW[K]: wiring, DX[i]: wiring, DX[2]: wiring, DX[L]: wiring, CL[i]: wiring, CL[2]: wiring, CL[P]: wiring, VE: wiring, VE1: wiring, VE2: wiring, VDDL: wiring, VINIL1: wiring, VINIL2: wiring, VWL: wiring, VTL: wiring, VTHL: wiring, VRL: wiring, VRL2: wiring, VRL3: wiring, VRPL: wiring, VRML: wiring, VHE: wiring, VSE: wiring, OEL: wiring, TM[i]: wiring, TM[n]: wiring, TH[1,*h*]: wiring, TH[n,h]: wiring, THr[1,*h*]: wiring, THr[n,h]: wiring, LXS[i]: wiring, LXS[m]: wiring, DXS[i]: wiring, DXS [m]: wiring, VANL: wiring, SCL: wiring, SPL: wiring, SEL[1]: wiring, SEL[m]: wiring, DAT: wiring, LAT: wiring, SWL[1]: wiring, SWL[m]: wiring, EIL[1]: wiring, EIL[i]: wiring, EIL[m]: wiring, SWLA: wiring, SWLB: wiring, RCL[1]: wiring, RCL[n]: wiring, CCL: layer, ERL: layer, PDL: layer, PHL: layer, LY1: layer, LY2: layer, LY3: layer, LY4: layer, DNK: electrode, PTC: circuit, PTR[1]: circuit, PTR[i]: circuit, PTR[m]: circuit, AC[1]: circuit, AC[m]: circuit, SA[1]: switch, SA[i]: switch, SA[m]: switch, SB[1]: switch, SB[n]: switch, SCL1: scribe line, SCL2: scribe line, 100: neural network, 300: transistor, 310: substrate, 310A: substrate, 312: element isolation layer, 313: semiconductor region, 314*a*: low-resistance region, 314*b*: low-resistance region, 315: insulator, 316: conductor, 320: insulator, 322: insulator, 324: insulator, 326: insulator,

328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 492: insulator, 493: insulator, 500: transistor, 503: conductor, 503*a*: conductor, 503*b*: conductor, 510: insulator, 512: insulator, 513: insulator, 514: insulator, 516: insulator, 518: conductor, 522: insulator, 524: insulator, 530: oxide, 530*a*: oxide, 530*b*: oxide, 530*c*: oxide, 530*c*1: oxide, 530*c*2: oxide, 540: conductor, 540*a*: conductor, 540*b*: conductor, 542: conductor, 542*a*: conductor, 542*b*: conductor, 543*a*: region, 543*b*: region, 544: insulator, 546: conductor, 550: insulator, 552: insulator, 560: conductor, 560*a*: conductor, 560*b*: conductor, 574: insulator, 576: insulator, 580: insulator, 581: insulator, 582: insulator, 586: insulator, 600: capacitor, 600A: capacitor, 600B: capacitor, 610: conductor, 611: conductor, 612: conductor, 620: conductor, 630: insulator, 631: insulator, 640: insulator, 650: insulator, 651: insulator, 700: photoelectric conversion element, 700A: photoelectric conversion element, 701: insulator, 740: conductor, 741: conductor, 742: conductor, 743: conductor, 744: conductor, 750: insulator, 751: insulator, 752: insulator, 753: insulator, 754: insulator, 755: insulator, 756: insulator, 765*a*: layer, 765*b*: layer, 767*a*: layer, 767*b*: layer, 767*c*: layer, 767*d*: layer, 767*e*: layer, 771: light-blocking layer, 772: optical conversion layer, 773: microlens array, 4510: package substrate, 4511: package substrate, 4520: cover glass, 4521: lens cover, 4530: adhesive, 4535: lens, 4540: bump, 4541: land, 4550: image sensor chip, 4551: image sensor chip, 4560: electrode pad, 4561: electrode pad, 4570: wire, 4571: wire, 4590: IC chip, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6105: chip, 6106: controller chip, 6140: robot, 6141*a*: tactile sensor, 6141*b*: tactile sensor, 6141*c*: tactile sensor, 6141*d*: tactile sensor, 6141*e*: tactile sensor, 6150: industrial robot, 6151: function unit, 6152: control unit, 6153: drive shaft, 6154: drive shaft, 6155: drive shaft, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 6900: alarm, 6901: sensor, 6902: receiver, 6903: transmitter, 6904: sensor circuit, 6905: air vent, 6906: operation key, 6907: display portion, 6908: operation key, 6909: operation key, 6910: wiring, 6911: speaker, 6912: lighting device, 7500: stationary game machine, 7520: main body, 7522: controller

The invention claimed is:

1. A semiconductor device comprising:

a first layer comprising a first cell, switch, a first wiring, and a second wiring adjacent to the first wiring;

a second layer over the first layer, the second layer comprising a third wiring and a fourth wiring adjacent to the third wiring; and a third layer over the second layer, the third layer comprising an electrode and a sensor, wherein the sensor is electrically connected to the third wiring through the electrode and a first plug, wherein a first terminal of the switch is electrically connected to the third wiring through a second plug, wherein a second terminal of the switch is electrically connected to the first cell through the first wiring, wherein the electrode comprises a region overlapping with the sensor and a region overlapping with the first plug, wherein the first wiring, the second wiring, the third wiring, and the fourth wiring are parallel to each other, and wherein a distance between the third wiring and the fourth wiring is greater than or equal to 0.9 times and less than or equal to 1.1 times a distance between the first wiring and the second wiring.

2. The semiconductor device according to claim 1, wherein the sensor comprises a photodiode.

3. An electronic device comprising the semiconductor device according to claim 1 and a housing, wherein the semiconductor device is configured to perform product-sum operation.

4. The semiconductor device according to claim 1, wherein the first layer further comprises a second cell, wherein the first cell comprises a first transistor, a second transistor, and a first capacitor, wherein the second cell comprises a third transistor, a fourth transistor, and a second capacitor, wherein a gate of the first transistor is electrically connected to a first terminal of the first capacitor and a first terminal of the second transistor, wherein a first terminal of the first transistor is electrically connected to a second terminal of the second transistor, wherein a second terminal of the first capacitor is electrically connected to the second terminal of the switch through the first wiring, wherein a gate of the third transistor is electrically connected to a first terminal of the second capacitor and a first terminal of the fourth transistor, wherein a first terminal of the third transistor is electrically connected to a second terminal of the fourth transistor, and wherein a second terminal of the second capacitor is electrically connected to the second terminal of the switch through the first wiring.

5. The semiconductor device according to claim 4, wherein the first layer further comprises a first current supply circuit, wherein an output terminal of the first current supply circuit is electrically connected to the first terminal of the first transistor, wherein the first current supply circuith is configured to supply a first current from the output terminal of the first current supply circuit, wherein the sensor is configured to supply a second current corresponding to data obtained by sensing and applying an input potential corresponding to an amount of the second current to each of the second terminal of the first capacitor and the second terminal of the second capacitor, wherein the second cell is configured to set an amount of current flowing between the first terminal and a second terminal of the third transistor to the amount of the second current by retaining a potential corresponding to the amount of the second current in the gate of the third transistor, wherein the first cell is configured to set an amount of current flowing between the first terminal and a second terminal of the first transistor to an amount of the first current by retaining a potential corresponding to the first current in the gate of the first transistor and changing the amount of the first current flowing between the first terminal and the second terminal of the first transistor to an amount of a third current corresponding to an amount of change in the input potential when the amount of the second current supplied from the sensor is changed, wherein each of the amount of the first current and the amount of the third current is in a range of current flowing when the first transistor operates in a subthreshold region, and wherein the amount of the second current is in a range of current flowing when the second transistor operates in a subthreshold region.

6. The semiconductor device according to claim 4, wherein the first transistor, the second transistor, the third transistor, and the fourth transistor each comprise a metal oxide in a channel formation region.

7. A semiconductor device comprising:

a first layer comprising a first cell, a switch, a first wiring, and a second wiring adjacent to the first wiring;

a second layer over the first layer, the second layer comprising a third wiring and a fourth wiring adjacent to the third wiring; and a third layer over the second layer, the third layer comprising an electrode and a sensor, wherein the sensor is electrically connected to the third wiring through the electrode and a first plug, wherein a first terminal of the switch is electrically connected to the third wiring through a second plug, wherein a second terminal of the switch is electrically connected to the first cell through the first wiring, wherein the electrode comprises a region overlapping with the sensor and a region overlapping with the first plug, and wherein the first wiring, the second wiring, the third wiring, and the fourth wiring are parallel to each other.

8. The semiconductor device according to claim 7, wherein the sensor comprises a photodiode.

9. An electronic device comprising the semiconductor device according to claim 7 and a housing, wherein the semiconductor device is configured to perform product-sum operation.

10. The semiconductor device according to claim 7, wherein the first layer further comprises a second cell, wherein the first cell comprises a first transistor, a second transistor, and a first capacitor, wherein a gate of the first transistor is electrically connected to a first terminal of the first capacitor and a first terminal of the second transistor, wherein a first terminal of the first transistor is electrically connected to a second terminal of the second transistor, and wherein a second terminal of the first capacitor is electrically connected to the second terminal of the switch through the first wiring.

11. The semiconductor device according to claim 10, wherein the first layer further comprises a first current supply circuit, and wherein an output terminal of the first current supply circuit is electrically connected to the first terminal of the first transistor.

12. The semiconductor device according to claim 10, wherein the first transistor and the second transistor each comprise a metal oxide in a channel formation region.

* * * * *